United States Patent
Tanaka et al.

(10) Patent No.: US 6,363,010 B2
(45) Date of Patent: Mar. 26, 2002

(54) NONVOLATILE SEMICONDUCTOR MEMORY DEVICE

(75) Inventors: Tomoharu Tanaka; Kazunori Ohuchi, both of Yokohama; Toru Tanzawa, Ebina; Ken Takeuchi, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/899,290

(22) Filed: Jul. 6, 2001

Related U.S. Application Data

(63) Continuation of application No. 09/532,329, filed on Mar. 21, 2000, which is a continuation of application No. 09/314,446, filed on May 19, 1999, now Pat. No. 6,044,013, which is a continuation of application No. 08/816,830, filed on Mar. 18, 1997, now Pat. No. 5,969,985.

(30) Foreign Application Priority Data

| Mar. 18, 1996 | (JP) | ............................................. 8-061352 |
| Mar. 18, 1996 | (JP) | ............................................. 8-061443 |
| Mar. 18, 1996 | (JP) | ............................................. 8-061444 |
| Mar. 18, 1996 | (JP) | ............................................. 8-061449 |

(51) Int. Cl.$^7$ ............................................. G11C 16/04
(52) U.S. Cl. ............................... 365/185.03; 365/189.05
(58) Field of Search ........................ 365/185.03, 187.17, 365/189.05, 63

(56) References Cited

U.S. PATENT DOCUMENTS

| 5,521,865 | A | 5/1996 | Ohuchi et al. | .......... 365/185.22 |
| 5,570,315 | A | 10/1996 | Tanaka et al. | .......... 365/185.22 |
| 5,602,789 | A | 2/1997 | Endoh et al. | ................ 365/201 |
| 5,615,165 | A | 3/1997 | Tanaka et al. | .......... 365/230.06 |
| 5,671,388 | A | 9/1997 | Hasbun | ..................... 395/430 |
| 5,815,436 | A | 9/1998 | Tanaka et al. | .......... 365/185.03 |
| 5,903,495 | A | 5/1999 | Takeuchi et al. | ........ 365/185.03 |
| 6,046,935 | A | 4/2000 | Takeuchi et al. | ........ 365/185.03 |

Primary Examiner—Vu A. Le
(74) Attorney, Agent, or Firm—Foley & Lardner

(57) ABSTRACT

A bit line controller is provided for connecting a data input/output line and one bit line BL to each other. The bit line controller has a data latch for latching multilevel write data supplied from the data input/output line to the memory cell and a sense amplifier for sensing and latching data output to one bit line BL from the memory cell transistor. When the number of multilevel data to be output to one bit line BL is $2^m$ (m is a natural number not smaller than 2)=n-level, the number of each of the data latch and sense amplifier is "m". Specifically, when the number is determined such that $2^2=4$, the number of each of the data latch and the sense amplifier is two. As a result, there is provided a nonvolatile semiconductor memory device capable of decreasing the size of a column-system circuit and realizing a highly integrated structure.

5 Claims, 98 Drawing Sheets

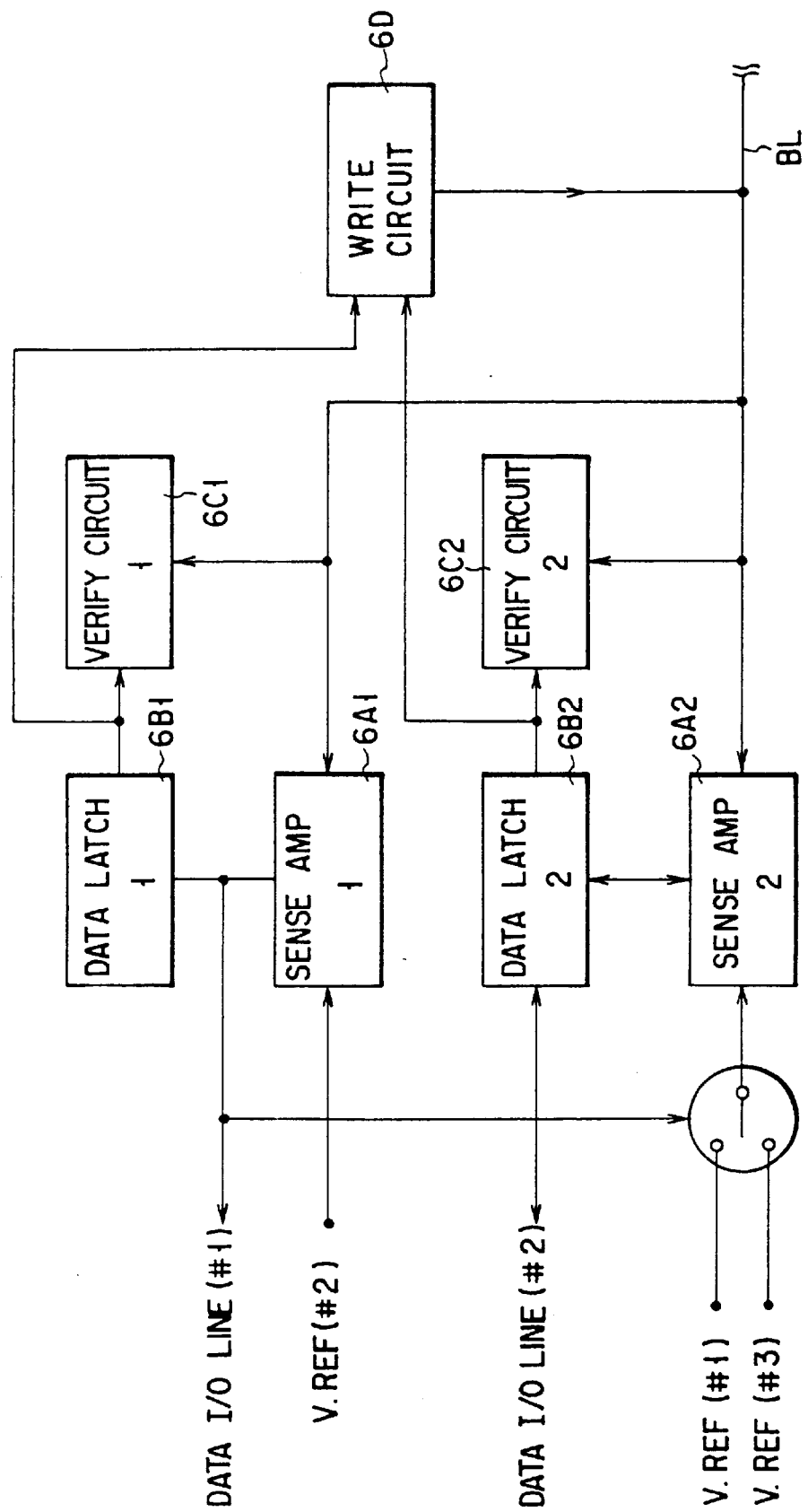
F I G. 7

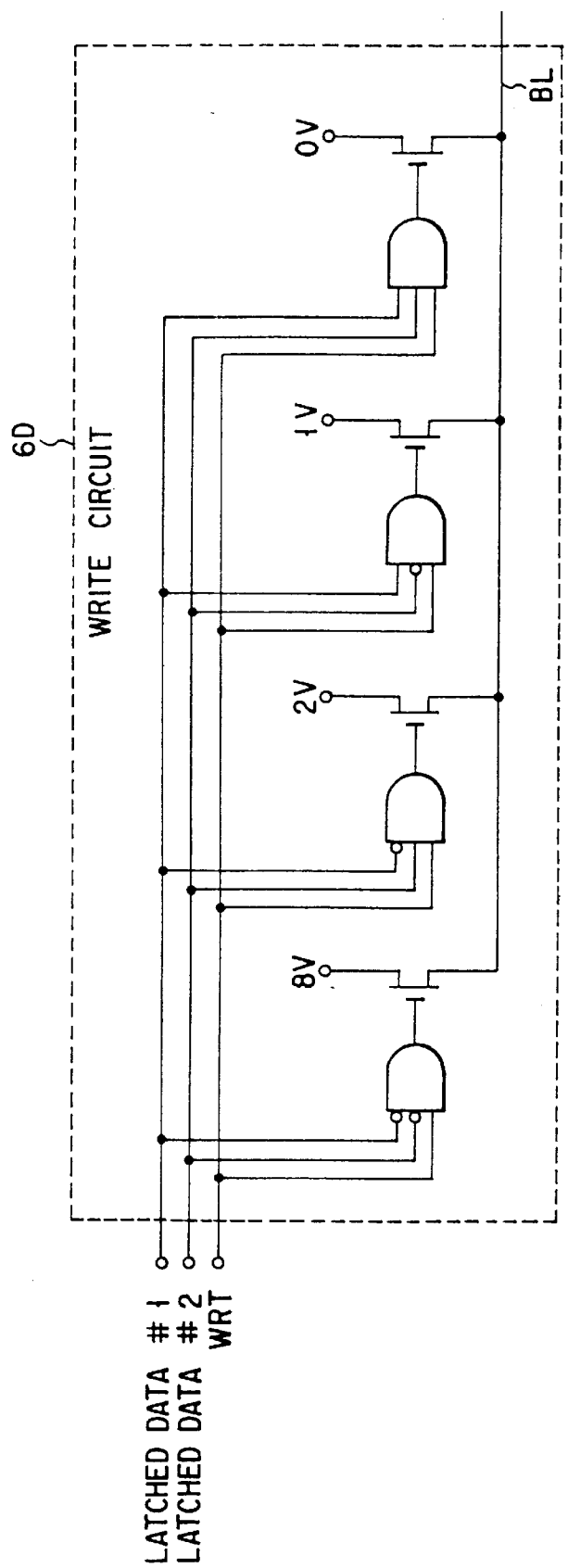
F I G. 8

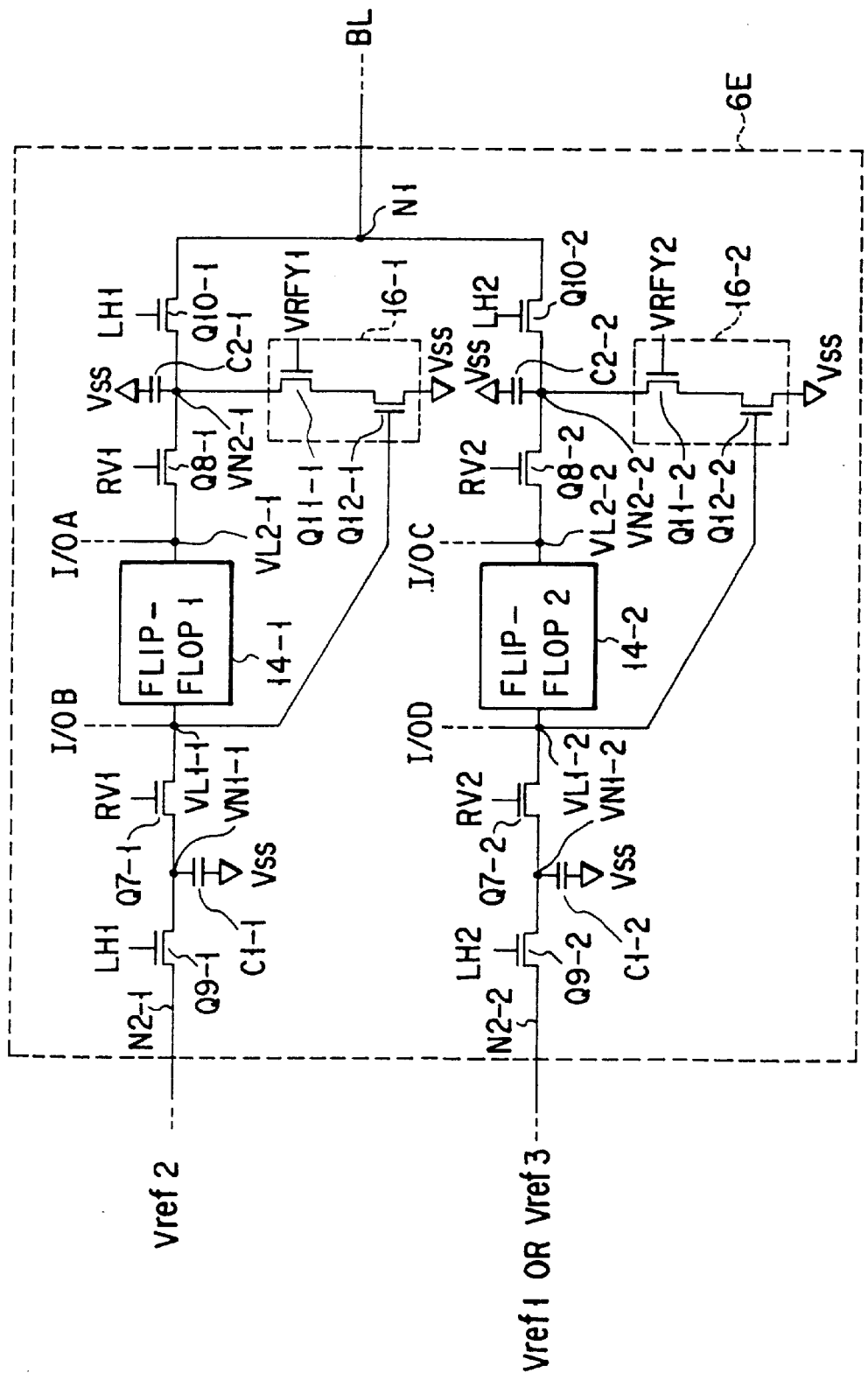
F I G. 10

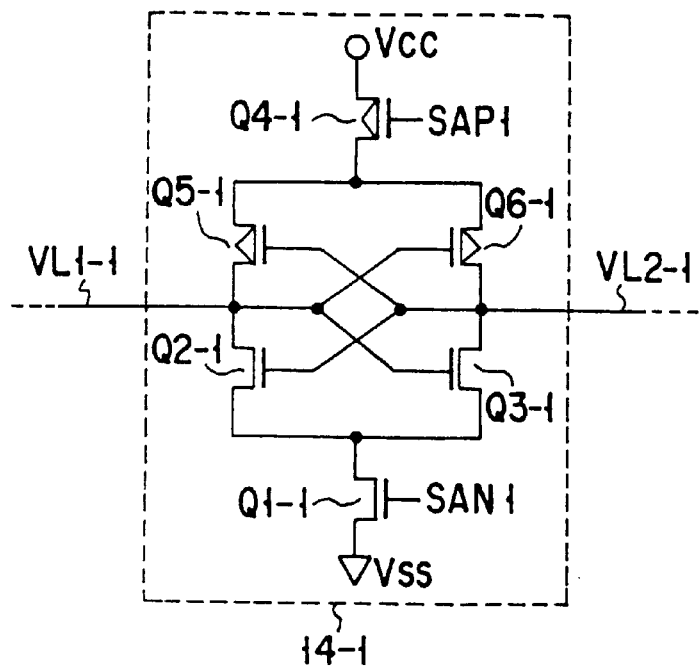
F I G. 11
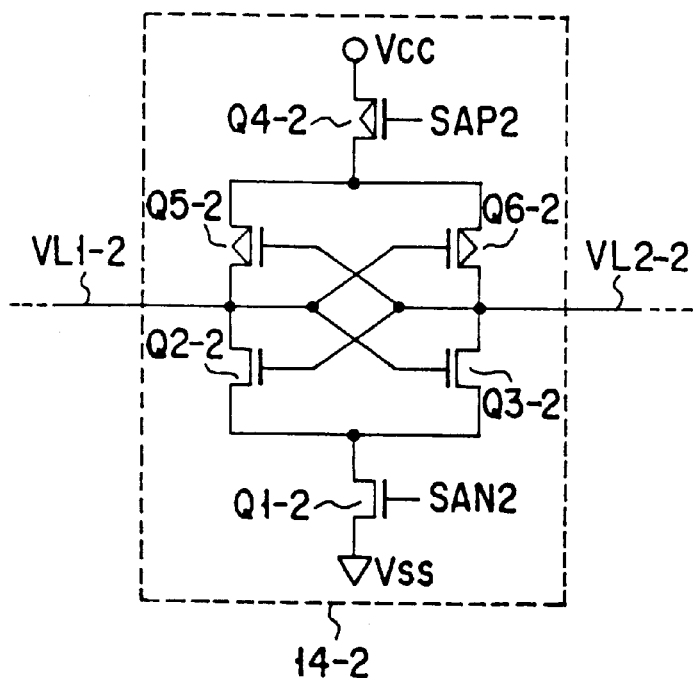
F I G. 12

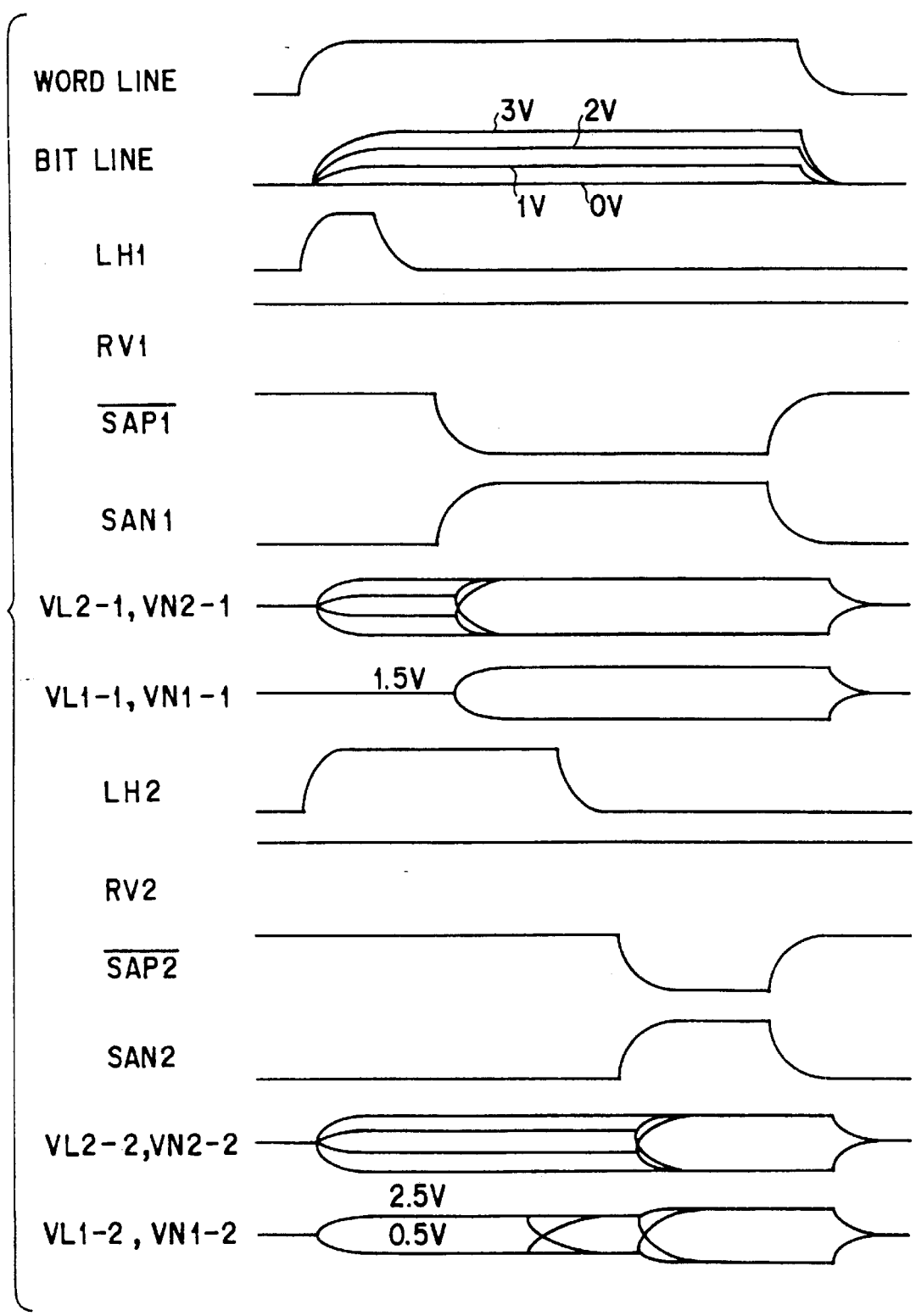
F I G. 13

| DATA | SENSE AMP #1 (FLIP-FLOP 14-1) (VL1-2, VL2-2) | SENSE AMP #2 (FLIP-FLOP 14-2) (VL1-2, VL2-2) |
|---|---|---|
| "1" | L, H | L, H |
| "2" | L, H | H, L |
| "3" | H, L | L, H |
| "4" | H, L | H, L |

F I G. 15

| DATA | DATA LATCH #1 (FLIP-FLOP 14-1) (VL1-1, VL2-1) | DATA LATCH #2 (FLIP-FLOP 14-2) (VL1-2, VL2-2) |
|---|---|---|
| "1" | H, L | H, L |
| "2" | H, L | L, H |
| "3" | L, H | H, L |
| "4" | L, H | L, H |

F I G. 16

| DATA | WRITE STATUS | SENSE AMP & DATA LATCH #1 (FLIP FLOP 14-1) (VL1-1, VL2-1) | SENSE AMP & DATA LATCH #2 (FLIP FLOP 14-2) (VL1-2, VL2-2) |
|---|---|---|---|
| "1" |  | H, L | H, L |
| "2" | COMPLETED | H, L | H, L |
|  | INSUFFICIENT | H, L | L, H |
| "3" | COMPLETED | H, L | H, L |
|  | INSUFFICIENT | L, H | H, L |
| "4" | COMPLETED | H, L | H, L |
|  | INSUFFICIENT | L, H | L, H |

F I G. 17

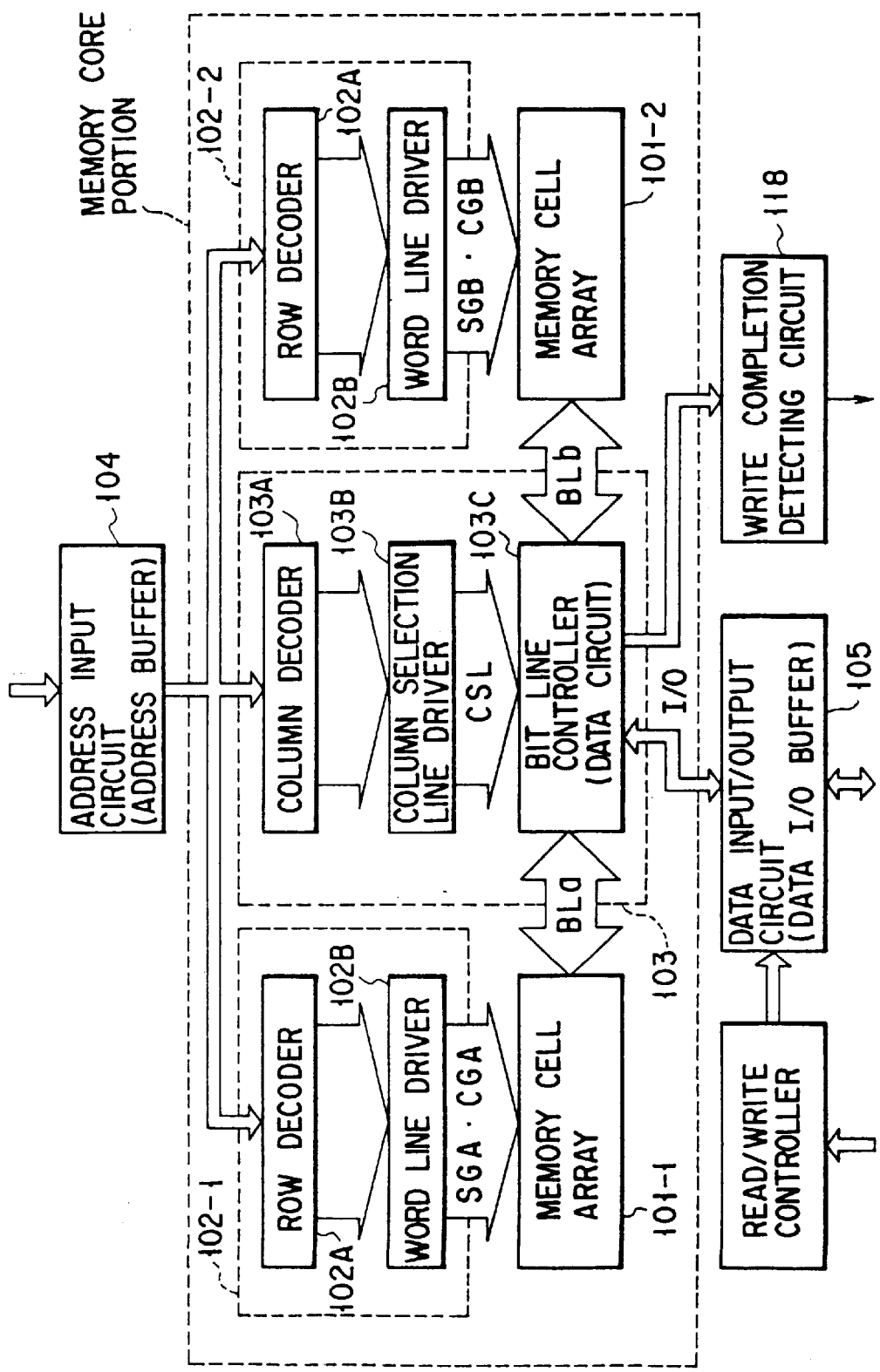
F I G. 19

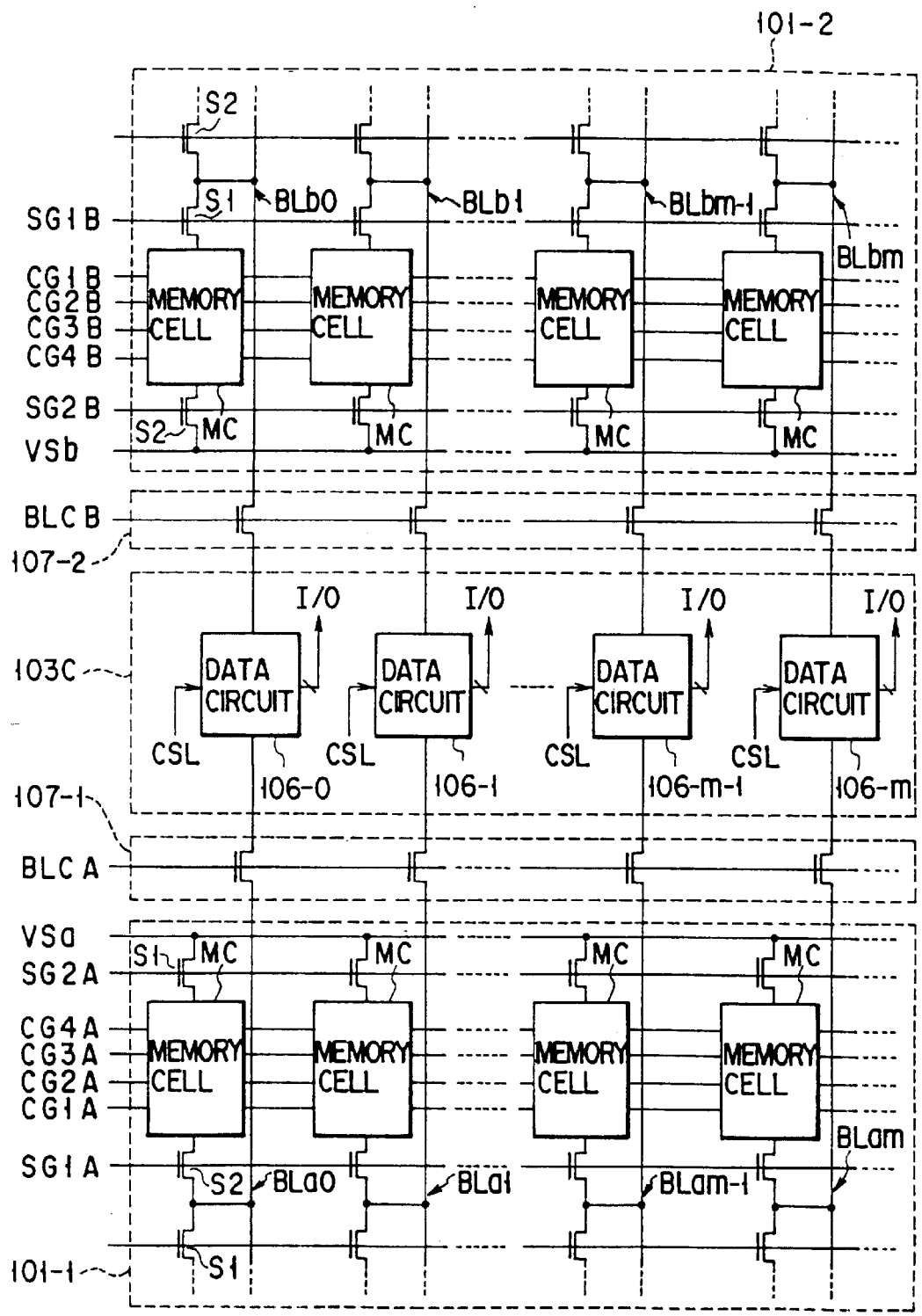
F I G. 20

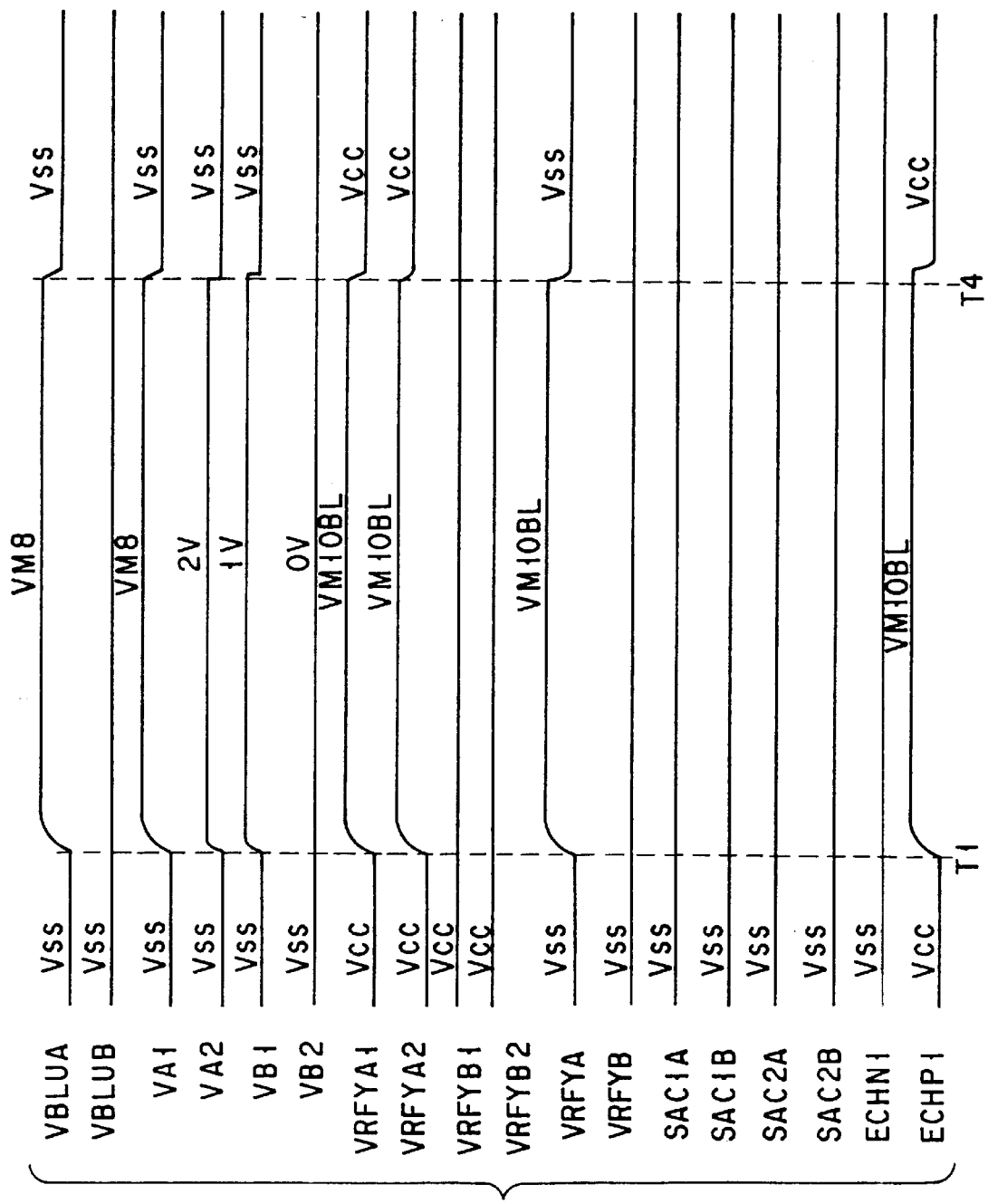
F I G. 27

| THRESHOLD LEVEL | LATCHED DATA ||
|---|---|---|
| | D1A | D2A |
| "4" | H | H |
| "3" | H | L |
| "2" | L | H |
| "1" | L | L |

FIG. 29

| THRESHOLD LEVEL | LATCHED DATA ||
|---|---|---|
| | D1A | D2A |
| "4" | L | L |
| "3" | L | H |
| "2" | H | L |
| "1" | H | H |

FIG. 30

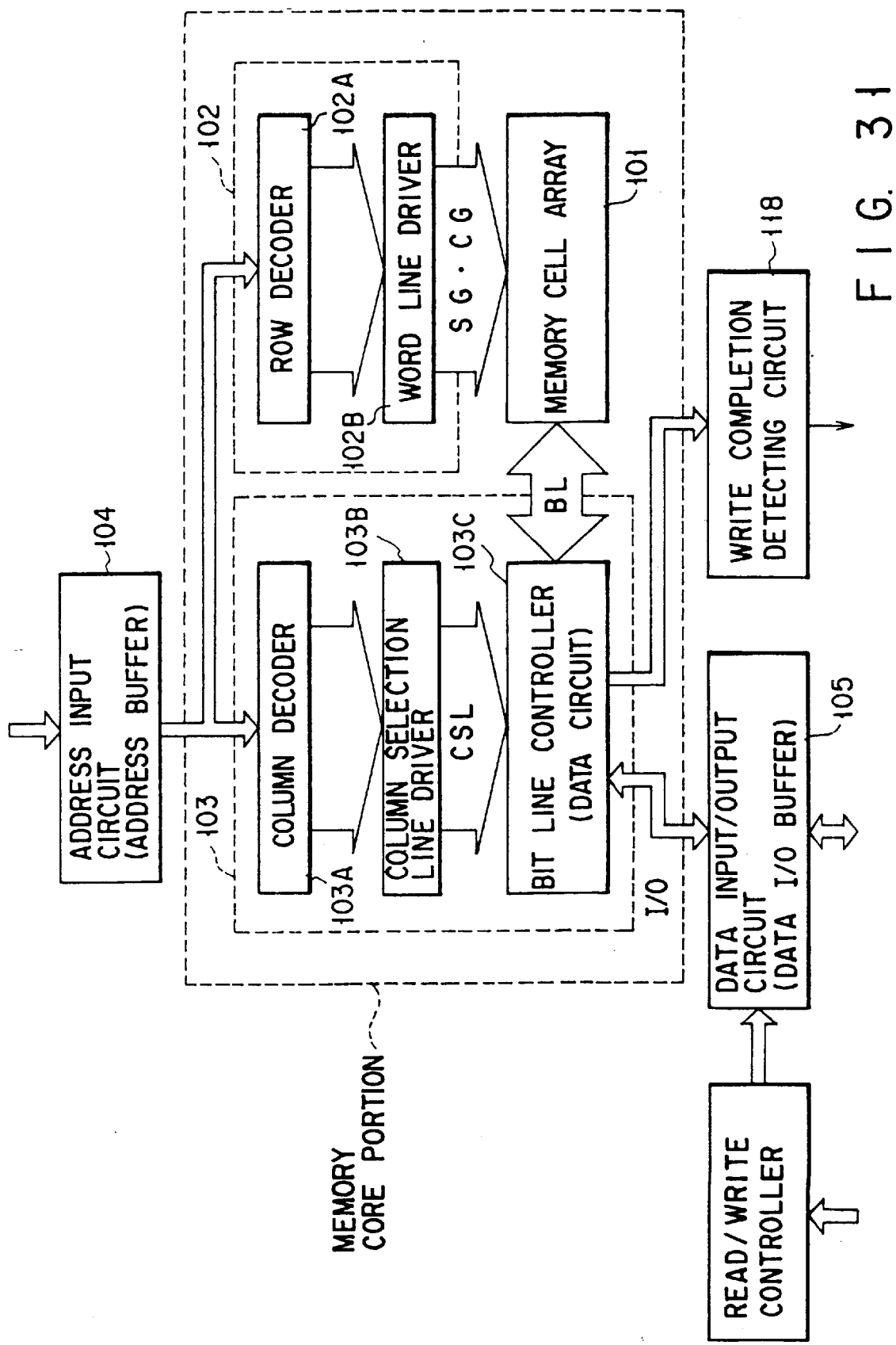
F I G. 31

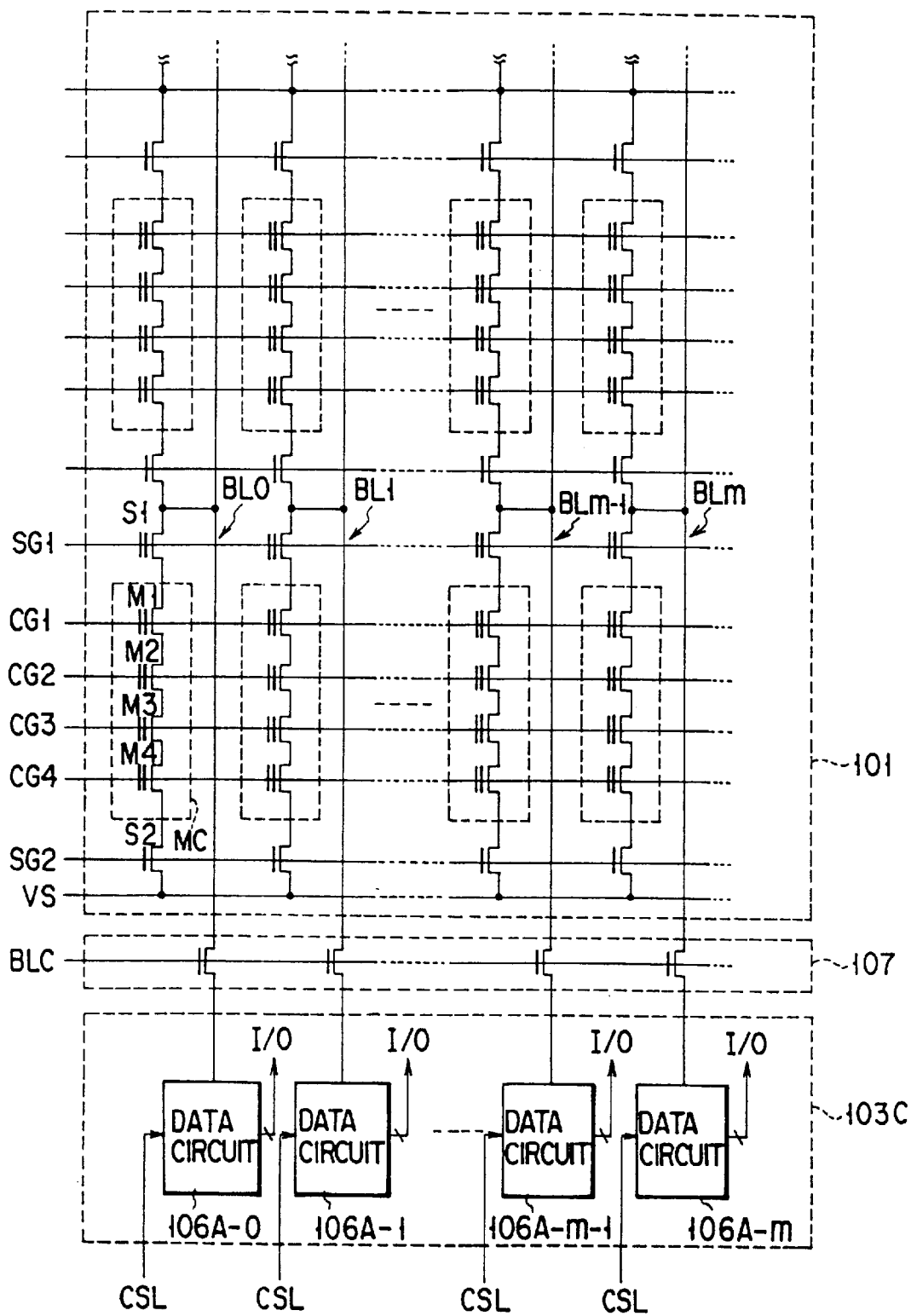
F I G. 32

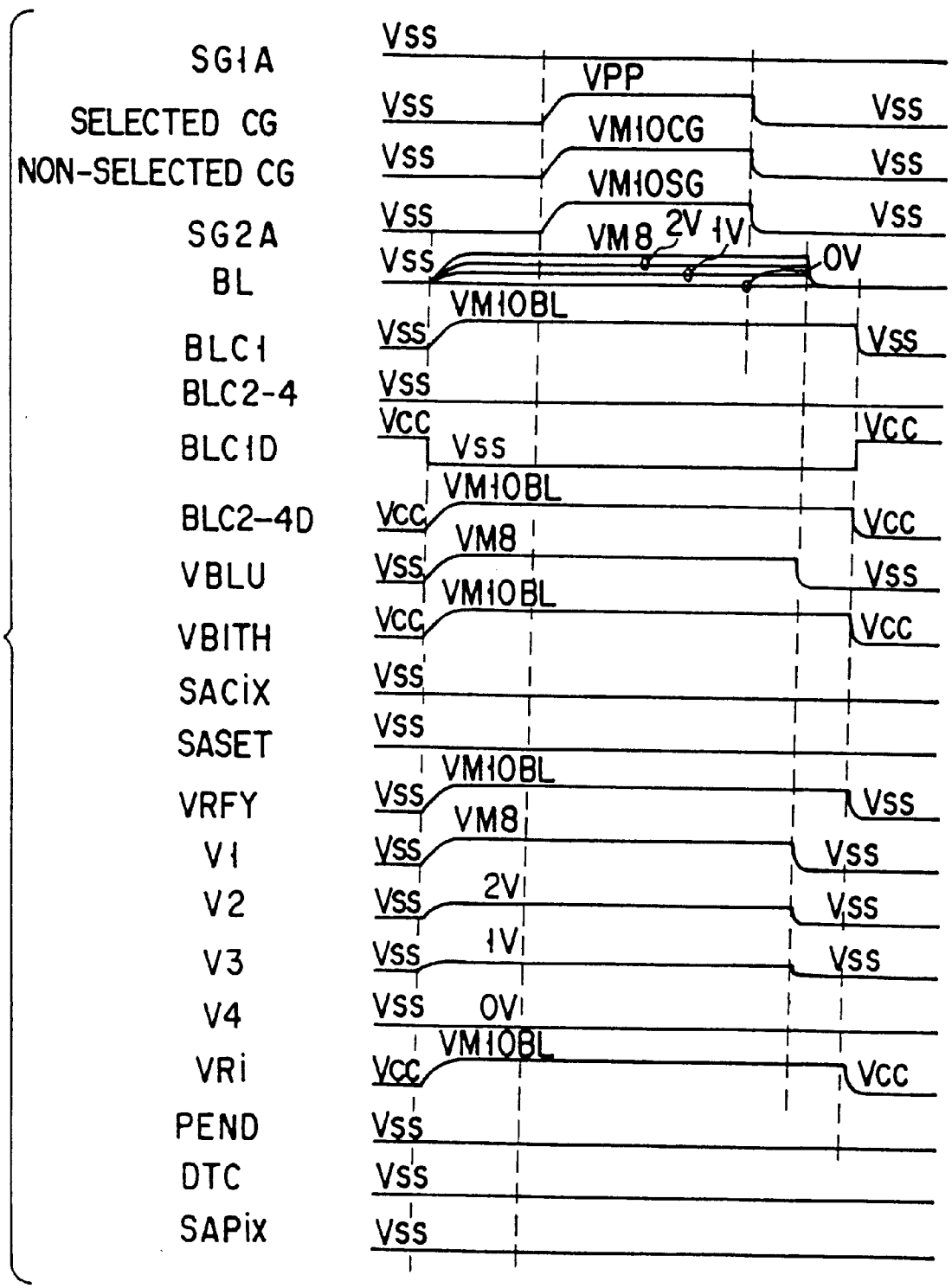
F I G. 35

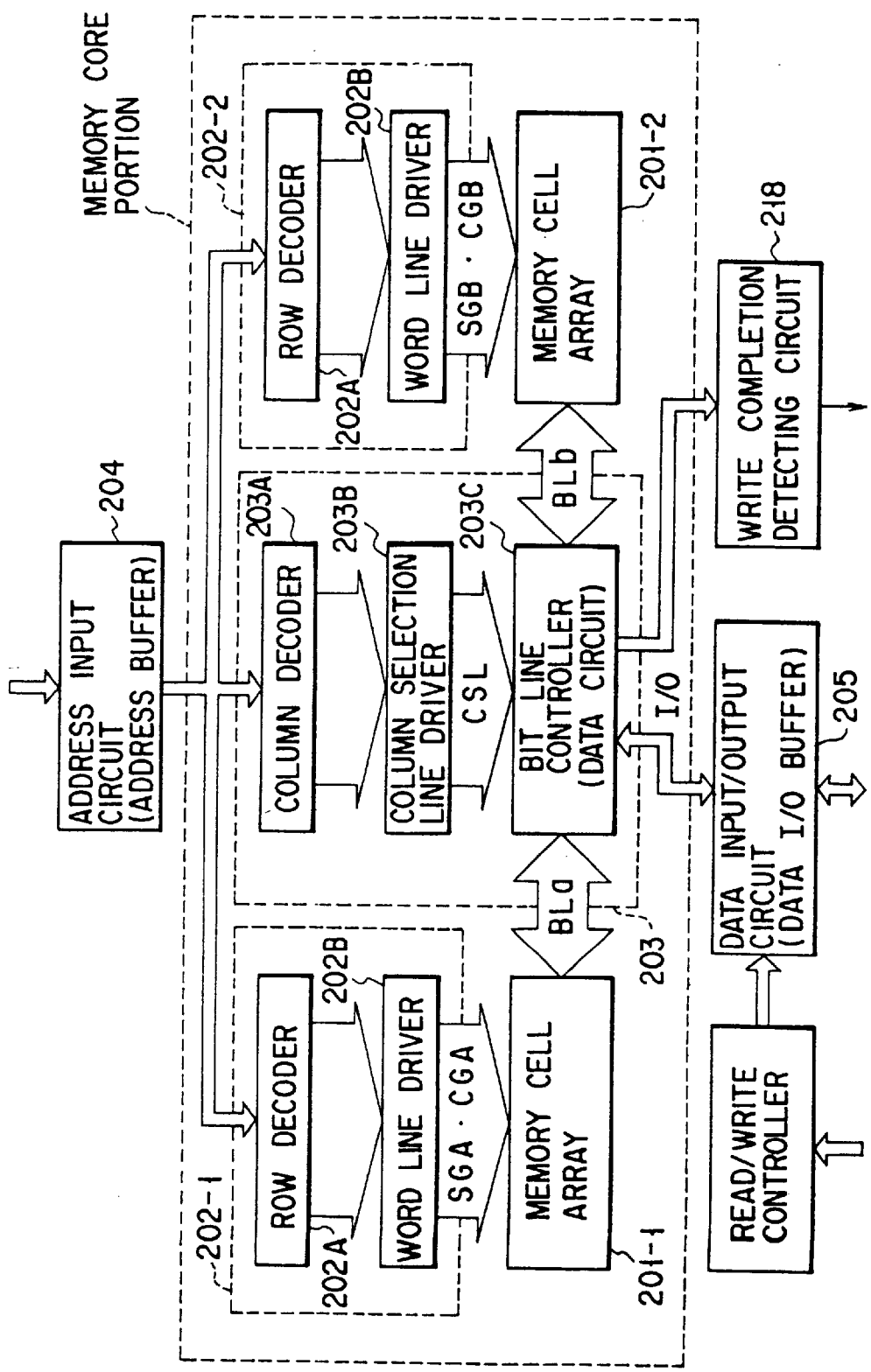
F I G. 36

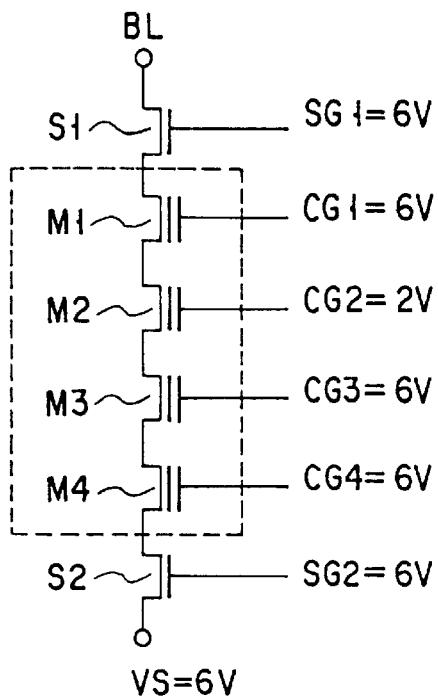
F I G. 38A
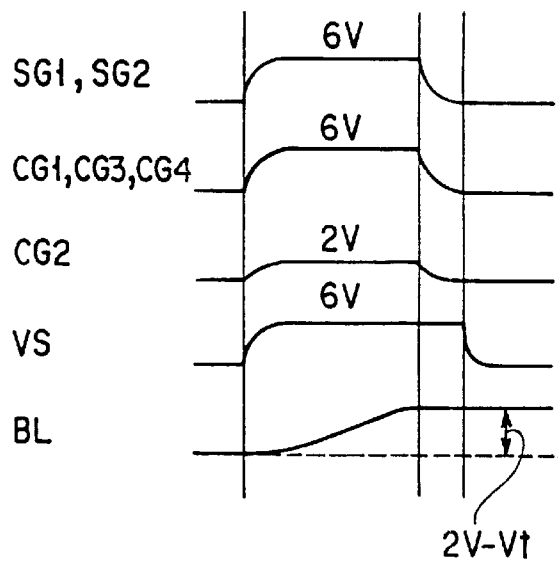
F I G. 38B
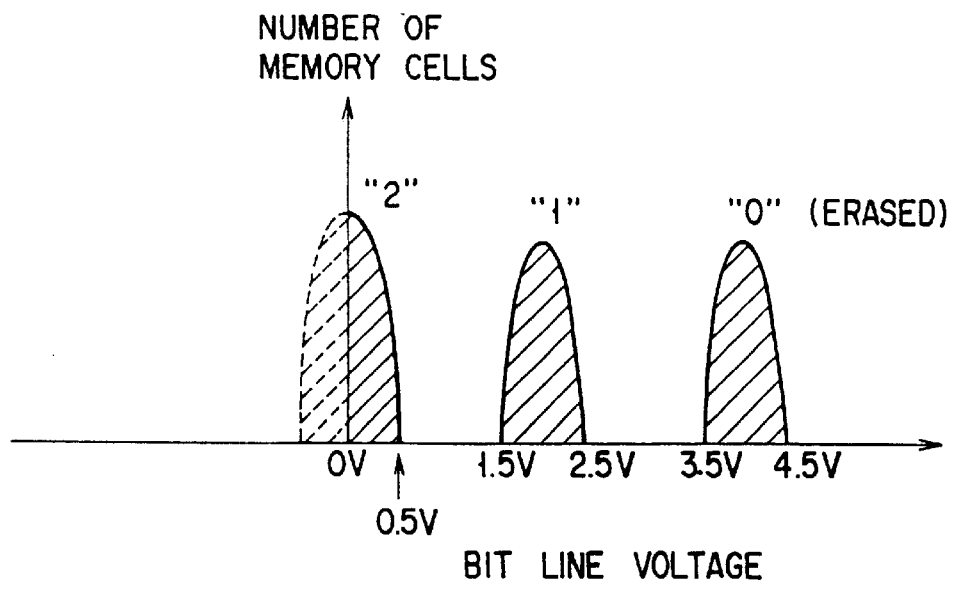
F I G. 39

| READ DATA | "0" | "1" | "2" |
|---|---|---|---|
| I/OA(N3) | L | H | H |
| I/OB(N4) | H | L | L |
| I/OC(N5) | H | H | L |
| I/OD(N6) | L | L | H |

F I G. 42

| WRITE DETA | "0" | "1" | "2" |
|---|---|---|---|
| I/OA(N3) | H | L | L |
| I/OB(N4) | L | H | H |
| I/OC(N5) | H | H | L |
| I/OD(N6) | L | L | H |

F I G. 43

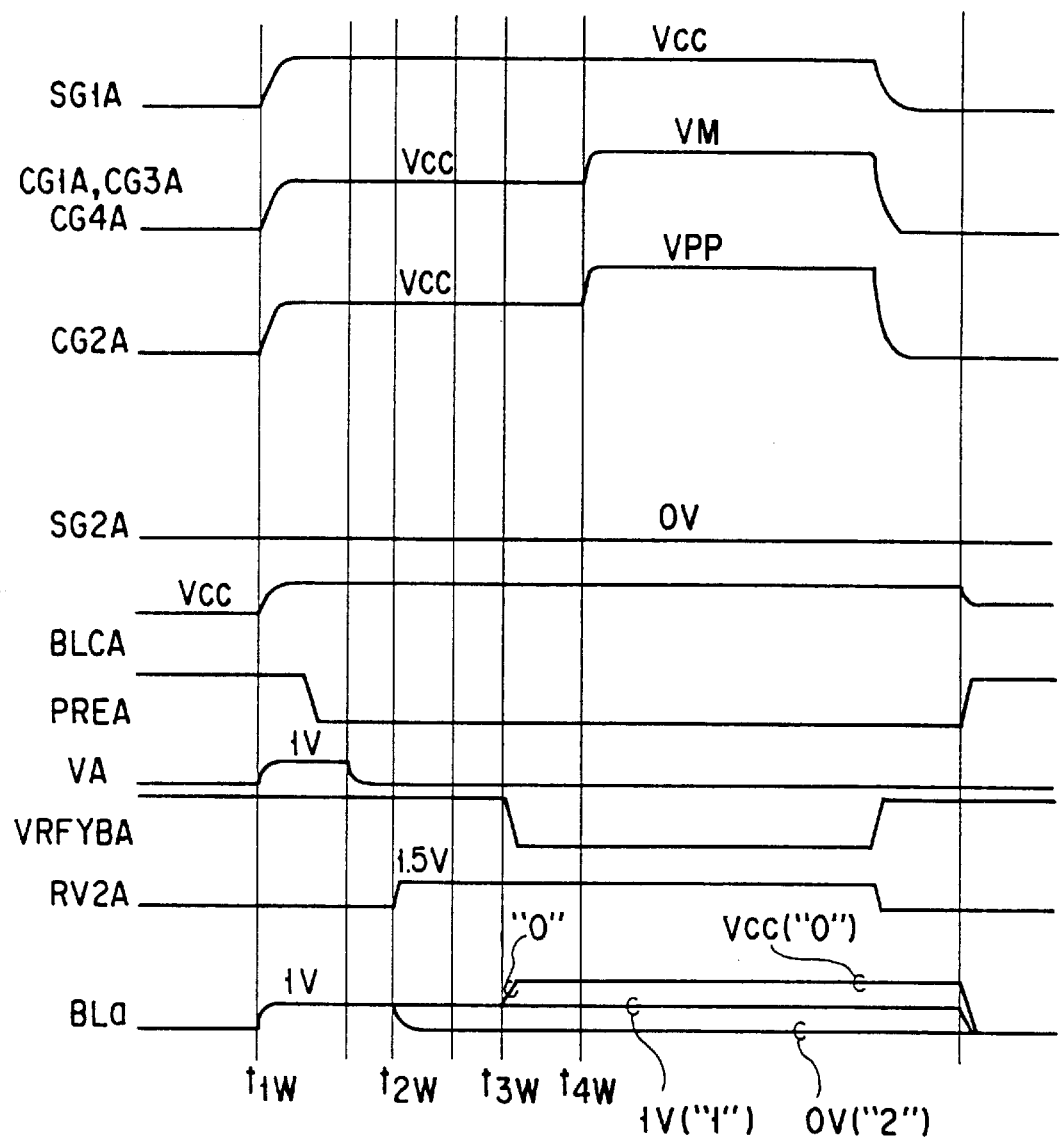
F I G. 44

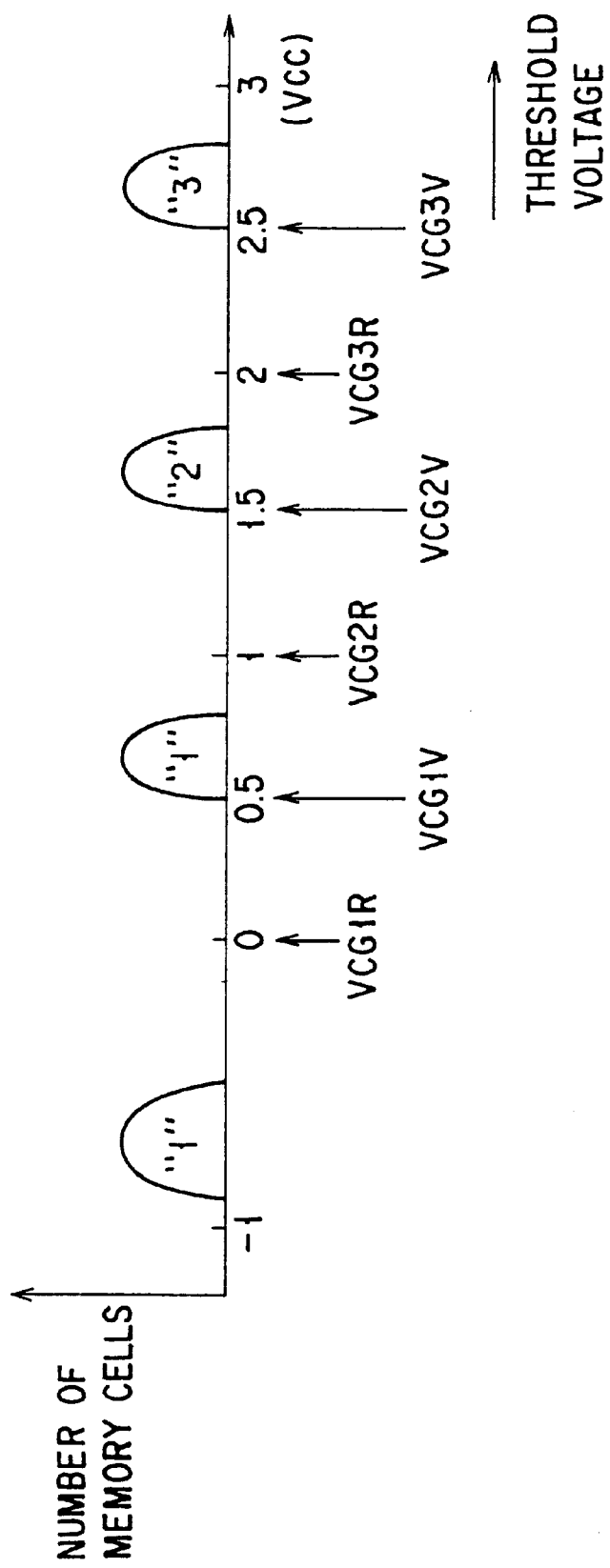
F I G. 46

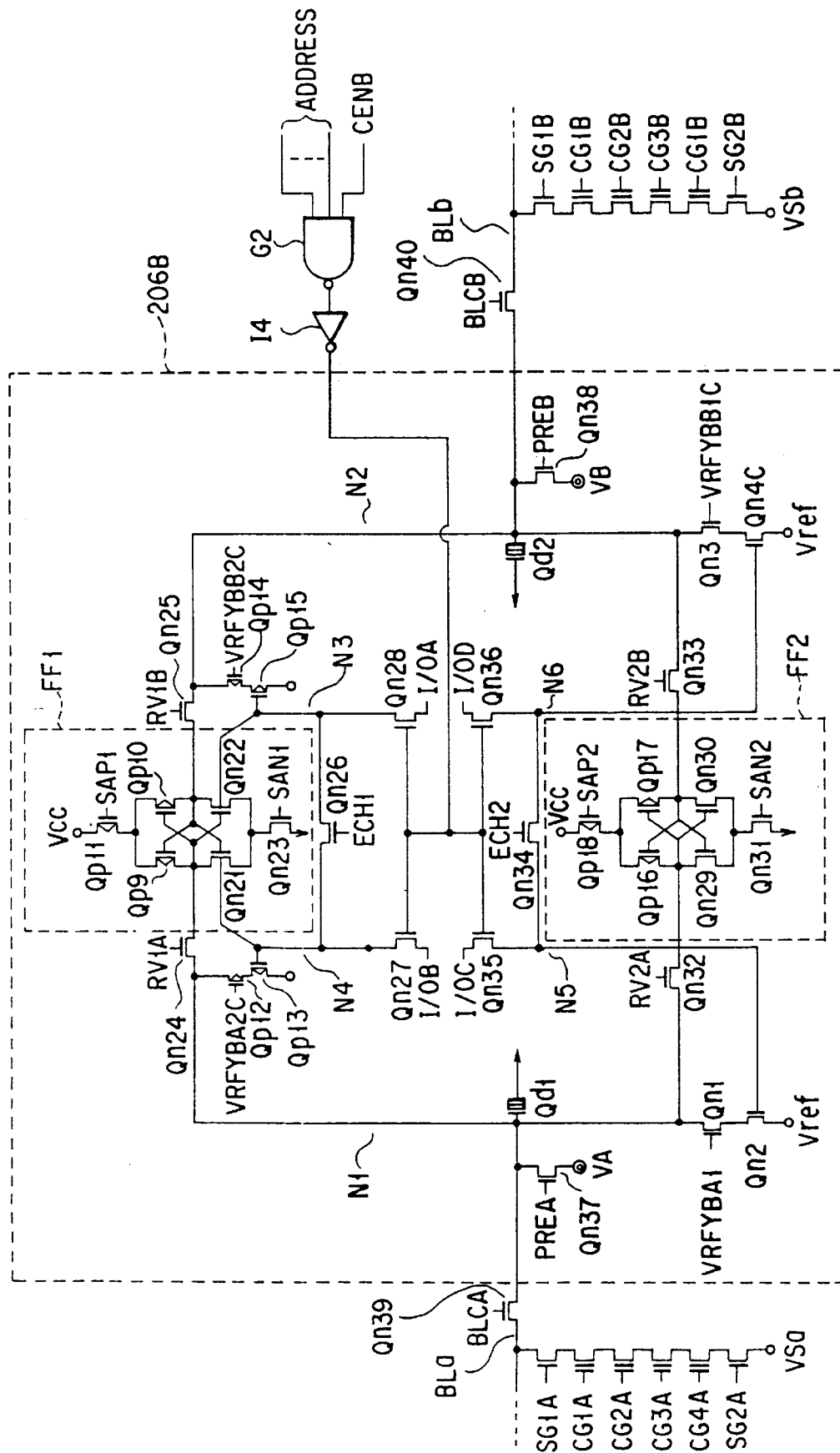
F I G. 47

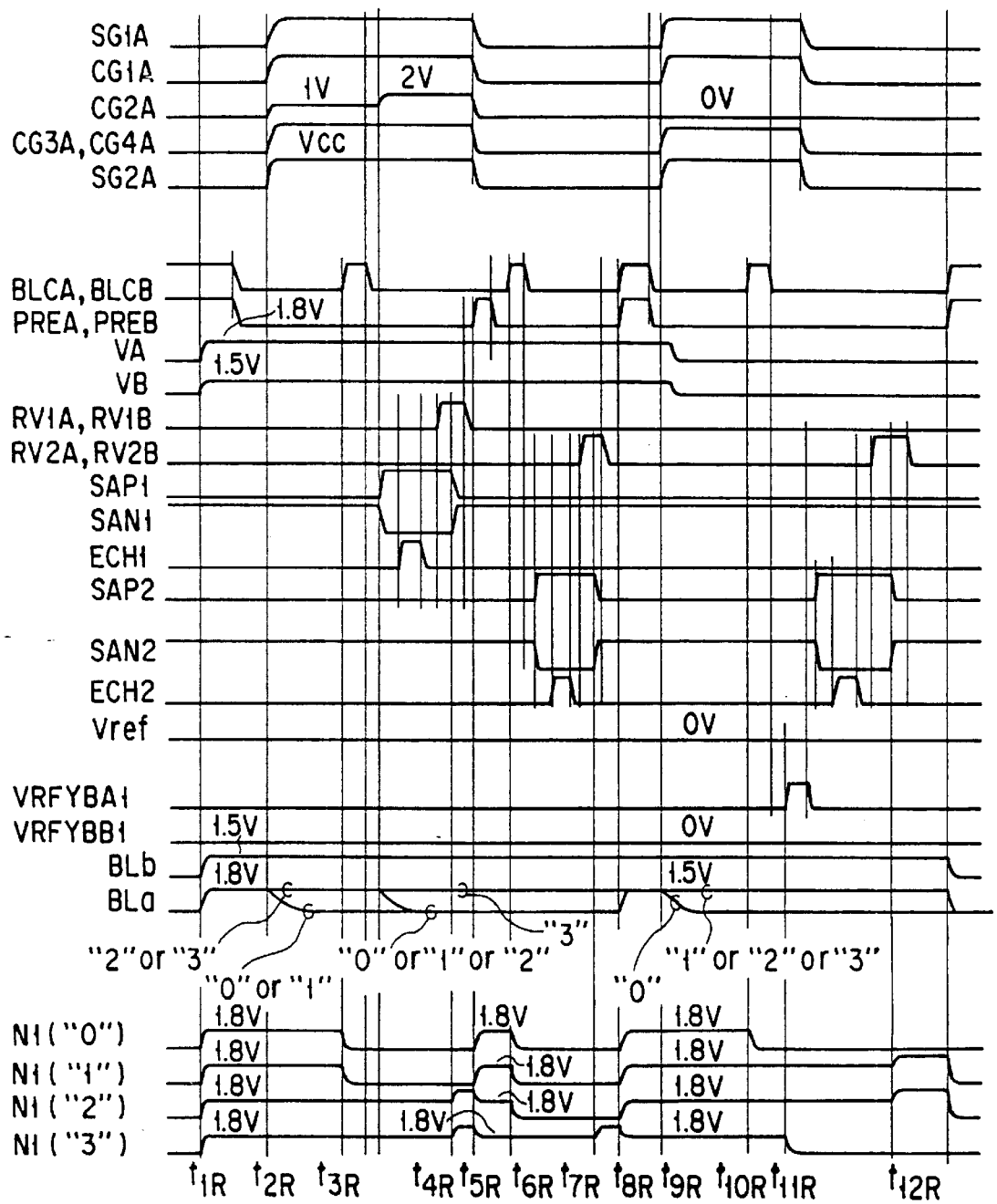
F I G. 48

| READ DATA | "0" | "1" | "2" | "3" |
|---|---|---|---|---|
| N3 | L | L | H | H |
| N5 | L | L | L | H |

FIG. 49

| READ DATA | "0" | "1" | "2" | "3" |
|---|---|---|---|---|
| I/OA (N3) | L | L | H | H |
| I/OB (N4) | H | H | L | L |
| I/OC (N5) | L | H | H | L |
| I/OD (N6) | H | L | L | H |

FIG. 50

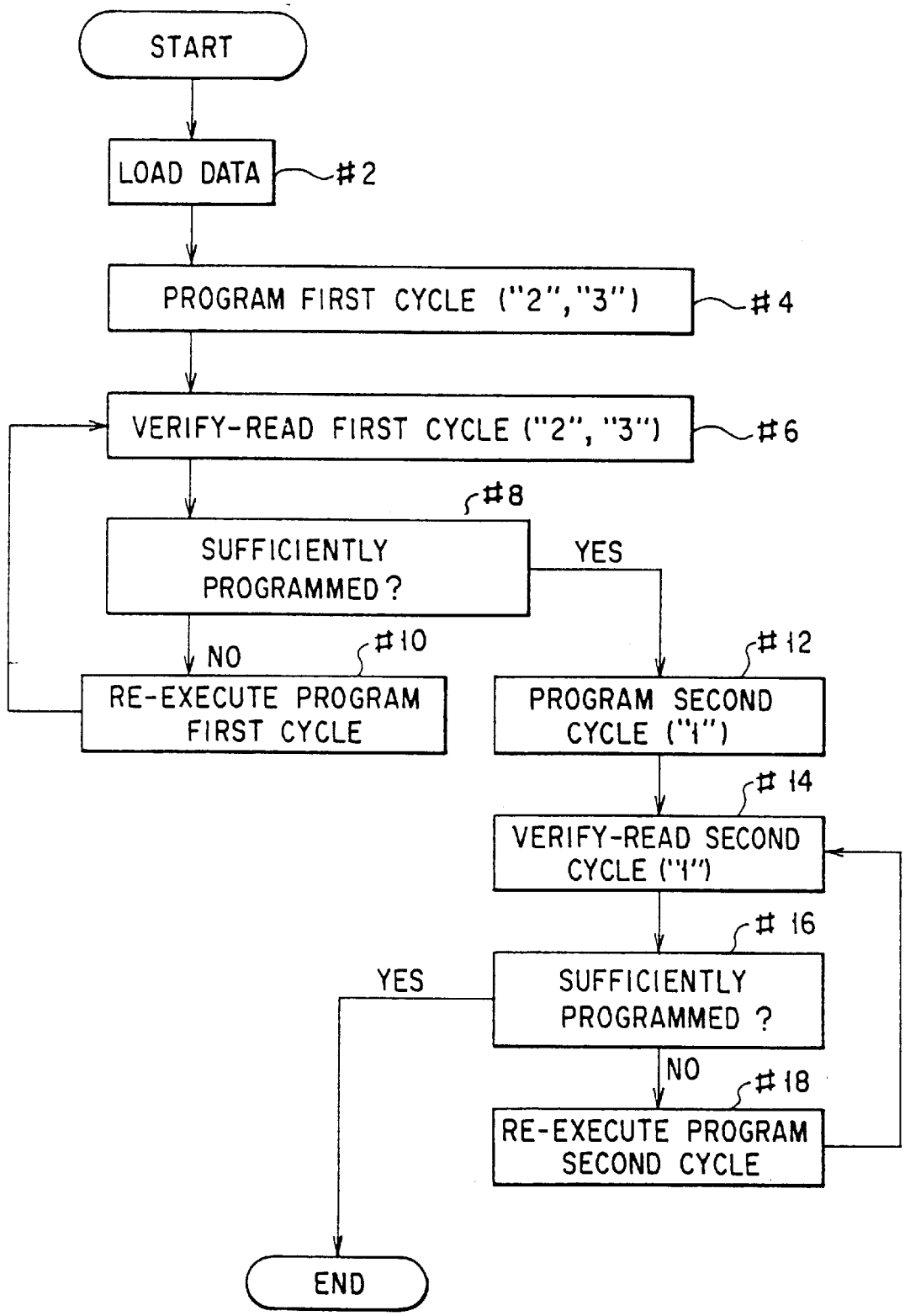
F I G. 51

| WRITE DATA | "0" | "1" | "2" | "3" |
|---|---|---|---|---|
| I/OA(N3) | H | H | L | L |
| I/OB(N4) | L | L | H | H |
| I/OC(N5) | H | L | H | L |
| I/OC(N6) | L | H | L | H |

FIG. 52

| | "0" | "1" | "2" | "3" |
|---|---|---|---|---|
| N3 | H | H | H | H |
| N4 | L | L | L | L |
| N5 | H | L | H | H |
| N6 | L | H | L | L |

FIG. 55

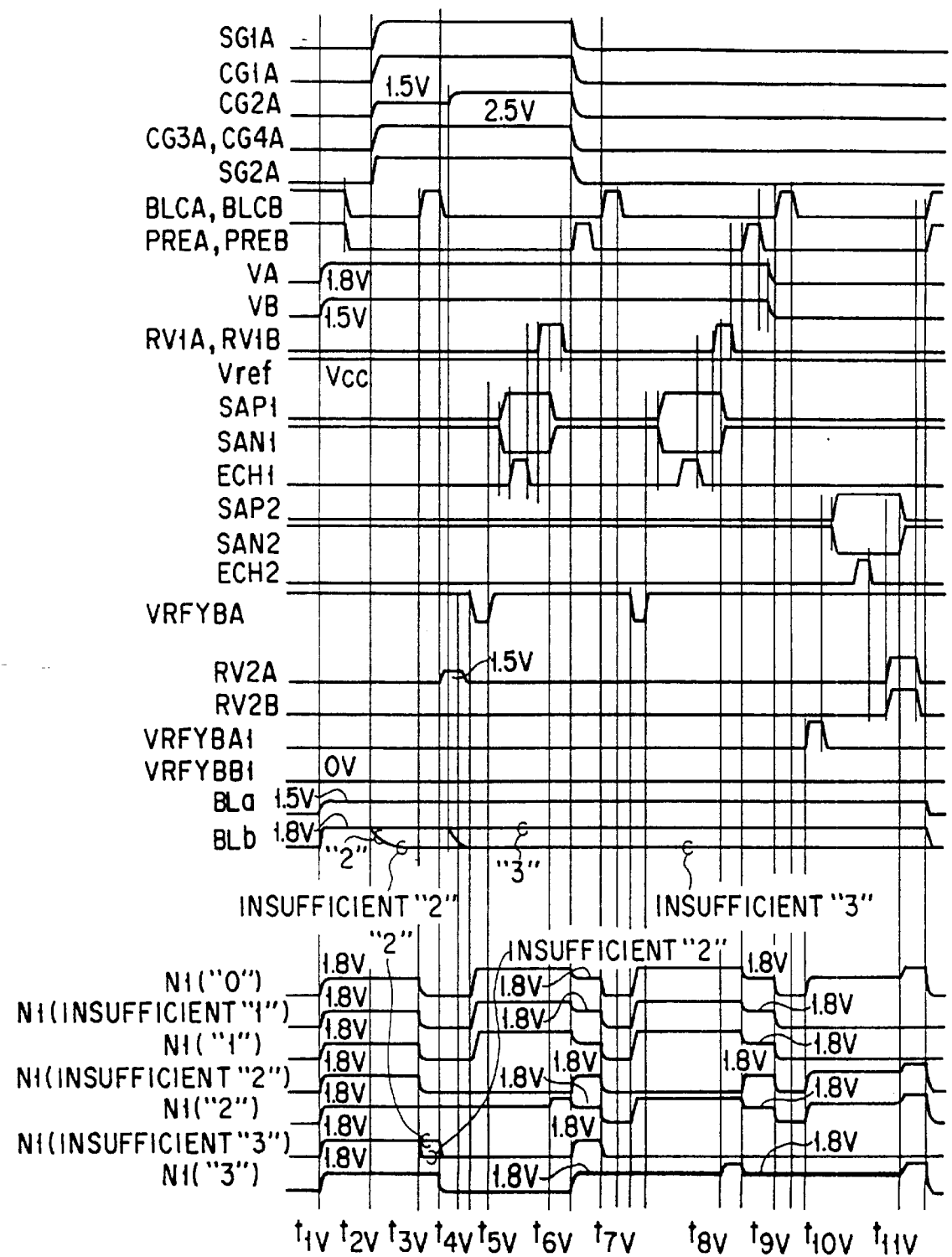
F I G. 54

|     | "0" | "1" | "2" | "3" |
|-----|-----|-----|-----|-----|
| N3  | H   | H   | H   | H   |
| N4  | L   | L   | L   | L   |
| N5  | H   | H   | H   | H   |
| N6  | L   | L   | L   | L   |

FIG. 59

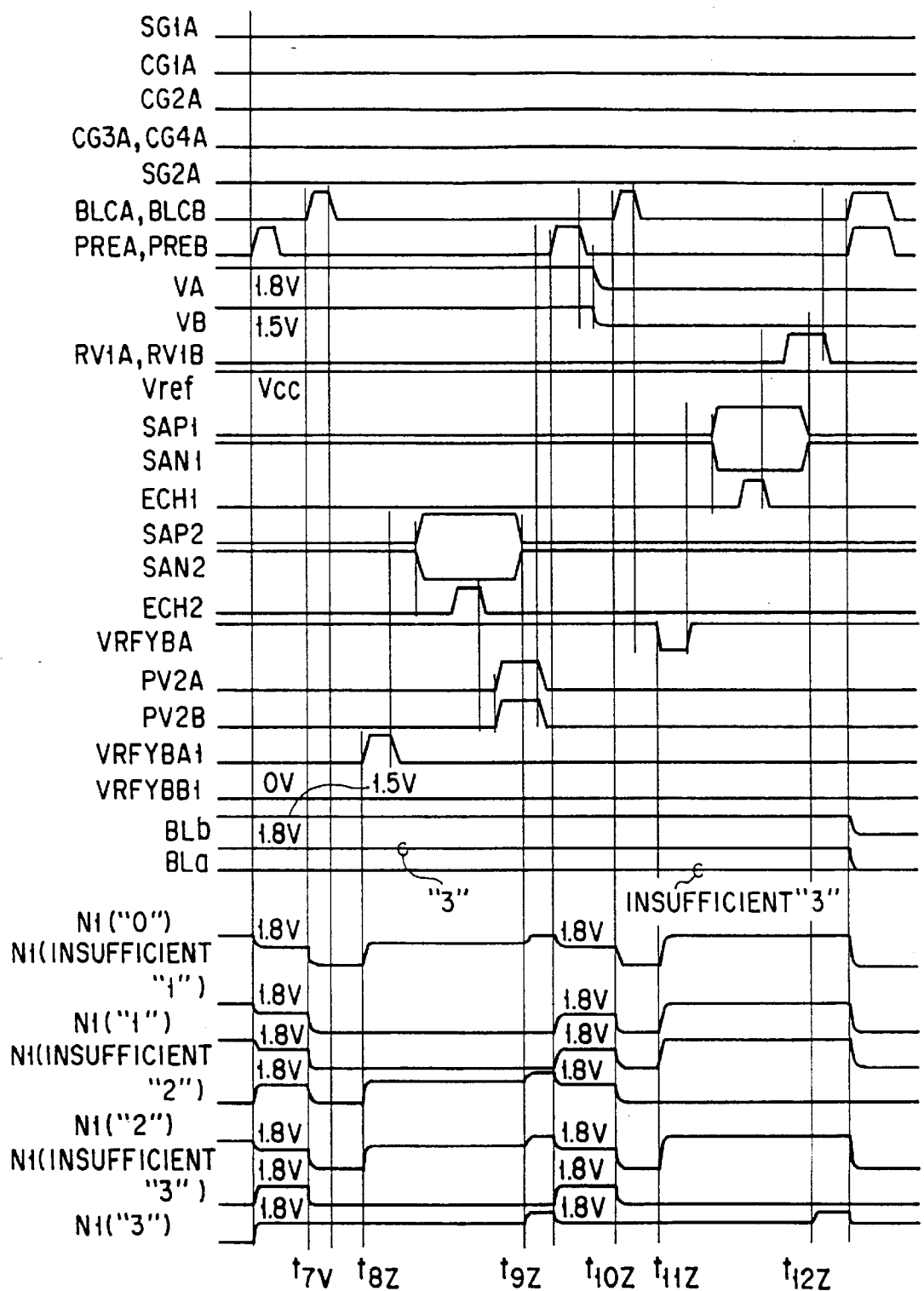
F I G. 60

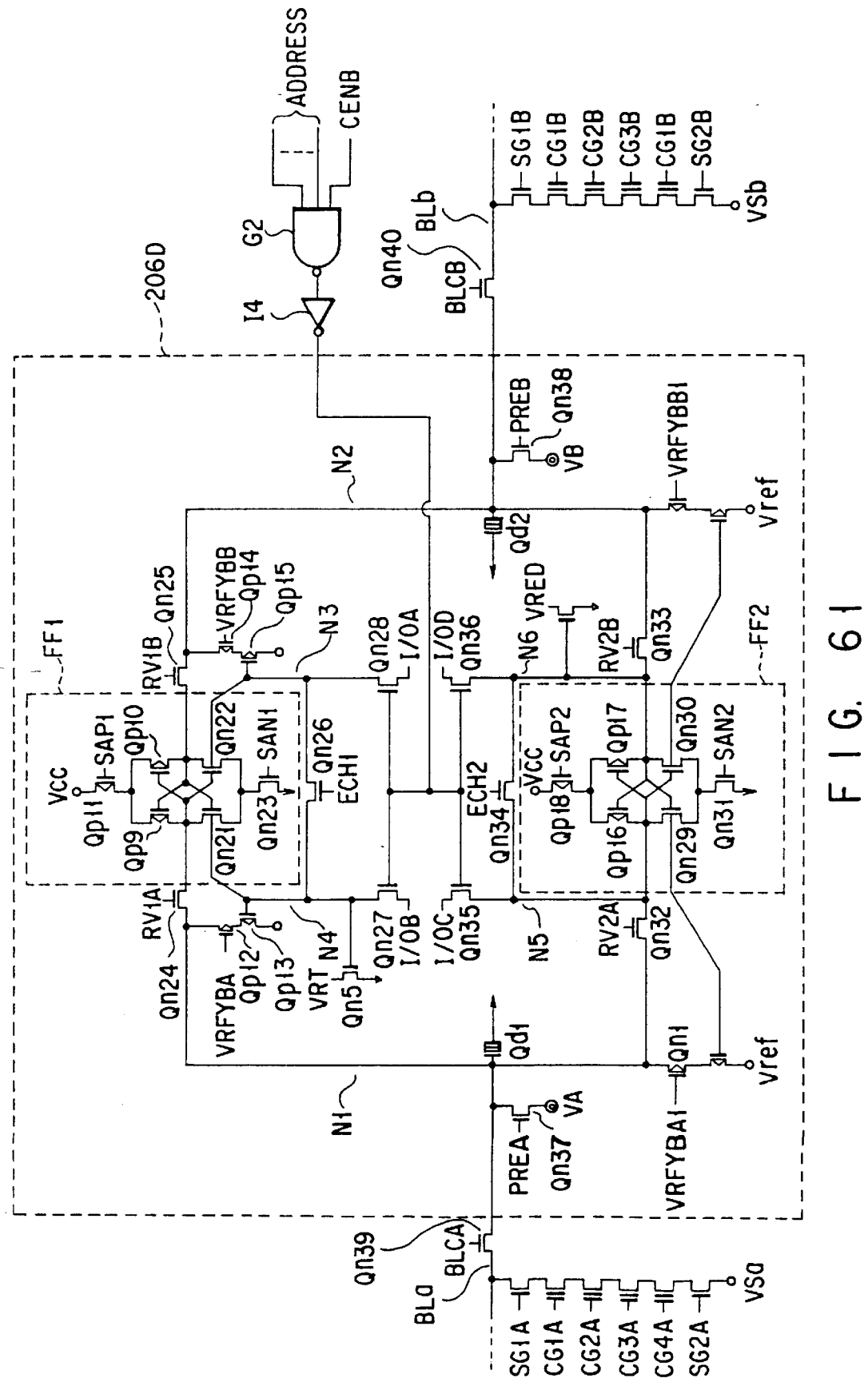
F I G. 61

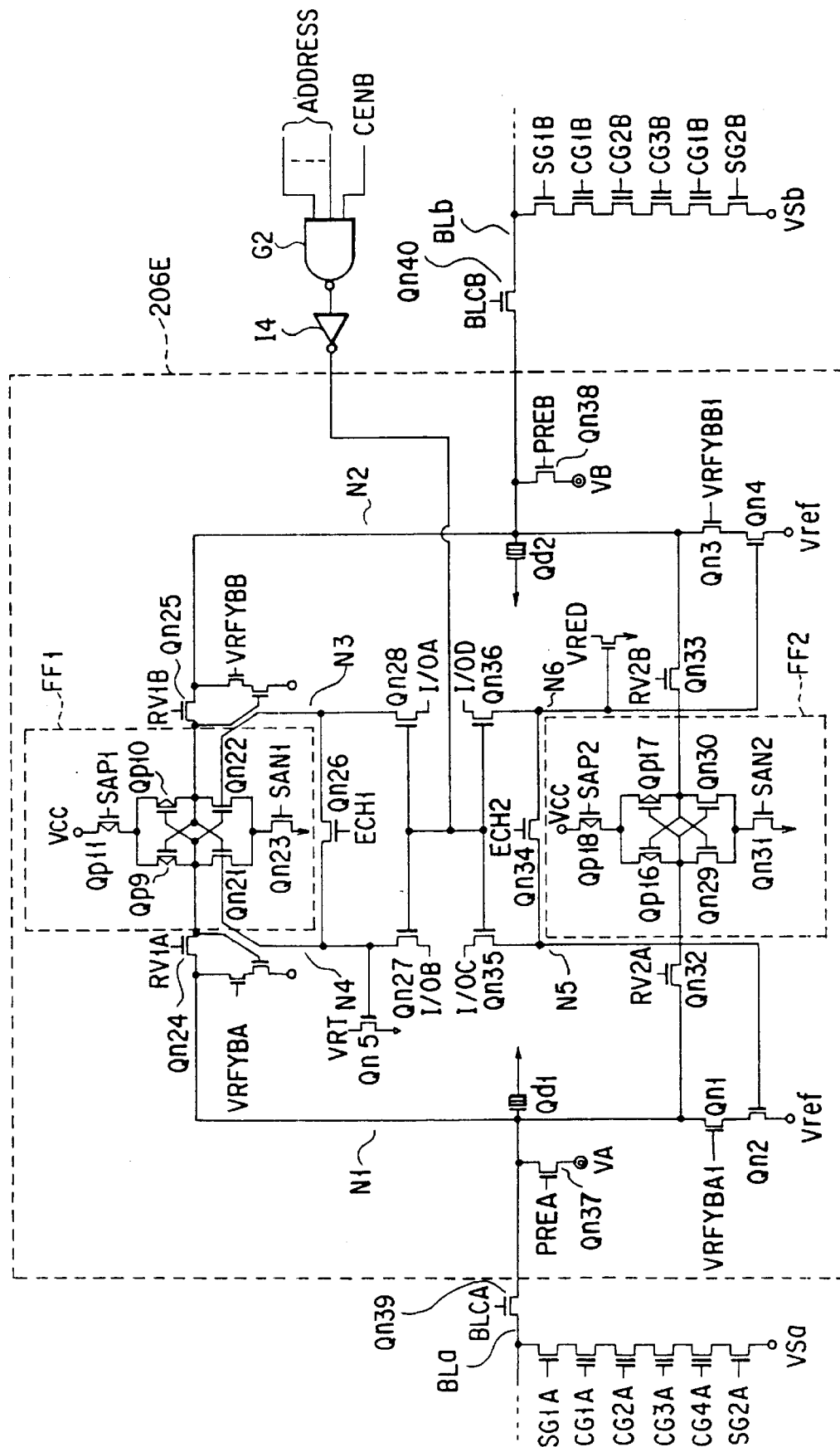
F I G. 62

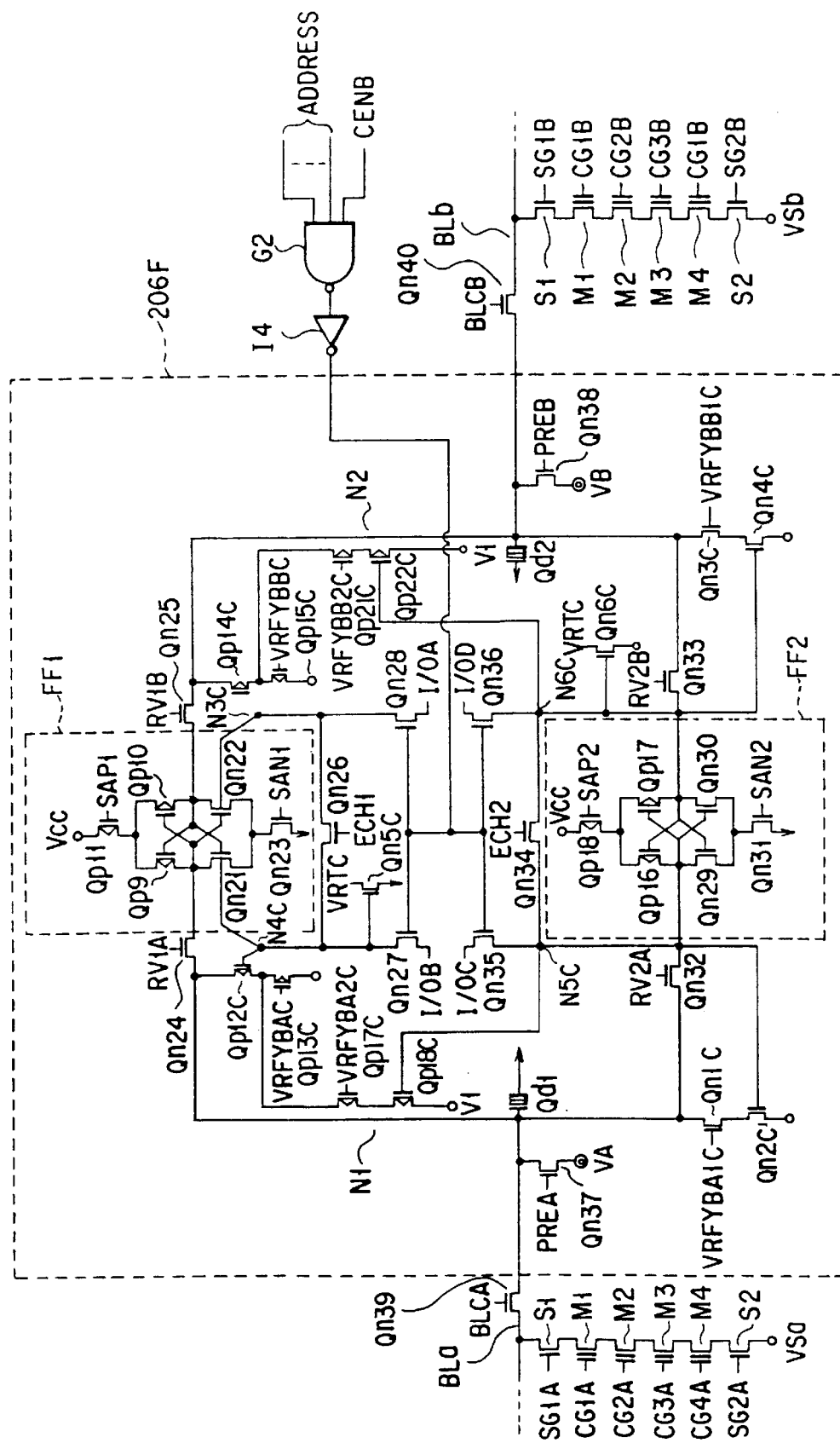
F I G. 63

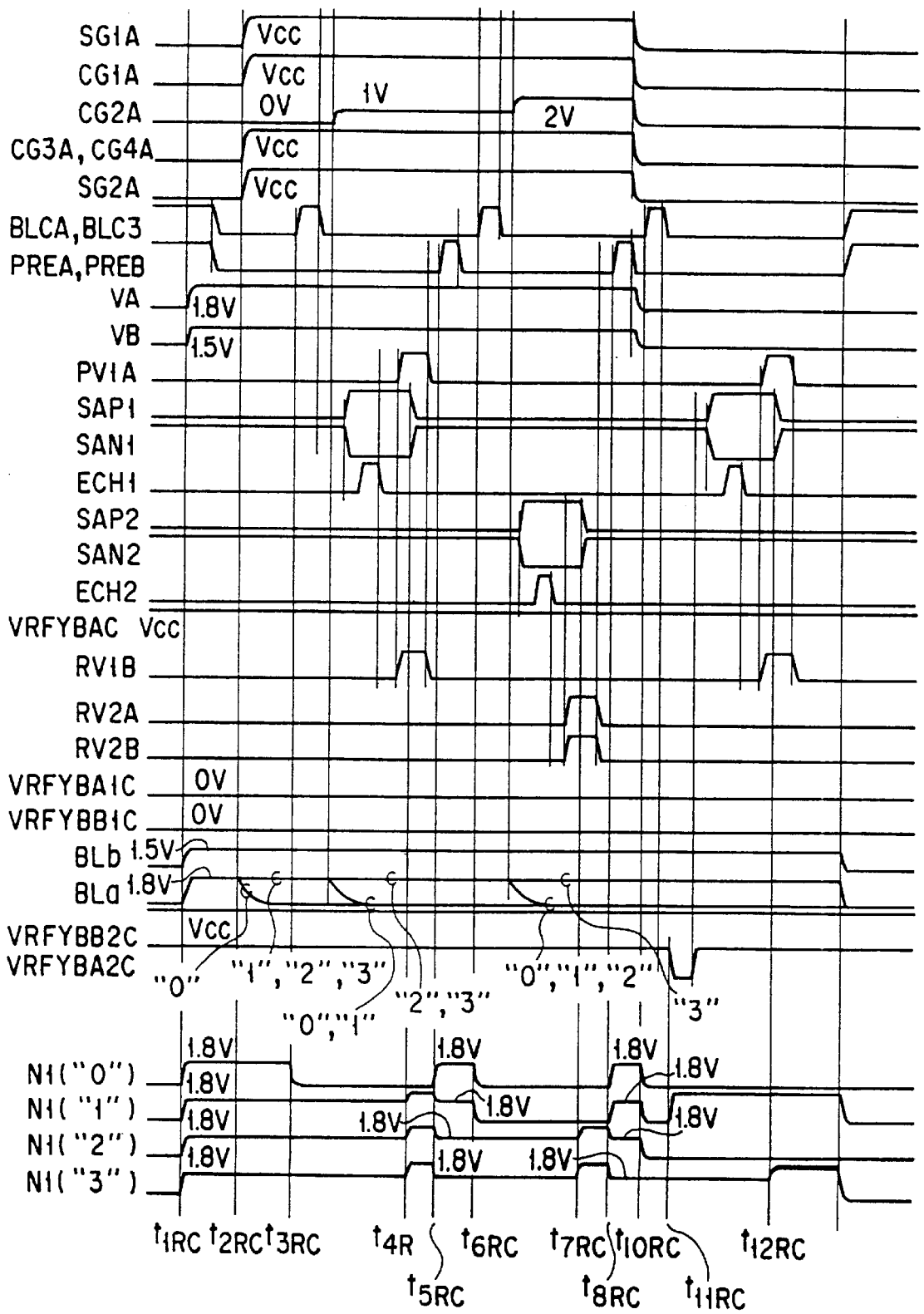
F I G. 64

FIG. 65

| READ DATA | "0" | "1" | "2" | "3" |
|---|---|---|---|---|
| I/OA(N3C) | L | H | L | H |
| I/OB(N4C) | H | L | H | L |
| I/OC(N5C) | L | L | H | H |
| I/OD(N6C) | H | H | L | L |

FIG. 66

| READ DATA | "0" | "1" | "2" | "3" |
|---|---|---|---|---|
| N3C | L | H | H | H |
| N5C | L | L | H | H |

FIG. 67

| WRITE DATA | "0" | "1" | "2" | "3" |
|---|---|---|---|---|
| I/OA(N3C) | H | H | L | L |
| I/OB(N4C) | L | L | H | H |
| I/OC(N5C) | H | L | H | L |
| I/OC(N6C) | L | H | L | H |

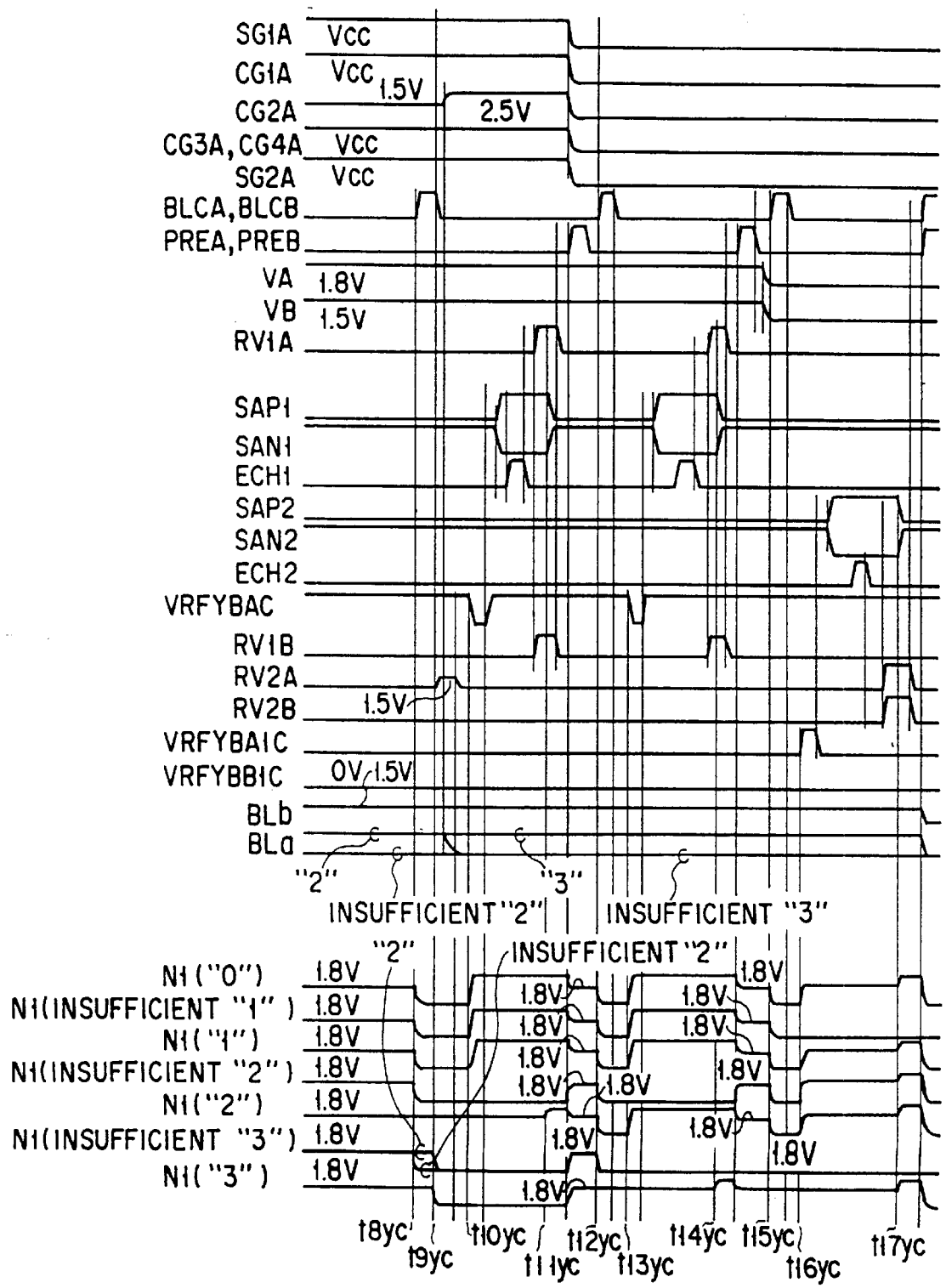
F I G. 70

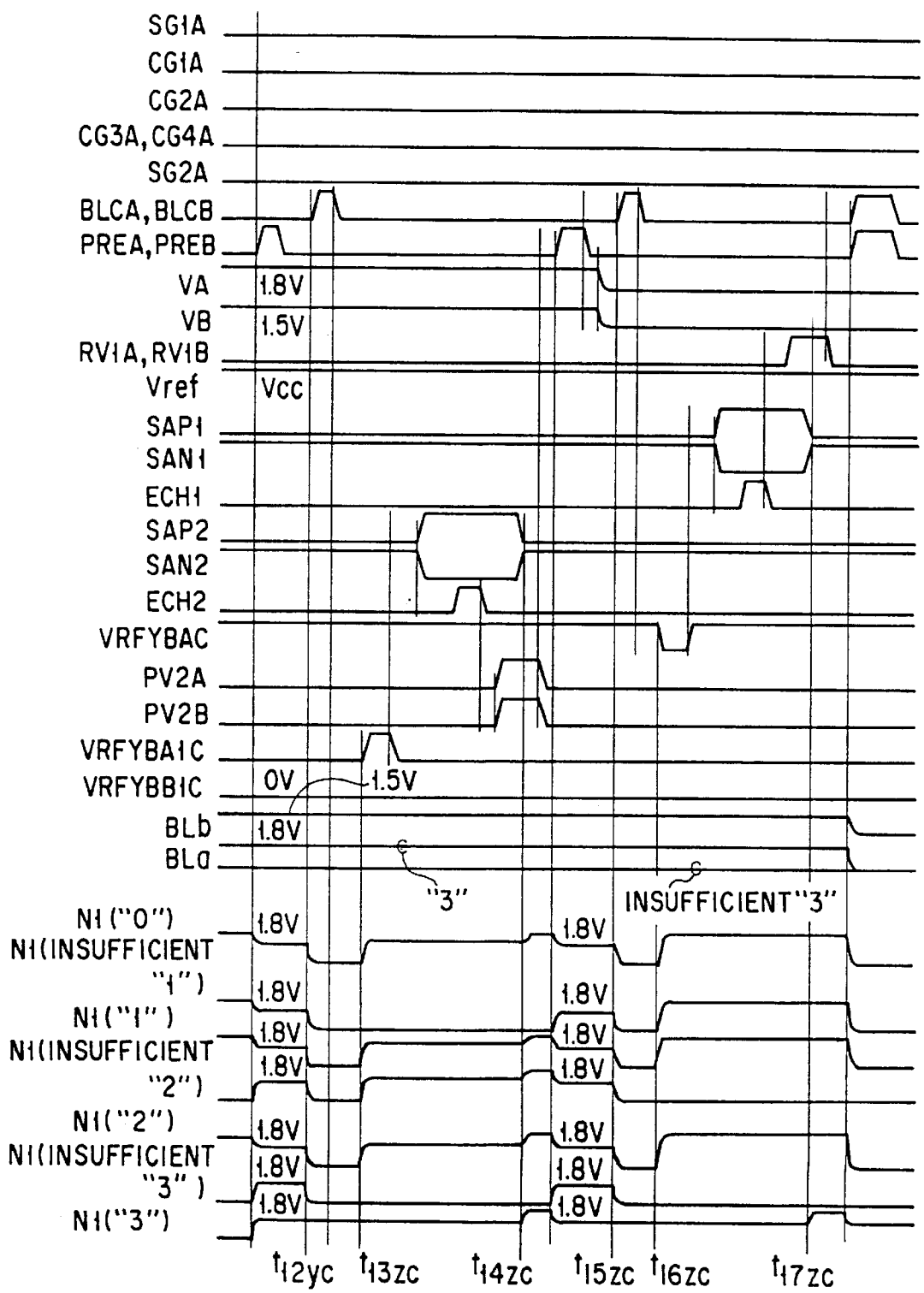
F I G. 71

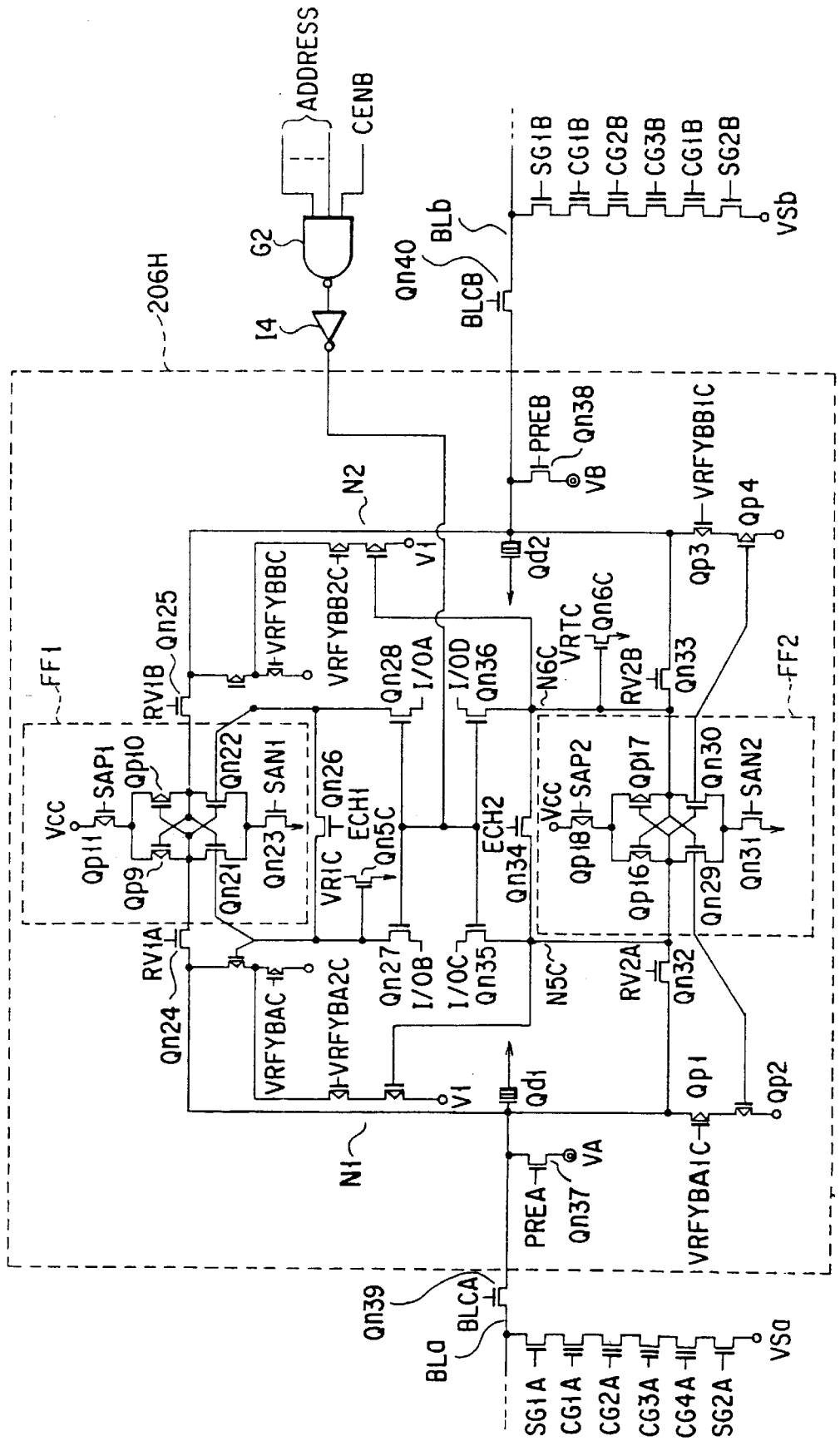
F I G. 73

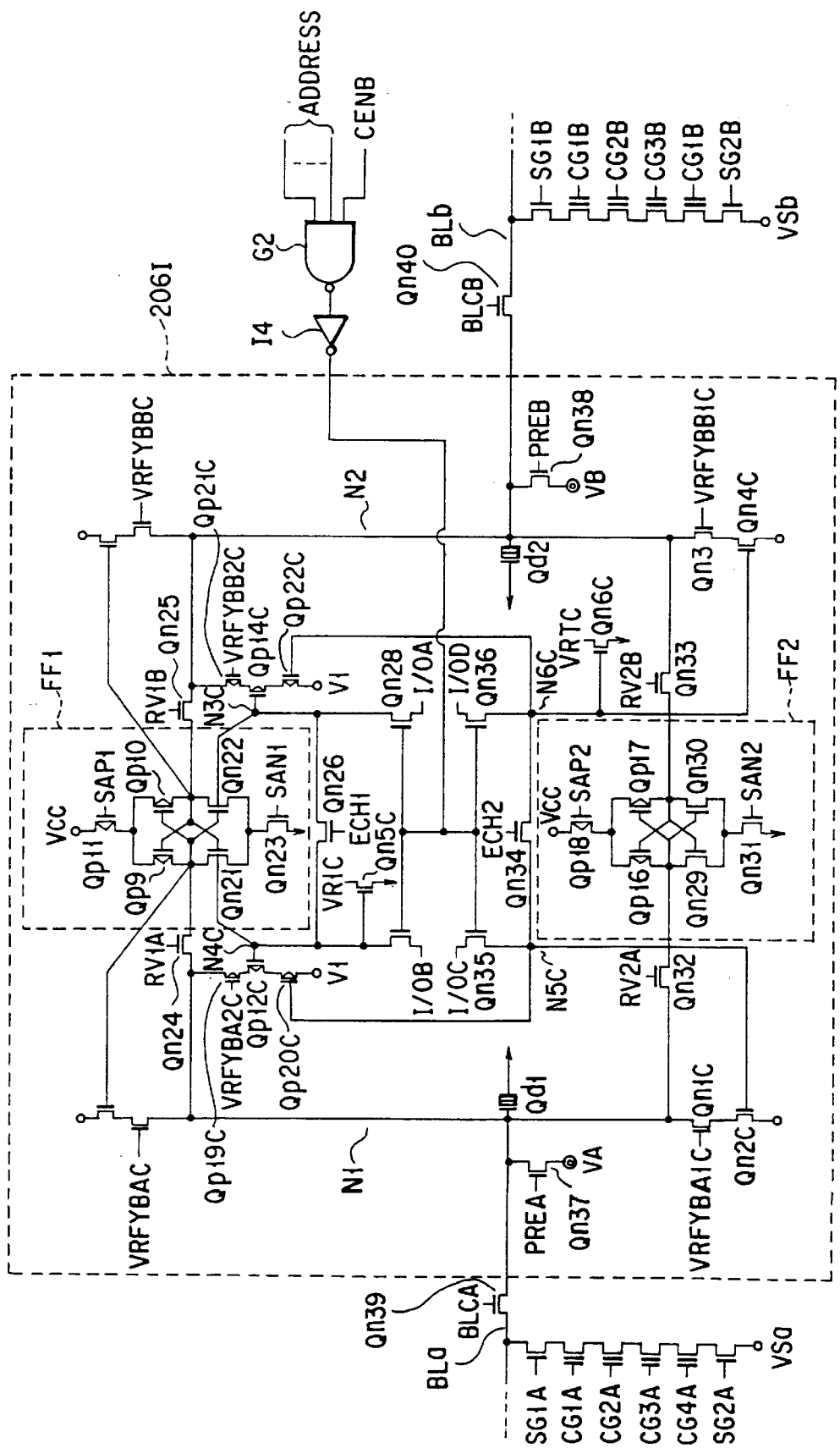
F I G. 74

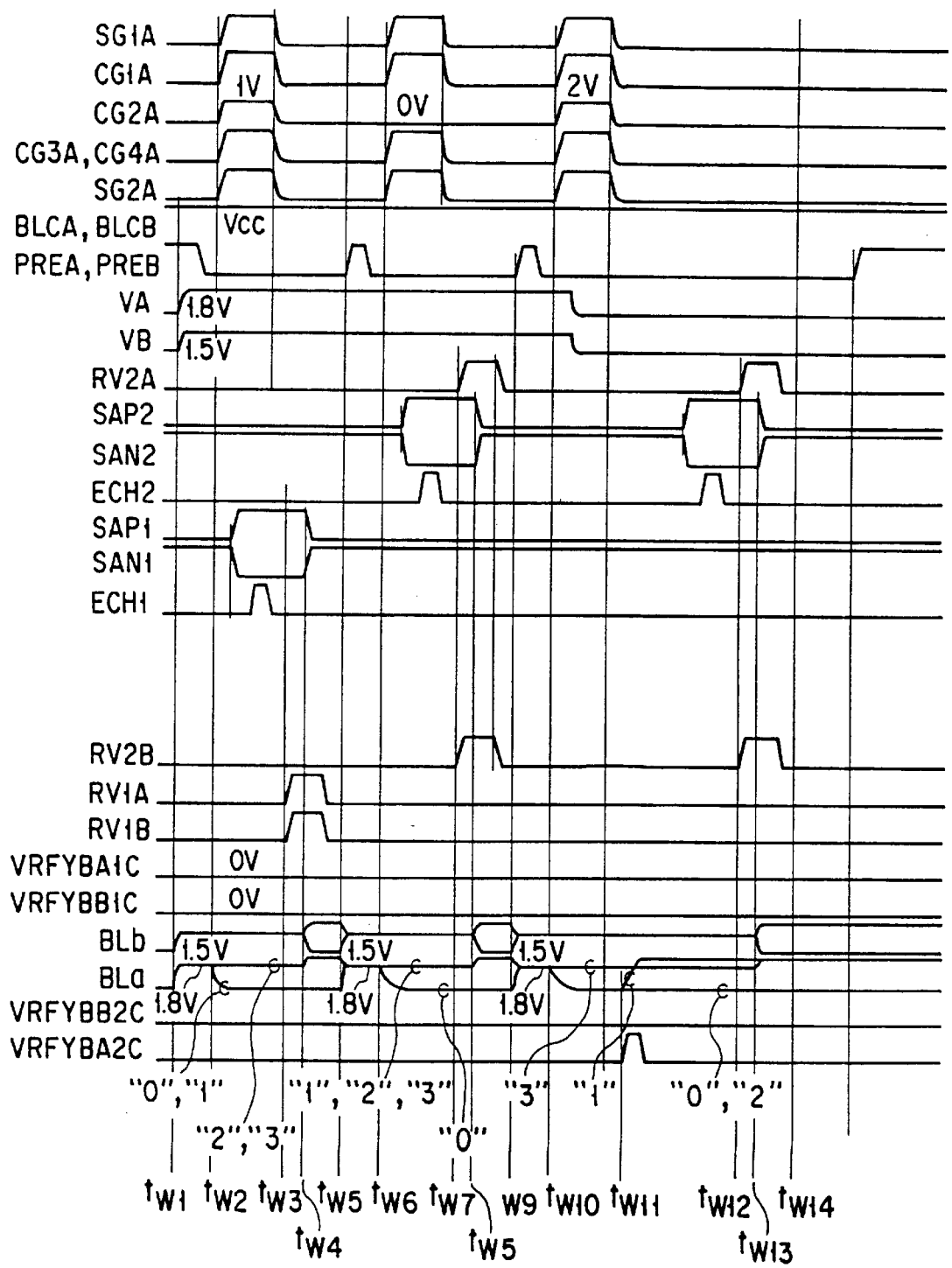
F I G. 77

|  | "0" | "1" | "2" | "3" |
|---|---|---|---|---|
| N3C | L | L | H | H |
| N5C | L | H | H | H |

FIG. 78

|  | "0" | "1" | "2" | "3" |
|---|---|---|---|---|
| N3C | L | L | H | H |
| N5C | L | H | L | H |

FIG. 79

| WRITE DATA | I/O1 | I/O2 | I/O3 |
|---|---|---|---|
| 0 | H | H | H |
| 1 | L | H | H |
| 2 | H | L | H |
| 3 | H | H | L |

| READ DATA | I/O1 | I/O2 | I/O3 |
|---|---|---|---|
| 0 | L | L | L |
| 1 | H | L | L |
| 2 | H | H | L |
| 3 | H | H | H |

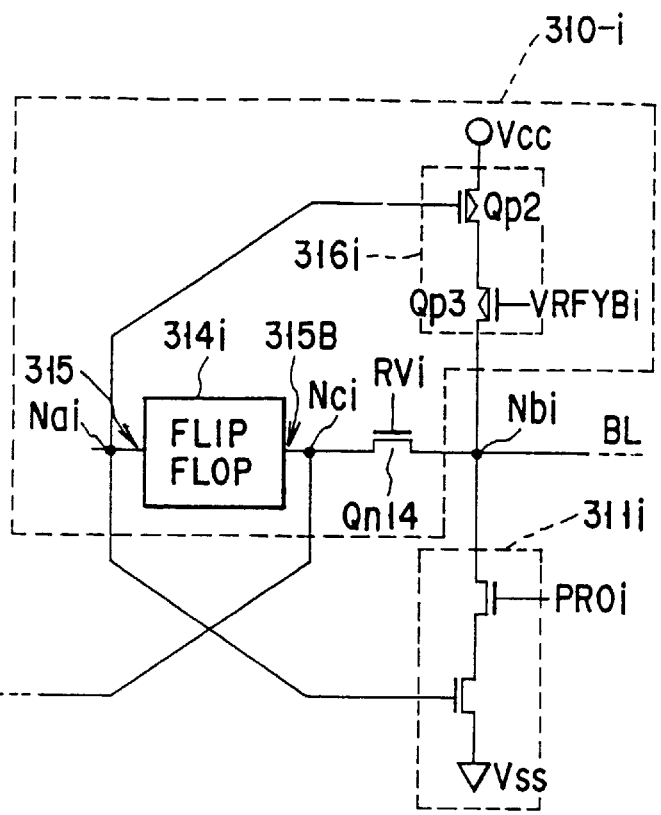
F I G. 88A
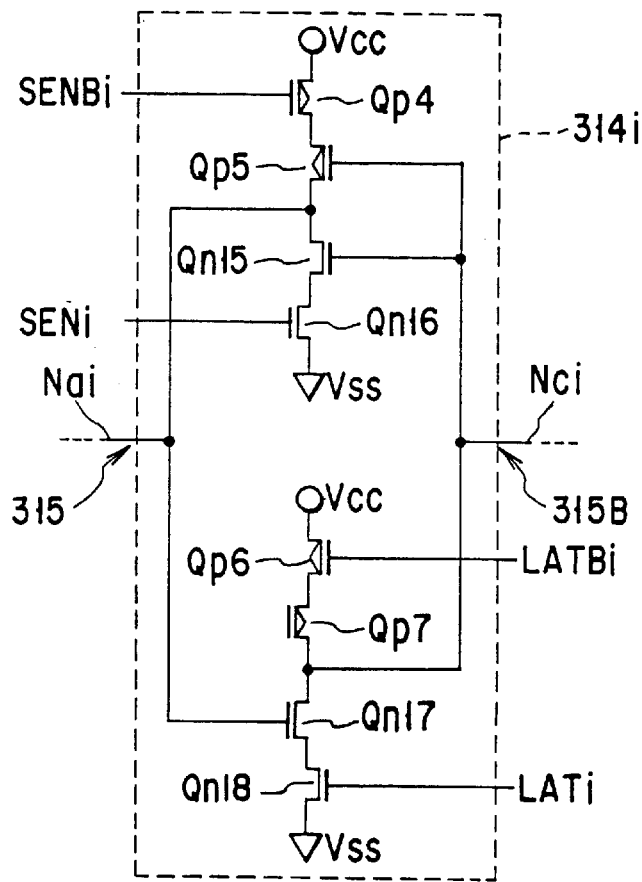
F I G. 88B

| WRITE DATA | MEMORY CELL TRANSISTOR STATE | MODIFIED WRITE DATA | VERIFICATION RESULT |
|---|---|---|---|
| 0 | 0, 1, 2, 3 | 0 | SUCCESS |
| 1 | 0 | 1 | INSUFFICIENT |
| 1 | 1 | 0 | SUCCESS |
| 2 | 0 | 2 | INSUFFICIENT |
| 2 | 1 | 2 | INSUFFICIENT |
| 2 | 2 | 0 | SUCCESS |
| 3 | 0 | 3 | INSUFFICIENT |
| 3 | 1 | 3 | INSUFFICIENT |
| 3 | 2 | 3 | INSUFFICIENT |
| 3 | 3 | 0 | SUCCESS |

FIG. 92

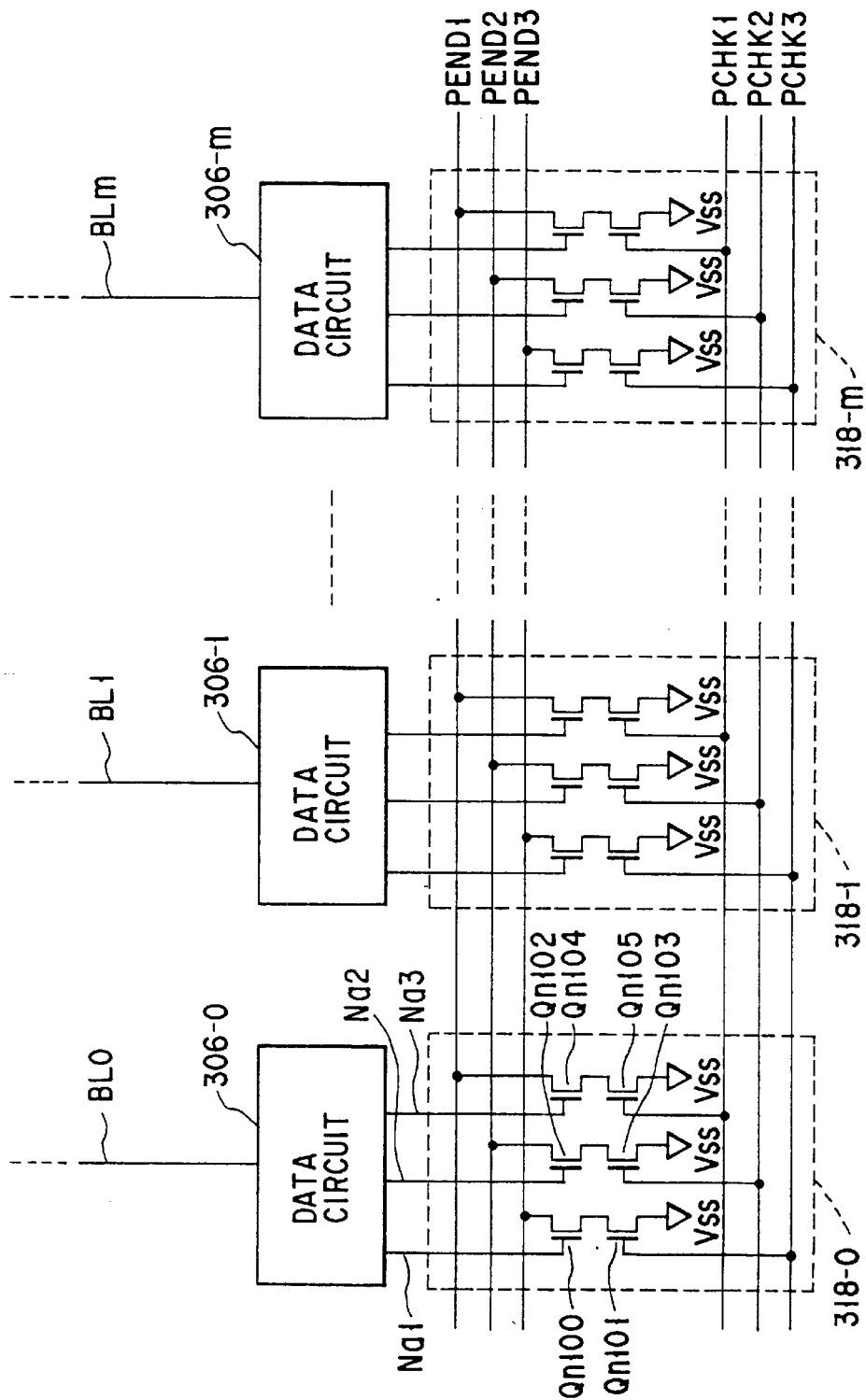
F I G. 93

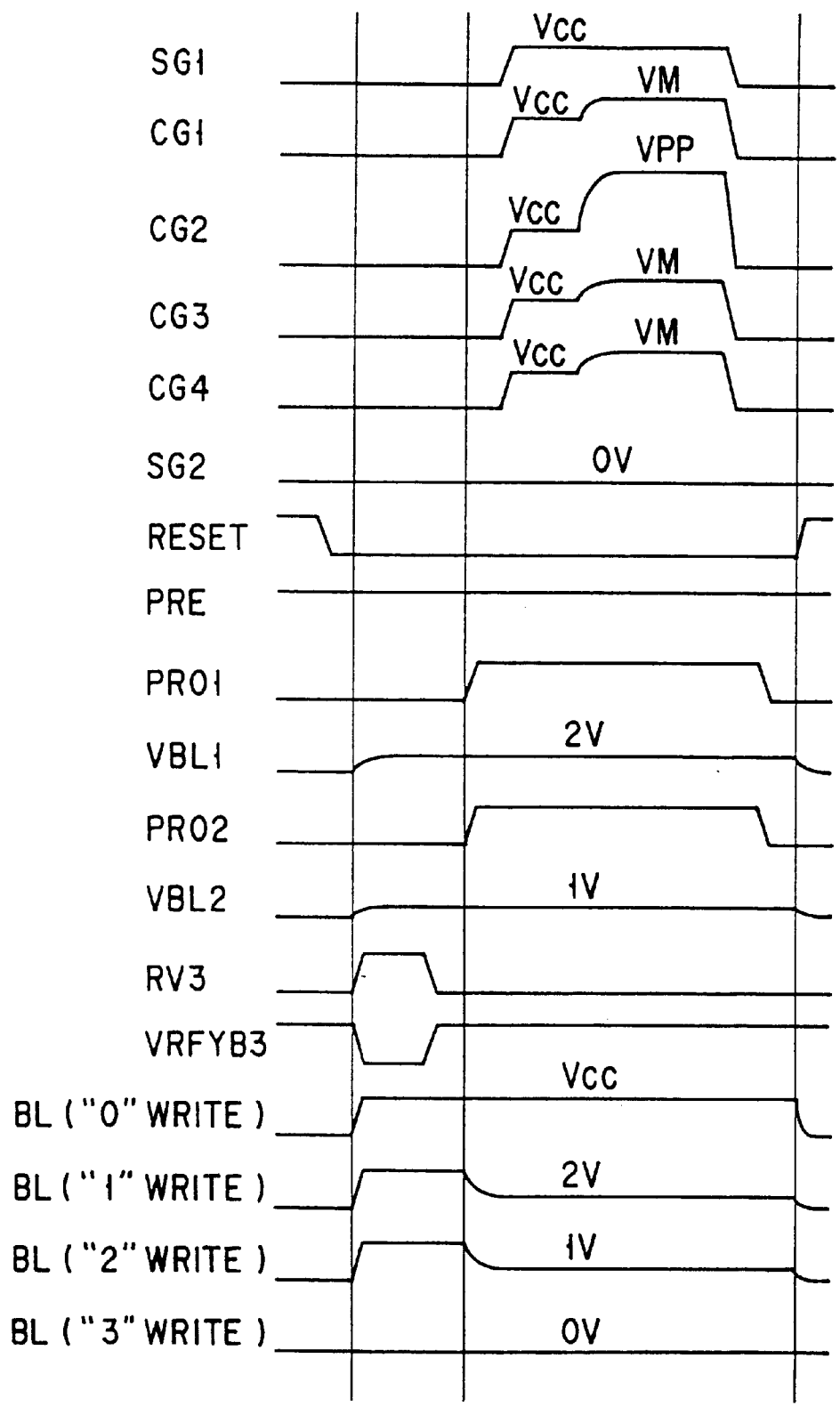
F I G. 95

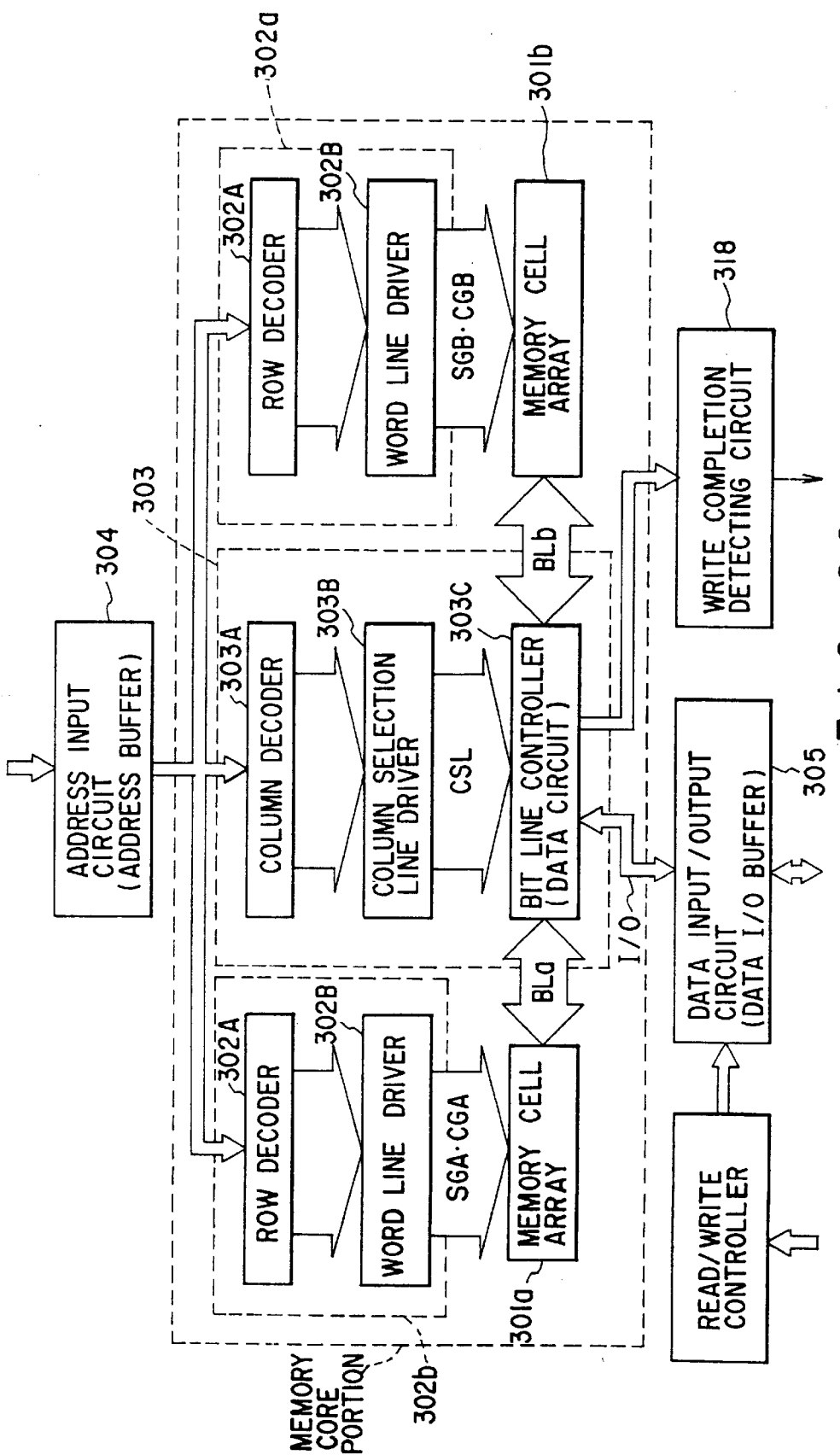
F I G. 96

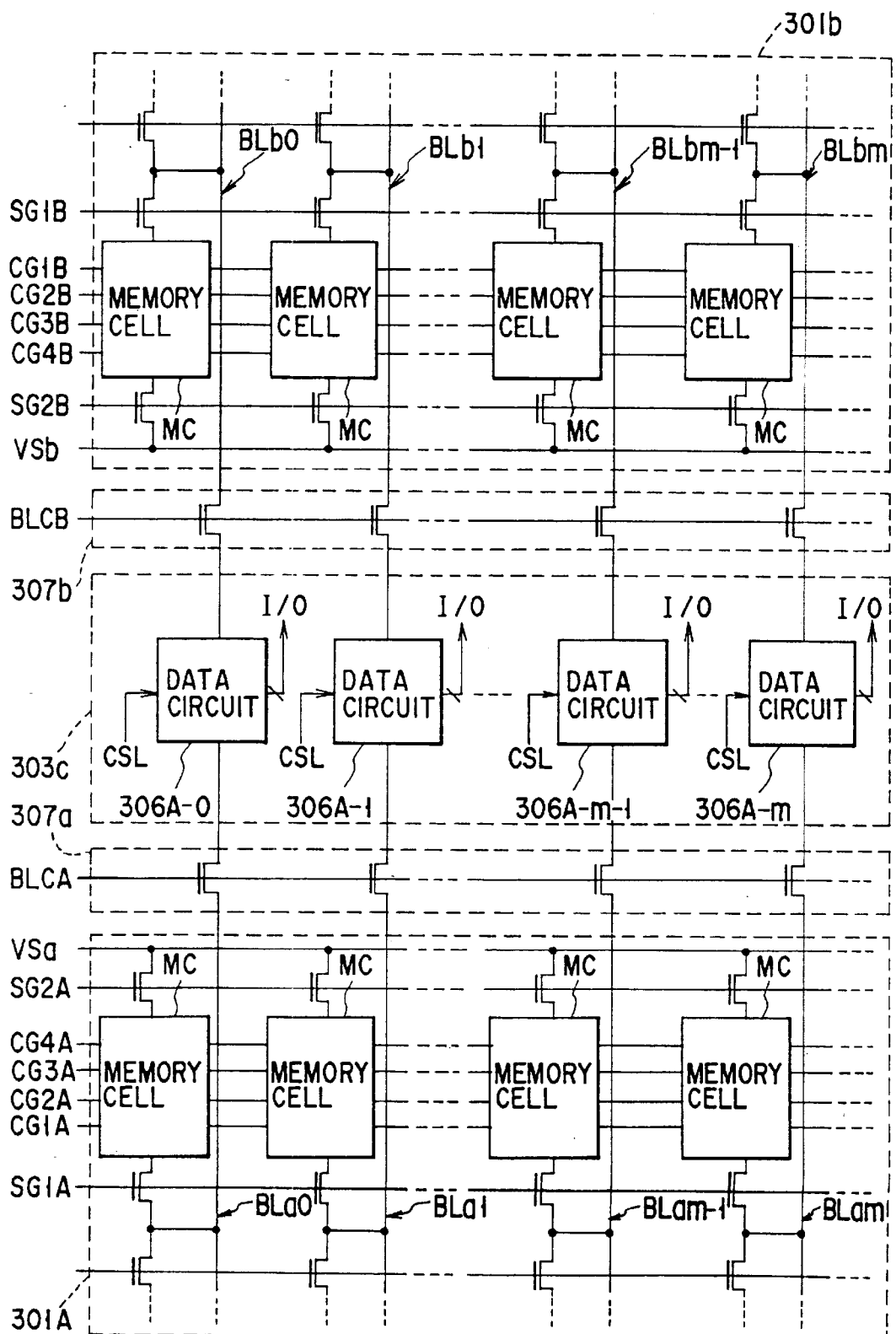
F I G. 97

| WRITE DATA | I/OA | I/OB | I/OC | I/OD |
|---|---|---|---|---|
| 0 | H | L | H | L |
| 1 | L | H | H | L |
| 2 | L | H | L | H |

FIG. 103

| READ DATA | I/OA | I/OB | I/OC | I/OD |
|---|---|---|---|---|
| 0 | L | H | L | H |
| 1 | H | L | L | H |
| 2 | H | L | H | L |

FIG. 104

| WRITE DATA | MEMORY CELL TRANSISTOR STATE | MODIFIED WRITE DATA | VERIFICATION RESULT |
| --- | --- | --- | --- |
| 0 | 0,1,2(∗10) | 0 | SUCCESS |
| 1 | 0 | 1 | INSUFFICIENT |
| ↓1 | 1 | 0 | SUCCESS |
| 2 | 0 | 2 | INSUFFICIENT |
| ↓2 | 1 | 2 | INSUFFICIENT |
| ↓2 | 2 | 0 | SUCCESS |

FIG. 109

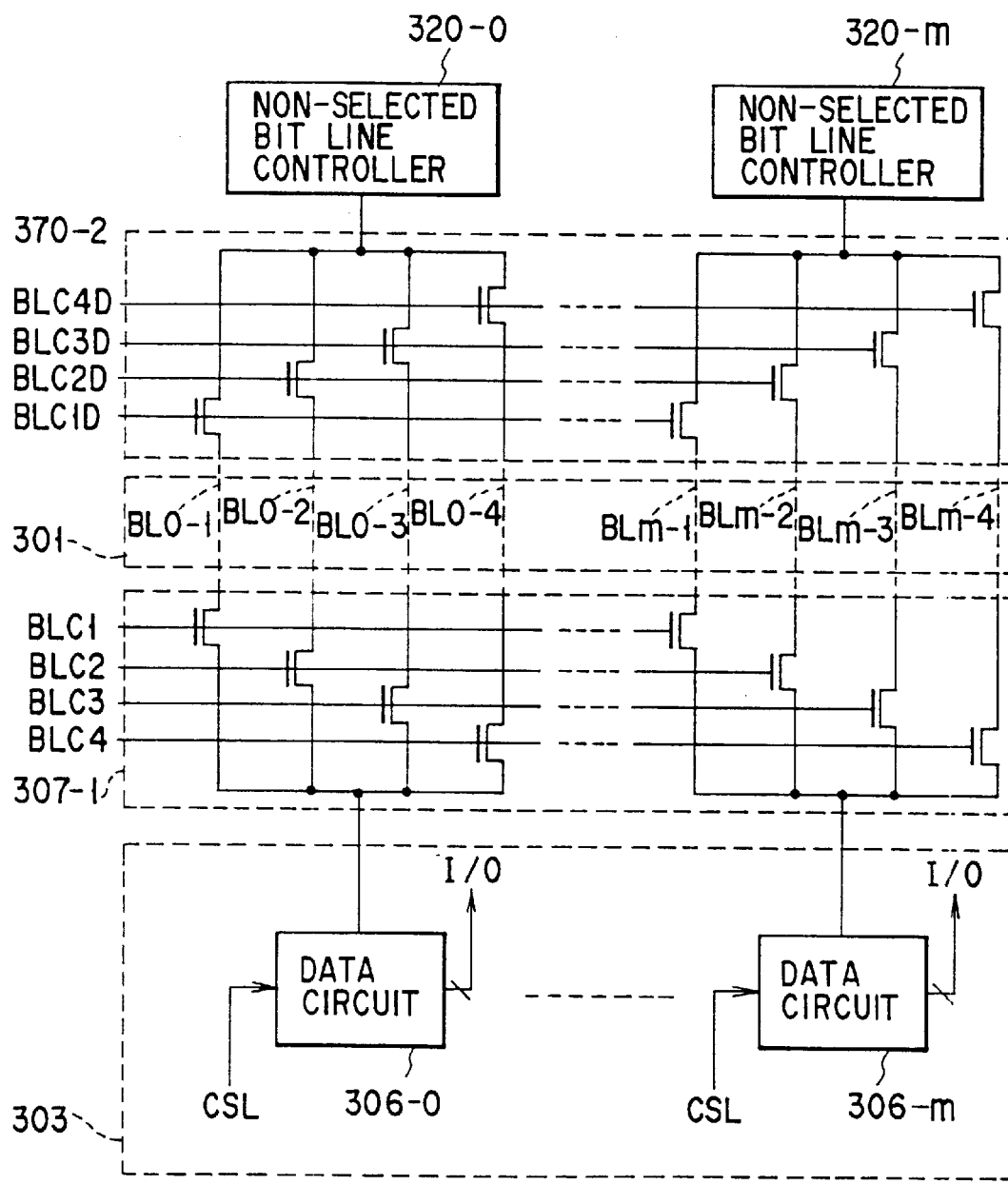
F I G. 110

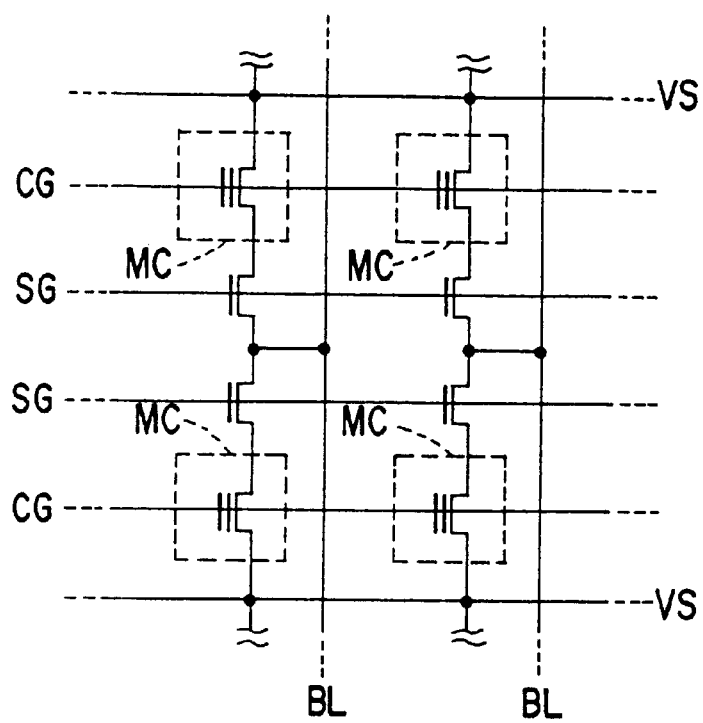
F I G. 112
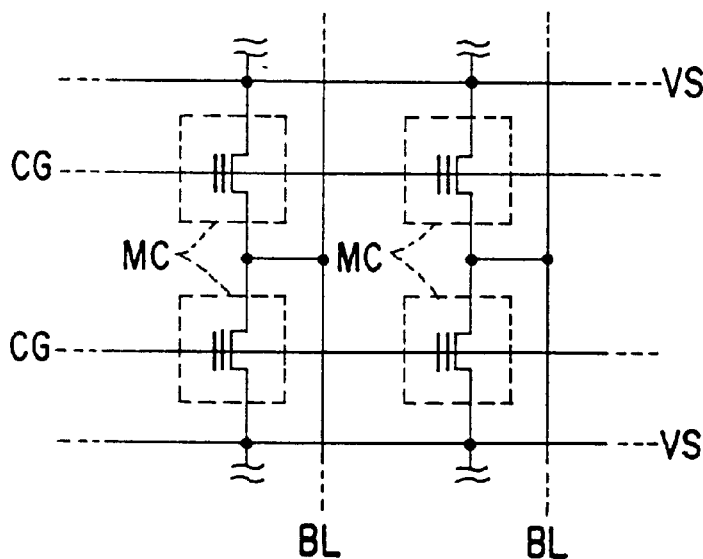
F I G. 113

NONVOLATILE SEMICONDUCTOR MEMORY DEVICE

This application is a continuation of Ser. No. 09/532,329 filed Mar. 21, 2000, which is a continuation of Ser. No. 09/314,446 filed May 19, 1999 now U.S. Pat. No. 6,040,013, which is a continuation of 08/816,830 filed Mar. 18, 1997 now U.S. Pat. No. 5,969,985.

BACKGROUND OF THE INVENTION

The present invention relates to an electrically erasable programmable read-only memory (EEPROM) device, and more particularly to an EEPROM storing data of a multilevel.

The present application is based on Japanese Patent Application. No. 8-61352, Japanese Patent Application. No. 8-61443, Japanese Patent Application. No. 8-61444 and Japanese Patent Application. No. 8-61449, the content of which is incorporated herein by reference.

As one of a means for increasing the capacity of an EEPROM, a multilevel storing EEPROM has been known capable of causing n (n≧3)-level information to be stored in one memory cell. A four-level data storing structure is arranged such that each cell is provided with one of four threshold voltages and the threshold voltages correspond to 2-bit information expressed as "0, 0", "0, 1", "1, 0" and "1, 1".

To read data in the memory cell in which n-level information has been stored, data read from the cell must be compared with (n−1) reference voltages. Accordingly, (n−1) sense amplifiers have been required (refer to, for example, Japanese Patent KOKAI Publication No. 61-117796). A four-level data storing EEPROM must have three sense amplifiers.

Therefore, the four-level data storing EEPROM involves the storing density in the memory cell being doubled as compared with the EEPROM having binary data storing cells. Although the area of the memory cells can be halved, the area of the sense amplifiers is tripled. Thus, a required high density structure cannot be formed. In particular, an EEPROM having a sense amplifier provided for each bit line for the purpose of page reading cannot easily be formed into a large capacity structure because the number of the sense amplifiers is enlarged excessively.

A read-only memory has been disclosed in Japanese Patent KOKAI Publication No. 62-54896 which is capable of decreasing the number of sense amplifiers by using an output from a sense amplifier, which has determined cell data, to control the reference voltages of other sense amplifiers. However, the foregoing structure cannot be applied to a writable memory.

On the other hand, a multilevel data storing EEPROM for causing n (n≧3) types of threshold voltages to be stored in the memory cells must distribute the threshold voltages in each of narrow ranges when data to be stored is written. Therefore, writing is performed little by little and whether or not data has been written in each memory cell within a required threshold voltage range is verified between writing operations. If a cell, in which data has not sufficiently been written, exists, additional writing of the cell has been performed. The foregoing technology is arranged to cause optimum writing to be performed for each memory cell and is known as "bit-by-bit verification". The concept of the bit-by-bit verification has been disclosed in Japanese Patent KOKAI Publication No. 3-295098.

The technology disclosed in Japanese Patent KOKAI Publication No. 3-295098 relates to a binary-data storing EEPROM. The bit-by-bit verification applicable to a multilevel data storing EEPROM has been disclosed in Japanese Patent KOKAI Publication No. 7-93979. However, the apparatus disclosed in Japanese Patent KOKAI Publication No. 7-93979 requires (n−1) sense amplifiers and (n−1) verify circuits. Although the memory cell is able to store larger quantity of data and thus a large quantity of data can be stored in a chip having the same area, the size of a circuit for controlling data read/write is enlarged excessively to form a highly integrated structure.

Moreover, the multilevel-data storing EEPROM involves the number of bits of signals for use therein, in particular, the signals for use in the input/output data line being different from the number of bits of signals for use in a circuit substrate for establishing the connection between the multilevel-data storing EEPROM with another integrated circuit apparatus, such as a processor. As a result, the multilevel-data storing EEPROM must have a circuit for converting the number of bits of the signal for use in the outside portion of the apparatus into the number of bits of the signal for use in the apparatus.

When the number of multilevel data is n (n is a natural number not smaller than 3) in the conventional multilevel-data storing EEPROM having the verify means, (n−1) verify circuits must be provided. Therefore, also (n−1) sense amplifiers and (n−1) data latches must be provided to correspond to the verify circuits. As a result, the size of the circuit connected to the bit line, that is, the size of the column-system circuit, in particular, the number of the sense amplifiers and data latches cannot be reduced. Thus, a highly integrated structure cannot be realized.

Moreover, the circuit for converting the number of bits of the signal for use in the outside portion of the apparatus and the number of bits of the signal for use in the apparatus must be provided. Therefore, a highly integrated structure cannot be realized and a high speed input/output operation cannot be performed.

BRIEF SUMMARY OF THE INVENTION

Accordingly, it is a first object of the present invention is to provide a nonvolatile semiconductor memory device capable of decreasing the size of a column-system circuit and realizing a highly integrated structure.

A second object of the present invention is to provide a nonvolatile semiconductor memory device capable of omitting a circuit for converting the number of bits and realizing both highly integrated structure and a high speed input/output operation.

The foregoing objects can be realized by the following nonvolatile semiconductor memory device.

According to one aspect of the present invention, there is provided a nonvolatile semiconductor memory device comprising:
  a memory cell array in which memory cells for storing multilevel data are arranged in a matrix manner;
  a bit line controller having latching means for latching data to be written in the memory cell when data is written in the memory cell and sensing/latching means for sensing and latching data read from the memory cell when data is read from the memory cell; and
  a bit line for electrically connecting the bit line controller and the memory cell to each other, supplying data from the latching means to the memory cell when data is written in the memory cell and supplying read data from the memory cell to the sensing/latching means when data is read from the memory cell, wherein when the number of multilevel data is n (n is a natural number not smaller than 4), the number of the latching means and the number of the sensing/latching means are m (m satisfies $2^{m-1}<n\leq 2^m$ (m is a natural number not smaller than 2).

According to the nonvolatile semiconductor memory device of the first aspect, when the number of multilevel data is n satisfying $n=2^m$, m is the same as the number of bits of data input/output lines which are electrically connected to the bit line controller, and one bit data is assigned to each of the m latching means and the m sensing/latching means.

According to the nonvolatile semiconductor memory device of the first aspect, when data is read from the memory cell, the m sensing/latching means are sequentially operated from first sensing/latching means assigned to a first bit which is the most significant bit toward the m-th sensing/latching means assigned to the m-th bit which is the least significant bit.

According to the nonvolatile semiconductor memory device of the first aspect, the first sensing/latching means assigned to the first bit which is the most significant bit compares read data supplied from the memory cell through the bit line with a first reference voltage to output a result of a comparison representing whether or not read data is higher than the first reference voltage, and switches the level of a second reference voltage to be provided for a second sensing/latching means assigned to a second bit which is a next bit in accordance with the output result of the comparison.

According to the nonvolatile semiconductor memory device of the first aspect, the level of the m-th reference voltage to be provided for a sensing/latching means assigned to the m-th bit which is the least significant bit is switched $2^{m-1}$ times in accordance with a result of a comparison between the (m−1)-th reference voltage provided for the sensing/latching means assigned to the (m−1)-th bit which is an upper bit and data read from the memory cell.

According to the nonvolatile semiconductor memory device of the first aspect, the number of bits of the data input/output line is the same as the number of bits of write data to be supplied to the apparatus from outside of the apparatus and the number of bits of read data to be output from the inside portion of the apparatus to the outside of the apparatus.

According to the nonvolatile semiconductor memory device of the first aspect, write data is supplied to the latching means from outside of the apparatus such that the number of bits of write data is not converted, and read data is output from the sensing/latching means to the outside of the apparatus such that the number of bits of read data is not converted.

According to the nonvolatile semiconductor memory device of the first aspect, $2^m$=n-level data, which appears on one bit line, is converted into m-bit and n-level data by the latching means and the sensing/latching means.

According to the nonvolatile semiconductor memory device of the first aspect, each of write data to be supplied from the latching means to the memory cell through the bit line and read data to be supplied from the memory cell to the sensing/latching means through the bit line is n multilevel data, and the bit line distinguishes each of n multilevel data in accordance with the level of voltage to supply data from the latching means to the memory cell and supply data from the memory cell to the sensing/latching means.

According to the nonvolatile semiconductor memory device of the first aspect, the memory cell for storing multilevel data includes a transistor having a variable threshold voltage, and the transistor having the variable threshold voltage distinguishes each of n multilevel data in accordance with the level of the threshold voltage and then store n multilevel data.

According to a second aspect of the present invention, there is provided a nonvolatile semiconductor memory device comprising:

a memory cell array in which memory cells for storing multilevel data are arranged in a matrix manner;

a bit line controller having latching means for latching data to be written in the memory cell when data is written in the memory cell, sensing/latching means for sensing and latching data read from the memory cell when data is read from the memory cell and verify means for performing a verify operation to make a reference to data latched by the latching means and arranged to be written in the memory cell; and a bit line for electrically connecting the bit line controller and the memory cell to each other, supplying data from the latching means into the memory cell when data is written in the memory cell and supplying read data from the memory cell to the sensing/latching means when data is read from the memory cell, wherein when the number of multilevel data is n (n is a natural number not smaller than 4), the number of the latching means, the number of the sensing/latching means and the number of the verify means are m (m satisfies $2^{m-1}<n\leq 2^m$ (m is a natural number not smaller than 2).

According to the nonvolatile semiconductor memory device of the second aspect, when the number of multilevel data is n satisfying $n=2^m$, m is the same as the number of bits of data input/output lines which are electrically connected to the bit line controller, and one bit data is assigned to each of the m latching means and the m sensing/latching means.

According to the nonvolatile semiconductor memory device of the second aspect, when data is read from the memory cell, the m sensing/latching means are sequentially operated from first sensing/latching means assigned to a first bit which is the most significant bit toward the m-th sensing/latching means assigned to the m-th bit which is the least significant bit, and when data is read from the memory cell for verification, the m sensing/latching means are sequentially operated from m-th sensing/latching means assigned to m-th bit which is the least significant bit toward the first sensing/latching means assigned to the first bit which is the most significant bit.

According to the nonvolatile semiconductor memory device of the second aspect, when data is read from the memory cell, the first sensing/latching means assigned to the first bit which is the most significant bit compares read data supplied from the memory cell through the bit line with a first reference voltage to output a result of a comparison representing whether or not read data is higher than the first reference voltage, and switches the level of a second reference voltage to be provided for a second sensing/latching means assigned to a second bit which is a next bit in accordance with the output result of the comparison, and when data is read from the memory cell for verification, the level of the second reference voltage to be provided for the second sensing/latching means assigned to the second bit which is the next bit is switched in accordance with read data latched by the first latching means assigned to the first bit which is the most significant bit.

According to the nonvolatile semiconductor memory device of the second aspect, when data is read from the memory cell, the level of the m-th reference voltage to be provided for a sensing/latching means assigned to the m-th bit which is the least significant bit is switched $2^{m-1}$ times in accordance with a result of a comparison between the (m−1)-th reference voltage provided for the sensing/latching means assigned to the (m−1)-th bit which is an upper bit and data read from the memory cell.

According to the nonvolatile semiconductor memory device of the second aspect, when data is read from the memory cell, the sensing/latching means converts $2^m$=n-level data read to one bit line into n m-bit read data, when data is written in the memory cell, the latching means supplies m-bit n-level write data to data writing circuit for converting data into $2^m$=n-level write data for one bit line, and m-bit and n-level read data and m-bit and n-level write data are supplied as different data.

According to the nonvolatile semiconductor memory device of the second aspect, when data is read from the memory cell for verification, the latching means compares m-bit n-level write data with $2^m$=n-level data read to one bit line, activates the verify means when the write data and the read data coincide with each other and deactivates the verify means when the write data and the read data do not coincide with each other.

According to the nonvolatile semiconductor memory device of the second aspect, the number of bits of the data input/output lines is the same as each of the number of bits of write data to be supplied from outside of the apparatus into the apparatus and the number of bits of read data to be output from the inside portion of the apparatus to the outside of the apparatus.

According to the nonvolatile semiconductor memory device of the second aspect, write data is supplied from the outside of the apparatus to the latching means such that the number of bits of write data is not converted, and read data is output from the sensing/latching means to the outside of the apparatus such that the number of bits of read data is not converted.

According to the nonvolatile semiconductor memory device of the second aspect, each of write data to be supplied from the latching means to the memory cell through the bit line and read data to be supplied from the memory cell to the sensing/latching means through the bit line is n multilevel data, and the bit line distinguishes each of n multilevel data in accordance with the level of voltage to supply data from the latching means to the memory cell and supply data from the memory cell to the sensing/latching means.

According to the nonvolatile semiconductor memory device of the second aspect, each of write data to be supplied from the latching means to the memory cell through the bit line and read data to be supplied from the memory cell to the sensing/latching means through the bit line is n multilevel data, and the bit line distinguishes each of n multilevel data in accordance with the level of voltage to supply data from the latching means to the memory cell and supply data from the memory cell to the sensing/latching means.

According to the nonvolatile semiconductor memory device of the second aspect, the memory cell for storing multilevel data includes a transistor having a variable threshold voltage, and the transistor having the variable threshold voltage distinguishes each of n multilevel data in accordance with the level of the threshold voltage and then store n multilevel data.

According to a third aspect of the present invention, there is provided a nonvolatile semiconductor memory device comprising:

a memory cell array in which memory cells for storing multilevel data are arranged in a matrix manner;

a bit line controller having latching function for latching data to be written in the memory cell when data is written in the memory cell and sensing/latching function for sensing and latching data read from the memory cell when data is read from the memory cell and in which when the number of multilevel data is n (n is a natural number not smaller than 4), the number of the latching function and the number of the sensing/latching function are m (m satisfies $2^{m-1}<n \leq 2^m$ (m is a natural number not smaller than 2);

a bit line for electrically connecting the bit line controller and the memory cell to each other, supplying data from the latching function into the memory cell when data is written in the memory cell and supplying read data from the memory cell to the sensing/latching function when data is read from the memory cell;

a writing circuit for selecting write control voltage corresponding to multilevel data in accordance with write data latched by the latching function when data is written in the memory cell and applying selected write control voltage to the bit line; and a verify circuit for verifying data written in the memory cell, wherein the verify circuit and the writing circuit is controlled in accordance with n write data latched by the latching function.

According to the nonvolatile semiconductor memory device of the third aspect, the latch function updates write data latched in the latch function to non-changed memory cell data when data has been written in the memory cell in a case where a result of verify read operation is valid.

According to the nonvolatile semiconductor memory device of the third aspect, data to be input to the latch function is controlled by the verify circuit and the writing circuit in accordance with latched write data in order to prevent change of updated write data during a verify read operation.

According to a fourth aspect of the present invention, there is provided a nonvolatile semiconductor memory device comprising a memory cell array formed of a plurality of memories each having a charge storage portion capable of storing n-level (n≧3) data, a plurality of bit lines, a plurality of word lines, a plurality of program controllers and a plurality of data circuits, wherein the program controller selects a memory cell and applies write voltage to the selected memory cell, the data circuit is formed of m latches when m is a natural number satisfying $2^{m-1}<n \leq 2^m$, holds first, second, . . . , n-th logical level write control data for controlling write control voltages to be applied to corresponding memory cells selected by the program control circuit, applies the write control voltages to the corresponding memory cells, selectively detects only a write state of the memory cell corresponding to the data circuit storing the write control data of a logical level except the first logical level, changes the logical level of the write control data in the data circuit corresponding to the memory cell which has brought to a predetermined write state to the first logical level, holds the logical level of write control data in the data circuit corresponding to the memory cell which has not reached the predetermined write state, and holds the logical level of write control data in the data circuit storing first logical level write control data in the first logical level, and write data is updated in accordance with the combination of states of m latches.

According to the nonvolatile semiconductor memory device of the fourth aspect, a verify circuit for updating write data generates write control voltage.

According to a fifth aspect of the present invention, there is provided a nonvolatile semiconductor memory device comprising:

a memory cell array in which memory cells for storing multilevel data are arranged in a matrix manner;

a bit line controller having data latch/sense amplifier for latching data to be written in the memory cell when data is written in the memory cell and sensing and latching data read from the memory cell when data is read from the memory cell such that when the number of multilevel data is $2^m$ (m is a natural number not smaller than 2)=n-level, the number of the data latch/sense amplifier is m;

a bit line for connecting the data latch/sense amplifier and the memory cell to each other, supplying data from the data latch/sense amplifier into the memory cell when data is written in the memory cell and supplying read data from the memory cell to the data latch/sense amplifier when data is read from the memory cell;

a writing circuit for selecting write control voltage corresponding to multilevel data in accordance with write data latched by the data latch/sense amplifier when data is written in the memory cell and applying selected write control voltage to the bit line; and a verify circuit for verifying whether or not written data has been brought to a required date storing state after data has been written in the memory cell.

According to a sixth aspect of the present invention, there is provided a nonvolatile semiconductor memory device comprising:

a memory cell array in which memory cells for storing n-level (n is a natural number not smaller than 3) which can electrically be rewritten are arranged in a matrix manner;

threshold detection means for electrically charging the bit line connected to the memory cell through the memory cell and outputting multilevel data in the memory cell as a multilevel level potential to the bit line;

a sense amplifier for sensing the multilevel level bit line potential charged by the threshold detection means;

first, second, . . . , m-th data circuits for storing data to be written in the memory cell;

verify means for verifying whether or not the state after data has been written in the memory cell has been a required data storing state by using the threshold detection means; and means for simultaneously updating contents of the data circuit formed of a data updating circuit for simultaneously updating the contents of the data circuit to again write data in only a memory cell in which data has not been sufficiently written in accordance with the contents of the data circuit and the state after data has been written in the memory cell, wherein the data updating circuit makes a reference to the contents of one data circuit.

According to a seventh aspect of the present invention, there is provided a nonvolatile semiconductor memory device comprising:

a memory cell array in which memory cells for storing n-level (n is a natural number not smaller than 3) which can electrically be rewritten are arranged in a matrix manner;

threshold detection means for electrically charging the bit line connected to the memory cell through the memory cell and outputting multilevel data in the memory cell as a multilevel level potential to the bit line;

a sense amplifier for sensing the multilevel level potential of the bit line electrically charged by the threshold detection means by making a comparison with a reference voltage;

first, second, . . . , m-th data circuits for storing data to be written in the memory cell;

verify means for verifying whether or not the state after data has been written in the memory cell has been a required data storing state by using the threshold detection means; and means for simultaneously updating contents of the data circuit, which is formed of a data updating circuit for simultaneously updating the contents of the data circuit to again write data in only a memory cell in which data has not been sufficiently written in accordance with the contents of the data circuit and the state after data has been written in the memory cell, wherein the data updating circuit makes a reference to the contents of one data circuit, the means for simultaneously updating contents of the data circuit modifies the bit line to which the state after the memory cell writing operation has been performed is output and the reference voltage in accordance with the contents of the data circuit in order to cause the potential of the bit line to be sensed and stored as re-write data, holds the data storing state of the data circuit until the potential of the bit line is modified, operates the data circuit as a sense amplifier while storing the modified potential of the bit line and simultaneously updates the contents of the data circuit, and a writing operation and the simultaneous update of the contents of the data circuit in accordance with the contents of the data circuit are repeated until the memory cell is brought to a predetermined write state so that data is electrically written.

According to the nonvolatile semiconductor memory device of the fifth, sixth and seventh aspects, the memory cell is a NAND cell having a plurality of memory cell transistors, in series, connected, an end of the NAND cell is connected to the bit line through a first election gate, and another end of the NAND cell is connected to a source line through a second selection gate, the threshold detection means causes the voltage of the source line to be transferred to the bit line through the NAND cell, and voltages of non-selected control gates and voltages of the first and second selection gates are controlled in such a manner that voltage transfer performance of the non-selected memory cells and the first and second selection transistors is improved such that the voltage of the bit line is determined in accordance with the threshold voltage of the selected memory cell.

According to an eighth aspect of the present invention, there is provided a nonvolatile semiconductor memory device comprising:

a memory cell array in which memory cells for storing n-level (n is a natural number not smaller than 4) which can electrically be rewritten are arranged in a matrix manner;

first, second, . . . , m-th (m is a natural number satisfying $2^{m-1} < n \leq 2^m$) data circuits for storing data to be written in the memory cell; and verify means for verifying whether or not the state after data has been written in the memory cell has been a required data storing state.

According to a ninth aspect of the present invention, there is provided a nonvolatile semiconductor memory device comprising:

a memory cell array in which memory cells for storing n-level (n is a natural number not smaller than 3) which can electrically be rewritten are arranged in a matrix manner;

first, second, . . . , m-th (m is a natural number satisfying $2^{m-1} < n \leq 2^m$) data circuits for storing data to be written in the memory cell;

verify means for verifying whether or not the state after data has been written in the memory cell has been a required data storing state; and means for simultaneously pupdating contents of the data circuit, which is formed of a data updating circuit for simultaneously updating the contents of the data circuit to again write data in only a memory cell in which data has not been sufficiently written in accordance with the contents of the data circuit and the state after data has been written in the memory cell, wherein the data update circuit makes a reference to the contents of one data circuit.

According to a tenth aspect of the present invention, there is provided a nonvolatile semiconductor memory device comprising:

a memory cell array in which memory cells for storing n-level (n is a natural number not smaller than 4) which can electrically be rewritten are arranged in a matrix manner;

threshold detection means for detecting the threshold voltage of the memory cell;

first, second, . . . , m-th (m is a natural number satisfying $2^{m-1} < n \leq 2^m$) data circuits for storing data to be written in the memory cell; and verify means for verifying whether or not the state after data has been written in the memory cell has been a required data storing state, wherein detection of the threshold voltage is performed such that first threshold detection voltage is applied to a gate electrode of the memory cell to determine whether the memory cell is (i) in a "1" state or (ii) in a "2 or more" state (i.e., "2", "3", . . . , or "n" state), second threshold detection voltage is applied to the gate electrode of the memory cell to determine whether the memory cell is (i) in the "1 or 2" state (i.e., "1" or "2" state) or (ii) in a "3 or more" state (i.e., "3", "4", . . . , or "n" state), and third to (n–1)-th threshold detection voltage is applied to the gate electrode of the memory cell.

According to an eleventh aspect of the present invention, there is provided a nonvolatile semiconductor memory device comprising:

a memory cell array in which memory cells for storing n-level (n is a natural number not smaller than 3) which can electrically be rewritten are arranged in a matrix manner;

a data circuit for storing data to be written in the memory cell; and verify means for verifying whether or not the state after data has been written in the memory cell has been a required data storing state, wherein a writing operation is performed to realize n types of write states such that first writing of memory cells, in which writing of k types (k is a natural number satisfying $2 \leq k < n$) is performed, is substantially simultaneously performed, and writing of a memory cell in which (n–k) types of writing states are performed is performed before or after the first writing operation.

According to a twelfth aspect of the present invention, there is provided a nonvolatile semiconductor memory device comprising:

a memory cell array in which memory cells for storing n-level (n is a natural number not smaller than 3) in which "1" state is an erase state, and "2", "3", . . . , of "n" state is a write state and which can electrically be rewritten are arranged in a matrix manner;

a data circuit for storing data to be written in the memory cell; and verify means for verifying whether or not the state after data has been written in the memory cell has been a required data storing state, wherein first writing of memory cells which are written in the "3", . . . , or "n" state among the n types of writing operations is substantially simultaneously performed, and writing to "2" state is performed before or after the first writing operation.

According to the nonvolatile semiconductor memory device of the twelfth aspect, threshold voltages for writing "1", "2", "3", . . . , or "n" state satisfying the following relation;

"1" state<"2" state<"3" state< . . . <"n" state.

According to a thirteenth aspect of the present invention, there is provided a nonvolatile semiconductor memory device comprising:

a memory cell array in which memory cells for storing n-level and having storing states of "1", "2", "3", . . . , or "n" state (n is a natural number not smaller than 3) and being able to be electrically rewritten are arranged in a matrix manner;

a signal line for communicating data with the memory cell; and a read data storing circuit for storing data read from the memory cell, wherein an i-th reading operation is performed such that the threshold voltage of the memory cell is similar to "i" state, higher than the "i" state or lower than the "i" state is determined, and read data is stored in the data storing circuit, and when a j-th reading operation is performed in which the threshold voltage of the memory cell is similar to "j" state, higher than the "j" state or lower than the "j" state is determined, the potential of the signal line from which data in the memory cell has been output is changed by making a reference to data stored in the data storing circuit, and then the potential of the signal line is sensed.

According to a fourteenth aspect of the present invention, there is provided a nonvolatile semiconductor memory device comprising:

a memory cell array in which memory cells for storing n-level (n is a natural number not smaller than 3) which can electrically be rewritten are arranged in a matrix manner;

a signal line for communicating data with the memory cell;

a data circuit for storing data to be written in the memory cell; and verify means for verifying whether or not the state after data has been written in the memory cell has been a required data storing state, wherein reference to the potential of a signal line from which data to be written in the memory cell has been output is made two or more times to update the contents of the data circuit in such a manner that the writing of a memory cell in which data has not been sufficiently written is again performed in accordance with the contents of the data circuit and a state after data has been written in the memory cell.

According to a fifteenth aspect of the present invention, there is provided a nonvolatile semiconductor memory device comprising:

a memory cell array in which memory cells for storing n-level (n is a natural number not smaller than 3) which can electrically be rewritten are arranged in a matrix manner;

threshold detection means for detecting the threshold voltage of the memory cell;

a data circuit for storing data to be written in the memory cell; and verify means for verifying whether or not the state after data has been written in the memory cell has been a required data storing state, wherein detection of the threshold voltage is performed such that first threshold detection voltage is applied to a gate electrode of the memory cell to determine whether the memory cell is (i) in a "1" state or (ii) in a "2 or more" state (i.e., "2", "3", . . . , or "n" state), second threshold detection voltage is applied to the gate electrode of the memory cell to determine whether the memory cell is (i) in "1 or 2" state (i.e., "1" or "2" state) or (ii) "3 or more" state (i.e., "3", "4", . . . , or "n state"), third to (n−1)-th threshold detection voltage is applied to the gate electrode of the memory cell, and reference to the potential of a signal line from which data to be written in the memory cell has been output is made two or more times to update the contents of the data circuit in such a manner that the writing of a memory cell in which data has not been sufficiently written is again performed in accordance with the contents of the data circuit and a state of the memory cell after data has been written.

According to a sixteenth aspect of the present invention, there is provided a nonvolatile semiconductor memory device comprising:

a memory cell array in which memory cells for storing n-level (n is a natural number not smaller than 3) and being able to be electrically rewritten are arranged in a matrix manner;

m data circuits for storing data to be written in the memory cell;

verify means for verifying whether or not the state of the memory cell after data has been written has been a required data storing state; and means for simultaneously updating contents of the data circuit, which is formed of a data updating circuit for simultaneously updating the contents of the data circuit to again write data in only a memory cell in which data has not been sufficiently written in accordance with the contents of the data circuit and the state of the memory cell after data has been written, wherein the data update circuit makes a reference to the contents of one data circuit.

According to a seventeenth aspect of the present invention, there is provided a nonvolatile semiconductor memory device comprising:

means for charging the bit line with one of bit line write potentials corresponding to multilevel data when multilevel data is written in the memory cell and brining the bit line to an electrically floating state; and means for causing the potential of the bit line to have a bit line write control potential determined in accordance with multilevel data by increasing, decreasing or maintaining the quantity of charge of the bit line.

According to an eighteenth aspect of the present invention, there is provided a nonvolatile-semiconductor memory device comprising:

a memory cell array in which memory cells for storing binary or higher level data are arranged in a matrix manner;

a bit line used for writing data in the memory cell and reading data from the memory cell; and a bit line controller for making the bit line to a predetermined potential and then bringing the bit line to an electrically floating state, wherein the bit line is set to a predetermined potential and then is brought to an electrically floating state, and when data is written in the memory cell, the predetermined potential of the bit line is used as one of bit line write control voltages.

According to a nineteenth aspect of the present invention, there is provided a nonvolatile semiconductor memory device comprising:

a memory cell array in which memory cells for storing binary or higher level data are arranged in a matrix manner;

a bit line for transferring data to be written in the memory cell and data read from the memory cell;

a first circuit connected to the bit line to make the potential of the bit line to a predetermined level before data is written in the memory cell and bring the bit line to an electrically floating state; and a second circuit connected to the bit line for maintaining the potential of the bit line at the predetermined level when one of binary or higher level data is written in a selected memory cell and shifting the potential of the bit line to a level different from the predetermined level when another binary or higher level data is written in a selected memory cell.

According to the nonvolatile semiconductor memory device of the nineteenth aspect, the second circuit includes a flip-flop circuit, and the flip-flop circuit stores data to be written when data is written in the memory cell.

According to the nonvolatile semiconductor memory device of the nineteenth aspect, the flip-flop circuit maintains the potential of the bit line at the predetermined level or shifts the potential to a level different from the predetermined level in accordance with stored data to be written when data is written in the memory cell.

According to the nonvolatile semiconductor memory device of the nineteenth aspect, the flip-flop circuit amplifies and stores read data when data is read from the memory cell.

According to the nonvolatile semiconductor memory device of the nineteenth aspect, the number of data to be stored by the memory cell is n (n≧2), the number of the flip-flop circuits for storing data to be written in the memory cell and amplifies and stores data read from the memory cell is (n−1).

According to the nonvolatile semiconductor memory device of the nineteenth aspect, write data stored by (n−1) flip-flop circuits is changed to another data after a verify operation has been completed.

According to the nonvolatile semiconductor memory device of the nineteenth aspect, there is further provided a write completion detecting circuit for detecting change of write data stored by (n−1) flip-flop circuits into another data to complete a writing operation when the write completion detecting circuit has detected the change.

According to a twentieth aspect of the present invention, there is provided a nonvolatile semiconductor memory device comprising:

a memory cell array in which memory cell for storing binary or higher level data are arranged in a matrix manner;

a bit line connected to a source and a drain of the memory cell; and a bit line controller connected between the bit line and a data input/output line, wherein the bit line controller has a charging circuit for charging the bit line before a writing operation, a write data storing portion for storing write data supplied to the data input/output line, and a data controller for maintaining the potential of the bit line at the charged level or shifting the potential from the charged level in accordance with write data stored by the write data storing portion.

According to the nonvolatile semiconductor memory device of the twenties aspect, the data controller includes a flip-flop circuit, and the flip-flop circuit stores write data supplied to the data input/output line when data is written in the memory cell.

According to the nonvolatile semiconductor memory device of the twenties aspect, the flip-flop circuit amplifies data read to the bit line to supply read data to the data input/output line.

According to the nonvolatile semiconductor memory device of the twenties aspect, when the number of data to be stored by the memory cell is n (n≧2), the number of the flip-flop circuits for storing data to be written in the memory cell and amplifies and stores data read from the memory cell is (n−1).

According to the nonvolatile semiconductor memory device of the twenties aspect, write data to be stored by (n−1) flip-flop circuits is changed to another data after a verification operation has been completed.

According to the nonvolatile semiconductor memory device of the twenties aspect, there is further provided a write completion detecting circuit for detecting change of write data stored by (n−1) flip-flop circuits into another data to complete a writing operation when the write completion detecting circuit has detected the change.

According to the nonvolatile semiconductor memory device of the twenties aspect, the charging circuit charges the bit line to a power supply potential.

According to the nonvolatile semiconductor memory device of the twenties aspect, the data controller maintains the potential of the bit line at the power supply potential or makes the potential to be lower than the power supply potential.

According to the nonvolatile semiconductor memory device of the twenties aspect, the charging circuit charges the bit line to a potential between a ground voltage and the power supply voltage.

According to the nonvolatile semiconductor memory device of the twenties aspect, the data controller maintains the potential of the bit line at the intermediate potential, makes the potential to be lower than the intermediate potential or makes the potential to be higher than the intermediate potential in accordance with write data stored by the write data storing portion included in the data controller.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a diagram showing the structure of a data circuit in a bit line controller of a NAND type EEPROM according to the first embodiment of the present invention;

FIG. 8 is a circuit diagram showing the writing circuit shown in FIG. 7;

FIG. 10 is a circuit diagram showing the bit line controller shown in FIG. 9;

FIG. 11 is a circuit diagram showing an example of the flip-flop circuit shown in FIG. 10;

FIG. 12 is a circuit diagram showing another example of the flip-flop circuit shown in FIG. 10;

FIG. 13 is an operation waveform showing a data reading operation;

FIG. 15 is a table showing states of nodes VL1-1, VL2-1, VL1-2 and VL2-2 after four-level data has been read;

FIG. 16 is a table showing states of nodes VL1-1, VL2-1, VL1-2 and VL2-2 when four-level data is written;

FIG. 17 is a table showing states of nodes VL1-1, VL2-1, VL1-2 and VL2-2 during verification of four-level data;

FIG. 19 is a diagram showing the structure of a multilevel data storing NAND type EEPROM according to a fourth embodiment of the present invention;

FIG. 20 is a diagram showing the structures of the memory cell array and the column-system circuit shown in FIG. 19;

FIG. 27 is an operation waveform showing the writing operation;

FIG. 29 is a table showing the relationship between the threshold voltages and latched data of the memory cell transistor;

FIG. 30 is a table showing the relationship between the latched data and the threshold voltages of the memory cell transistor;

FIG. 31 is a diagram showing the structure of a multilevel data storing NAND type EEPROM according to a fifth embodiment of the present invention;

FIG. 32 is a diagram showing the structures of the memory cell array and the column-system circuit shown in FIG. 31;

FIG. 35 is an operation waveform showing a writing operation;

FIG. 36 is a diagram showing the structure of a multilevel data storing NAND type EEPROM according to a sixth embodiment of the present invention;

FIG. 38A shows voltage input states when data is read from the memory cell shown in FIG. 37;

FIG. 38B shows waveforms. of input voltages and output waveform appearing on the bit line;

FIG. 39 is a graph showing output voltage appearing on the bit line and the number of the memory cells;

FIG. 42 is a table showing data sensed and latched by a flip-flop;

FIG. 43 is a table showing write data latched by the flip-flop;

FIG. 44 is an operation waveform showing the writing operation;

FIG. 46 is a graph showing distribution of threshold voltages of the memory cell transistor when four-level data is stored by the apparatus according to the seventh embodiment of the present invention;

FIG. 47 is a circuit diagram showing the bit line controller of the EEPROM according to the seventh embodiment;

FIG. 48 is an operation waveform showing the reading operation;

FIG. 49 is a table showing read data sensed and latched by the flip-flop;

FIG. 50 is a table showing read data sensed and latched by the flip-flop;

FIG. 51 is a schematic view showing the writing operation;

FIG. 52 is a table showing write data latched by the flip-flop;

FIG. 54 is an operation waveform showing the verify reading operation (verify read first cycle);

FIG. 55 is a table showing data latched by the flip-flop circuit;

FIG. 59 is a table showing data latched by the flip-flop;

FIG. 60 is a operation waveform showing another verify reading operation (verify read first cycle);

FIG. 61 is another circuit diagram showing the data circuit;

FIG. 62 is another circuit diagram showing the data circuit;

FIG. 63 is a circuit diagram showing a bit line controller of the EEPROM according to an eighth embodiment of the present invention;

FIG. 64 is an operation waveform showing the reading operation;

FIG. 65 is a table showing read data sensed and latched by the flip-flop;

FIG. 66 is a table showing read data sensed and latched by the flip-flop;

FIG. 67 is a table showing write data latched by the flip-flop;

FIG. 70 is an operation waveform showing the verify read operation;

FIG. 71 is an operation waveform showing another verify read operation;

FIG. 73 is another circuit diagram showing the data circuit;

FIG. 74 is another circuit diagram showing the data circuit;

FIG. 77 is an operation waveform showing the reading operation;

FIG. 78 is a table showing read data sensed and latched by the flip-flop;

FIG. 79 is a table showing read data sensed and latched by the flip-flop;

FIG. 88A is a diagram showing the structure of a data controller of a nonvolatile semiconductor memory device according to a tenth embodiment of the present invention;

FIG. 88B is a circuit diagram showing the flip-flop circuit shown in FIG. 88A;

FIG. 92 is a table showing state of change of write data in the data circuit;

FIG. 93 is a circuit diagram showing a circuit for detecting completion of writing of data;

FIG. 95 is an operation waveform showing the writing operation of the EEPROM having the data circuit shown in FIG. 94;

FIG. 96 is a diagram showing the structure of the multi-level data storing EEPROM according to a twelfth embodiment of the present invention;

FIG. 97 is a diagram showing the structures of the memory cell array and the column-system circuit shown in FIG. 96;

FIG. 103 is a table showing the relationship between write data and potential levels of the data input/output line;

FIG. 104 is a table showing the relationship between read data and the potential levels of the data input/output line;

FIG. 109 is a table showing a state of change of write data in the data circuit;

FIG. 110 is a diagram showing the structures of the memory cell array and the column-system circuit of the EEPROM according to a thirteenth embodiment of the present invention;

FIG. 112 is a diagram showing a memory cell array having NOR cells integrated therein;

FIG. 113 is a diagram showing a memory cell array having other NOR cells integrated therein;

FIG. 114 is a diagram showing a memory cell array having ground array cells integrated therein;

FIG. 115 is a diagram showing a memory cell array having ground array cells integrated therein;

FIG. 116 is a diagram showing a memory cell array having alternate ground array cells integrated therein;

FIG. 117 is a diagram showing a memory cell array having other alternate ground array cells integrated therein;

FIG. 118 is a diagram showing a memory cell array having DINOR cells integrated therein; and FIG. 119 is a diagram showing a memory cell array having AND cells integrated therein.

DETAILED DESCRIPTION OF THE INVENTION

A preferred embodiment of a nonvolatile semiconductor memory device according to the present invention will now be described with reference to the accompanying drawings.
(First Embodiment)

Figure 1:
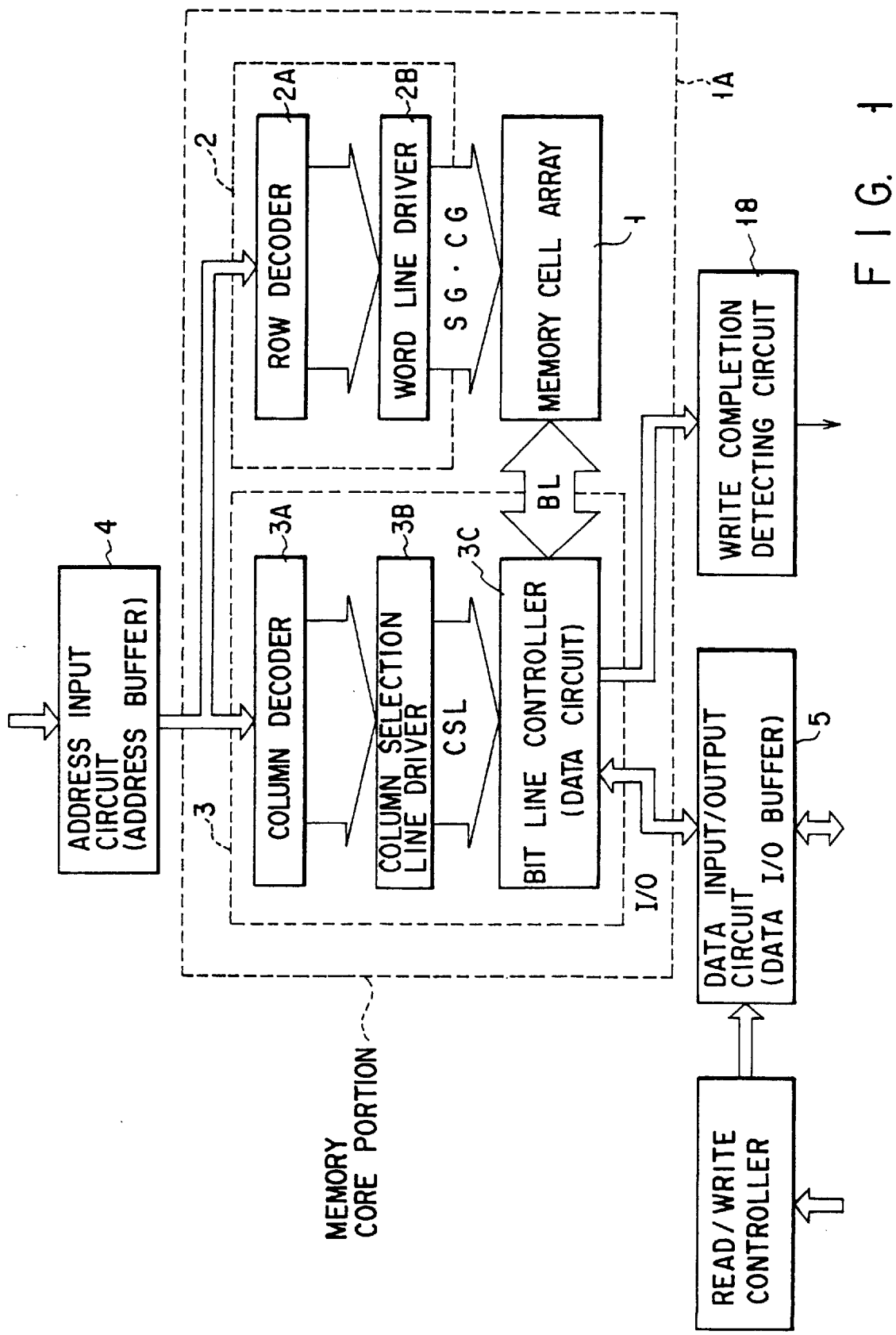
FIG. 1 is a diagram showing the structure of a multilevel data storing EEPROM according to a first embodiment of the present invention.

FIG. 1 is a diagram showing the structure of a multilevel storing EEPROM according to a first embodiment of the present invention. A row-system circuit 2 and a column-system circuit 3 are connected to a memory cell array 1 having memory cells (not shown) arranged in a matrix manner.

The row-system circuit 2 includes a row decoder 2A for receiving an address signal output from an address input/output circuit (hereinafter called as an "address buffer") 4 to select a row of the memory cell array in response to the supplied address signal, and a word line driver 2B for driving a word line of the memory cell array in accordance with an output from the row decoder 2A. In this embodiment, a NAND type EEPROM will now be described which comprises word lines which are selection gates (SG) and control gates (CG). Therefore, the word line driver 2B is sometimes called a control gate/selection gate driver. The control gate/selection gate driver 2B selects a selection gate (SG) and a control gate (CG) in response to the address signal to apply writing voltage, reading voltage and the like to the selected selection gate and control gate.

The column-system circuit 3 includes a column decoder 3A for receiving the address signal output from the address buffer 4 to select a column of the memory cell array and a column selection line driver 3B for driving the column selection line for selecting a column of the memory cell array in accordance with an output from the column decoder 3A.

Moreover, the column-system circuit 3 includes a bit line controller (including data circuits to be described later) 3C for temporarily storing data to be written in the memory cell and reading data in the memory cell. The bit line controller 3C is connected to a data input/output circuit (data input/output buffer) 5. The bit line controller 3C receives write data from the data input/output buffer 5 when data is written to output the received write data to the memory cell array 1.

On the other hand, the bit line controller 3C receives data read from the memory cell to output received data to the data input/output buffer 5. The data input/output buffer 5 controls input/output of data such that it introduces write data supplied from outside of the EEPROM and outputs data read from the memory core portion 1A to the outside of the EEPROM. A write completion detecting circuit 18 detects whether or not writing of data has been completed in accordance with an output from the bit line controller 3C.

Figure 2:
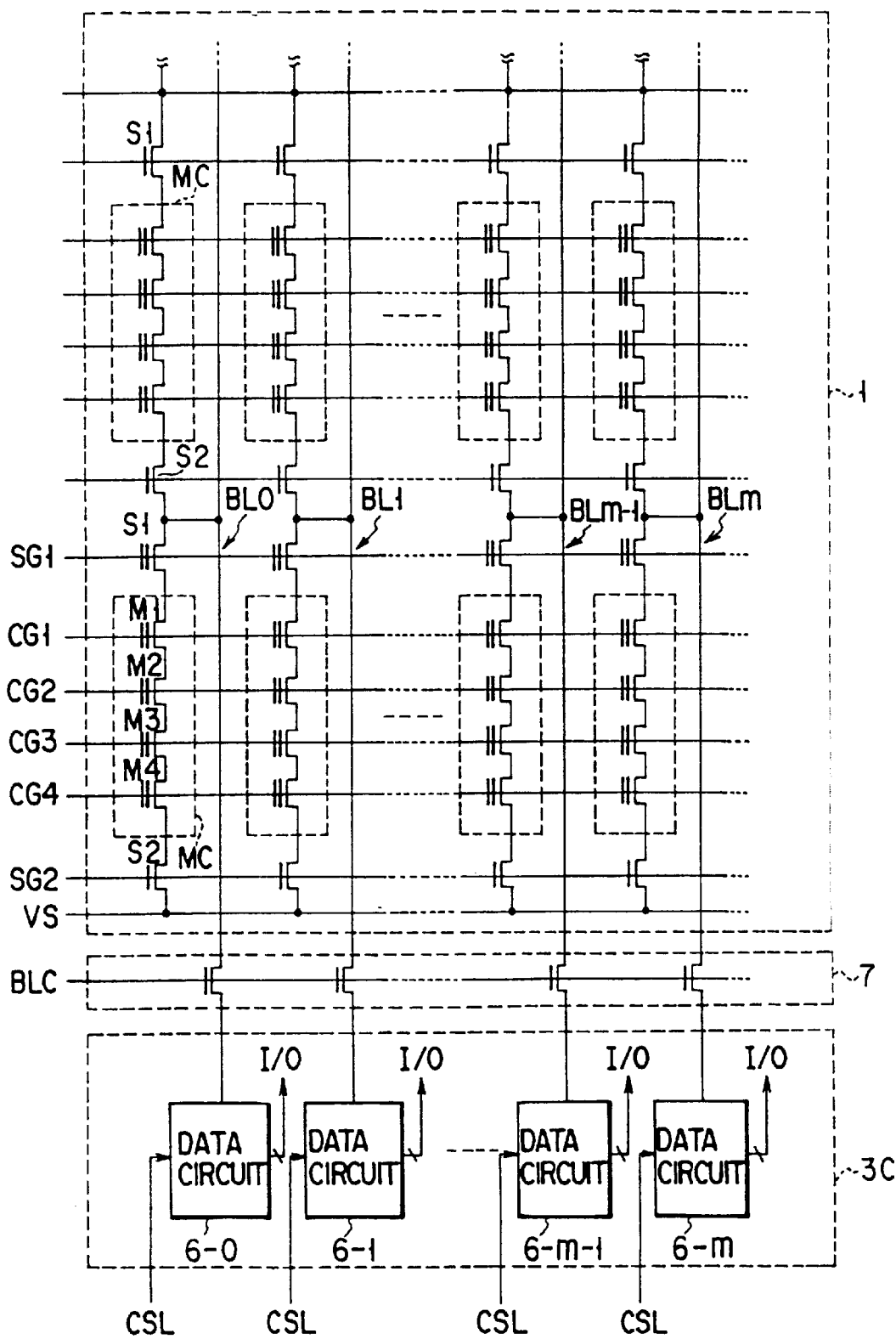
FIG. 2 is a diagram showing the structure of a memory cell array and a column-system circuit shown in FIG. 1.

FIG. 2 is a diagram showing the structure of the memory cell array 1 and the column-system circuit 3 (in particular, the bit line controller 3C) shown in FIG. 1.

As shown in FIG. 2, the memory cell array 1 has memory cells MC arranged in the matrix manner. The EEPROM according to this embodiment has a structure such that one cell MC includes a plurality of memory cell transistors M1 to M4 connected in series so that a NAND cell MC is formed. An end of the cell MC is connected to bit line BL0 to BLm through a selection transistor S1, while another end of the same is connected to a source line VS through a selection transistor S2. A group of the memory cell transistors M sharing the control gate CG forms a unit called a "page". Data is written and read simultaneously in page units. A group of memory cell transistors M connected to four control gates CG1 to CG4 forms a unit called a "block". The page and block respectively are selected by control gate/selection gate driver (not shown).

Data circuits 6-0 to 6-*m* respectively are connected between the bit lines BL0 to BLm and data input/output line I/O. The data circuits 6-0 to 6-*m* have means for temporarily storing data to be written in the memory cell and means for sensing and temporarily storing data read from the memory cell.

Figures 3A, 3B:
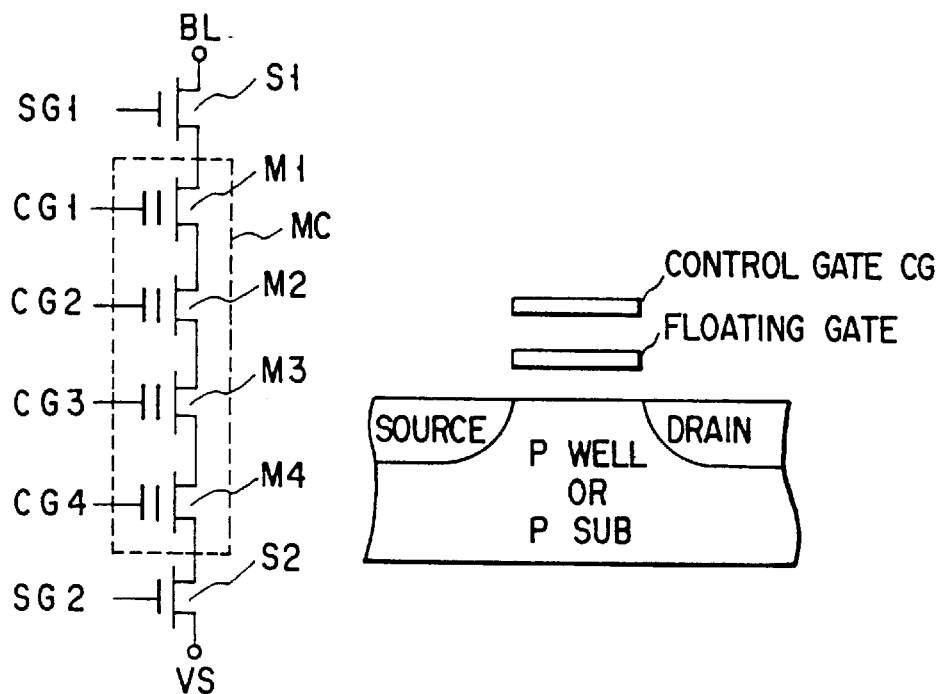
FIG. 3A is a circuit diagram showing the NAND cell shown in FIG. 2.
FIG. 3B is a cross sectional view showing the structure of the memory cell transistor.

The structure of the NAND cell shown in FIG. 2 will now be described. FIG. 3A is a circuit diagram, and FIG. 3B is a cross sectional view showing the structure of the memory cell transistor. The memory cell array 1 shown in FIG. 2 is formed on a p-type well or a p-type substrate. As shown in FIG. 3A, the NAND cells integrated in the memory cell array 1 are structured such that, for example, four memory cell transistors M1 to M4 are connected in series. An end of the cell MC is, through the selection transistor S1, connected to bit line BL, while another end of the same is connected to common source line VS through selection transistor S2. The gates of the transistors M1 to M4 respectively are connected to control gates CG1 to CG4.

As shown in FIG. 3B, one memory cell transistor M has a floating gate (a charge storage layer) and the control gate CG and stores data in accordance with the quantity of electrons stored in the floating gate. The quantity of the stored electrons can be read as the threshold voltage of the memory cell transistor.

The operation of the NAND cell MC shown in FIGS. 3A and 3B will now be described such that a case in which the memory cell transistor M2 is selected is taken as an example.

Figures 4A, 4B:
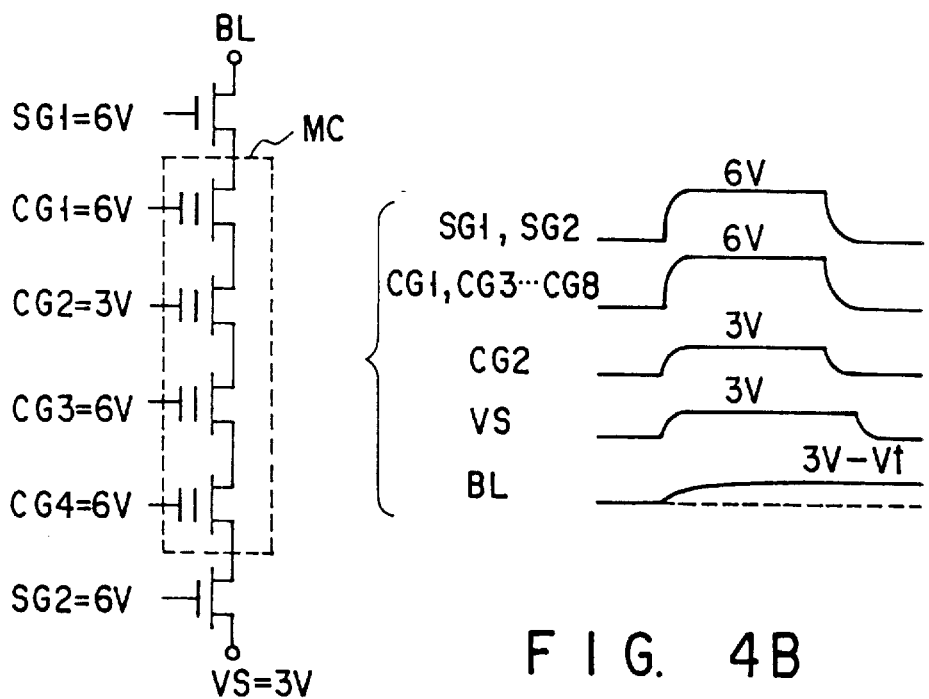
FIG. 4A shows a voltage input state when data is read from the NAND cell.
FIG. 4B is a graph showing waveforms of input voltages and waveforms of outputs appearing on the bit line.

The operation for reading data from the NAND cell MC will now be described. FIG. 4A shows a state where voltage is applied, and FIG. 4B is a graph showing waveforms of gate voltages of the transistors and waveforms of outputs appearing the bit lines.

Initially, the bit line BL is previously reset to 0V. After the resetting operation, the bit line BL is brought to a floating state. Then, voltages as shown in FIGS. 4A and 4B are applied to the NAND cell to read data. The bit line BL is electrically charged from the common source line VS through the selection transistors S1 and S2 and the memory cell transistors M1 to M4. The voltages of the selection gate and the control gate are controlled in such a manner that the potential of the charged bit line BL is determined in accordance with the threshold voltage of the memory cell transistor M.

In this example, while employing the waveforms shown in FIG. 4B, the selection gates SG1 and SG2 and the control gates CG1, CG3 and CG4 are set to be 6V, the selected control gate CG2 is set to be 3V and the common source line VS is set to be 3V. As a result, voltage obtained by subtracting the threshold voltage of the memory cell transistor M2 from the voltage of the control gate CG2 appears at the selected control gate BL.

An example of the threshold voltage of the memory cell transistor M is as follows: the threshold voltage is −2V when data "1" has been stored, the threshold voltage is 1V when data "2" has been stored, the threshold voltage is 2V when data "3" has been stored, and the threshold voltage is 3V when data "4" has been stored.

Figure 5:
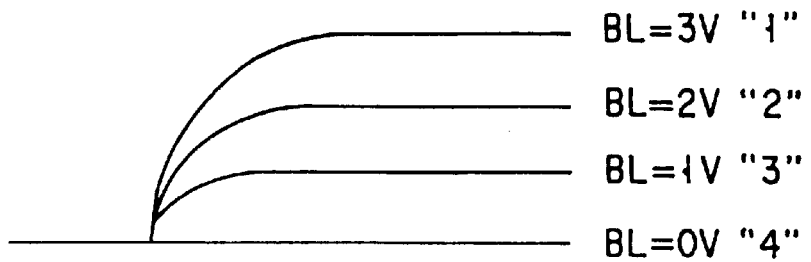
FIG. 5 is a graph showing a state of voltages on the bit line.

In this case, when data is read, voltage of 3V appears at the bit line BL when the memory cell transistor M2 has stored data "1", voltage of 2V appears when the same has stored data "2", voltage of 1V appears when the same has stored data "3" and voltage of 0V appears when the same has stored data "4", as shown in FIG. 5.

Figure 6:
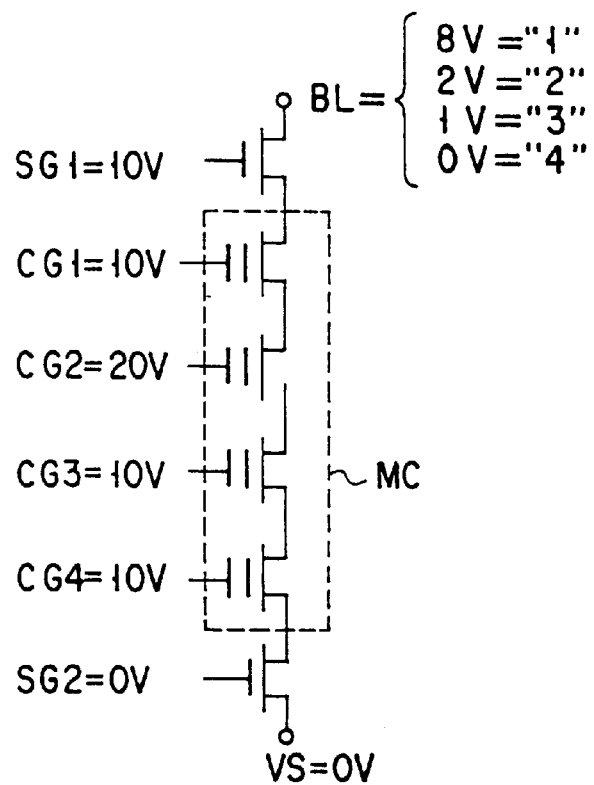
FIG. 6 shows a state of voltage input when data is written in the NAND cell.

FIG. 6 is a diagram showing a state where voltage is applied when data is written in the NAND cell shown in FIGS. 3A and 3B.

Data is written such that voltage corresponding data as shown in FIG. 6 is applied to the bit line BL to raise the voltage of each of the selection gate SG1 and control gates CG1 and CG3 to CG4 to 10V, that of the selected control gate CG2 to 20V and that of each of the control gate SG2 and the common source line VS to be 0V. The bit line BL is applied with voltage corresponding to data to be written such that 8V is applied when data "1" is written, 2V is applied when data "2" is written, 1V is applied when data "3" is written and 0V is applied when data "4" is written.

When data "4" is written, the difference of the potential between the control gate CG of the memory cell transistor M and the channel of the same is increased to 20V so that the well-known tunnel current causes electrons to be injected from the channel into the floating gate so that the threshold voltage of the memory cell transistor M is considerably shifted in a direction toward positive-levels. As a result, the threshold voltage of the memory cell transistor M is made to be, for example, 3V. When data "3" is written or when data "2" is written, the difference in the potential between the control gate CG2 and the channel is made to be smaller as compared with the difference in the potential when Data "4" is written. Therefore, the quantity of electrons to be injected into the floating gate is reduced. Thus, the threshold voltage is made to be, for example, 2V and 1V.

When data "1" is written, the difference in the potential between the control gate CG2 and the channel is made to be a low voltage of 12V. In this case, any tunnel current does not flow, thus causing the threshold voltage of the memory cell transistor M to be maintained in the state where data has been erased.

Data is erased by making the voltage of each of the control gate CG1 to CG4 to be 0V, while the p-type well or the p-type substrate is applied with 20V. As a result, a tunnel current flows in a direction opposite to the direction when data is written. As a result, electrons are discharged from the floating gate to the p-type well or the p-type substrate. An example of the threshold voltage of the memory cell transistor M in the state where data has been erased is, for example, –2V.

The details of a data circuit 6 shown in FIG. 2 will now be described with reference to FIG. 7. FIG. 7 shows the structure in a case where four-level data is stored.

As shown in FIG. 7, the data circuit 6 has first and second sense amplifiers 6A1 and 6A2 for detecting data in the memory cell transistor appeared on the bit line BL so as to amplify above data, first and second data latches 6B1 and 6B2 for storing data to be written in the memory cell transistor, and first and second verify circuits 6C1 and 6C2 for detecting whether or not writing into the cell has been performed sufficiently in accordance with data detected by the first and second sense amplifiers 6A1 and 6A2 and data stored in the first and second data latches 6B1 and 6B2 at the time of verification to generate data to be written next so as to transfer generated data to the first and second data latches 6B1 and 6B2. Moreover, the data circuit 6 has a write circuit 6D for supplying data, to be written into the cell, to the bit line BL as voltage in accordance with the cell of the first and second data latches 6B1 and 6B2.

One-bit data is communicated between outside of the chip and the data circuit 6 through first and second data input/output lines respectively so that data in a quantity of two bits is communicated.

Data is read from the first and second sense amplifiers 6A1 and 6A2 to the outside of the chip through the corresponding first and second data input/output lines. When a writing operation is performed, data is supplied from the outside of the chip to the first and second data latches 6B1 and 6B2 through the first and second data input/output lines.

The sense amplifier 6A1 is supplied with second reference voltage serving as reference voltage for detecting data. The sense amplifier 6A2 is supplied with either the first reference voltage or the third reference voltage which is selectively switched in accordance with the content of the sense amplifier 6A1 or the first data latch 6B1.

The operation will now be described.

Initially, a reading operation will now be described.

Any one of four-level data "1", "2", "3" or "4" is read from the memory cell transistor M selected by the word line (the control gate). In accordance with read four-level data, any one of voltages 3V, 2V, 1V or 0V appears at the bit line BL. Read data which has appeared at the bit line BL is supplied to both of the first and second sense amplifiers 6A1 and 6A2.

Initially, the sense amplifier 6A1 is operated. The sense amplifier 6A1 is supplied with the second reference voltage (=1.5V) as the reference voltage. Read data is compared with the second reference voltage by the sense amplifier 6A1. If read data is "1" or "2", the voltage is higher than the second reference voltage. Therefore, the sense amplifier 6A1 detects "H" level and amplifies the same.

If data is "3" or "4", the voltage is lower than the second reference voltage. Therefore, the sense amplifier 6A1 detects "L" level and amplifies the same.

Then, the sense amplifier 6A2 is operated.

If the output from the sense amplifier 6A1 is "H", then the sense amplifier 6A2 is supplied with the first reference voltage (=2.5V) as the reference voltage. If data is "1", the voltage is higher than the first reference voltage, the sense amplifier 6A2 detects "H" level and amplifiers the same. If data is "2", the voltage is lower than the first reference voltage. Therefore, the sense amplifier 6A2 detects "L" and amplifies the same.

If the output from the sense amplifier 6A1 is "L", the sense amplifier 6A2 is supplied with the third reference voltage (=0.5V) as the reference voltage. If data is "3", the voltage is higher than the third reference voltage. Therefore, the sense amplifier 6A2 detects "H" and amplifies the same. If data is "4", the voltage is lower than the third reference voltage. Therefore, the sense amplifier 6A2 detects "L" and amplifies the same.

As described above, the four-level data "1", "2", "3" and "4" expressed as the voltage levels on one bit line BL are expressed by two bits as "H, H", "H, L", "L, H" and "L, L" in accordance with the output level from the sense amplifier 6A1 and that from the sense amplifier 6A2. Thus, four-level data which has appeared on one bit line BL is converted into two-bit binary data. Two-bit binary data is read to the outside of the chip through the first and second data input/output lines.

Then, a writing operation will now be described.

Two-bit binary data is, through first and second data input/output lines, supplied to the first and second data latches 6B1 and 6B2. Then, the contents of the first and second data latches 6B1 and 6B2 are supplied to the write circuit 6D.

FIG. 8 is a circuit diagram showing an example of the write circuit 6D.

In synchronization with write signal WRT, the write circuit shown in FIG. 8 applies, to the bit line BL, four-level data "1"=8V, "2"=2V, "3"=1V and "4"=0V to correspond to the output levels from the first data latch 6B1 and the data latch 6B2 to correspond to two-bit data "L, L", "L, H", "H, L" and "H, H".

High voltage of, for example, 20V is applied to the selected word line. In accordance with the voltage of the bit line BL, electrons are injected into the floating gate so that writing proceeds. If data is "1", injection of electrons is not performed and thus the threshold voltage of the cell is not changed.

In order to accurately write data, that is, in order to distribute threshold voltages in a narrowest voltage range, a verifying operation is performed after data has been written. The foregoing operation is repeatedly performed. In order to improve the accuracy, verification is performed for each bit to enable data to be written optimally in each bit.

The verifying operation will now be described.

Initially, the bit line BL is reset to 0V similarly to the reading operation. Then, the voltage of the column selection line is made to be 3V, and the word line (the control gate) is also applied with 3V. If a margin is given to the threshold voltage after data has been written, it is preferable that the voltage of the word line (the control gate) is set to be a slightly lower level as compared with that when data is read, for example, 2.8V.

Voltage corresponding to the writing operation appears at the bit line BL so as to be applied to the first and second sense amplifiers 6A1 and 6A2. When the verifying operation is performed, the sense amplifier 6A2 is first operated. Whether the first reference voltage is applied to the sense amplifier 6A2 or the third reference voltage is applied to the same is determined in accordance with the content of first data latch 6B1. If the output from the first data latch 6B1 is "L", the data latch 6B2 is supplied with the first reference voltage (=2.5V). If the output from the data latch 6B2 is "H", the third reference voltage (=0.5V) is applied to the sense amplifier 6A2.

Then, the sense amplifier 6A2 is operated.

If the content of the data latch 6B2 is "H", that is, write data is "2" or "4", the sense amplifier 6A2 makes a reference to the first reference voltage or the third reference voltage similarly to the reading operation to detect the voltage of the bit line BL and amplifies the voltage. If the output from the sense amplifier 6A2 is "H", it is determined that writing of data "2" or "4" is insufficient. In this case, the sense amplifier 6A1 is not operated but the writing operation is again performed. If the output from the sense amplifier 6A2 is "L", it is determined that writing of data "2" or "4" has been performed sufficiently.

If the content of the data latch 6B2 is "L", that is, if the write data is "1" or "3", the output from the sense amplifier 6A2 is forcibly made to be "L".

When the output from the sense amplifier 6A2 is forcibly made to be "L", determination of the degree of writing of data "3" is not performed. To overcome this, the sense amplifier 6A1 is then operated.

If the content of the first data latch 6B1 is "H", that is, write data is "3" or "4", the sense amplifier 6A1 makes a reference to the second reference voltage similarly to the reading operation to detect the voltage of the bit line BL and amplifies the same. If the output from the sense amplifier 6A1 is made to be "H", it is determined that writing of data "3" is insufficient. In this case, the writing operation is again performed. If the output from the sense amplifier 6A1 is "L", a determination that writing of data "3" has been performed sufficiently is performed.

If the content of first data latch 6B1 is "L", that is, if write data is "1" or "2", the output from the sense amplifier 6A1 is forcibly made to be "L".

If a determination has been performed that writing of data "2", "3" or "4" is insufficient, two-bit data "L, H", "H, L" and "H, H", which are the same as those before writing are stored by the first data latch 6B1 and the data latch 6B2. When next writing is performed, a writing operation similar to the previous operation is performed.

If data "1" is written, that is, if the threshold voltage of the memory cell transistor is not changed and if determination is performed that writing of data "2", "3" or "4" has been sufficiently written, data "L, L" is stored in the first data latch 6B1 and second data latch 6B2 to prevent change of the threshold voltage when next writing is performed.

Each of the writing operation and the verifying operation is simultaneously performed for a plurality of memory cells. If a memory cell to which data has been written insufficiently exists, writing and verification are repeatedly performed. When writing to all of the memory cells has been completed (when writing has been performed sufficiently), the write completion detecting circuit 18 detects the completion and interrupts the writing operation. If a memory cell, to which data has not been sufficiently written, exists even after the writing or verifying operation has been repeated by a predetermined number of times, it is determined that writing bas been failure and the writing operation is ended.

The multilevel storing NAND type EEPROM having the verifying means for each bit according to the first embodiment is able to limit the number of each of the data latching circuits, the sense amplifiers and the verifying circuits to "m" when it is assumed that the number of the multilevel data is "n" ($n=2^m$ and $m=\log_2 n$ (m is a natural number not smaller than 2)). Therefore, if it is assumed that the number of multilevel data items is "n", the conventional structure requires (n−1) data latch circuits, sense amplifiers and verifying circuits. However, the present invention is able to considerably reduce the number of the foregoing circuits.

Specifically, if it is assumed that the number of multilevel data items is 4, the conventional apparatus requires 4−1=3 sets of data latch circuits, sense amplifiers and verifying circuits. However, the apparatus according to the first embodiment is able to reduce the number to $\log_2 4=2$ sets. Therefore, the size of the column-system circuit can be reduced because the number of the sense amplifiers and the sense amplifiers can be decreased. As a result, a highly integrated circuit can be realized.

Moreover, the number "m" of the data latch circuits and the sense amplifiers can be made to be the same as the number of bits of the data input/output lines to be connected to the data latch circuits and the sense amplifiers. At this time, one bit data is assigned to each of "m" data latch circuits and sense amplifiers. As a result, the structure of the circuit can be simplified. Since the simplified circuit structure realizes a basic component of a multilevel storing semiconductor memory device, the function and performance can be improved.

It is preferable that "m" data latch circuits and sense amplifiers be assigned in the descending order from the first data bit to the m-th bit which is the least significant bit. When the foregoing structure is employed, data is read from the memory cell transistor such that the operation is started at the first data latch/sense amplifier toward the m-th data latch/sense amplifier assigned to the least significant m-th bit. The foregoing structure attains an effect that the numbers of the data latches and sense amplifiers can easily be increased when the number of bits is sequentially increased as, for example, "3", "4", . . . , to correspond to the increase.

In the above-mentioned embodiment, the number of bits is "2". Thus, the first data latch 6B1 and the sense amplifier 6A1 assigned to the first bit which is the most significant bit, subject read data to a comparison with the second reference voltage. A result of the comparison representing whether read data is higher or lower than the second reference voltage is initially output. In accordance with the above output, the level of the reference voltage to be applied to the data latch 6B2 and the sense amplifier 6A2 assigned to the second bit is switched to the first or third reference voltage to output a result of a comparison representing whether the read data is higher than the first reference voltage or the third reference voltage. As described above, each data item of four-level data respectively are identified and four-level data is converted into two-bit data.

When the number of bits has been increased to "3", a basic structure is employed in which the operation is performed from the most significant bit to the least significant bit. Initially, read data is subjected to a comparison with the fourth reference voltage by the first data latch/sense amplifier assigned to the first bit, which is the most significant bit. Then, a result of the comparison representing whether or not read data is higher than the fourth reference voltage is output. In accordance with the output, the level of the reference voltage to be applied to the second data latch/sense amplifier assigned to the second bit, which is the next bit, is switched to the second reference voltage or the sixth reference voltage. A result of a comparison representing whether read data is higher or lower than the second reference voltage or the fourth reference voltage is output. In accordance with the output, the level of the reference voltage to be applied to the third data latch/sense amplifier assigned to the third bit, which is the next bit, is switched to any one of the first reference voltage, the third reference voltage, the fifth reference voltage or the seventh reference voltage. As a result, eight-level data can be identified and 8-level data can be converted into 3-bit data.

When data is read from the memory cell to perform verification, "m" data latches and sense amplifiers are operated such that the operation proceeds from the m-th data latch/sense amplifier assigned to the m-th bit, which is the least significant bit, toward the first bit, which is the most significant bit. The foregoing structure realizes the structure of a circuit capable of protecting data for setting the reference voltage, that is, write data, from being destroyed by the verifying operation. Therefore, a result of the verification can be determined by using the data latch and the sense amplifier which are latching the same write data item.

Moreover, m-bit and n-level read data and m-bit and n-level write data are given by different data items. As a result, a structure can be provided in which comparison of write data latched by the data latch and the sense amplifier with read data enables a result of the verification to be detected.

A method of determining a result of validity determination of the verification by the structure according to this embodiment will briefly be described. Write data and read data latched by the data latch and the sense amplifier are subjected to a comparison. If write data is changed by the read data, it is determined that the result of the verification is valid.

Moreover, the above-mentioned embodiment has a structure such that the verifying circuit is controlled to be turned on or off with write data latched by the data latch and the sense amplifier. As a result, an effect can be obtained in that the size of a circuit for controlling the verifying circuit can be reduced. Moreover, the verifying circuit can be turned off immediately after write data latched by the data latch and the sense amplifier has been changed. Therefore, the verifying circuit can precisely be controlled and thus the operation speed of the verifying circuit can be raised. Thus, possibility of overwriting caused from, for example, slow operation of the verifying circuit can be lowered.

When the embodiment having the above-mentioned structure is formed such that the number of bits of the data input/output lines, the number of bits of write data to be supplied from outside of the apparatus to the inside portion of the apparatus and the number of bits of read data to be output from the apparatus to the outside of the apparatus are made to be the same, a structure can be realized with which a circuit for converting the number of bits can be omitted. If the circuit for converting the number of bits can be omitted, both of higher integration and high speed input/output operation can be achieved.

The foregoing structure can as well as be achieved by an arrangement in which the circuit for converting the number of bits is formed into a precise structure capable of operating at high speed. However, a structure for realizing a further precise circuit for converting the number of bits capable of operating at higher speed encounters a problem of noise generated in the integrated circuit. If the circuit for converting the number of bits is affected by noise above, there arises a risk that data can erroneously be converted. That is, there arises a risk that the satisfactory reliability of the present circuit for converting the number of bits deteriorates. In view of the foregoing, it is preferable that the circuit for converting the number of bits be omitted from the structure in the future. The NAND type EEPROM according to this embodiment has a structure with which the circuit for converting the number of bits can be omitted.

The above-mentioned embodiment may be modified such that the number of bits of write data is not converted and supplied from outside of the apparatus into the data latch and the sense amplifier. Moreover, the number of bits of read data is not converted and output to the outside of the apparatus. As a result of employment of the above-mentioned structure, a multilevel storing NAND type EEPROM can be obtained which is capable of realizing high degree of integration and high speed input/output operation with satisfactory reliability.

Other embodiments of the present invention will now be described. Elements in the following embodiments which are the same as those according to the first embodiment are given the same reference numerals and the same elements are omitted from detailed description.

(Second Embodiment)

A second embodiment of the present invention will now be described in which the structure of the bit line controller 3C is modified.

Figure 9:
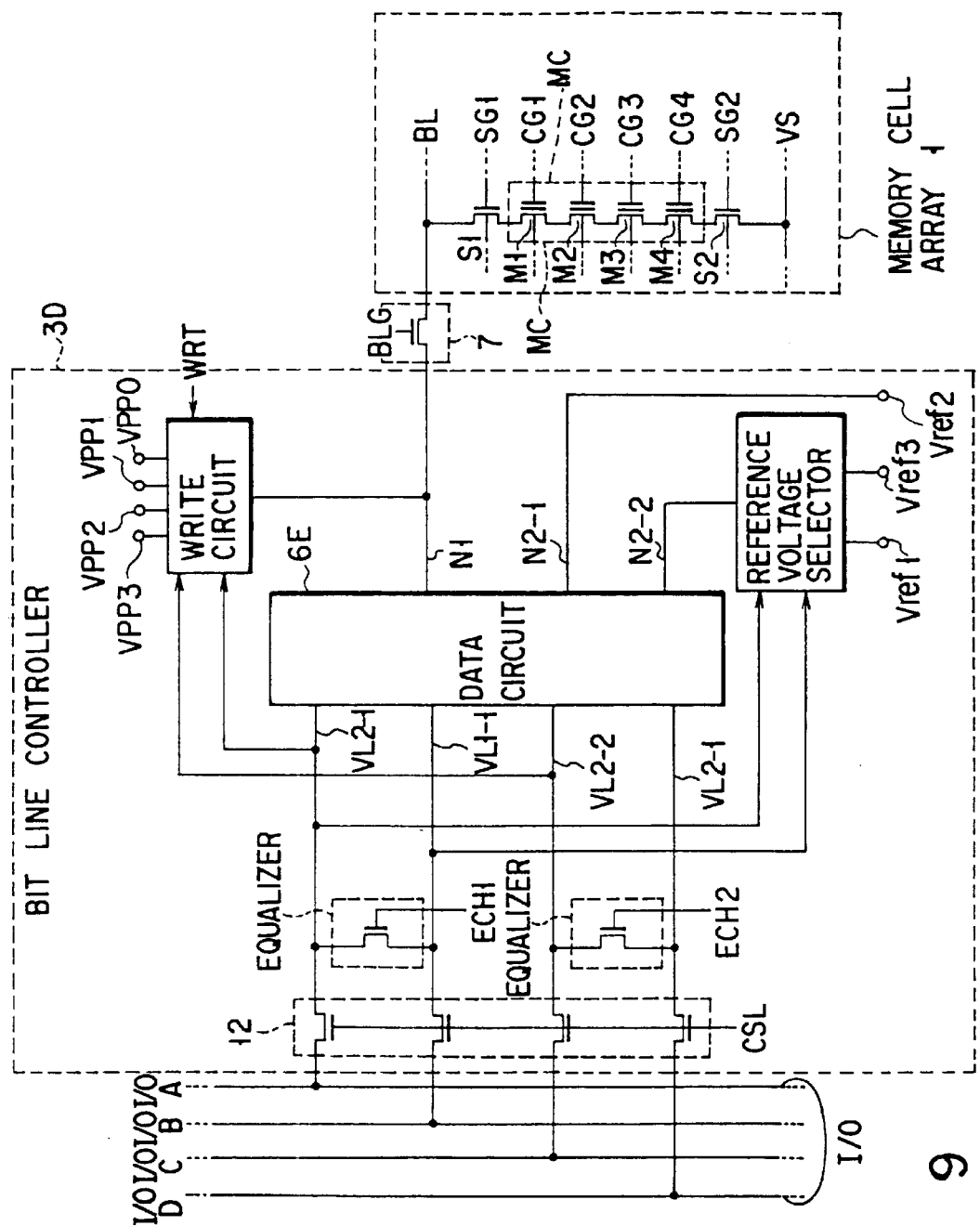
FIG. 9 is a diagram showing the structure of a NAND type EEPROM according to a second embodiment of the present invention.

FIG. 9 is a diagram showing the structure of a NAND type EEPROM according to the second embodiment. FIG. 10 is a circuit diagram showing bit line controller 3D shown in FIG. 9. FIG. 11 is a circuit diagram showing a flip-flop circuit 14-1 shown in FIG. 10. FIG. 12 is a circuit diagram showing the flip-flop circuit 14-2 shown in FIG. 10.

As shown in FIG. 9, the bit line controller 3D established the connection between a two-bit (data input/output lines I/OA and I/OB form a one bit line and data input/output lines I/OC and I/OD form a one bit line) data input/output line I/O and a bit line BL. Moreover, a column gate circuit 12 having a gate for receiving column selection signal CSL is connected between a data circuit 6E and the data input/output line I/O in the bit line controller 3D. The data circuit 6E is connected to the data input/output line I/O when it is selected in response to the column selection signal CSL. A transfer gate circuit 7 having a gate for receiving transfer gate drive signal BLC is connected between the data circuit 6E and the bit line BL. The data circuit 6E is connected to the bit line BL when the transfer gate drive signal BLC is "H" level.

As shown in FIG. 10, the data circuit 6E includes two flip-flop circuits 14-1 and 14-2. The first flip-flop circuit 14-1 has two nodes VL1-1 and VL2-1. The nodes VL1-1 and VL2-1 respectively are connected to the data input/output lines I/OB and I/OA. Similarly, the second flip-flop circuit 14-2 has two nodes VL1-2 and VL2-2. The nodes VL1-2 and VL2-2 respectively are connected to the data input/output lines I/OD and I/OC.

As shown in FIGS. 11 and 12, each of the flip-flop circuits 14-1 and 14-2 is formed of transistors Q1-1 to Q6-1 and Q1-2 to Q6-2.

The flip-flop circuit 14-1 forms the first data latch 6B1 and sense amplifier 6A1 shown in FIG. 7 so that the flip-flop circuit 14-1 serves as the sense amplifier 6A1 when data is read and as the data latch 6B1 when data is written. Similarly, the flip-flop circuit 14-2 form the data latch 6B2 and the sense amplifier 6A2 shown in FIG. 7. When data is read, the flip-flop circuit 14-2 serves as the sense amplifier 6A2. When data is written, the flip-flop circuit 14-2 serves as the data latch 6B2.

The first node VL1-1 of the flip-flop circuit 14-1 is connected to a node N2-1 of the data circuit 6E through a transistor Q7-1 having a gate for receiving drive signal RV1 and a transistor Q9-1 having a gate for receiving drive signal LH1. The node N2-1 is supplied with second reference voltage Vref2. The second node VL2-1 of the flip-flop circuit 14-1 is connected to a node N1 of the data circuit 6E through a transistor Q8-1 having a gate for receiving the drive signal RV1 and a transistor Q10-1 having a gate for receiving the drive signal LH1. The node N1 is connected to the bit line BL through the transfer gate circuit 7.

The first node VL1-2 of the flip-flop circuit 14-2 is connected to node N2-2 of the data circuit 6E through a transistor. Q7-2 having a gate for receiving the drive signal RV2 and a transistor Q9-2 having a gate for receiving the drive signal LH2. The node N2-2 is supplied with first reference voltage Vref1 or third reference voltage Vref3. The second node VL2-2 of the flip-flop circuit 14-2 is connected to a node N1 of the data circuit 6E through a transistor Q8-2 having a gate for receiving the drive signal RV2 and a transistor Q10-2 having a gate for receiving the drive signal LH2.

A first verifying circuit 16-1 is connected between a node VN2-1 between the transistor QB-1 and the transistor Q10-1 and a node VL1-1. The first verifying circuit 16-1 includes a transistor Q11-1 having a gate for receiving a verifying signal VRFY1 and a transistor Q12-1 having a gate connected to the node VL1-1. The transistor Q11-1 and the transistor Q12-1 are, in series, connected to each other and are connected between a low-potential power source (ground potential Vss) and the node VN2-1.

A second verifying circuit 16-2 is connected between the node VN2-2 between the transistor Q8-2 and the transistor Q10-2 and the node VL1-2. The second verifying circuit 16-2 includes a transistor Q11-2 having a gate for receiving verifying signal VRFY2 and a transistor Q12-2 having a gate connected to the node VL1-2. The transistor Q11-2 and the transistor Q12-2 are, in series, connected to each other and connected between the lower potential power source (ground potential Vss) and the node VN2-2.

The operation will now be described.

FIG. 13 is a waveform showing the operation which is performed when data is read.

When data is read, the flip-flop circuits 14-1 and 14-2 respectively act as sense amplifiers. Prior to reading data, the nodes VL1-1, VL2-1, VL1-2, VL2-2, VN1-1, VN2-1, VN1-2 and VN2-2 of the flip-flop circuits 14-1 and 14-2 are initialized to a voltage level between the power source potential Vcc and the ground voltage Vss. Note that the initializing circuit is omitted from illustration. One word line defined in accordance with a supplied address signal is activated so that data is output from a selected memory cell transistor to the bit line BL so that the bit line BL is electrically charged. The bit line is charged with 3V when data "1" has been output, 2V when data "2" has been output, 1V when data "3" has been output and 0V when data "4" has been output.

The flip-flop circuit 14-1 is applied with 1.5V as the second reference voltage Vref2. The flip-flop circuit 14-2 is applied with either 0.5V as the first reference voltage Vref1 or 2.5V as the third reference voltage Vref3. The first reference voltage Vref1 and the third reference voltage Vref3 are switched in accordance with a result of the detection performed by the flip-flop circuit 14-1, as described in the first embodiment. Note that the selector is omitted from illustration.

The level of the drive signal LH1 is raised to "H" level at a similar timing as that of the word line so that the voltage of the bit line BL is transferred to the nodes VN2-1 and VL2-1. The second reference voltage Vref2 is transferred to the nodes VN1-1 and VL1-1. When the transfer has been completed, the level of the drive signal LH1 is lowered to "L" level so that the flip-flop circuit 14-1 is separated from the bit line and the second reference voltage Vref2. Then, sense-amplifier activating signal SAN1 and (reverse) SAP1 are supplied to activate the flip-flop circuit 14-1 so that a data sense-amplifying operation is started. As a result, the voltage of the bit line BL transmitted to the node VL2-1 and the second reference voltage Vref2 transmitted to the node VL1-1 are subjected to a comparison. Thus, the states of the nodes VL1-1 and VL2-1 are determined to be either "H, L" or "L, H".

Then, based on the result of detection performed by the flip-flop circuit 14-1, the first reference voltage Vref1 and the third reference voltage Vref3 are switched.

Then, the flip-flop circuit 14-2 is operated. Initially, the level of the drive signal LH2 is raised to "H" level similarly to the foregoing operation so that the voltage of the bit line BL is transmitted to the nodes VN2-2 and VL2-2. When each transfer has been completed, the level of the drive signal LH2 is lowered to "L" level so that the flip-flop circuit 14-2 is separated from the bit line BL and reference voltage Vref1 or Vref3. Then, sense-amplifier activating signal SAN2 and (reverse) SAP2 are supplied so that the flip-flop circuit 14-2 is activated and the operation for sense-amplifying read data is started. As a result, the voltage of the bit line BL transmitted to the node VL2-2 and the reference voltage Vref1 or Vref3 transmitted to the node VL1-2 are subjected to a comparison. Thus, the states of the nodes VL1-2 and VL2-2 are determined to be either "H, L" or "L, H".

FIG. 15 is a table showing the states of the nodes VL1-1, VL2-1, VL1-2 and VL2-2 of the sense amplifier (the flip-flop) after four-level data has been read. As shown in FIG. 15, read data is transferred to the data input/output circuit 5 through the data input/output line I/O so as to be read to the outside of the chip.

Figure 14:
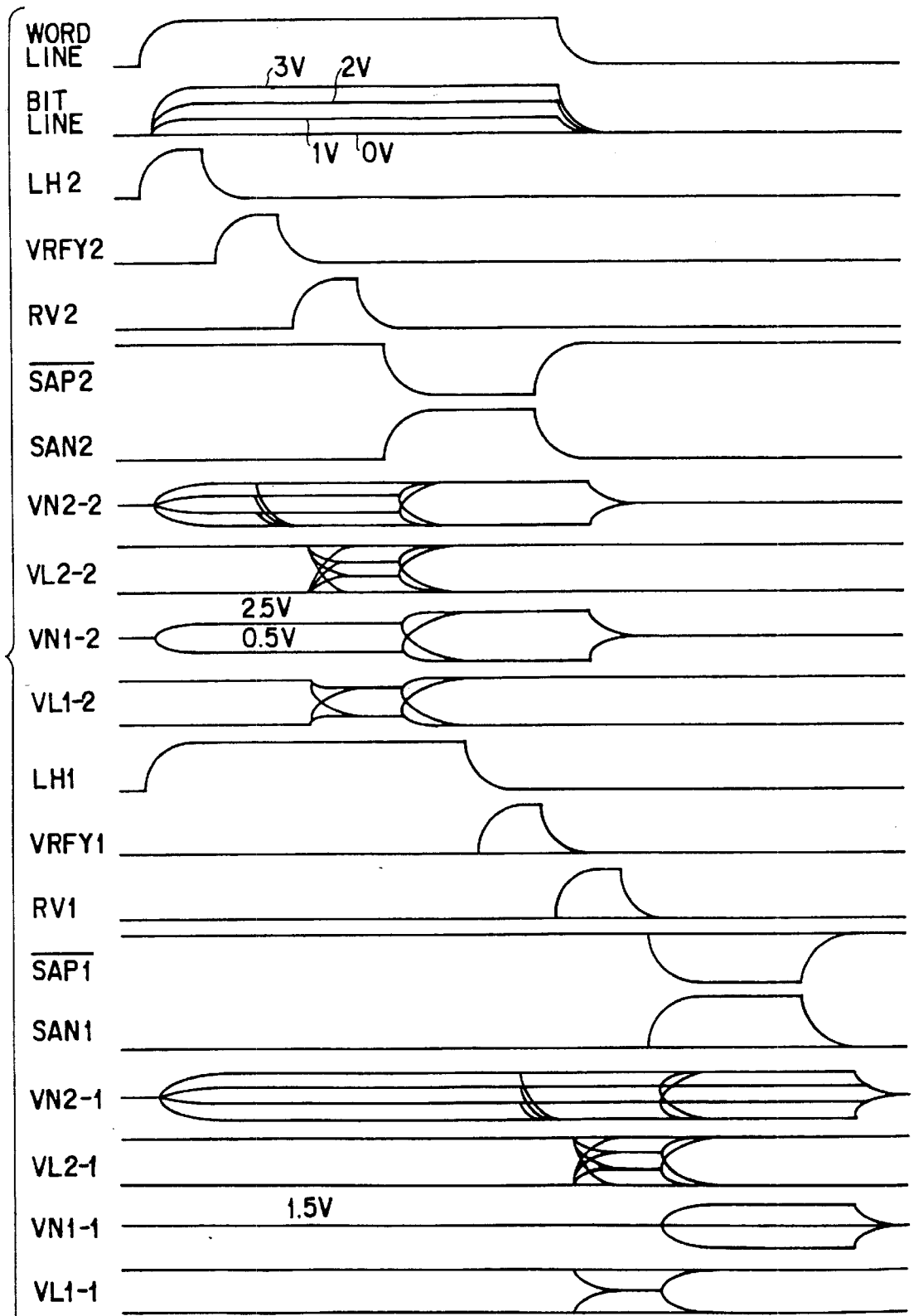
FIG. 14 is an operation waveform showing a data writing operation.

FIG. 14 is a waveform showing the operation which is performed when data is written.

When data is written, the flip-flop circuits 14-1 and 14-2 respectively act as data latches. Similarly, data supplied from outside of the chip to the data circuit 6E is transferred to the nodes VL1-1, VL2-1, VL1-2 and VL2-2 through the data input/output line I/O.

FIG. 16 is a table showing states of nodes VL1-1, VL2-1, VL1-2 and VL2-2 when four-level data is written. Data supplied to the nodes VL1-1, VL2-1, VL1-2 and VL2-2 is transferred to the writing circuit shown in FIG. 8 so that voltage corresponding to above data, for example, 8V, 2V, 1V and 0V to the bit line BL. Then, the foregoing write voltage is applied to the memory cell transistor selected in response to the address signal so that data is written in the memory cell transistor. In order to narrow the distribution of the threshold voltage of the memory cell transistor after data has been reference numeral, writing is repeatedly performed in each small quantity. Moreover, the verifying operation is performed between the writing operations.

The verifying operation is performed similarly to the reading operation except for an operation for modifying the voltage of the bit line BL transferred to the nodes VN2-1 and VN2-2 in accordance with write data latched by the flip-flop circuits 14-1 and 14-2.

Referring to FIG. 10, the verifying operation will now be described.

The flip-flop circuits 14-1 and 14-2 have latched write data. Prior to performing the verifying operation, the level of the each of the drive signals RV1 and RV2 is lowered to a low voltage level so as to make non-conductive the transistors Q7-1, Q7-2, Q8-1 and Q8-2 so as to separate the node VL1-1 and the node VN1-1 from each other, the node VL1-2 and the node VN1-2 from each other, the node VL2-1 and the node VN2-1 from each other, and the node VL2-2 and the node VN2-2 from each other.

Then, similarly to the reading operation, the word line is activated so that data is output from the selected memory cell transistor to the bit line BL. For example, 3V is charged to the bit line BL when data "1" has been output, 2V is charged when data "2" has been output, 1V is charged when data "3" has been output and 0V is charged when data "4" has been output. The reference voltage Vref2 to be supplied to the flip-flop circuit 14-1 is 1.5V. On the other hand, the flip-flop circuit 14-2 is supplied with either 0.5V as the reference voltage Vref1 or 2.5V as the reference voltage Vref3 in accordance with data latched by the flip-flop circuit 14-1. When data in the nodes VL1-1 and VL1-2 is "H, L", Vref3 is applied. When data in the nodes VL1-1 and VL1-2 is "L, H", Vref1 is applied.

At a similar timing to that of the word line, the level of the drive signal LH2 is raised to "H" level so that the voltage of the bit line BL is transmitted to the node VN2-2 and either the reference voltage Vref1 or Vref3 is transmitted to the node VN1-2. After each transfer has been completed, the level of the signal LH2 is lowered to "L" level so that the flip-flop circuit 14-2 is separated from the bit line BL and the reference voltage Vref1 or Vref3.

Then verify signal VRFY2 is supplied to modify the voltage output to the node VN2-2 in accordance with latched data. Therefore, the level of the verify signal VRFY2 is raised to high voltage to make conductive the transistor Q11-2. If data latched by the nodes VL1-2 and VL2-2 is "H, L" at this time, also the transistor Q12-2 is made conductive so that the node VN2-2 is electrically discharged to the ground voltage. If data 1 to the nodes VL1-2 and VL2-2 is "L, H", the transistor Q12-2 is non-conductive and the voltage of the node VN2-2 transferred from the bit line BL is not changed.

Then, sense-amplifying activating signal SAN2 and (reverse) SAP2 are supplied to activate the flip-flop circuit 14-2 so as to start the operation for sensing and amplifying read data. As a result, the voltage of the bit line BL transmitted to the node VL1-2 and the reference voltage Vref1 or Vref3 transmitted to the node VL1-1 are subjected to a comparison so that the states of the nodes VL1-2 and VL2-2 are determined to be either "H, L" or "L, H". The foregoing states are latched as data to be written next.

If the states of the nodes VL1-2 and VL2-2 of the flip-flop circuit 14-2 is "H, L" after the sensing operation has been completed in a state where the reference voltage is 2.5V (Vref3), it means that write data is "1" or "2" and required writing has been performed.

Then, operation is shifted to the operation of the flip-flop circuit 14-1. Since the node VL1-1 of the flip-flop circuit 14-1 is "H" level, the node VN2-1 is electrically discharged to the ground voltage when the verifying signal VRFY1 has been supplied. Therefore, after the operation has been started, the flip-flop circuit 14-1 is brought to a state in which the nodes VL1-1 and VL2-1 are "H, L". Thus, it is determined that writing of write data "1" (since writing is not performed when data is "1", no comparison between read data and the reference voltage Vref2 is performed and completion of written is determined) and write data "2" have been completed. At this time, data in the flip-flop circuits 14-1 and 14-2 is made to be "H, L" for all of the nodes VL1-1, VL2-1, VL1-2 and VL2-2.

When the state of the flip-flop circuit 14-2 is such that the nodes VL1-2 and VL2-2 are "L, H" after the sensing operation has been performed in a state where the reference voltage is 2.5V (Vref3), it is determined that write data "2" has not been written as desired. At this time, the flip-flop circuit 14-1 is not operated. Therefore, the nodes VL1-1 and VL2-1 of the flip-flop circuit 14-1 are maintained in "H, L" before the verification and the operation is shifted a next writing operation.

At this time, the states of the flip-flop circuits 14-1 and 14-2 are such that the nodes VL1-1 and VL2-1 are "H, L" and the nodes VL1-2 and VL2-2 are "L, H" so that data is the same as that before the writing operation.

If the state of the flip-flop circuit 14-2 is "H. L" after the sensing operation has been completed in a state where the reference voltage is 0.5V (Vref1), it means a fact that write data "3", or "4" has been written as desired.

Then, the operation is shifted to the operation of the flip-flop circuit 14-1. Since the node VL1-1 of the flip-flop circuit 14-1 is "L", the transistor Q12-1 is non-conductive even if the signal VRFY1 is supplied. Therefore, the voltage of the node VN2-1 is not changed and the voltage transferred from the bit line is maintained. Then, the sense-amplifying activation signal SAN1 and (reverse) SAP1 are supplied so that the sense amplifying operation is started. Data transmitted to the nodes VL2-1 and VL1-1 and the reference voltage Vref2 are subjected to a comparison so that the state of the nodes VL1-1 and VL2-1 is determined to be either "H, L" or "L, H". The state is latched as data to be written next.

When write data is "3" and data in the nodes VL1-1 and VL2-1 of the flip-flop circuit 14-1 is "H, L", it means a fact that required writing corresponding to data "3" has been performed. In the next rewriting cycle, no writing is performed. Then, data "H, L" in the nodes VL1-1 and VL2-1 and the nodes VL1-2 and VL2-2 is set to the flip-flop circuits 14-1 and 14-2. When data in the nods VL1-1 and VL2-1 of the flip-flop circuit 14-1 is "L, H", it means a fact that writing corresponding to data "3" is insufficient. Therefore, data "3" is written in the next rewriting cycle by setting data "L, H" in the node VL1-1 and VL2-1 and data "H, L" in the nodes VL1-2 and VL2-2 which are the same as those before writing to the flip-flop circuits 14-1 and 14-2.

When the state of the flip-flop circuit 14-2 is "L, H", it means a fact that write data is "4" and writing is insufficient. At this time, the flip-flop circuit 14-1 is not operated and data in the flip-flop circuits 14-1 and 14-2 is maintained at data in the nodes VL1-1 and VL2-1, that is, data (="L, H") in the nodes VL1-2 and VL2-2. Then, shift to the writing operation is again performed.

FIG. 17 is a table showing states of the nodes VL1-1, VL2-1, VL1-2 and VL2-2 during verification of four-level data.

The foregoing operation loop consisting of writing of data, verification reading of data, and data writing operation is repeated until data is sufficiently written in all of the selected memory cell transistors. If cell, to which data has not been satisfactorily written, exists, the chip is determined to be a defective chip and the writing operation is ended.

If data has sufficiently be written in the memory cell, data of both of the flip-flop circuits 14-1 and 14-2 is made to be data in the nodes VL1-1 and VL2-1, that is, data in nodes VL1-2 and VL2-2, that is, "H, L". Thus, a writing completion signal is supplied to the write completion detecting circuit 18 to complete the writing operation.

If a cell, to which data has not been sufficiently written, exists after writing has been repeated by a predetermined number of times, a circuit (not shown) for counting the number of writing times transmits a signal denoting this to the detection circuit. Then, the write completion detecting circuit 18 generates a write error signal so that the writing operation is ended.

(Third Embodiment)

Figure 18:
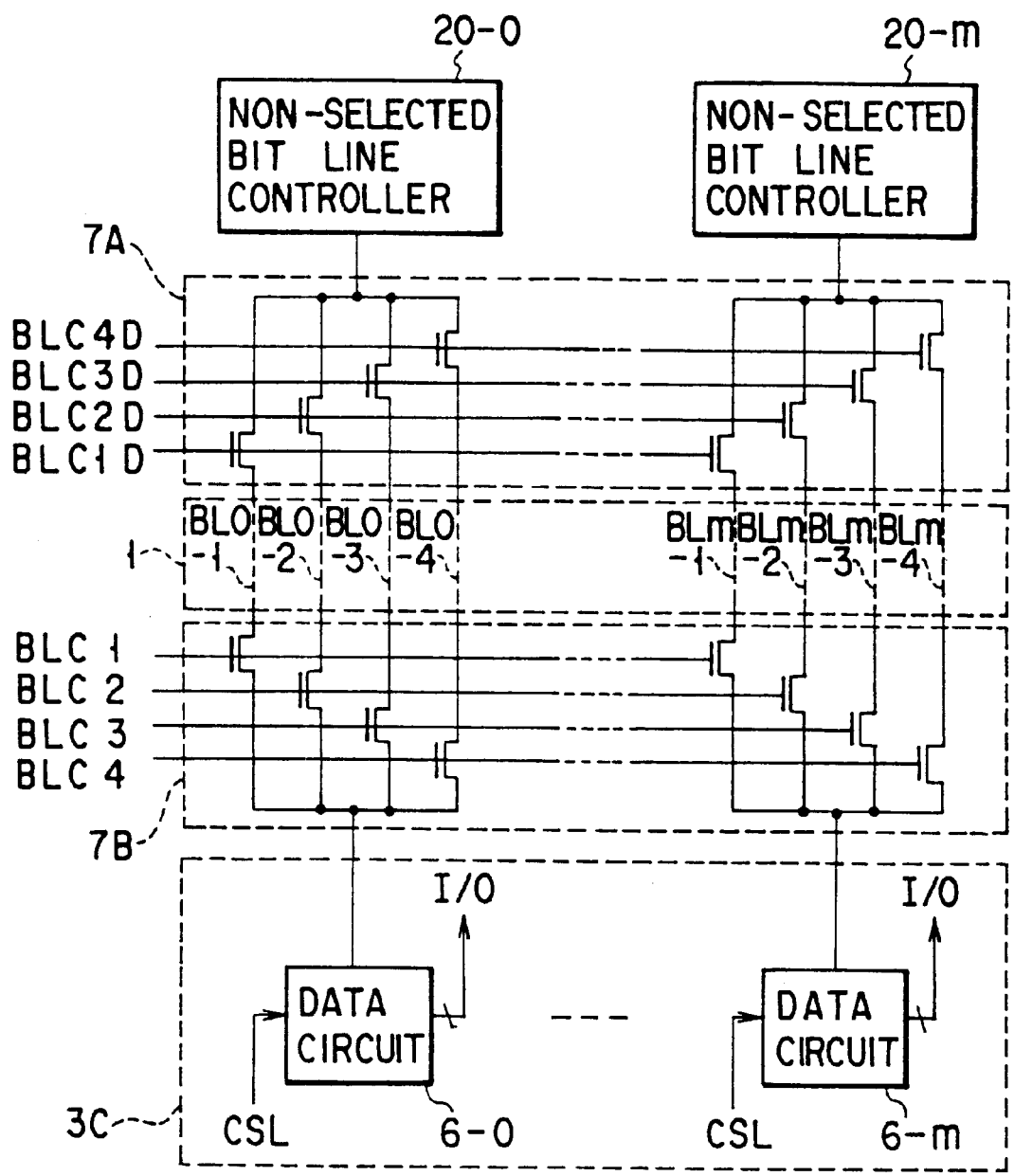
FIG. 18 is a diagram showing the structures of a memory cell array and a column-system circuit of an EEPROM according to a third embodiment of the present invention.

FIG. 18 is a diagram showing structures of a memory cell array 1 and a column-system circuit 3 of an EEPROM according to a third embodiment of the present invention.

In the first and second embodiment has the structure in which one data circuit 6 corresponds to one bit line BL. In the present invention, a modification is permitted such that one data circuit 6 corresponds to a plurality of the bit lines BL. This modification is the third embodiment.

As shown in FIG. 18, the EEPROM according to the third embodiment has a structure such that one of data circuits 6-0 to 6-m is provided for four bit lines BLi-1 to BLi-4 (i is any one of 0 to m). When, for example, BLi-1 is selected from four bit lines BLi-1 to BLi-4, the level of signal BLC1 among drive signals BLC1 to BLC4 for driving a transfer gate circuit 7B for the data circuit is raised to "H" level. On the other hand, the level of other signals BLC2 to BLC4 is made to be "L" level.

Simultaneously, the level of signal BLC1D among drive signals BLC1D to BLC4D for driving a transfer gate 7A of a non-selection bit line controller 20 is made to be "L" level. On the other hand, the level of the other drive signals BLC2D to BLC4D is made to be "H" level. As a result, only the selected bit line BLi-1 is connected to the data circuits 6-0 to 6-m.

Thus, only selected bit line BLi-1 is connected to the data circuits 6-0 to 6-m, while non-selected bit lines Bli-2 to BLi-4 respectively connected to the non-selected bit line controllers 20-0 to 20-m. The non-selected bit line controllers 20-0 to 20-m control potentials of the non-selected bit lines BLi-2 to BLi-4.

(Fourth Embodiment)

FIG. 19 is a diagram showing the structure of a multilevel storing NAND type EEPROM according to a fourth embodiment of the present invention.

As shown in FIG. 19, the multilevel storing NAND type EEPROM according to the fourth embodiment has a structure called an open bit structure. The open bit type multilevel storing NAND type EEPROM has memory cell arrays 101-1 and 101-2 having memory cells arranged in a matrix manner, row-system circuits 102-1 and 102-2 provided to correspond to the memory cell arrays 101-1 and 101-2 and a column-system circuit 103 arranged to be commonly used by the memory cell arrays 101-1 and 101-2.

The row-system circuits 102-1 and 102-2 have a row decoder 102A for receiving an address signal output from an address input circuit (buffer) 104 to select a row in a memory cell array in accordance with the supplied address signal, and a word line driver 102B for driving a word line of memory cell arrays 101-1 and 101-2 in accordance with an output from a row decoder 102A. In the case of the NAND type EEPROM, the word lines are selection gates SG (SGA and SGB) and control gates CG (CGA and CGB). The word line driver 102B is also called a control gate/selection gate driver.

The column-system circuit 103 which is commonly used by the memory cell arrays 101-1 and 101-2 has a column decoder 103A for receiving the address signal output from the address buffer 104 to select a column in the memory cell arrays 101-1 and 101-2 in response to the supplied address signal, and a column selection line driver 103B for driving a column selection line for selecting a column of the memory cell arrays 101-1 and 101-2 in accordance with an output from the column decoder 103A.

Moreover, the column-system circuit 103 has a bit line controller 103C including a data circuit for temporarily storing data to be written in the memory cell and reading data in the memory cell.

The bit line controller 103C is connected to a data input/output circuit (data input/output buffer) 105 through an data input/output line I/O. Moreover, the bit line controller 103C is, through a bit line BLa, connected to memory cells of the memory cell array 101-1 and memory cells of the memory cell array 101-2.

The bit line controller 103C receives write data from the data input/output buffer 105 when data is written to output received write data to the memory cell arrays 101-1 and 101-2. The bit line controller 103C receives read data from the memory cell when data is read to output the supplied read data to the data input/output buffer 105.

The data input/output buffer 105 controls input and output of data such that it introduces write data supplied from outside of the EEPROM to a memory core portion and outputs data read from the memory core portion to the outside of the EEPROM.

The write completion detecting circuit 118 detects whether or not writing of data has been completed in accordance with an output from the bit line controller.

FIG. 20 is a diagram showing the structures of the memory cell array and the column-system circuit shown in FIG. 19.

As shown in FIG. 20, each of the memory cell arrays 101-1 and 101-2 has memory cells MC arranged in a matrix manner.

The bit line controller 103C includes "m" data circuits 106. The data circuit 106 is connected one bit line BLa and reference bit line BLb.

Since the structure of one cell MC of the NAND type EEPROM is the same as that according to the first embodiment shown in FIGS. 3A and 3B, it is not described in detail. The cell MC comprises a plurality of memory cell transistors M1 to M4 connected to each other in series to form a NAND cell MC. An end of the cell MC is connected to a source line VS through a selection transistor S2. A group of the memory cell transistors M sharing the control gate CG forms a unit called a page. writing and reading of data is performed simultaneously to and from the page. The group of the memory cell transistors M connected to four control gates CG1 to CG4 forms a unit called a block. The page and the block respectively are selected by the control gate/selection gate driver.

One memory cell transistor M has a floating gate (a charge storage layer) and a control gate CG each of which is formed into a laminate shape to store data in accordance with the quantity of electrons stored in the floating gate. The quantity of stored electrons can be read as the threshold voltage of the memory cell transistor.

Data erase is performed from all of memory cell transistors M, in series, connected between the selection transistors S1 and S2. When data is erased from the memory cell transistor M, the control gate CG of the memory cell transistor M is grounded to apply positive and high potential to a p-type well or a p-type substrate. As a result, electrons stored in the floating gate is discharged to the p-type well or the p-type substrate.

Writing of data is performed on all of memory transistors connected to one control gate CG. When data is written in the memory cell transistor M, electrons are injected into the floating gate by a method contrary to the data erase operation. The quantity of electrons injected into the floating gate can be read as the threshold voltage of the memory cell transistor M.

Figure 21:
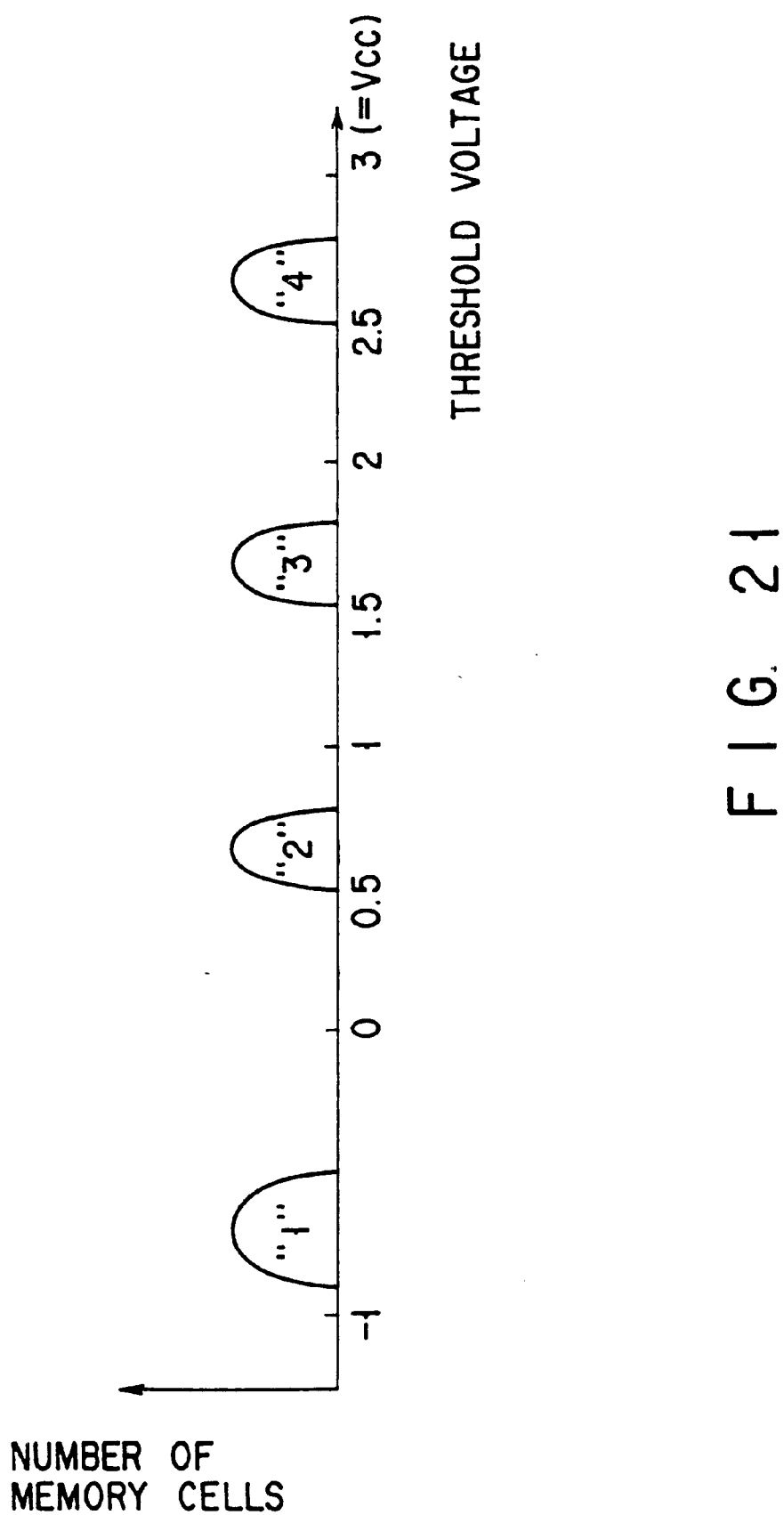
FIG. 21 is a graph showing distribution of threshold voltages of a memory cell transistor when multilevel data is stored.

FIG. 21 is a graph showing distribution of threshold voltages of the memory cell transistor when multilevel data is stored. The axis of abscissa stands for the threshold voltages, while the axis of ordinate stands for the number of memory cells.

FIG. 21 shows a case where four-levels formed of data "1", "2", "3" and "4" are stored in one memory cell transistor.

When data has been erased as shown in FIG. 21, the threshold voltage of the memory cell transistor M is made to be, for example, a negative-level. Data "1" corresponds to a case where the threshold voltage is a negative-level. Data "2" corresponds to a case where the threshold voltage is 0.5V or higher and 0.8V or lower. Data "3" corresponds to a case where the threshold voltage is 1.5V or higher and 1.8V or lower. Data "4" corresponds to a case where the threshold voltage is 2.5V or higher and 2.8V or lower.

Figure 22:
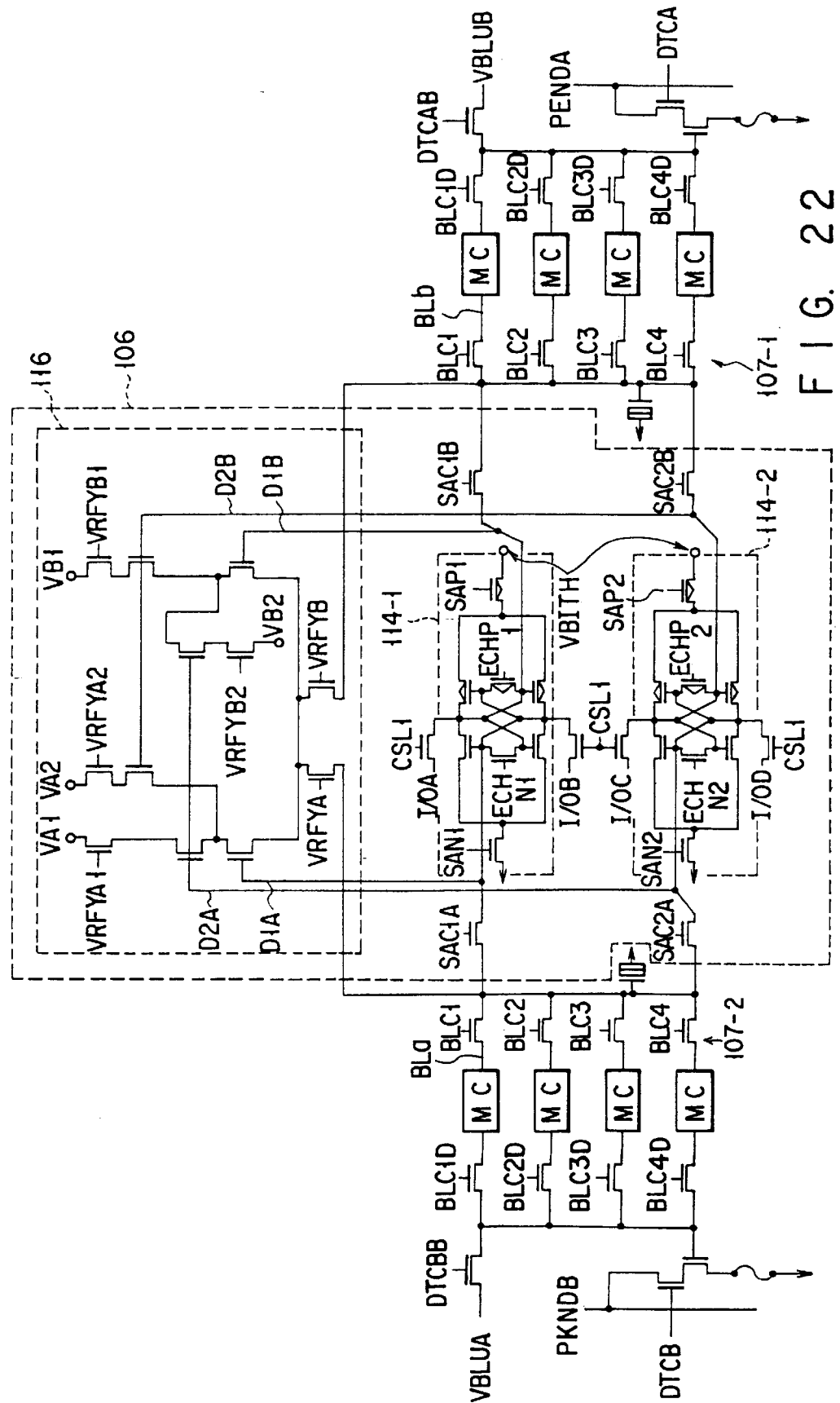
FIG. 22 is a circuit diagram showing the bit line controller shown in FIG. 20.

FIG. 22 is a circuit diagram, in detail, showing the column-system circuit shown in FIG. 20. FIG. 20 shows an example of the structure in which the data circuit 106 is connected to one bit line BL. FIG. 22 shows an example of a structure in which the data circuit 106 is connected to four bit lines BL1 to BL4.

As shown in FIG. 22, the data circuit 106 includes two flip-flop circuits 114-1 and 114-2. The flip-flop circuits 114-1 and 114-2 are connected to four bit lines respectively provided for the right and left portions. When the apparatus is turned on, one right bit line and one left bit line are selected from four bit lines. The selected bit lines are connected to the flip-flop circuits 114-1 and 114-2. Both of the flip-flop circuits 114-1 and 114-2 serve as sense amplifiers for amplifying and latching read data when the data reading operation is performed. When data is written, the flip-flop circuits 114-1 and 114-2 serve as data latches for latching write data. That is, each of the flip-flop circuits 114-1 and 114-2 is a sense amplifier/data latch. Moreover, the flip-flop circuits 114-1 and 114-2 are connected to a writing/verifying circuit 116 serving as a data writing circuit and a verifying circuit.

When the writing/verifying circuit 116 writes data, it outputs any one of write control voltages VA1, VA2, VB1 and VB2 in accordance with the combination of latch data latched by the flip-flop circuits 114-1 and 114-2. The write control voltages VA1, VA2, VB1 and VB2 are generated by a write control voltage generating circuit (not shown). When data is read or when data is read for verification, the writing/verifying circuit 116 controls the voltage of the bit line in accordance with the combination of data latched by the flip-flop circuits 114-1 and 114-2.

The operation of the data circuit 106 shown in FIG. 22 will now be described.

Figure 23:
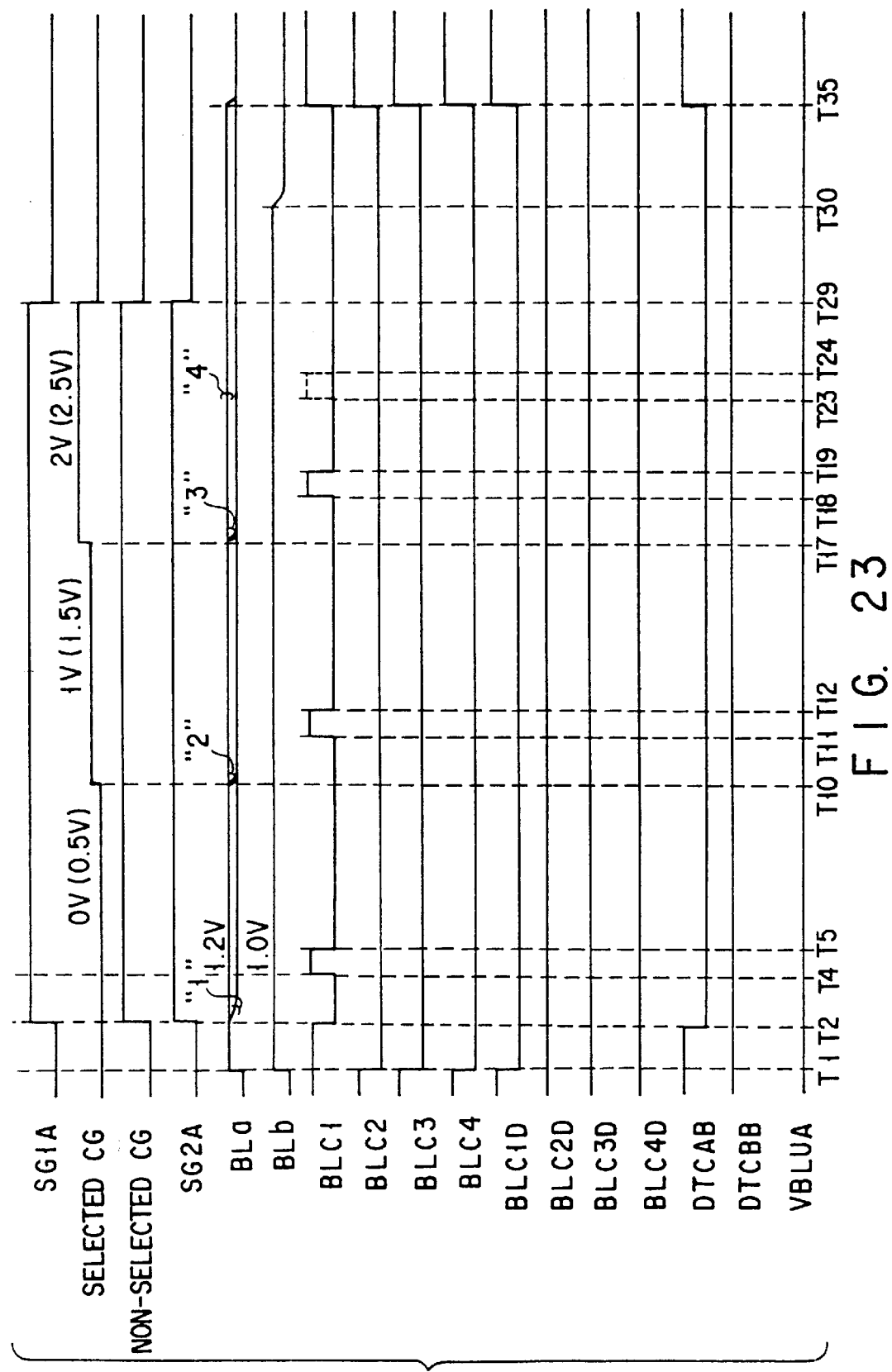
FIG. 23 is an operation waveform showing a usual reading operation and a verify operation.
Figure 24:
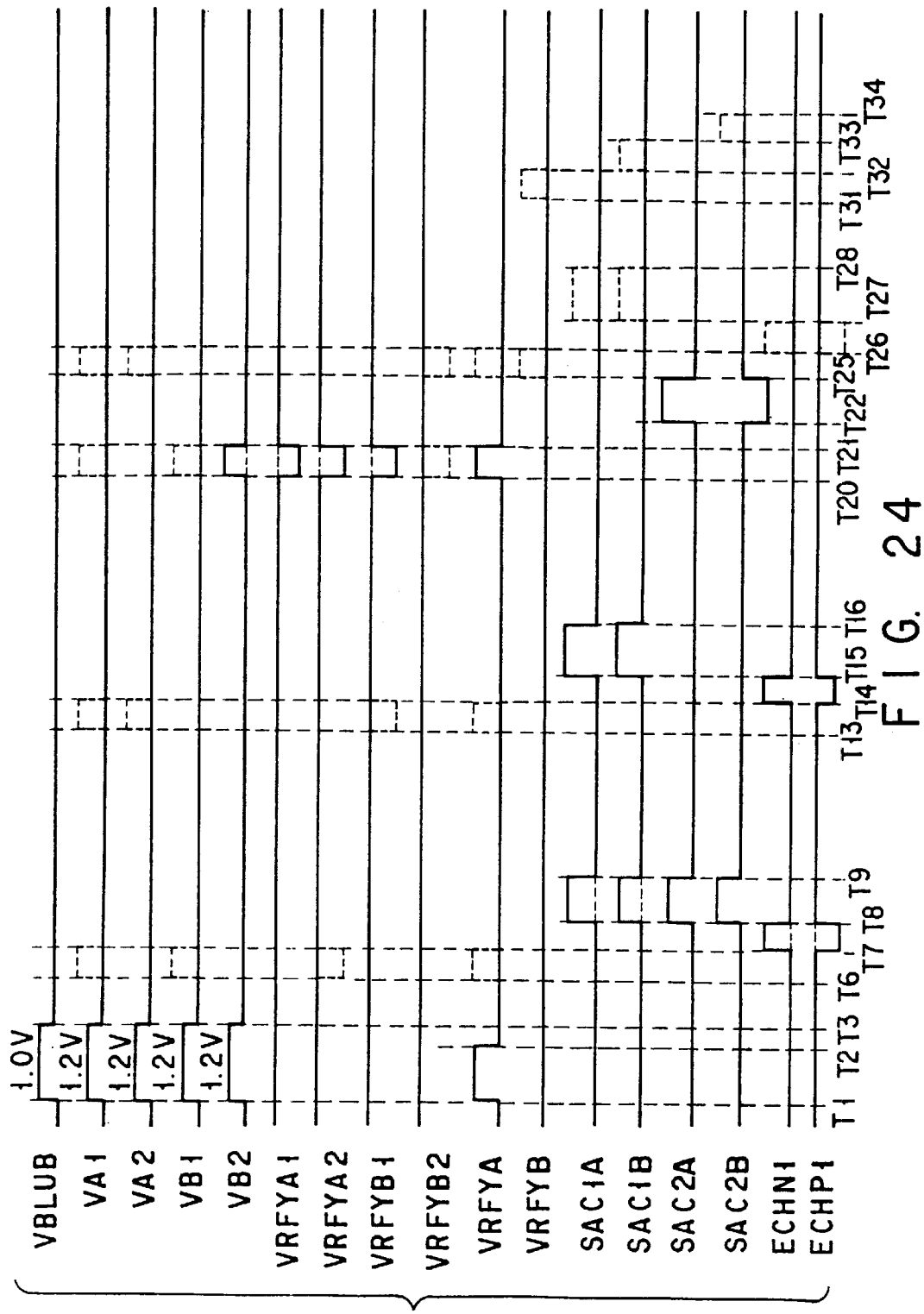
FIG. 24 is an operation waveform showing the usual reading operation and the verify operation.
Figure 25:
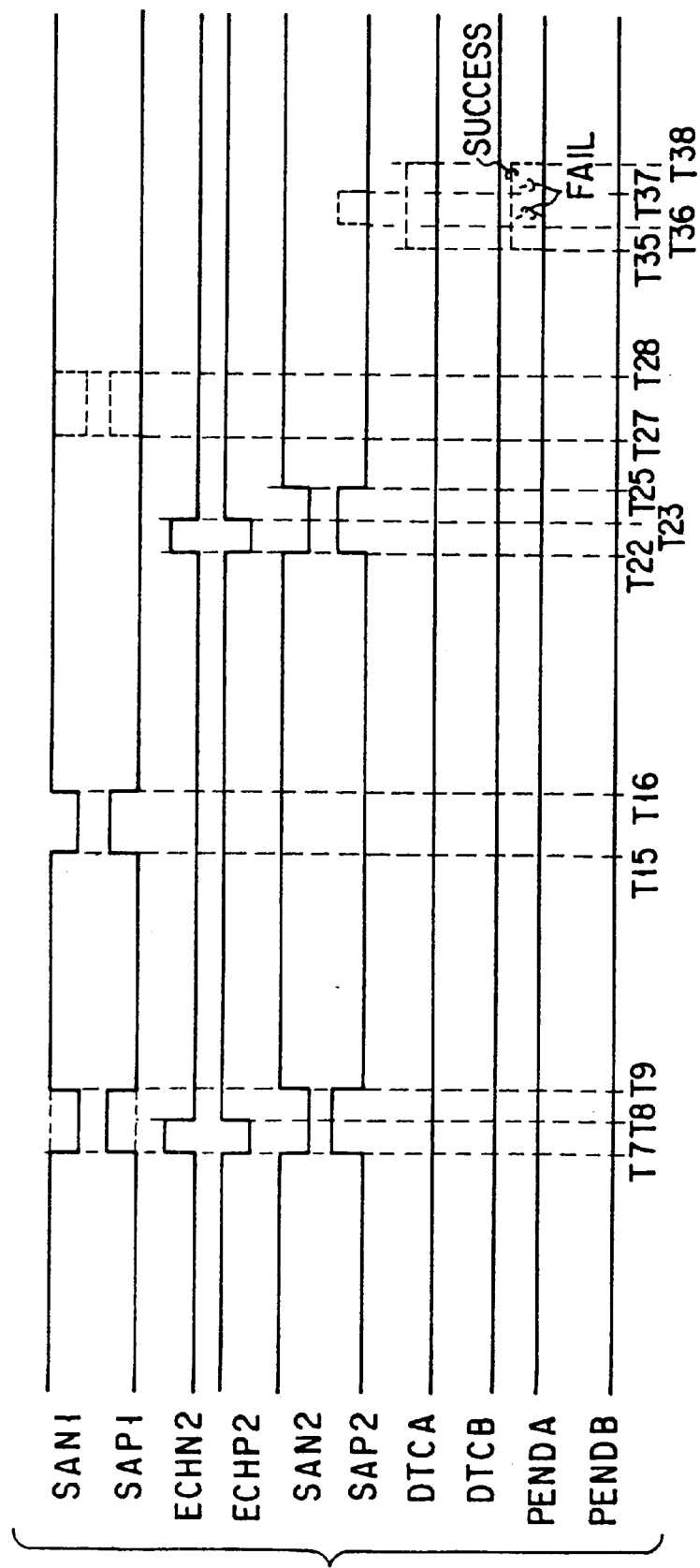
FIG. 25 is an operation waveform showing the usual reading operation and the verify operation.

FIGS. 23, 24 and 25 are waveforms showing a usual reading operation and a verifying operation. In the operation waveforms shown in FIGS. 23, 24 and 25, the usual reading operation is indicated by a solid line and only portions of the verifying operation different from the usual reading operation are indicated by a broken line. Referring to the drawings, T1 to T38 represent operation timings in a direction in which time passes in this order.

Figure 26:
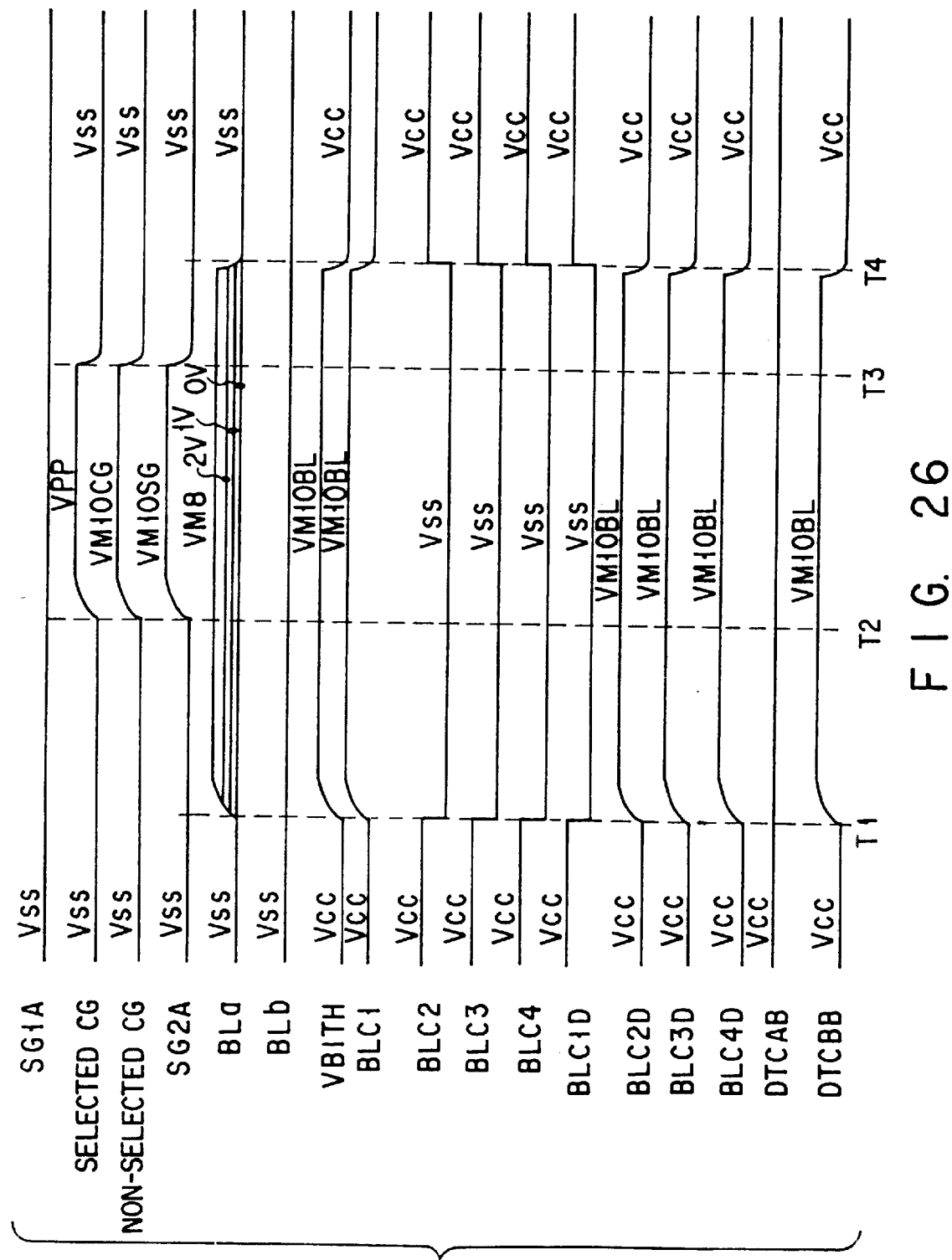
FIG. 26 is an operation waveform showing a writing operation.
Figure 28:
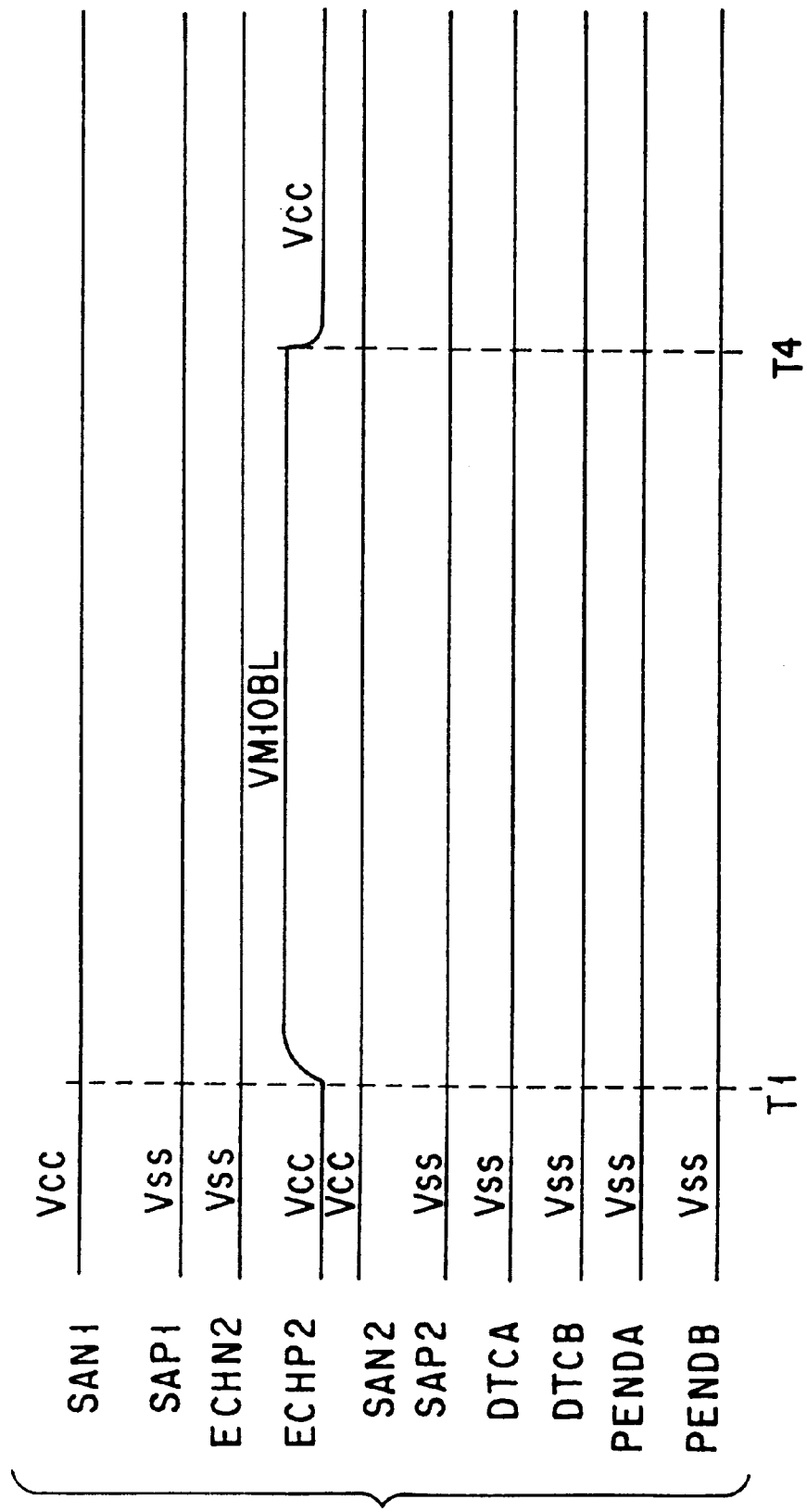
FIG. 28 is an operation waveform showing the writing operation.

FIGS. 26, 27 and 28 are operation waveforms showing writing operation, in which t1 to t4 operation timings.

Initially, a usual reading operation will now be described.

As shown in FIGS. 23, 24 and 25, a selected bit line BLa and a reference bit line BLb are electrically charged to 1.2V and 1.0V, respectively. Then, the lines BLa and BLb are brought to a floating state. The potentials of the selection gates SG1a and SG2a on the selected row and a non-selected control gate CG are made to be 4V. The potentials of the selected control gates CG are 0V, 1V and 2V in this sequential order.

If the memory cell transistor M has stored data "1", the memory cell transistor M is electrically conducted when the potential of the selected control gate CG is 0V. Therefore, the bit line is electrically discharged (that is, an electric current flows toward the source line VS) so that the voltage of the bit line is made to be 0V. If the memory cell transistor M has stored another data item at this time, no electric current flows in the bit line so that the voltage 1.2V of the bit line BLa is maintained.

Then, the voltage of the selected bit line BLa and the voltage (1.0V) of the reference bit line BLb are simultaneously applied to the two flip-flop circuits 114-1 and 114-2. If data is "1", then both of a node D1A of the flip-flop circuit 114-1 and a node D2A of the flip-flop circuit 14-2 are made to be "L". If data is another data item, both of the nodes D1A and D2A are made to be "H".

Then, the potential of the selected control gate CG is raised from 0V to 1V, and whether or not an electric current flows in the bit line BLa is detected. In a case where the memory cell transistor M has stored data "1" or "2" when the potential of the selected control gate CG has been raised to 1V, the potential of the bit line BLa is made to be 0V. When the memory cell transistor M has stored data "3" or "4", the potential of the bit line BLa is maintained at 1.2V.

The voltage of the selected bit line BLa and the voltage of the reference bit line BLb are connected to the flip-flop circuit 114-1. When data is "1", the levels of the nodes D1A and D2A are maintained at "L". When data is "2", the levels of the nodes D1A and D2A are "L, H". When data is another data item, the levels of both of the nodes D1A and D2A are made to be "H" level.

Then, the potential of the selected control gate CG is raised from 1V to 2V to detect whether or not an electric current flows in the bit line BLa. When the potential of the selected control gate CG has been raised to 2V and the memory cell transistor M has stored data "1", "2" or "3", the voltage of the bit line BLa is made to be 0V. When the memory cell transistor M has stored data "4", the voltage of the bit line BLa is maintained at 1.2V.

When the memory cell transistor M has stored data "2", that is, when the levels of the nodes D1A and D2A are "L, H", voltage VB2 is made to be "H" level so that the voltage of the bit line is modified to be "H" level.

Then, the voltage of the selected bit line BLa and the voltage of the reference bit line BLb are connected to the second flip-flop circuit 14-2. When data is "1", both of the nodes D1A and D2A are made to be "L" level. When data is "2", the nodes D1A and D2A are made to be "L, H" levels. Although the node D2A is made to be "L" level when data is "2", the level "L" of the node D1A is used to modify the potential of the bit line BLa to "H" level. When data is "3", the nodes D1A and D2A respectively made to be "H, L". When data is "4", both of the nodes D1A and D2A are made to be "H" level.

As described above, the four threshold voltages read from the memory cell transistor M are made to correspond to the four types of latched data items in the flip-flop circuits 114-1 and 114-2.

FIG. 29 is a table showing the relationship between the threshold voltages of the memory cell transistor and latched data items (read data).

Referring to FIGS. 26, 27 and 28, the writing operation will now be described.

The selected bit line BLa is, from the data circuit 106, applied with any one of voltage VA1=VM8 (about 8V), voltage VA2=2V, voltage VB1=1V or voltage VB2=0V. The selection of the voltages VA1, VA2, VB1 and VB2 is performed in accordance with write data, that is, four types of latched data items latched by the two flip-flop circuits 114-1 and 114-2.

FIG. 30 is a table showing the relationship between latched data items (write data items) and the threshold voltages of the memory cell transistor.

The voltages VA1, VA2, VB1 and VB2 correspond to writing of data "1" to "4". Potential VM8 of the voltage VA1 is set in such a manner that no electron is injected into the floating gate when the difference between potential VPP of the control gate CG and the potential of the substrate (the channel) is (VPP−VM8).

To write data in the memory cell transistor M belonging to the selected row, the potential of the selected control gate CG is set to be high voltage VPP (about 20V), the potential of the non-selected control gates is set to be voltage VM10CG (about 10V) to transfer the potential VM8, the potential of the selection gate SG1 is set to be 0V to prevent flow of a direct current from the bit line, and the potential of the selection gate SG2 is set to be voltage VM10SG (about 10V) to transfer the potential VMB.

The non-selected bit lines are applied with the potential VM8 to prevent change of the threshold voltage of the memory cell transistor M belong to the non-selected column. The application is performed by making the voltage VBLA to be the potential VM8 and by setting transfer gate circuit drive signal BLC2D to BLC4D and signal DTCBB to be voltage VM10BL (about 10V) to transfer the potential VMB. Similarly, to transfer voltage VA1=VM8 voltage VBITH of the n-type well on which the p-channel transistor for forming the flip-flop circuit, the signal BLC1, signal VRFY101-1 and signal VRFYA are set to be VM10BL.

If self-boost write method (K. D. Suh et al., 1995 ISSCC Digest of Technical Papers, pp. 128–129) is employed, the potential VM8, voltage VM10SG and voltage VM10BL may respectively be about 3V, 3V and 5V.

That is, in this specification, the potential of the channel of a cell in which data is not required to be written is self-raised to prevent change in the threshold voltage of the memory cell transistor caused from injection of electrons into the floating gate in a case where the writing operation is performed such that the bit line write control is made to be vcc (for example, 3V or 5V).

The self-boost writing method will now be described.

Initially, 0V is applied to the selected bit line BL1, while 3V is applied to the non-selected bit line BL2. Then, the level of the selection gate SG1 of a drain side selection transistor is raised from 0V to 3V to turn the transistor on so that the memory cell array is connected to the bit lines BL1 and BL2. On the other hand, 0V is applied to the source side selection gate SG2 so as to turn the selection transistor off so that the connection between the memory cell array and the common source line CSL is disconnected. As a result, the channel potential Vch of the cell array between two selection transistors SG1 and SG2 is 0V commonly for the selected cell arrays connected to the bit line BL1. On the other hand, 3V is supplied to the non-selected cell array from the bit line BL2.

Writing of data to the selected cell array will now be described. Only the control gate electrode of the selected cell is applied with high voltage (Vpp: for example, 18V) for writing. The state of the selected cell is such that the control gate electrode is 18V and the channel potential is 0V. If the coupling ratio of the cell is 0.6, the difference in the potential between the floating gate electrode and the semiconductor substrate is 11V so that electrons are injected into the floating gate electrode through a tunnel oxide film-thus, the threshold voltage of the cell is made to be positive so that data is written in the selected cell. An intermediate potential (VM: for example, 10V) is applied to the control gate electrode of each non-selected cells of the selected cell array. Since the coupling ratio is 0.6 as described above, the difference in the potential between the floating gate electrode and the semiconductor substrate is 6V. With the foregoing potential, writing attributable to injection of the tunnel current is not performed within a usual writing time. Therefore, data is not written in the cells except for the selected cells.

On the other hand, writing of data on the NAND cell array connected to the non-selected bit line BL2 is inhibited as follows. As described above, 3V (power supply voltage Vcc) is applied to the non-selected bit line BL2. When SG1 has been raised from 0V to Vcc, that is, 3V, the selection transistor is turned on so that the potential of 3V is applied from the bit line to the cell array connected to the bit line BL2. All of the channel potentials (Vch) of the NAND cell array are made such that Vch=Vcc−Vths assuming that the threshold voltage of the selection gate SG1. Then, the selection gate SG1 is turned off. That is, if Vcc=3V and Vths=1V, the channel potential of all of the cells of the non-selected cell array is made such that Vch=3V−1V=2V. Thus, the channel potential is electrically charged to 2V. On the other hand, since the selection gate SG2 has been turned off (the potential of SG2 is 0), the channel potential Vch (the potential in the source and drain region and the diffusion layer between cells) of the non-selected NAND cell array is in a floating state. After the channel potential has been brought to the floating state, the voltage of the control gate is raised to the writing voltage (Vpp=18V) or the intermediate potential (VM=10V). Since the channel potential is in the floating state at this time, the channel potential is raised from 2V, which is the initial-level, to 8V attributable to the voltage applied to the control gate. The degree of the self-boost is not determined in accordance with Vpp=18V but the same is determined in accordance with VM=10V. The reason for this will now be described. If a NAND cell array is formed by connecting, for example, four memory cells in series, only one control gate is applied with Vpp=18V and VM=10V is applied to all of the three other control gates. Therefore, the influence of VM=10V is overwhelmingly great.

As a result of the above self-boosting, only a low voltage of 3V is applied to the tunnel oxide film between the substrate and the floating gate electrode of the non-selected NAND cell array even if the writing voltage Vpp is 18V and the potential of the floating gate electrode is about 11V (18V×0.6). As a result, no tunnel current flows and writing of data on the non-selected NAND cell array is prevented.

Data is not written in the other cells of the non-selected NAND cell array because the difference in the potential to be applied to the tunnel oxide film is 2V because the voltage of the control gate electrode is such that VM=10V, the voltage of the floating gate electrode is 6V (10V×0.6) and the channel potential is about 8V.

Referring to FIGS. 23, 24 and 25, the verify reading operation will now be described.

Similarly to the reading operation, the selected bit line BLa and reference bit line BLb respectively are electrically charged to 1.2V and 1.0V, and then brought to the floating state. The potential of the two selection gates SG1 and SG2 of the selected row and the potential of the non-selected control gate CG are made to be 4V. The potentials of the selected control gates CG are sequentially made to be 0.5V, 1.5V and 2.5V. The foregoing potentials respectively correspond to verification of data "2", that of data "3" and that of "4".

Based on a result of the relationship between write data items and the threshold voltages of the memory cell transistor shown in FIG. 30, latch data in the second flip-flop circuit 114-2 may be inverted to be changed to write data of "1" if data "2" has been sufficiently written. If data "2" has been written insufficiently, latch data in the flip-flop circuit 114-2 may be maintained.

If data "3" has been sufficiently written, latch data in the first flip-flop circuit 114-1 is inverted to be changed to write data of "1". If data "3" has not been sufficiently written, latch data in the flip-flop circuit 114-1 is maintained.

If data "4" has been sufficiently written, latched data items in the first and second flip-flop circuits 114-1 and 114-2 respectively are inverted so as to be changed to write data of "1". If data "4" has been written insufficiently, latched data items in the two flip-flop circuits 114-1 and 114-2 are maintained.

Initially, the potential of the selected control gate CG is made to be 0.5V to verify data "2". If the state of the threshold voltage of the read memory cell transistor corresponds to data "1", an electric current flows in the bit line. Therefore, the voltage of the bit line is made to be 0V. If states of the threshold voltages of the read memory cell transistor M respectively correspond the data "2", "3" and "4", no electric current flows in the bit line so that the voltage of the bit line is maintained at 1.2V.

To maintain the latching state of the flip-flop circuit which writes data "1", data "3" or data "4", the voltages of the respective bit lines are made to be "H", "H" and "L". Then, the voltage of the selected bit line BLa and that of the reference bit line BLb are applied to the second flip-flop circuit 114-2. The latching state of the flip-flop circuit which has not latched data "2" is not changed. If data "2" has been sufficiently written, the latching state of the flip-flop circuit which has latched data "2" is changed to the writing latching state of data "1". If data "2" has not been sufficiently written, the latching state is maintained.

Then, the potential of the selected control gate CG is made to be 1.5V to verify data "3". If the state of the threshold voltage of the read memory cell transistor M corresponds to data "1" or "2", an electric current flows in the bit line BLa. Therefore, the voltage of the bit line BLa is made to be 0V. If the state of the threshold voltage of the read memory cell transistor M corresponds to data "3" or "4", no electric current flows in the bit line BLa so that the voltage of the bit line BLa is maintained at 1.2V.

To maintain the latching state of the flip-flop circuit which writes data "1", data "2" or data "4", the voltages of the respective bit lines are made to be "H", "H" and "L". Then, the voltage of the selected bit line BLa and that of the reference bit line BLb are applied to the first flip-flop circuit 114-1. The latching state of the flip-flop circuit which has not latched data "3" is not changed. If data "3" has been sufficiently written, the latching state of the flip-flop circuit which has latched writing of data "3" is changed to the writing latching state of data "1". If data "3" has not been sufficiently written, the latching state is maintained.

Finally, the potential of the selected control gate CG is made to be 2.5V to verify data "4". If the state of the threshold voltage of the read memory cell transistor M corresponds to data "1", "2" or "3", an electric current flows in the bit line BLa. Therefore, the voltage of the bit line BLa is made to be 0V. If the state of the threshold voltage of the read memory cell transistor M corresponds to data "4", no electric current flows in the bit line BLa so that the voltage of the bit line BLa is maintained at 1.2V.

To maintain the latching state of the second flip-flop circuit 114-2 which writes data "1", data "2" or data "3", the voltages of the respective bit lines are made to be "H", "L" and "H". Then, the voltage of the selected bit line BLa and that of the reference bit line BLb are applied to the second flip-flop circuit 114-2. The latching state of the flip-flop circuit which has not latched data "4" is not changed. If data "4" has been sufficiently written, the latching state of the flip-flop circuit which has latched writing of data "4" is changed to the writing latching state of data "3". If data "4" has not been sufficiently written, the latching state is maintained.

To maintain the state of the flip-flop circuit 114-1 which writes data "1", "2" or "3", the voltages of the respective bit lines are made to be "H", "H" and "L". Then, the voltage of the selected bit line BLa and that of the reference bit line BLb are connected to the flip-flop circuit 114-1. The latching state of a flip-flop circuit which has not latched writing of data "4" is not changed. The latching state of a flip-flop circuit which has latched writing of data "4" is changed to latching state of writing of data "1" if data "4" has been sufficiently written. If data "4" has not been sufficiently written, the latching state is maintained.

After the foregoing operation has been performed, write completion detection signal PENDA brought to be the floating state after the electric charge is charged maintains "H" level when the latching state of all of the flip-flop circuits 114-1 and 114-2 has been brought to the latching state of data "1". Thus, the writing operation can be completed.

On the other hand, if at least either the flip-flop circuit 114-1 or 114-2 is in the latching state of data "2" to "4", the write completion detection signal PENDA is brought to "L" level. Thus, the operation is again shifted to the writing operation.

As described above, according to the fourth embodiment, four-level voltages to be applied to the bit line are switched by the data circuit 106 comprising the flip-flop circuit 114-1 and 114-2 which are sense amplifiers and data latches and the writing/verifying circuit 116 serving as the data writing circuit and the verifying circuit to selectively apply the voltage to the bit line as DC bias. The number of the column-system circuits, and more particularly, the number of the circuits serving as the sense amplifiers and data latches and the writing and verifying circuits can be reduced. Therefore, a nonvolatile semiconductor memory device can be provided.

(Fifth Embodiment)

FIG. 31 is a diagram showing the structure of a multilevel storing NAND type EEPROM according to a fifth embodiment of the present invention.

The multilevel storing NAND type EEPROM according to the fifth embodiment has a single end structure different from the open bit structure according to the fourth embodiment.

As shown in FIG. 31, the multilevel storing NAND type EEPROM according to the fifth embodiment has a row-system circuit 102 and a column-system circuit 103 provided for a memory cell array 101 having memory cells arranged in the matrix manner.

The row-system circuit 102 includes a row decoder 102A for receiving an address signal output from an address buffer 104 and selecting a row of the memory cell array 101 in response to the supplied address signal, and a word line driver 102B for driving a word line of the memory cell array 101 in accordance with an output from the row decoder 102A. In the case of the NAND type EEPROM, the word lines are selection gates and control gates. The word line driver is also called a control gate/selection gate driver.

The column-system circuit 103 includes a column decoder 103A for receiving the address signal output from the address buffer 104 and selecting a column in the memory cell array in response to the supplied address signal and a column selection line driver 103B for driving a column selection line for selecting a column in the memory cell array in accordance with an output from the column decoder 103A.

The column-system circuit 103 is provided with a bit line controller 103C for temporarily storing data to be written in the memory cell and reading data in the memory cell.

The bit line controller 103C is, through a data input/output line I/O, connected to a data input/output circuit (data input/output buffer) 105. The bit line controller 103C is, through a bit line BL, connected to the memory cell of the memory cell array 101.

When data is written, the bit line controller 103C receives write data from the data input/output buffer 105 to output supplied write data to the memory cell. When data is read, the bit line controller 103C received read data from the memory cell to output supplied read data to the data input/output buffer 105.

The data input/output buffer 105 performs control input and output of data such that it introduces write data supplied from the outside of the EEPROM to a memory core portion and outputs data read from the memory core portion to the outside of the EEPROM.

The write completion detecting circuit 118 detects whether or not writing data has been completed in accordance with an output from the bit line controller.

FIG. 32 is a diagram showing the structures of the memory cell array and the column-system circuit shown in FIG. 31.

As shown in FIG. 32, the memory cell array 101 has memory cells MC arranged in a matrix manner.

The bit line controller 103C includes "m" data circuits 106A. The bit line controller 106A is connected to one bit line BL.

As shown in FIG. 32, the cell MC has a similar circuit structure to that according to the fourth embodiment, that is, the first embodiment. Moreover, the following facts are similar to those of the fourth and first embodiments, that the group of the memory cell transistors M sharing the control gate CG forms a unit called a page, writing and reading of data are performed simultaneously to and from in the unit of page, the group of memory cell transistors M connected to the four control gates CG1 to CG4 forms a unit called a block, and the page and the block are selected by the control gate/selection gate driver. The structure of the memory cell transistor M is similar to that shown in FIG. 3A. The level of the threshold voltage when four-level data is stored in one memory cell transistor M may be set similarly to the method shown in FIG. 21.

Figure 33:
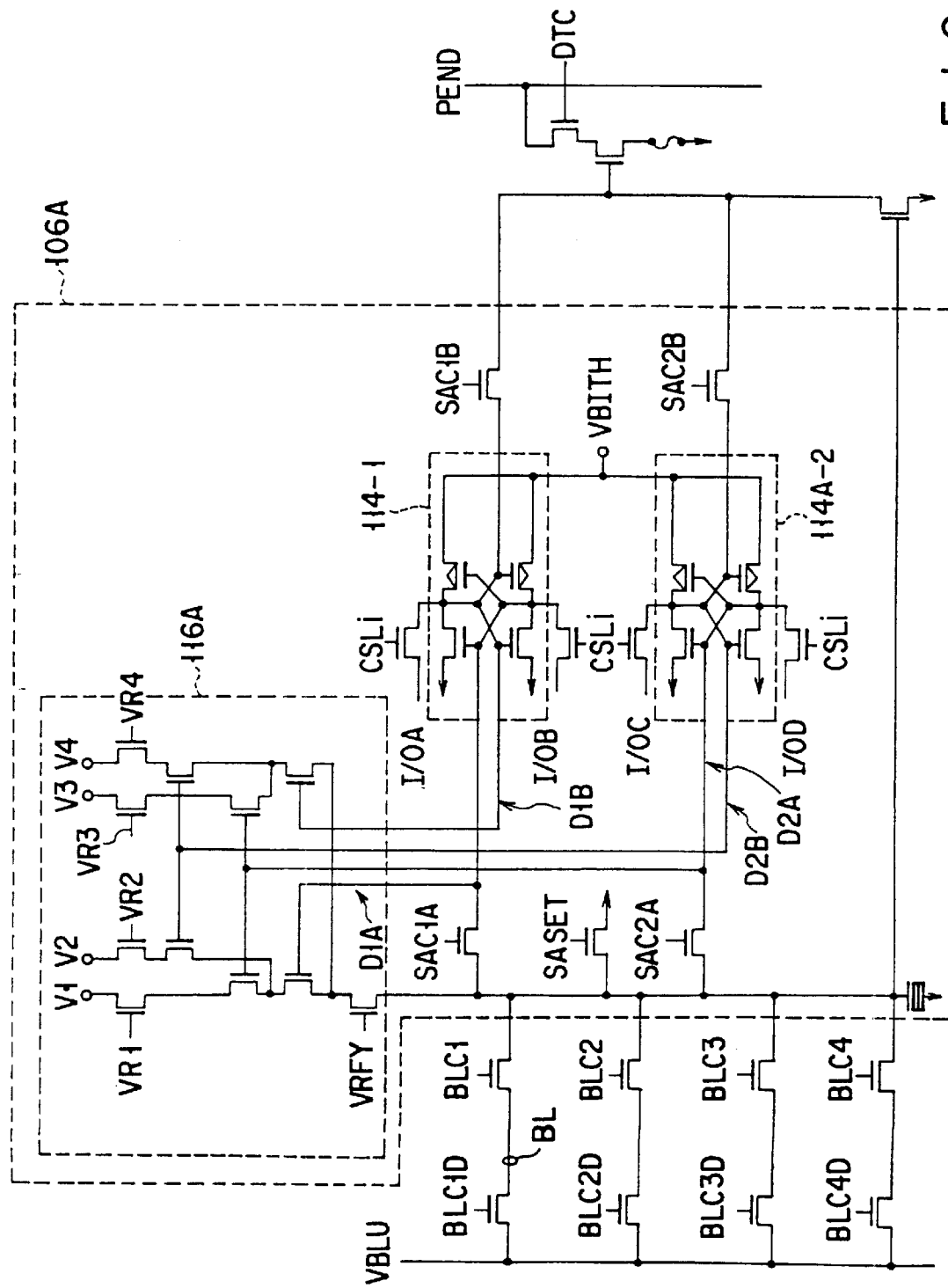
FIG. 33 is a circuit diagram showing the bit line controller shown in FIG. 31.

FIG. 33 is a circuit diagram showing the bit line controller 106A shown in FIG. 32.

Although FIG. 32 shows an example of the structure in which the bit line controller 106A is connected to one bit line, FIG. 33 shows an example of the structure in which the bit line controller 106A is connected to four bit lines. The foregoing structure shown in FIG. 33 will now be described.

As shown in FIG. 33, the bit line controller 106A includes two flip-flop circuits 114A-1 and 114A-2. The flip-flop circuits 114A-1 and 114A-2 are connected to four bit lines. When the operation is performed, one bit line is selected from four bit line. The selected bit line is connected to the flip-flop circuits 114A-1 and 114A-2. Both of the flip-flop circuits 114A-1 and 114A-2 serve as sense amplifiers for amplifying and latching read data when data is read, while same serve as data latch for latching write data when data is written. That is, the flip-flop circuits 114A-1 and 114A-2 are sense amplifiers/data latches.

The flip-flop circuits 114A-1 and 114A-2 are different from-those according to the fourth embodiment in that each of the flip-flop circuits 114A-1 and 114A-2 has a forcible reverse sense amplifier. The forcible reverse sense amplifier is described in, for example, the following document: K. D. Suh et al., 1995 ISSCC Digest of Technical Papers, pp. 128–129.

Moreover, the flip-flop circuits 114A-1 and 114A-2 are connected to a writing/verifying circuit 116A.

The writing/verifying circuit 116A outputs, to the bit line, any one of write control voltages V1, V2, V1 and V2 in accordance with the combination of latched data items latched by the flip-flop circuits 114A-1 and 114A-2. When data is read or data is read for verification, the writing/verifying circuit 116A controls the voltage of the bit line in accordance with the combination of latched data items latched by the flip-flop circuits 114A-1 and 114A-2.

The operation of the bit line controller shown in FIG. 33 will now be described.

Figure 34:
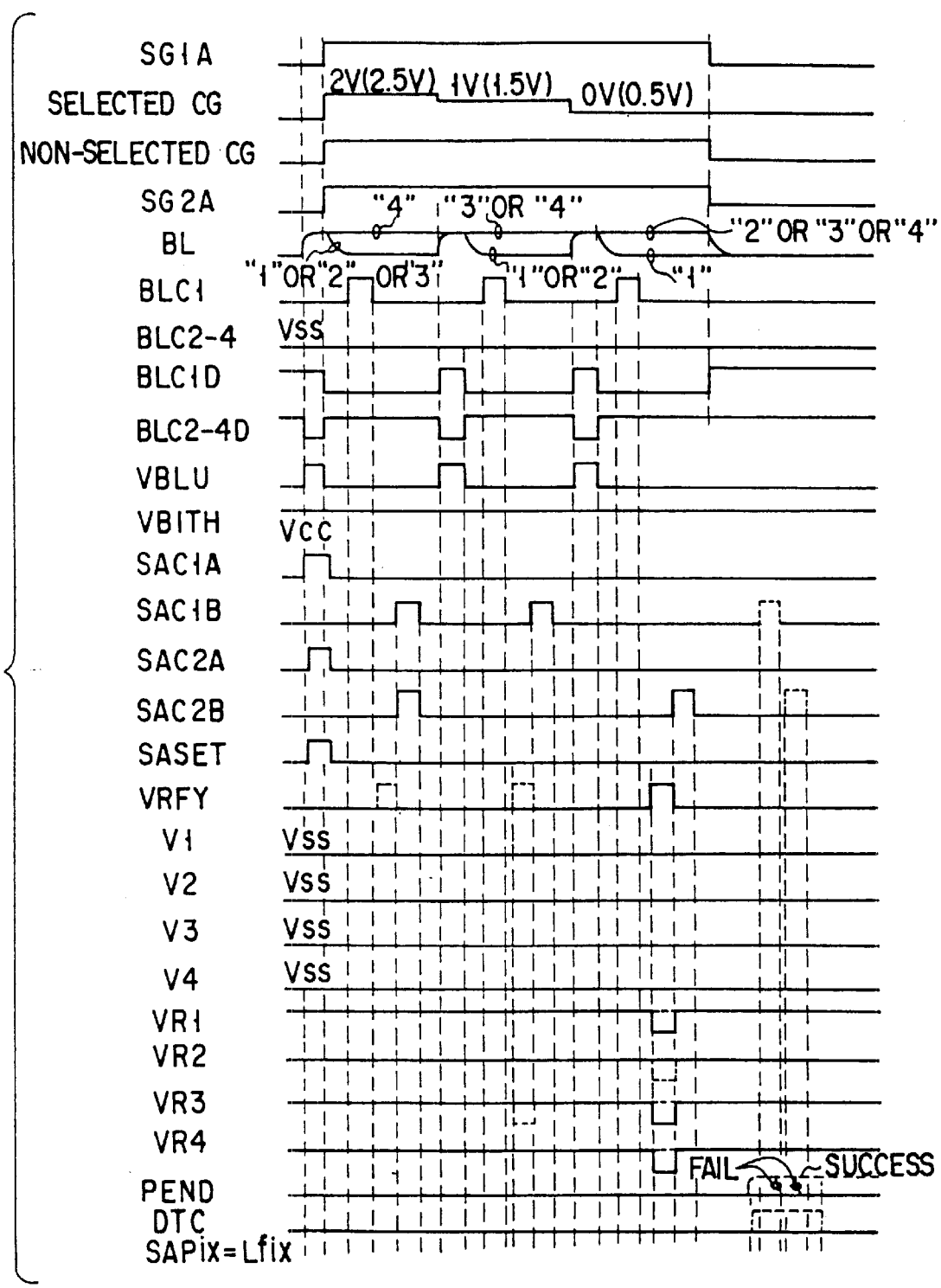
FIG. 34 is an operation waveform showing the usual reading operation and the verify operation.

FIG. 34 is a waveform showing a usual reading operation and a verifying operation. In the operation waveform shown in FIG. 34, the usual reading operation is indicated by a solid line and only portions of the verifying operation different from the usual reading operation are indicated by a broken line.

FIG. 35 is an operation waveform showing the writing operation.

First, the usual reading operation will now be described.

The selected bit line BL is precharged, as shown in FIG. 34, and then brought to a floating state. Simultaneously, the node D1A of the flip-flop circuit 114A-1 and the node D2A of the flip-flop circuit 114A-2 are reset to "L". The potential of the two selected selection gates SG1 and SG2 and the potential of the non-selected control gate CG are set to be 4V. The potentials of the selected control gate CG are sequentially made to be 2V, 1V and 0V.

In a case where the selected memory cell transistor M has stored data "4", the memory cell transistor M is not electrically conducted when the potential of the control gate CG is 2V. As a result, no electric current flows in the bit line so that the voltage of the bit line is maintained at "H". In a case where the selected memory cell transistor M has stored data "1", "2" or "3", the memory cell transistor M is electrically conducted when the potential of the selected control gate CG is 2V. Thus, an electric current flows in the bit line so that the voltage of the bit line is made to be 0V. Then, the voltage of the selected bit line is applied to the two flip-flop circuits 114A-1 and 114A-2. When data is "4", both of the nodes D1A and D2A are made to be "H". When data is another data item, both of the nodes D1A and D2A are made to be "L".

Then, the bit line BL is again precharged, and the potential of the selected control gate is made to be 1V. When the selected memory cell transistor M has stored data "1" or "2", the potential of the bit line is made to be 0V. When the selected memory cell transistor M has stored data "3" or "4", the potential of the bit line is maintained at "H". Then, the voltage of the selected bit line is applied to the flip-flop circuit 114A-1. When data is "4", the nodes D1A and D2A are maintained at "H". When data is "3", the nodes D1A and D2A are made to be "H, L". When data is "2" or "1", both of the nodes D1A and D2A are maintained at "L".

Then, the bit line BL is again precharged. Moreover, the selected control gate is made to be 0V. When data is "2", "3" or "4", the bit line is maintained at "H". When data is "1", the bit line is made to be "L". When data stored by the memory cell transistor M is "3", that is, when the nodes D1A and D2A respectively are "H, L", voltage V2=0V is transferred to modify the voltage of the bit line to "L". Then, the voltage of the selected bit line is supplied to the flip-flop circuit 114A-2. When data is "4", body of the nodes D1A and D2A are maintained at "H". When data is "3", the nodes D1A and D2A respectively maintained at "H, L". When data is "2", the nodes D1A and D2A respectively are maintained at "L, H". When data is "1", both of the nodes D1A and D2A are maintained at "L".

As described above, the levels of the four types of threshold voltages read from the memory cell transistor M can be made to correspond to four types of latched data items in the flip-flop circuits 114A-1 and 114A-2, similarly to the fourth embodiment shown in FIG. 29.

Since the writing operation is, as shown in FIG. 35, performed similarly to that according to the fourth embodiment described with reference to FIGS. 26 to 28, the writing operation is omitted from description.

Then, the verifying operation will now be described.

The selected bit line BL is electrically charged similarly to the reading operation, and then brought to a floating state. The potential of the two selected selection gates SG1 and SG2 and that of the non-selected control gate CG are made to be 4V. The potentials of the selected control gate CG are sequentially made to be 2.5V, 1.5V and 0.5V. The foregoing potentials correspond to verification of data "4", that of data "3" and that of data "2".

Initially, the potential of the selected control gate CG is made to be 2.5V to verify data "4". If the state of the threshold voltage of the read memory cell transistor M corresponds to data "4", no electric current flows in the bit line. Therefore, the voltage of the bit line is maintained in the precharge state. If the state of the threshold voltage of the read memory cell transistor M is data "1", "2" or "3", an electric current flows in the bit line. Therefore, the voltage of the bit line is made to be 0V.

To maintain the latching state of the flip-flop circuit which writes data "1", "2" or "3", the voltage of the bit line is made to be "L". Then, the voltage of the selected bit line is applied to the flip-flop circuits 114A-1 and 114A-2. At this time, the latching state of the flip-flop circuit which has not latched writing of data "4" is not changed. The latching state of the flip-flop circuit which has latched writing of data "4" is changed to the latching state of writing of data "1" if data "4" has been sufficiently written. If data "4" has not been sufficiently written, the latching state is maintained.

Then, the potential of the selected control gate CG is made to be 1.5V to verify data "3". If the state of the threshold voltage of the read memory cell transistor M corresponds to data "1" or "2", an electric current flows in the bit line. Therefore, the voltage of the bit line is made to be 0V. If the state of the threshold voltage of the read memory cell transistor M corresponds to data "3" or "4", no electric current flows in the bit line. Thus, the voltage of the bit line is maintained at the precharge level.

To maintain the latching state of the flip-flop circuit which writes data "1", "2" or "4", the voltages of the respective bit lines are made to be "L". Then, the voltage of the selected bit line is applied to the flip-flop circuit 114A-1. At this time, the latching state of the flip-flop circuit which has not latched writing of data "3" is not changed. If data "3" has been sufficiently written, the latching state is changed to the latching state of writing of data "1". If data "3" has been sufficiently written, the latching state is maintained.

Finally, the potential of the selected control gate CG is made to be 0.5V to verify data "2". If the state of the threshold voltage of the read memory cell transistor M corresponds to data "2", "3" or "4", no electric current flows in the bit line. Therefore, the voltage of the bit line is maintained to the precharge level. If the state of the of the read memory cell transistor M corresponds to data "1", no electric current flows in the bit line. Therefore, the voltage of the bit line is made to be 0V.

To maintain the latching state of the flip-flop circuit 114A-2 which has latched writing of data "1", "3" or "4", the voltages of the respective bit lines are made to be "L". Then, the voltage of the selected bit line is connected to the flip-flop circuit 114A-2. The latching state of the flip-flop circuit which has not latched writing of data "2" is not changed. The latching state of the flip-flop circuit which has latched writing of data "2" is changed to a latching state of writing of data "1" if data "2" has been sufficiently written. If data "2" has been sufficiently written, the latching state is maintained.

After the above-mentioned operation has been completed and all of the latching states of the flip-flop circuits 114A-1 and 114A-2 have been brought to the latching state for writing data "1", the "H" level of the write completion detection signal PEND is maintained. Thus, the writing operation can be ended.

If at least either the flip-flop circuit 114A-1 or the flip-flop circuit 114A-2 is in the latching state for writing data "2" to "4", the write completion detection signal PEND is brought to "L". Then, the operation is again shifted to the writing operation.

The four-level storing NAND type EEPROM according to the fourth and fifth embodiments has the structure such that the verifying circuit and the writing circuit are controlled by "n" write data items latched by the flip-flop (a data latch/sense amplifier circuit). As a result, when the number of the multilevel is made such that $2^m$ (m is a natural number not smaller than 2)=n, the number of the data latch/sense amplifier circuits can be made to be "m". Specifically, when four-level data is treated, use of only two flip-flop circuits serving as the data latches/sense amplifiers enables a bit line controller to be formed. Therefore, the size of the column-system circuit, and more particularly, the number of the sense amplifier/data latch circuits and the verifying circuits can be decreased. Therefore, a nonvolatile semiconductor memory device suitable to form a highly integrated structure can be obtained.

When a result of the verify reading operation is valid, the flip-flop circuit sequentially updates latched write data whenever a result "sufficient writing" is realized to make the four-level data such that write data is "1" to correspond to write data when data in the memory cell transistor M has not been changed, specifically, to the threshold voltages of the four-levels. As a result, the verify circuit and the writing circuit are controlled similar to the case where data "1" has been written.

When the number of multilevel data items is made to be $2^m$, an apparatus having the structure comprising "m" flip-flop circuits, during verify operation, sometimes encounters change of updated write data. However, the verify circuit and the writing circuit are structured to supply another data item to the flip-flop circuit to correspond to write data latched by the flip-flop circuit to prevent change of updated write data.

Whenever the result "sufficient writing" is realized, n-level data items which are latched by the flip-flop circuit are sequentially updated to write data "1". Moreover, change of updated write data can be prevented. As a result, completion of writing can automatically be detected because all of n-level data items which are latched by the flip-flop circuit are updated to write data "1".

Also during the reading operation, read data detected by the flip-flop circuit is sometimes changed. The foregoing embodiment has the structure such that a portion of latched read data is used to supply data for preventing change of detected read data to the flip-flop circuit. Also the foregoing structure is able to make the number of the flip-flop circuit to be "m" when the number of multilevel data items is $2^m$.

(Sixth Embodiment)

FIG. 36 is a diagram showing the structure of a multilevel storing NAND type EEPROM according to a sixth embodiment of the present invention.

As shown in FIG. 36, the multilevel storing NAND type EEPROM according to the sixth embodiment has a structure called an open bit structure. The open bit type multilevel storing NAND type EEPROM has memory cell arrays 201-1 and 201-2 having memory cells arranged in a matrix manner, row-system circuits 202-1 and 202-2 provided to correspond to the memory cell arrays 201-1 and 201-2 and a column-system circuit 203 arranged to be commonly used by the memory cell arrays 201-1 and 201-2.

The row-system circuits 202-1 and 202-2 have a row decoder 202A for receiving an address signal output from an address input circuit (address buffer) 204 to select a row in a memory cell array in accordance with the supplied address signal, and a word line driver 202B for driving a word line of memory cell arrays in accordance with an output from the row decoder 202A. In the case of the NAND type EEPROM, the word lines are selection gates SG (SGA and SGB) and control gates CG (CGA and CGB). The word line driver is also called a control gate/selection gate driver.

The column-system circuit 203 which is commonly used by the memory cell arrays 201-1 and 201-2 has a column decoder 203A for receiving the address signal output from the address buffer 204 to select a column in the memory cell array in response to the supplied address signal, and a column selection line driver 203B for driving a column selection line for selecting a column of the memory cell array in accordance with an output from the column decoder 203A.

Moreover, the column-system circuit 203 has a bit line controller 203C including a data circuit for temporarily storing data to be written in the memory cell and reading data in the memory cell. The bit line controller 203C is connected to a data input/output circuit (data input/output buffer) 205 through a data input/output line I/O. Moreover, the bit line controller 203C is, through a bit line BLa, connected to a memory cell of the memory cell array 201-1 and a memory cell of the memory cell array 201-2.

The bit line controller 203C receives write data from the data input/output buffer 205 when data is written to output received write data to the memory cell array. The bit line controller 203C receives read data from the memory cell when data is read to output the supplied read data to the data input/output buffer 205.

The data input/output buffer 205 controls input and output of data such that it introduces write data supplied from outside of the EEPROM to a memory core portion and outputs data read from the memory core portion to the outside of the EEPROM.

The write completion detecting circuit 218 detects whether or not writing of data has been completed in accordance with an output from the bit line controller.

Figure 37:
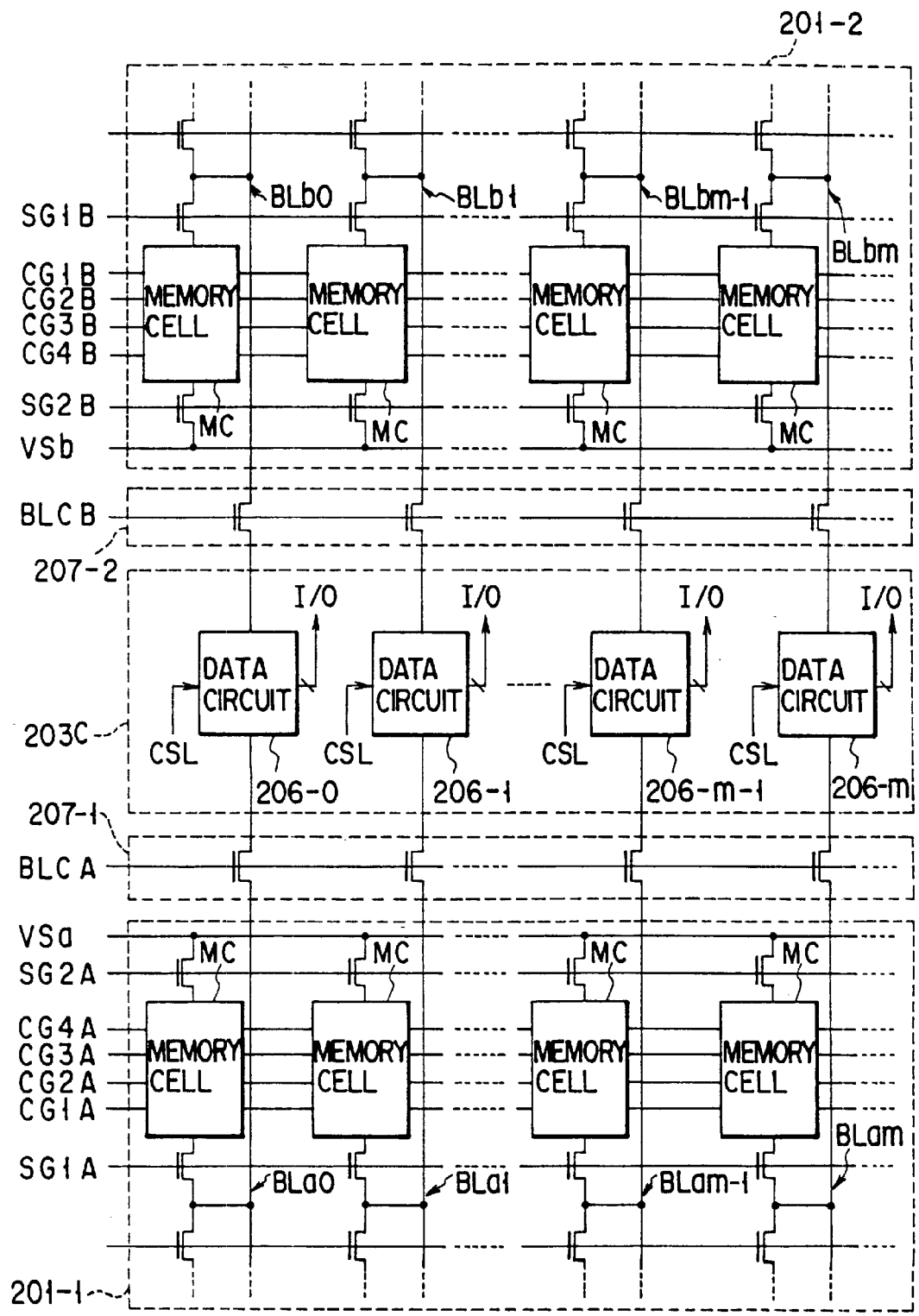
FIG. 37 is a diagram showing the structures of the cell array and the column-system circuit shown in FIG. 36.

FIG. 37 is a diagram showing the structures of the memory cell array and the column-system circuit shown in FIG. 36. FIG. 38A is a diagram showing a state of voltage input when data is read from the memory cell shown in FIG. 37. FIG. 38B is a diagram showing voltage input waveforms and output waveforms appearing on the bit line.

As shown in FIG. 37, each of the memory cell arrays 201-1 and 201-2 has memory cells MC arranged in a matrix manner.

The bit line controller 203C includes "m" data circuits 206. The data circuit 206 is connected one bit line BLa and reference bit line BLb.

As shown in FIG. 38A, the NAND type EEPROM has a structure such that its one cell MC includes a plurality of memory cell transistors M1 to M4 connected in series so that a NAND type cell MC is formed. An end of the cell MC is connected to the bit line BL through the selection transistor S1, while another end of the same is connected to the source line VS through the selection transistor S2. The group of the memory cell transistors M sharing the control gate CG forms a unit called a "page". Writing and reading of data are simultaneously performed with respect to the page. A group of the memory cell transistors M connected to the four control gates CG1 to CG4 forms a unit called a "block". The page and the block are selected by the control gate/selection gate driver 202B.

The memory cell transistor M stores multilevel data in accordance with the level of the threshold voltage. The apparatus according to the present invention reads the level of the threshold voltage as shown in FIGS. 38A and 38B. In this embodiment, memory cell transistor M2 having the control gate CG2 has been selected. Voltages as shown in FIG. 38A are applied to the portions. The bit line BL is brought to a floating state. When the bit line BL is previously reset to 0V, the bit line BL is electrically charged by the common source line VS through the NAND cell. The selection gates and the control gate voltages are controlled in such a manner that the potential of the electrically charged bit line BL is determined by the threshold voltage of the selected memory cell M2. In this embodiment, the selection gates SG1 and SG2, the control gates CG1, CG3 and CG4 are made to be 6V, the selected control gate CG2 is made to be 2V and the common source line VS is made to be 6V. The voltage waveforms are shown in FIG. 38B. If the potential of the bit line BL is 0V, the threshold voltage is 2V or higher. If the potential of the bit line is 3.5V, the threshold voltage is −1.5V or lower. In order to simplify the description, the expression the "threshold voltage" is a level determined in consideration of a back bias.

After electrons have been discharged from the floating gate of the memory cell as a result of the erasing operation, electrons are injected into the floating gate as a result of the writing operation which is performed in accordance with write data.

FIG. 39 is a graph showing output voltage which appears on the bit line and the number of the memory cells.

In a case where one memory cell has three states (data "0", "1" or "2"), a state where the output voltage from the bit line is 3.5V to 4.5V (a state where the threshold voltage is about −2.5V to −1.5V) as shown in FIG. 39 is made to be data "0" (erased), a state where the output voltage from the bit line is 1.5V to 2.5V (a state where the threshold voltage is about −0.5V to 0.5V) is made to be data "1" and a state where the output voltage from the bit line is 0V to 0.5V (a state where the threshold voltage is about 1.5V to 2.5V) is made to be "2".

Figure 40:
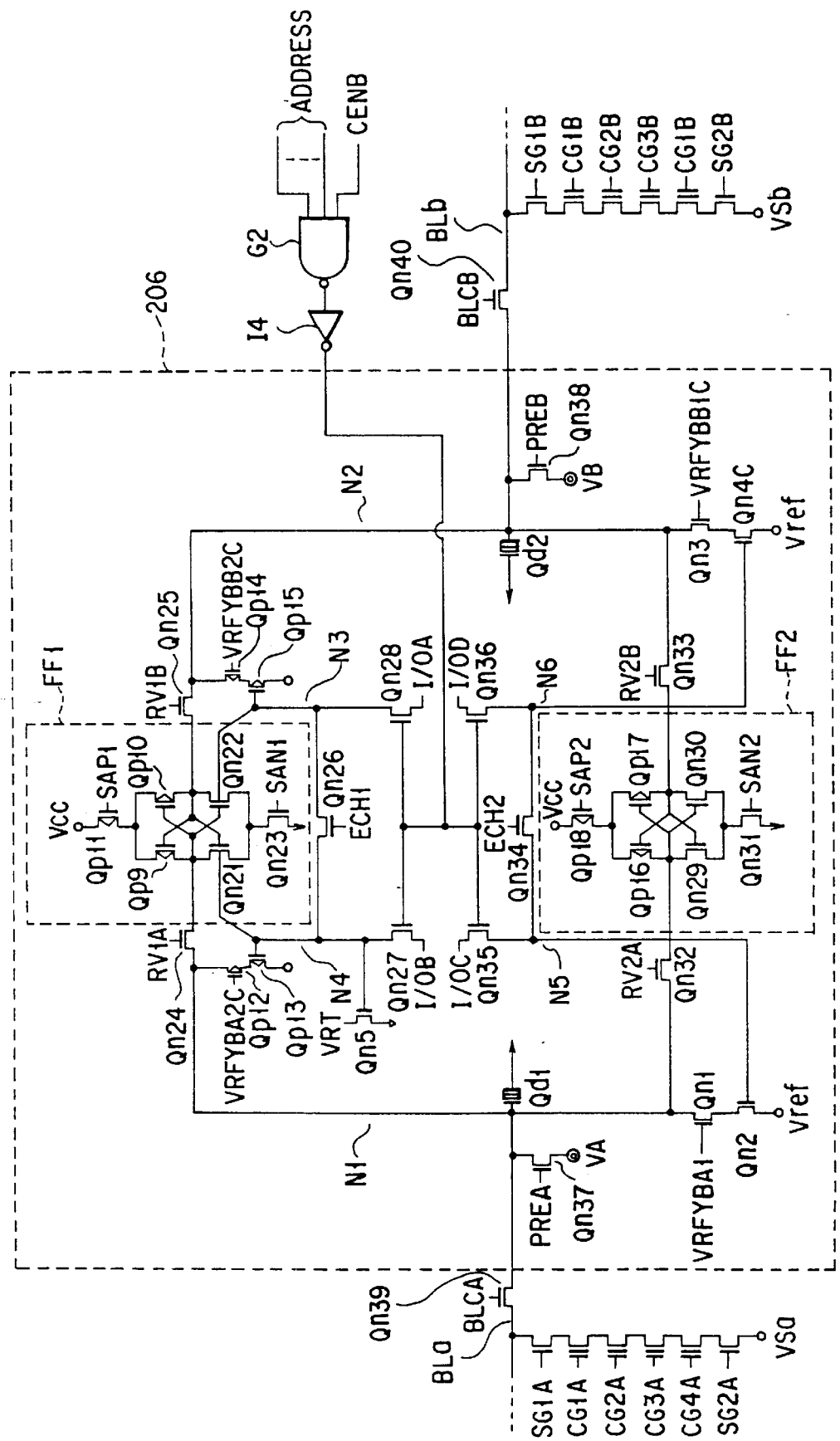
FIG. 40 is a circuit diagram showing the bit line controller shown in FIG. 37.

FIG. 40 is a circuit diagram showing the detailed structure of a data circuit 206 shown in FIG. 37. The data circuit 206 shown in FIG. 40 has a structure for storing three-levels.

As shown in FIG. 40, write/read data is latched by a flip-flop FF1 formed of n-channel MOS transistors Qn21, Qn22 and Qn23 and p-channel MOS transistors Qp9, Qp10 and Qp11 and a flip-flop FF2 formed of n-channel MOS transistors Qn29, Qn30 and Qn31 and p-channel MOS transistors Qp16, Qp17 and Qp18. The foregoing flip-flops FF1 and FF2 serve as sense amplifiers.

The flip-flop FF1 latches whether "0" is written or other (i.e., "1" or "2") is written as write data information and senses and latches whether the memory cell has information of "0" or information of "1" or "2" as data information. The flip-flop FF2 latches whether "1" is written or "2" is written as data information and senses and latches whether the memory cell has information of "1" or information of "2" as read data information.

The data input/output lines I/OA and I/OB and the flip-flop FF1 are connected to each other through the n-channel MOS transistors Qn28 and Qn27. The data input/output lines I/OC and I/OD and the flip-flop FF2 are connected to each other through the n-channel MOS transistors Qn35 and Qn36. The data input/output lines I/OA, I/OB, I/OC and I/OD are also connected to the data input/output buffer 205 shown in FIG. 36.

The gates of the n-channel MOS transistors Qn27, Qn28, Qn35 and Qn36 are connected to the output of a column address decoder formed of a NAND logic circuit G2 and an inverter I4. The n-channel MOS transistors Qn26 and Qn34 equalizes flip-flops FF1 and FF2 when signals ECH1 and ECH2 are "H". The n-channel MOS transistors Qn24 and Qn32 control the connection between the flip-flops FF1 and FF2 and a MOS capacitor Qd1. The n-channel MOS transistors Qn25 and Qn33 control the connection between the flip-flops FF1 and FF2 and a MOS capacitor Qd2.

A circuit formed of the p-channel MOS transistors Qp12 and Qp13 changes the gate voltage of the MOS transistor Qd1 in accordance with data in the flip-flop FF1 and in response to activating signal VRFYBA. A circuit formed of the p-channel MOS transistor Qp14 and Qp15 changes the gate voltage of the MOS capacitor Qd2 in accordance with data in the flip-flop FF1 and in response to activating signal VRFYBB. A circuit formed of the n-channel MOS transistors Qn1 and Qn2 changes the gate voltage of the MOS capacitor Qd1 in accordance with data in the flip-flop FF2 and in response to activating signal RRFYBA1. A circuit formed of the n-channel MOS transistors Qn3 and Qn4 changes the gate voltage of the MOS capacitor Qd2 in accordance with data in the flip-flop FF2 and in response to activating signal VRFYBB1.

Each of the MOS capacitors Qd1 and Qd2 comprises depletion n-channel MOS transistors and have capacities which are sufficiently smaller than the capacity of the bit line. The n-channel MOS transistor Qn37 electrically charges the MOS capacitor Qd1 in response to signal PREA. The n-channel MOS transistor Qn38 electrically charges the MOS capacitor Qd2 to voltage VB in response to signal PREB. The n-channel MOS transistors Qn39 and Qn40 control the connection between the data circuit 206 and the bit lines Bla and Blb in response to signals BLCA and BLCB. A circuit formed of the n-channel MOS transistors Qn37 and Qn38 also serves as a bit line voltage controller. A circuit formed of the p-channel MOS transistors Qp12 and QP13, a circuit formed of the p-channel MOS transistors Qp14 and Qp15, a circuit formed of the n-channel MOS transistors Qn1 and Qn2 and a circuit formed of the n-channel MOS transistors Qn3 and Qn4 also serve as bit line voltage controllers.

The operation of the EEPROM having the above-mentioned structure will now be described with reference to the operation waveform. In the following description, a state where control gate CG2A has been selected will now be described.

Reading Operation

Figure 41:
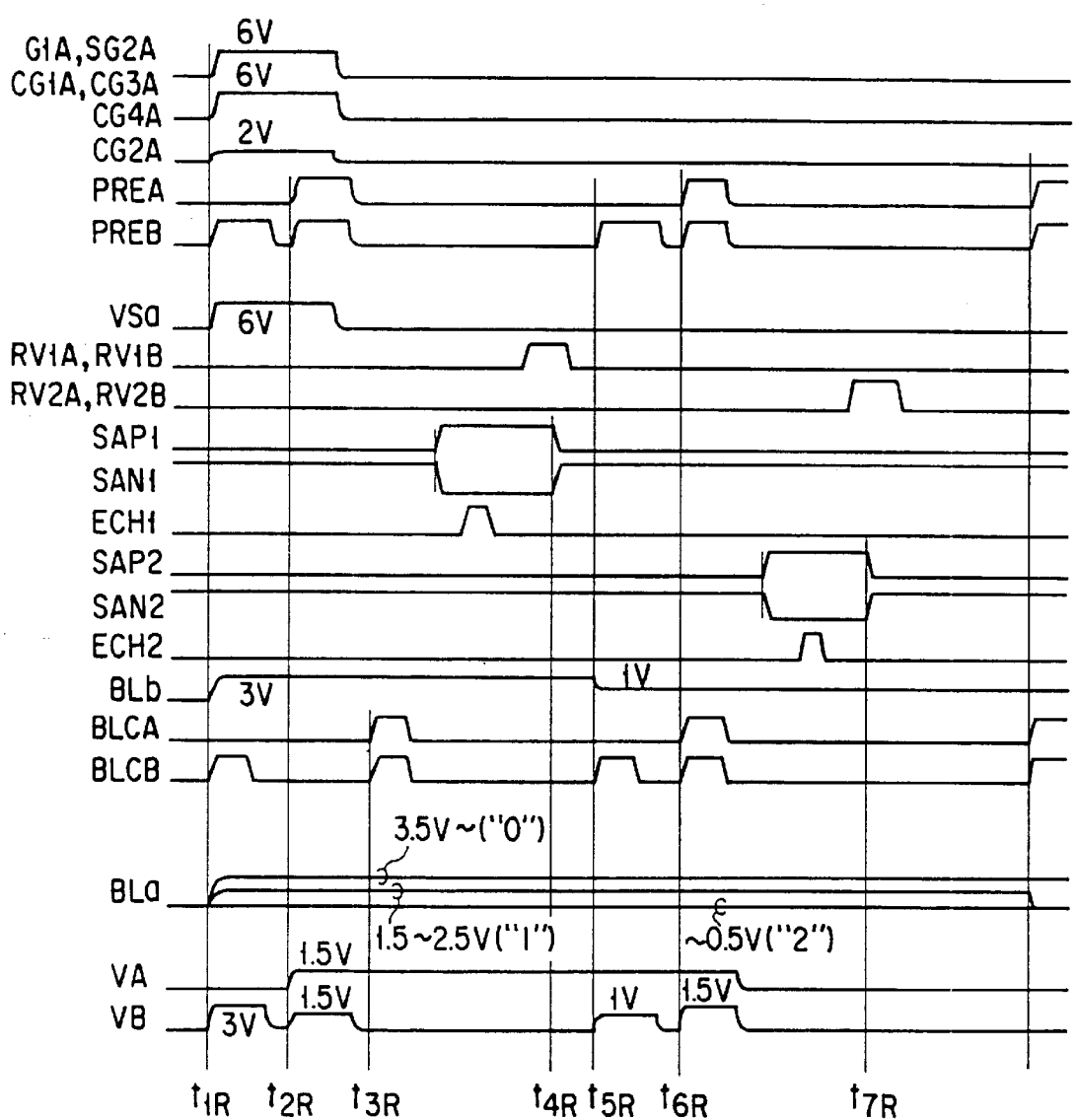
FIG. 41 is an operation waveform showing the reading operation.

FIG. 41 is an operation waveform showing a reading operation.

As shown in FIG. 6, at time $t_{1R}$, the selected control gate CG2A in the block selected by the control gate/selection gate driver 202B is made to be 2V, and non-selected control gates CG1A, CG3A and CG4A and selection gates SG1A and SG2A are made to be 6V. The source potential of the memory cell is made to be 6V. If the memory cell is "0", the bit line BLa is made to be 3.5V or higher. If it is "1", the bit line BLa is made to be 1.5V or higher and 2.5V or lower. If it is "2", the bit line BLa is made to be 0.5V or lower. The reference bit line BLb is electrically charged from VB to 3V. If voltage drop corresponding to the threshold voltage of the n-channel MOS transistor Qn40 raises a problem, the level of the signal BLCA is required to be raised.

At time $t_{2R}$, the levels of the nodes N1 and N2 of the capacitors Qd1 and Qd2 are made to be 1.5V, and then brought to a floating state. At time $t_{3R}$, BLCA and BLCB are made to be Vcc (for example, 5V) so that the potentials of the bit lines BLa and BLb are transferred to N1 and N2. Then, the signals BLCA and BLCB are again made to be "L" so that the bit line BLa and the MOS capacitor Qd1 are separated from each other and the bit line BLb and the MOS capacitor Qd2 are separated from each other. The signals SAN1 and SAP1 are respectively brought to "L, H" so that the flip-flop FF1 is deactivated. Thus, the signal ECH1 is made to be "H" so that it is equalized. Then, signals RV1A and RV1B are made to be "H". When voltage drop corresponding to the threshold voltages of the n-channel MOS transistors Qn24 and Qn25 raises a problem, the levels of the signals RV1A and RV1B are required to be raised. At time $t_{4R}$, the signals SAN1 and SAP1 respectively made to be "H, L", the voltages of the nodes N1 and N2 are sensed and latched. As a result, a fact that data in the memory cell is "0" or other (i.e., "1" or "2") is sensed by the flip-flop FF1 and its information is latched by the same.

Then, whether the memory cell is "1" or "2" is sensed.

At time $t_{5R}$, the dummy bit line BLb is electrically charged from VB to 1V. At time $t_{6R}$, the nodes N1 and N2 of the capacitors Qd1 and Qd2 are made to be 1.5V, and then brought to a floating state. The signals BLCA and BLCB are again made to be "L" so that the bit line BLa and the MOS capacitor Qd1 are separated from each other and the bit line BLb and the MOS capacitor Qd2 are separated from each other. The signals SAN2 and SAP2 respectively are made to be "L" and "H" so that the flip-flop FF2 is deactivated. Moreover, the signal ECH2 is made to be "H" so as to be equalized. Then, the signals RV2A and RV2B are made to be "H". At time $t_{7R}$, the signals SAN2 and SAP2 respectively are again made to be "H" and "L" so that the voltage of the node N1 is sensed and latched. Thus, whether data in the memory cell is "1" or "2" is sensed by the flip-flop FF2 and information of this is latched by the same.

FIG. 42 is a table showing data which is sensed and latched by the flip-flops FF1 and FF2.

As shown in FIG. 42, data in the flip-flops FF1 and FF2 are output to the data input/output lines I/OA, I/OB, I/OC and I/OD.

Data to be output to the outside of the chip may be data obtained by converting signals output to the data input/output line I/OA, I/OB, I/OC and I/OD by the data input/output buffer 205.

Writing Operation

Prior to performing the writing operation, supplied data for two bits is converted by the data input/output buffer 205 so as to be supplied to the bit line controller 203C (the data circuit 206).

FIG. 43 is a table showing data to be supplied to the data circuit 206 and latched by the flip-flops FF1 and FF2. The relationship between four-level data and the data input/output line I/OA, I/OB, I/OC and I/OD is as shown in FIG. 43.

Converted ternary data is transferred to a data circuit at a column address instructed with the address signal when the column activating signal CENB is "H".

FIG. 44 is an operation waveform showing the writing operation.

At time $t_{1w}$, voltage VA is made to be the bit line writing control voltage 1V so that the bit line BLa is made to be 1V. When voltage drop of the n-channel MOS transistor Qn39 corresponding to the threshold voltage raises a problem, the level of the signal BLCA is required to be raised. Then, the signal PRE is made to be "L" so that the bit line is brought to a floating state. At time $t_{2w}$, the signal RV2A is made to be 1.5V. As a result, bit line control voltage of 0V is applied to the bit line of the columns having data "2". When the threshold voltage of the n-channel MOS transistor Qn32 is made to be 1V, the n-channel MOS transistor Qn32 is turned off when "0" or "1" is written. When "2" is written, the n-channel MOS transistor Qn32 is turned on. Then, VRFYBA is made to be 0V at time $t_{3w}$, and bit line write control voltage Vcc (for example, 5V) is output from a data circuit having data "0" to the bit line.

As a result, bit lines for writing "0" are made to be Vcc, bit lines for writing "1" are made to be 1V and bit lines for writing "2" are made to be 0V. At time $t_{1w}$, selection gate SG1A and control gates CG1A to CG4A of the block selected by the control gate/selection gate driver 202B are made to be Vcc. The selection gate SG2A is made to be 0V. Then, the selected control gate CG2A is made to be high voltage of VPP (for example, 20V), while the non-selected control gates CG1A, CG3A and CG4A are made to be intermediate voltage of VM (for example, 10V). In the memory cell corresponding to a data circuit storing data "2", the difference in the potential between the channel potential of 0V and VPP of the control gate caused electrons to be injected into the floating gate so that the threshold voltage is increased. In the memory cell corresponding to the data circuit storing data "1", the difference in the potential between the channel potential of 1V and VPP of the control gate causes electrons to be injected into the floating gate so that the threshold voltage is increased. The reason why the channel potential is made to be 1V is that the quantity of electrons may be smaller as compared with the case in which data "2" is written. In the memory cell corresponding to the data circuit storing data "0", the difference in the potential between the channel potential and VPP of the control gate is small. Therefore, substantially no electrons is injected into the floating gate. Therefore, the threshold voltage of the memory cell is not changed. During the writing operation, signals SAN1, SAN2, VRFYBB, PREB and BLCB are "H" level, signals SAP1, SAP2, RV1A, RV1B, RV2B, ECH1 and ECH2 are "L" level and the voltage VB is 0V.

Verify Reading Operation

Figure 45:
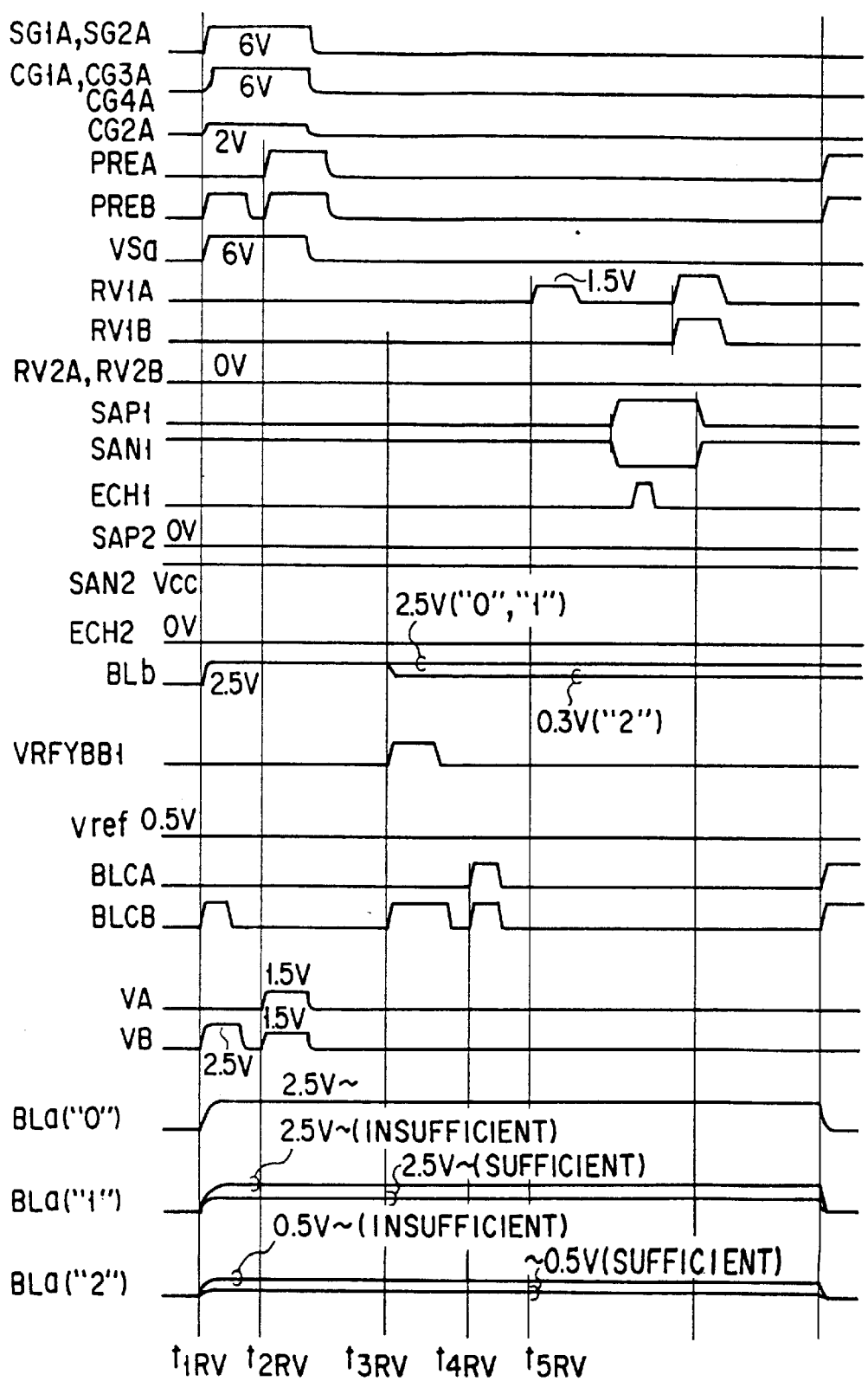
FIG. 45 is an operation waveform showing the verify reading operation.

FIG. 45 is an operation waveform showing the verify reading operation.

At time $t_{1RV}$, the selected control gate CG2A in the block selected by the control gate/selection gate driver 202B is made to be 2V, the non-selected control gates CG1A, CG3A and CG4A and the selection gates SG1A and SG2A are made to be 6V. The potential of the memory cell is made to be 6V. When data "0" is written, the bit line BLa is made to be 3.5V or higher. When data "1" has been sufficiently written, the bit line BLa is made to be 2.5V or lower. When data "1" has been written insufficiently, it is made to be 1.5V or higher. When data "2" has been sufficiently written, it is made to be 0.5V or lower. When data "2" has been written insufficiently, it is made to be 0.5V or higher. The dummy bit line BLb is electrically charged from VB to 2.5V. The reason why the potential of the dummy bit line BLb is made to be a level lower, by 0.5V, than 3V employed when data "1" is read is that data must be sufficiently written in the memory cell. When degree of voltage drop corresponding to the threshold voltage of the n-channel MOS transistor Qn40 raises a problem, the level of the signal BLCA must be raised.

At time $t_{2RV}$, the nodes N1 and N2 of the capacitors Qd1 and Qd2 are made to be 1.5V, and then brought to a floating state. At time $t_{3RV}$, VRFYBB1 is made to be "H". As can be understood from FIG. 42, the node N6 is made to be "H" only when data "2" is written. Therefore, the dummy bit line BLb for writing data "2" is made from Vref to 0.5V. The reason why the potential of the dummy bit line BLb for writing data "2" is that data must be sufficiently written. When data "0" or "1" is written, the n-channel MOS transistor Qn4 is turned off because the node N6 is "L" and thus the dummy bit line BLb holds 2.5V.

At time $t_{4RV}$, the control gate BLCA and BLCB of the transfer gates 207-1 and 207-2 are made to be Vcc (for example, 5V) so that the potentials of the bit lines BLa and BLb are transferred to the nodes N1 and N2. Then, the signals BLCA and BLCB are again made to be "L" so that the bit line BLa and the MOS capacitor Qd1 are separated from each other and the bit line BLb and the MOS capacitor Qd2 are separated from each other.

At time $t_{5RV}$, the signal RV1A is made to be 1.5V. As a result, node N1 of the column for writing data "0" is grounded. When the threshold voltage of the n-channel MOS transistor Qn24 is made to be 1V, the n-channel MOS transistor Qn24 is turned off when "1" or "2" is written. When "0" is written, the n-channel MOS transistor Qn24 is turned on.

The signals SAN1 and SAP1 are made to be "L" and "H" so that the flip-flop FF1 is deactivated. When the signal ECH1 is made to be "H" so as to be equalized. Then, the signals RV1A and RV1B are made to be "H". When the degree of voltage drop corresponding to the threshold voltage of the n-channel MOS transistors Qn24 and Qn25 raises a problem, the levels of the signals RV1A and RV1B are required to be raised. At time $t_{4R}$, the signals SAN1 and SAP1 are again made to be "H" and "L" so that the voltages of the nodes N1 and N2 are sensed and latched.

As described above, in the data circuit storing write data of "1", whether or not data in the corresponding memory cell has been sufficiently brought to the state for writing "1" is detected. If data in the memory cell is "1", the flip-flop FF1 senses and latches the voltage of the node N1 so that the write data is changed to "1". If data in the memory cell is not "1", the flip-flop FF1 senses and latches the voltage of the node N1, write data is maintained at "1". In the data circuit storing write data of "2", whether or not data in the corresponding memory cell has been sufficiently brought to the state for writing "2" is detected. If data in the memory cell is "2", the flip-flop FF1 senses and latches the voltage of the node N1 so that write data is changed to "0". If data in the memory cell is not "2", the flip-flop FF1 senses and latches the voltage of the node N1 so that write data is maintained at "2". Write data in the data circuit storing write data "0" is not changed.

During the write verification, the signal VRFYBB is made to be "H" and the voltage VS is made to be 0V.

If all of the selected memory cells for writing "1" or "2" have reached a required threshold voltage, the nodes N4 of all of the data circuits are made to be "L". That is, when data has been sufficiently written to all of the selected memory cells for writing "1" or "2", the nodes N3 of all of the data circuits 206-0, 206-1, . . . , 206-m−1 and 206-m are made to be "H". On the other hand, node N4 of the same is made to be "L". If the foregoing facts are detected, whether or not all of the selected memory cell for writing "2" or "3" have reached a required threshold voltage can be detected. Completion of writing of "2" and "3" can be detected by using a transistor Qn5 for simultaneously detecting writing "2" and "3", as shown in FIG. 40. After the verify read operation has been completed, VRT is precharged to, for example, Vcc. If one or more memory cells in which "1" or "2" has been written insufficiently exists, the node N4 of the data circuit is "H". Therefore, the n-channel MOS transistor Qn5 is turned on so that VRT is grounded. After data has been sufficiently written on all of the memory cells for writing "1" or "2", the nodes N4 of the data circuits 206-0, 206-1, . . . , 206-m−1 and 206-m are made to be "L". As a result, the n-channel MOS transistors Qn5 in all of the data circuits are turned off. Thus, VRT holds the precharged potential.

The multilevel storing NAND type EEPROM according to the sixth embodiment has the structure such that one or more bit line voltage controller electrically charge the bit line to a required bit line write control voltage when data is written. The apparatus according to this embodiment is able to realize a bit line voltage controller having a simple structure and capable of applying a bit line write control voltage corresponding to n(n≧2)-level write data to the bit line.

Therefore, the size of the column-system circuit 3 can be reduced because the number of the sense amplifier circuits, data latch circuits and verifying circuits. Therefore, a non-volatile semiconductor memory device capable of realizing a highly integrated structure can be obtained.

(Seventh Embodiment)

A multilevel storing NAND type EEPROM according to a seventh embodiment of the present invention will now be described.

Although the EEPROM according to the sixth embodiment has the structure for ternary-level is treated as the number of the multilevel data, the EEPROM according to the seventh embodiment has a structure such that the number of the multilevel data is four.

The EEPROM according to the seventh embodiment has a structure similar to that according to the sixth embodiment shown in FIGS. 36 and 37.

FIG. 46 is a graph showing distribution of threshold voltage of a memory cell transistor when four-levels are stored.

When the EEPROM is structure to be capable of storing four-levels, four writing states are provided for one memory cell transistor M. The four writing states are distinguished from one another in accordance with the threshold voltage of the memory cell transistor M.

As shown in FIG. 46, the state of data "0" in the EEPROM having the power supply voltage Vcc which is set to 3V is made to be the same as the state after data has been erased. Thus, for example, a negative threshold voltage is assigned. In a state of data "1", a threshold voltage from, for example, 0.5V to 0.8V is assigned. In a state of data "2", a threshold voltage from, for example, 1.5V to 1.8V is assigned. In a state of data "3", a threshold voltage from, for example, 2.5V to 2.8V is assigned.

When data is read from the memory cell transistor M, three read voltages VCG2R, VCG3R and VCG1R are applied to the control gate CG.

Initially, reading voltage VCG2R is applied to the control gate CG. In accordance with whether the memory cell transistor M turns on or off, whether stored data is "0, 1" or "2, 3" is detected. Then, reading voltage VCG3R is applied so that whether stored data is "2" or "3" is detected. When reading voltage VCG1R is applied, whether data is "0" or "1" is detected. The reading voltages VCG1R, VCG2R and VCG3R are, for example, 0V, 1V and 2V, respectively.

Voltages VCG1V, VCG2V and VCG3V are voltages called verify read voltages which are used to detect (when a verifying operation is performed) whether or not data has been sufficiently written. The verify read voltage is applied to the control gate CG after data has been written. Whether or not the threshold voltage of the memory cell transistor M has been shifted to a range corresponding to written data can be detected in accordance with whether or not the memory cell transistor M is turned on when the verify read voltage has been applied to the control gate CG. By using this, whether or not sufficient writing has been performed is detected. The verify read voltages VCG1V, VCG2V and VCG3V are, for example, 0.5V, 1.5V and 2.5V, respectively.

FIG. 47 is a circuit diagram of a data circuit 206B of the EEPROM according to the seventh embodiment of the present invention. The data circuit 206B shown in FIG. 47 is arranged to store four-level data.

As shown in FIG. 47, write/read data is latched by a flip-flop FF1 formed of n-channel MOS transistors Qn21, Qn22 and Qn23 and p-channel MOS transistors Qp9, Qp10 and Qp11 and a flip-flop FF2 formed of n-channel MOS transistors Qn29, Qn30 and Qn31 and p-channel MOS transistors Qp16, Qp17 and Qp18. The foregoing flip-flops FF1 and FF2 serve as sense amplifiers.

The flip-flops FF1 and FF2 latches whether "0" is written, whether "1" is written, whether "2" is written or whether "3" is written as write data information and senses and latches whether the memory cell has information of "0", information of "1", information of "2" or information of "3" as read data information.

The data input/output lines I/OA and I/OB and the flip-flop FF1 are connected to each other through the n-channel MOS transistors Qn28 and Qn27. The data input/output lines I/OC and I/OD and the flip-flop FF2 are connected to each other through the n-channel MOS transistors Qn35 and Qn36. The data input/output lines I/OA, I/OB, I/OC and I/OD are also connected to the data input/output buffer 205 shown in FIG. 36.

The gates of the n-channel MOS transistors Qn27, Qn28, Qn35 and Qn36 are connected to the output of a column address decoder formed of a NAND logic circuit G2 and an inverter I4. The n-channel MOS transistors Qn26 and Qn34 equalize flip-flops FF1 and FF2 when signals ECH1 and ECH2 are "H". The n-channel MOS transistors Qn24 and Qn32 control the connection between the flip-flops FF1 and FF2 and a MOS capacitor Qd1. The n-channel MOS transistors Qn25 and Qn33 control the connection between the flip-flops FF1 and FF2 and a MOS capacitor Qd2.

A circuit formed of the p-channel MOS transistors Qp12 and Qp13 changes the gate voltage of the MOS transistor Qd1 in response to activating signal VRFYBA and in accordance with data in the flip-flop FF1. A circuit formed of the p-channel MOS transistor Qp14 and Qp15 changes the gate voltage of the MOS capacitor Qd2 in accordance with data in the flip-flop FF1 and in response to activating signal VRFYBB. A circuit formed of the n-channel MOS transistors Qn1 and Qn2 changes the gate voltage of the MOS capacitor Qd1 in accordance with data in the flip-flop FF2 and in response to activating signal RRFYBA1. A circuit formed of the n-channel MOS transistors Qn3 and Qn4 changes the gate voltage of the MOS capacitor Qd2 in accordance with data in the flip-flop FF2 and in response to activating signal VRFYBB1.

Each of the MOS capacitors Qd1 and Qd2 comprises a depletion n-channel MOS transistor and has a capacity which is sufficiently smaller than the capacity of the bit line. The n-channel MOS transistor Qn37 electrically charges the MOS capacitor Qd1 in response to signal PREA. The n-channel MOS transistor Qn38 electrically charges the MOS capacitor Qd2 to voltage VB in response to signal PREB. The n-channel MOS transistors Qn39 and Qn40 control the connection between the data circuit 206B and the bit lines Bla and Blb in response to signals BLCA and BLCB. A circuit formed of the n-channel MOS transistors Qn37 and Qn38 also serves as a bit line voltage controller. A circuit formed of the p-channel MOS transistors Qp12 and QP13, a circuit formed of the p-channel MOS transistors Qp14 and Qp15, a circuit formed of the n-channel MOS transistors Qn1 and Qn2 and a circuit formed of the n-channel MOS transistors Qn3 and Qn4 also serve as bit line voltage controllers.

The operation of the EEPROM having the above-mentioned structure will now be described with reference to the operation waveform. In the following description, a state where control gate CG2A has been selected will now be described.

Reading Operation

FIG. 48 is an operation waveform showing a reading operation.

As shown in FIG. 48, at time $t_{1R}$, voltages VA and VB respectively are made to be 1.8V and 1.5V so that bit lines BLa and BLb respectively are made to be 1.8V and 1.5V. When signals BLCA and BLCB are made to be "L" and the bit line BLa and the MOS capacitor Qd1 are separated from each other and the bit line BLb and the MOS capacitor Qd2 are separated from each other. Moreover, the bit lines BLa and BLb are brought to a floating state. When the signals PREA and PREB are made to be "L", the nodes N1 and N2 which are the gate electrodes of the MOS capacitors Qd1 and Qd2 are brought to a floating state. At time $t_{2R}$, the selected control gate CG2A in a block selected by the control gate/selection gate driver 202B is made to be 1V, and the non-selected control gates CG1A, CG3A and CG4A and the selection gates SG1A and SG2A are made to be Vcc. If the threshold voltage of the selected memory cell is 1V or lower, the bit line voltage is made to be lower than 1.5V. If the threshold voltage of the selected memory cell is 1V or higher, the bit line voltage is maintained at 1.8V. Then, at time $t_{3R}$, the signals BLCA and BLCB are made to be "H" so that data in the bit line is transferred to the MOS capacitors Qd1 and Qd2. Then, the signals BLCA and BLCB are again made to be "L" so that the bit line B1a and the MOS capacitor Qd1 are separated from each other and the bit line BLb and the MOS capacitor Qd2 are separated from each other. When the signals SAN1 and SAP1 respectively are made to be "L" and "H" so that the flip-flop FF1 is deactivated. When the signal ECH1 is made to be "H" so as to be equalized. Then, the signal RV1A and RV1B are made to be "H". At time $t_{4R}$, the signals SAN1 and SAP1 respectively are made to be "H" and "L" so that the voltages of the nodes N1 and N2 are sensed and latched. As a result, data in the memory cell is sensed whether it is "0" or "1"; or "2" or "3" by the flip-flop FF1 and information of this is latched.

Then, the selected control gate CG2A is made to be 2V. At time $t_{5R}$, the signals PREA and PREB are made to be "H" so that the nodes N1 and N2 which are gate electrodes of the MOS capacitors Qd1 and Qd2 respectively are made to be 1.8V and 1.5V. When the signals PREA and PREB are made to be "L", the nodes N1 and N2 which are gate electrodes of the MOS capacitors Qd1 and Qd2 are brought to a floating state. If the threshold voltage of the selected memory cell is 2V or lower, the bit line voltage is made to be 1.5V or lower. If the threshold voltage of the selected memory cell is 2V or higher, the bit line voltage is maintained at 1.8V. Then, at time $t_{6R}$, signals BLCA and BLCB are made to be "H". The signals BLCA and BLCB are again made to be "L" so that the bit line Bla and the MOS capacitor Qd1 are separated from each other and the bit line BLb and the MOS capacitor Qd2 are separated from each other. When the signals SAN2 and SAP2 are brought to "L" level so that the bit line Bla and the MOS capacitor Qd1 are separated from each other and the bit line BLb and the MOS capacitor Qd2 are separated from each other. When the signals SAN2 and SAP2 respectively are brought to "L" and "H" so that the flip-flop FF2 is deactivated. When the signal ECH2 is made to be "H" so as to be equalized. Then, the signal RV2A and RV2B are made to be "H". At time $t_{7R}$, the signals SAN2 and SAP2 respectively are made to be "H" and "L" so that the voltage of the node N1 is sensed and latched. Thus, whether or not data in the memory cell is "3" is sensed by the flip-flop FF2 and information of this is latched.

FIG. 49 is a is table showing read data sensed and latched by the flip-flops FF1 and FF2 at time $t_{7R}$.

Finally whether or not data written in the memory cell is "0" is sensed. At time $t_{8R}$, the bit lines BLa and BLb respectively are electrically charged to 1.8V and 1.5V, and then brought to a floating state. Also the nodes N1 and N2 which are the gate electrodes of the MOS capacitors Qd1 and Qd2 are brought to a floating state. Then, at time $t_{9R}$, the selected control gate CG2A in the block selected by the control gate/selection gate driver 202B is made to be 0V and the non-selected control gates CG1A, CG3A and CG4A and the selection gates SG1A and SG2A are made to be Vcc. If the threshold voltage of the selected memory cell is 0V or lower, the bit line voltage is made to be 1.5V or lower. If the threshold voltage of the selected memory cell is 0V or higher, the bit line voltage is maintained at 1.8V.

At time $t_{10R}$, signals BLCA and BLCB are made to be "H" so that data in the bit line is transferred to the MOS capacitors Qd1 and Qd2. Then, the signals BLCA and BLCB are again made to be "L" so that the bit line BLa and the MOS capacitor Qd1 are separated from each other and the bit line BLb and the MOS capacitor Qd2 are separated from each other. Prior to sensing data in the MOS capacitor, VRFYBA1 is made to be Vcc at time $t_{11R}$.

As can be understood from FIG. 49, the node N5 is made to be "H" only when data is "3". Therefore, only when data is "3", the n-channel MOS transistor Qn2 is turned on so that the node N1 is grounded. When the signals SAN2 and SAP2 respectively are made to be "L" and "H" so that the flip-flop FF2 is deactivated. When the signal ECH2 is made to be "H" so as to be equalized. Then, the signals RV2A and RV2B are made to be "H".

At time $t_{12R}$, the signals SAN2 and SAP2 respectively are made to be "H" and "L" so that the voltage of the node N1 is sensed and latched. Thus, whether or not data in the memory cell is "0" is sensed by the flip-flop FF2 and information of this is latched.

FIG. 50 is a table showing read data which is sensed and latched by the flip-flops FF1 and FF2.

As a result of the foregoing reading operation, four-level data is latched by the flip-flops FF1 and FF2, as shown in FIG. 50.

Data items shown in FIG. 50 have threshold voltages distributed as follows:

data "0": threshold voltage is 0V or lower data "1": threshold voltage is 0.5V or higher and 0.8V or lower data "2": threshold voltage is 1.5V or higher and 1.8V or lower data "3": threshold voltage is 2.5V or higher and 2.8V or lower During the reading operation, the signals VRFYBA and VRFYBB are "H" level. Moreover, the voltage Vs (Vsa, Vsb) is made to be 0V.

When the column activating signal CENB to be supplied to the column address decoder is made to be "H", data stored in the data circuit selected by the address signal is output to the data input/output lines I/OA, I/OB, I/OC and I/OD so as to be output to the outside of the EEPROM through the data input/output buffer 205.

The relationship among data stored in the memory cell, the threshold voltage and levels to be output to the data input/output lines I/OA, I/OB, I/OC and I/OD after data has been read is as shown in FIG. 50.

Data to be output to the outside of the chip may be data obtained by converting signals output to the data input/output lines I/OA, I/OB, I/OC and I/OD by the data input/output buffer 205.

Writing Operation

FIG. 51 is a flow chart schematically showing the writing operation.

In step #2, write data is loaded into the flip-flops FF1 and FF2.

In step #4, data "2" and "3" are substantially simultaneously written in the program first cycle.

In step #6, a verify read first cycle is performed to detect whether or not data "2" and "3" have been sufficiently written. If memory cell to which data has not been sufficiently written exists, writing is again performed (steps #8 and #10).

When data has been sufficiently written in all of the memory cells for writing data "2" and "3", data is, in step #12, written substantially simultaneously in the memory cell for writing data "1" (program second cycle). In step #14, a verify second cycle is performed to detect whether or not data "1" has been sufficiently written. Data is again written to a memory cell to which data "1" has not been sufficiently written (steps #16 and #18). When data has been sufficiently written in all of the memory cells, writing is ended.

The program first cycle, the verify read first cycle, the program second cycle and the verify read second cycle will sequentially be described.

(1) Program First Cycle

Prior to performing the writing operation, supplied data for two bits is converted by the data input/output buffer 4 so as to be supplied to the data circuit 206B.

FIG. 52 is a table showing write data to be supplied to the data circuit 206B and latched by the flip-flops FF1 and FF2. The relationship between the four-level data and the data input/output lines I/OA, I/OB, I/OC and I/OD is as shown in FIG. 52.

Converted four-level data is transferred to a data circuit at a column address instructed with the address signal when the column activating signal CENB is "H".

Figure 53:
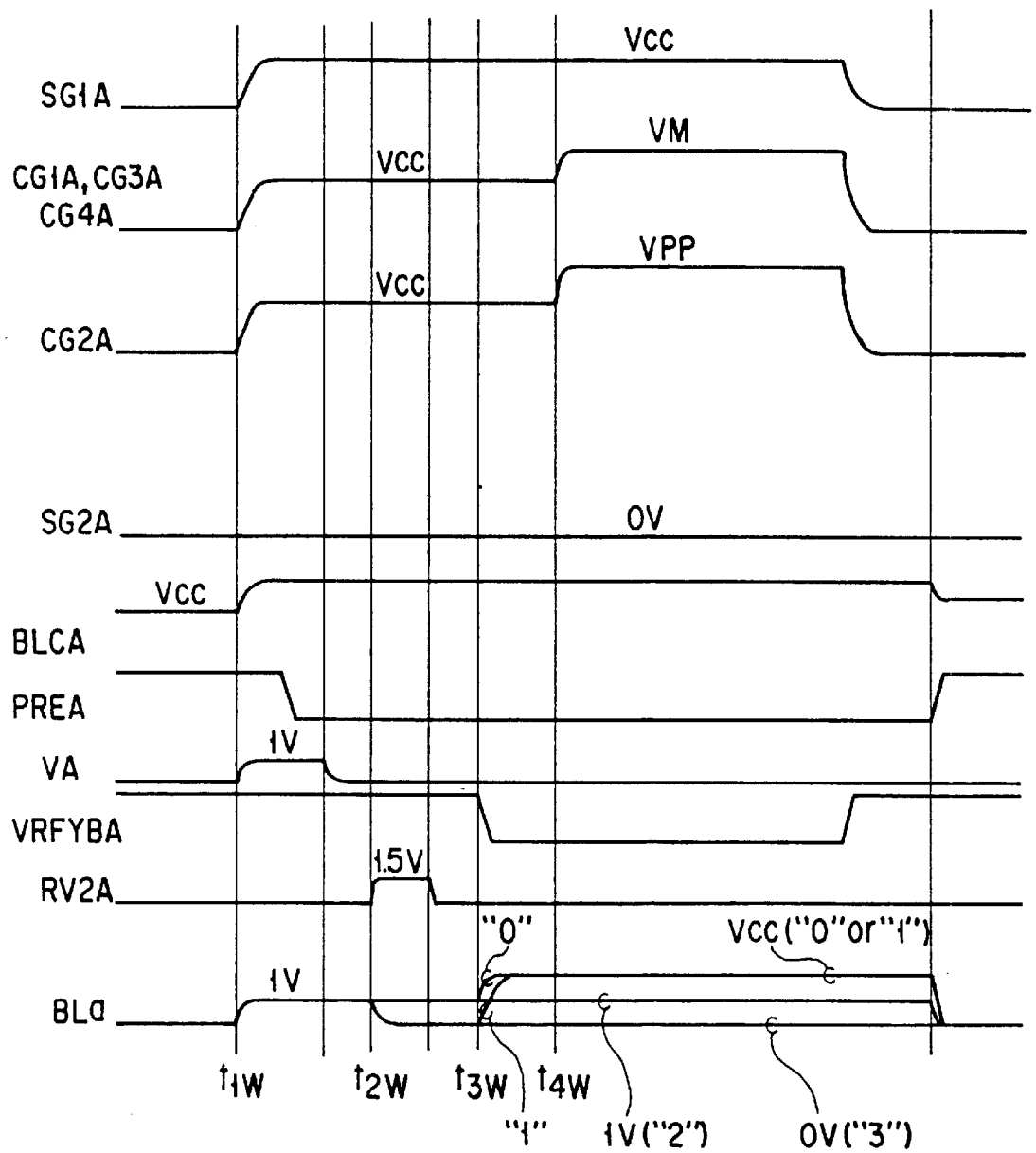
FIG. 53 is an operation waveform showing the writing operation (program first cycle)

FIG. 53 is an operation waveform showing the writing operation (the program first cycle).

At time $t_{1w}$, voltage VA is made to be the bit line writing control voltage 1V so that the bit line BLa is made to be 1V. When voltage drop of the n-channel MOS transistor Qn39 corresponding to the threshold voltage raises a problem, the level of the signal BLCA is required to be raised. Then, the signal PRE is made to be "L" so that the bit line is brought to a floating state. At time $t_{2w}$, the signal RV2A is made to be 1.5V. As a result, bit line control voltage of 0V is applied to the bit line of the columns having data "1" or "3". When the threshold voltage of the n-channel MOS transistor Qn32 is made to be 1V, the n-channel MOS transistor Qn32 is turned off when "0" or "2" is written. When "1" or "3" is written, the n-channel MOS transistor Qn32 is turned on. Then, VRFYBA is made to be 0V at time $t_{3w}$, and bit line write control voltage Vcc is output from a data circuit having data "0" or "1" to the bit line.

As a result, bit lines for writing "0" or "1" are made to be Vcc, bit line for writing "2" are made to be 1V and bit lines for writing "3" are made to be 0V.

At time $t_{1w}$, selection gate SG1A and control gates CG1A to CG4A of the block selected by the control gate/selection gate driver 202B are made to be Vcc. The selection gate SG2A is made to be 0V. Then, the selected control gate CG2A is made to be high voltage of VPP (for example, 20V), while the non-selected control gates CG1A, CG3A and CG4A are made to VM (for example, 10V). In the memory cell corresponding to a data circuit storing data "3", the difference in the potential between the channel potential of 0V and VPP of the control gate causes electrons to be injected into the floating gate so that the threshold voltage is increased. In the memory cell corresponding to the data circuit storing data "2", the difference in the potential between the channel potential of 1V and VPP of the control gate causes electrons to be injected into the floating gate so that the threshold voltage is increased. The reason why the channel potential is made to be 1V is that the quantity of electrons may be smaller as compared with the case in which data "3" is written. In the memory cell corresponding to the data circuit storing data "0" or "1", the difference in the potential between the channel potential and VPP of the control gate is small. Therefore, substantially no electrons is injected into the floating gate. Therefore, the threshold voltage of the memory cell is not changed. During the writing operation, signals SAN1, SAN2, VRFYBB, PREB and BLCB are "He level, signals SAP1, SAP2, RV1A, RV1B, RV2B, ECH1 and ECH2 are "L" level and the voltage VB is 0V.

(2) Verify Reading First Cycle

After the writing operation has been completed, the threshold voltages of the memory cell for writing "2" and that for writing "3" are detected (verification of writing). If a required threshold voltage has been realized, data in the data circuit is changed to "0". If the required threshold voltage has not been realized, data in the data circuit is maintained and writing is again performed. The program first cycle and write verify first cycle are repeated until all of the memory cells for writing "2" and those for writing "3" reach required threshold voltages.

FIG. 54 an operation waveform showing the verify reading operation (verify read first cycle).

At time $t_{1V}$, voltages VA and VB respectively are made to be 1.8V and 1.5V so that the bit lines BLa and BLb are made to be 1.8V and 1.5V. The signals BLCA and BLCB are made to be "L" so that the bit line Bla and the MOS capacitor Qd1 are separated from each other and the bit line BLb and the MOS capacitor Qd2 are separated from each other. Thus, the bit lines BLa and BLb are brought to a floating state. When signals PREA and PREB are made to be "L" so that the nodes N1 and N2 which are the gate electrodes of the MOS capacitors Qd1 and Qd2 are brought to a floating state. At time $t_{2V}$, the selected control gate CG2A in the block selected by the control gate/selection gate driver 202B is made to be 1.5V, the non-selected control gates CG1A, CG3A and CG4A and the selection gates SG1A and SG2A are made to be Vcc. If the threshold voltage of the selected memory cell is 1.5V or lower, the bit line voltage is made to be lower than 1.5V. If the threshold voltage of the selected memory cell is 1.5V or higher, the bit line voltage is maintained at 1.8V.

At time $t_{3V}$, the signals BLCA and BLCB are made to be "H" so that the potential of the bit line is transferred to the nodes N1 and N2. Then, the signals BLCA and BLCB are made to be "L" so that the bit line Bla and the MOS capacitor Qd1 are separated from each other and the bit line BLb and the MOS capacitor Qd2 are separated from each other. At time $t_{4V}$, the signal RV2A is made to be, for example, 1.5V which is not higher than Vcc. If the threshold voltage of the n-channel MOS transistor Qn32 is 1V, the n-channel MOS transistor Qn32 in the data circuit storing write data "3" is turned on so that the node N1 is made to be 0V. If "2" has been sufficiently written in the memory cell in the data circuit storing write data "2", the n-channel MOS transistor Qn32 is turned off so that the node N1 is maintained at 1.5V or higher. If writing of "2" is insufficient, the node N1 is 1.5V or lower.

When the signal VRFYBA has been made to be "L" at time $t_{5V}$, the p-channel MOS transistor Qp13 in the data circuit storing write data "0" or "1" is turned on so that the node N1 is made to be Vcc. The signals SAN1 and SAP1 respectively are made to be "L" and "H" so that the flip-flop FF1 is deactivated so that the signal ECH1 is made to be "H" so as to be equalized. Then, signals RV1A and RV1B are made to be "H". When the signals SAN1 and SAP1 are again made to be "H" and "L", the voltage of the node N1 is sensed and latched at time $t_{6V}$. Then, whether or not data in the memory cell corresponding to the data circuit storing write data "2" has been sufficiently brought to the state for writing "2" is detected. If data in the memory cell is "2", the flip-flop FF1 senses and latches the voltage of the node N1 so that write data is changed to "0". If data in the memory cell is not "2", the flip-flop FF1 senses and latches the voltage of the node N1 so that write data is maintained at "2". Write data for the data circuit storing write data "0" or "1" or "3" is not changed.

Then, the selected control gate is made to be 2.5V. If the threshold voltage of the selected memory cell is 2.5V or lower, the bit line voltage is made to be lower than 1.5V. If the threshold voltage of the selected memory cell is 2.5V or higher, the bit line voltage is maintained at 1.8V. At time $t_{7V}$, signals BLCA and BLCB are made to be "H" so that the potential of the bit line is transferred to the nodes N1 and N2. The signals BLCA and BLCB are again made to be "L" so that the bit line Bla and the MOS capacitor Qd1 are separated from each other and the bit line BLb and the MOS capacitor Qd2 are separated from each other. When the signal VREYBC is then made to be "L", the p-channel MOS transistor Qp12c of a data circuit storing write data "0" or "1" and a data circuit on which "2" has been sufficiently written is turned on so that the node N1 is made to be Vcc. When the signals SAN1 and SAP1 are made to be "L" and "H", the flip-flop FF1 is deactivated so that the signal ECH1 is made to be "H" so as to be equalized. Then, the signals RV1A and RV1B respectively are made to be "H" and "L" so that the voltage of the node N1 is sensed and latched.

Then, as shown in FIG. 54, write data is changed. At time $t_{9V}$, the signals BLCA and BLCB are made to be "H" so that the potential of the bit line is transferred to the nodes N1 and N2. The signals BLCA and BLCB are again made to be "L" so that the bit line Bla and the MOS capacitor Qd1 are separated from each other and the bit line BLb and the MOS capacitor Qd2 are separated from each other. At time $t_{10V}$, the VRFYBA1 is made to be "H" so that the n-channel MOS transistor Qn2 in the data circuit storing write data "0" or "2" is turned on so that the node N1 is made to be Vcc. The signals SAN2 and SAP2 respectively are made to be "L" and "H" so that the flip-flop FF2 is deactivated and the signal ECH2 is made to be "H" so as to be equalized. Then, the signals RV2A and RV2B are made to be "H". At time $t_{11V}$, the signals SAN2 and SAP2 are made to be "H" and "L" so that the voltage of the node N1 is sensed and latched.

In the seventh embodiment, VRFYBA1 is made to be Vcc at time $t_{10V}$, the node N1 of the MOS capacitor Qd1 is electrically charged to be higher than the potential (1.5V) of the node N2 in a case where "0" or "2" is written. The signal RV2B may be made to be, for example, 1.5V at time $t_{10V}$. When data "0" is written or data "2" is written in the foregoing case, the node N6 is 0V so that the n-channel MOS transistor Qn33 is turned on so that the node N2 is made to be 0V. When "1" or "3" is written, the node N6 is made to be Vcc and the node N2 is made to be 1.5V so that the n-channel MOS transistor Qn33 is turned off. Thus, the node N2 can be maintained at 1.5V. At time $t_{10V}$, the VRFYBA1 is made to be Vcc. Since charging of the node N1 when "0" or "2" is written is required to be higher than the potential (0V) of the node N2, low voltage of about 0.5V is sufficient to electrically charge the node N1.

As described above, it is detected whether or not data in the memory cell corresponding to the data circuit storing write data "3" has been sufficiently brought to a state for writing "3". If data in the memory cell is "3", the flip-flops FF1 and FF2 sense and latch the voltage of the node N1 so that write data is changed to "0". If data in the memory cell is not "3", the flip-flops FF1 and FF2 sense and latch the voltage of the node N1 so that write data "3" is maintained. Write data of the data circuit storing write data "0" or "1" or "2" is not changed.

During the write verification, the signal VRFYBB is made to be "H" and the voltage VS is made to be 0V.

FIG. 55 is a table showing data latched by the flip-flops FF1 and FF2 after data "2" or "3" has been sufficiently written.

If all of the selected memory cells for writing "2" or "3" have reached a required threshold voltage, data in the data circuits are as shown in FIG. 55. That is, when data has been sufficiently written to all of the selected memory cells for writing "2" or "3", the nodes N3 of all of the data circuits 206B-0, 206B-1, . . . , 206N-m-1 and 206B-m are made to be "H". On the other hand, node N4 of the same is made to be "L". If the foregoing facts are detected, it can be determined whether or not all of the selected memory cell for writing "2" or "3" have reached a required threshold voltage.

Figure 56:
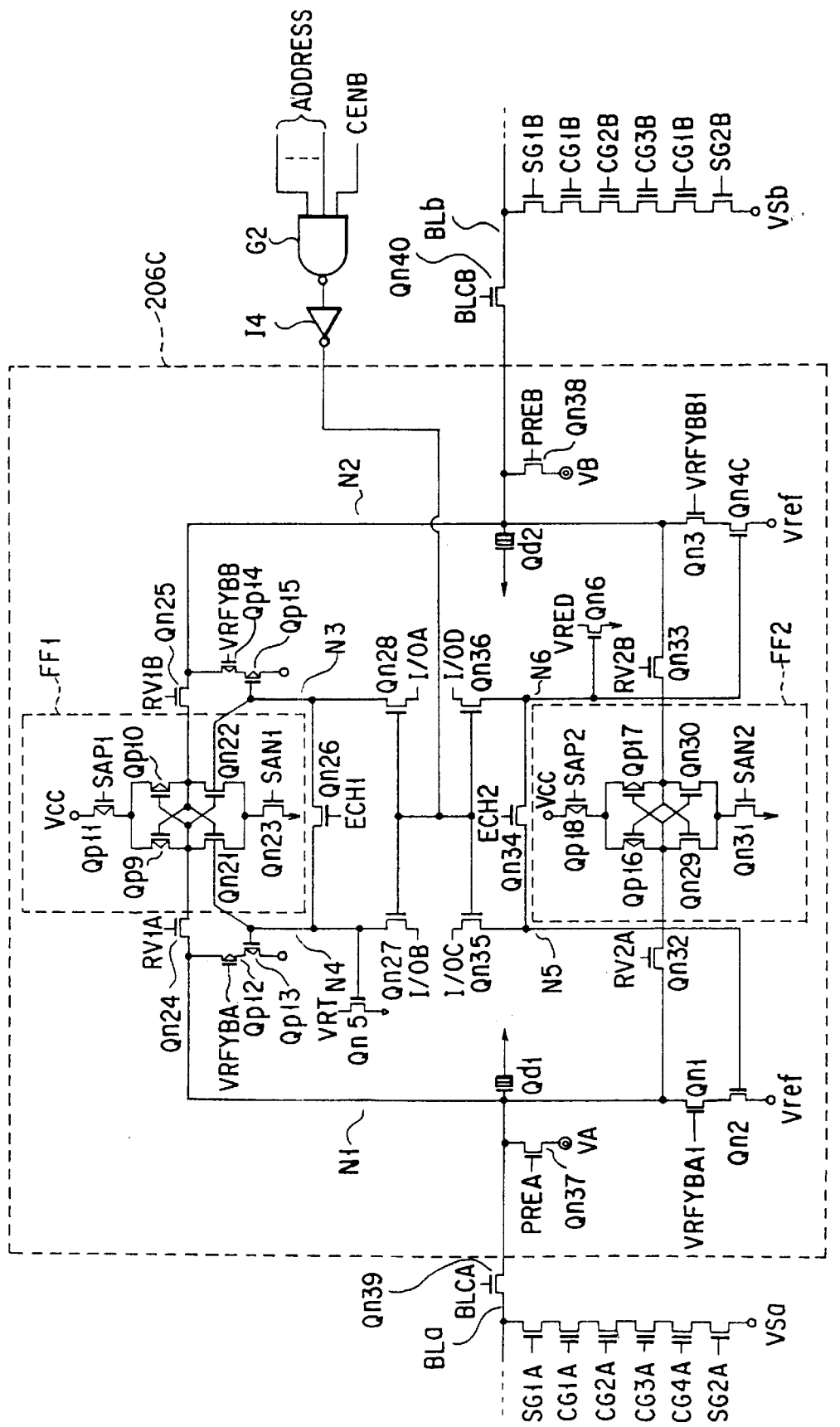
FIG. 56 is a circuit diagram showing a data circuit having a transistor for simultaneously detecting completion of writing.

FIG. 56 is a diagram showing a modification of the data circuit and is a circuit diagram showing a data circuit 206C having a write completion simultaneously detecting transistor.

Completion of writing of "2" and "3" can be detected by using a transistor Qn5 for simultaneously detecting writing "2" and "3" structured as shown in FIG. 56. After the verify read first cycle has been completed, VRT is precharged to, for example, Vcc. If one or more memory cells in which "2" or "3" has been written insufficiently exists, the node N4 of the data circuit is "H". Therefore, the n-channel MOS transistor Qn5 is turned on so that VRT is grounded. After data has been sufficiently written on all of the memory cells for writing "2" or "3", the nodes N4 of the data circuits 206C-0, 206C-1, . . . , 206C-m-1 and 206C-m are made to be "L". As a result, the n-channel MOS transistors Qn5 in all of the data circuits are turned off. Thus, VRT holds the precharged potential.

(3) Program Second Cycle

After writing of "2" and "3" has been completed, writing of "1" (program second cycle) is performed. The node potential of the flip-flop when "1" is written is as shown in FIG. 55. That is, when "1" is written , the node N5 is made to be "L" so that the writing potential is applied to the bit line. When data except for "1" is written, the node N5 is made to be "H" so that the write non-selected potential is applied to the bit line.

Figure 57:
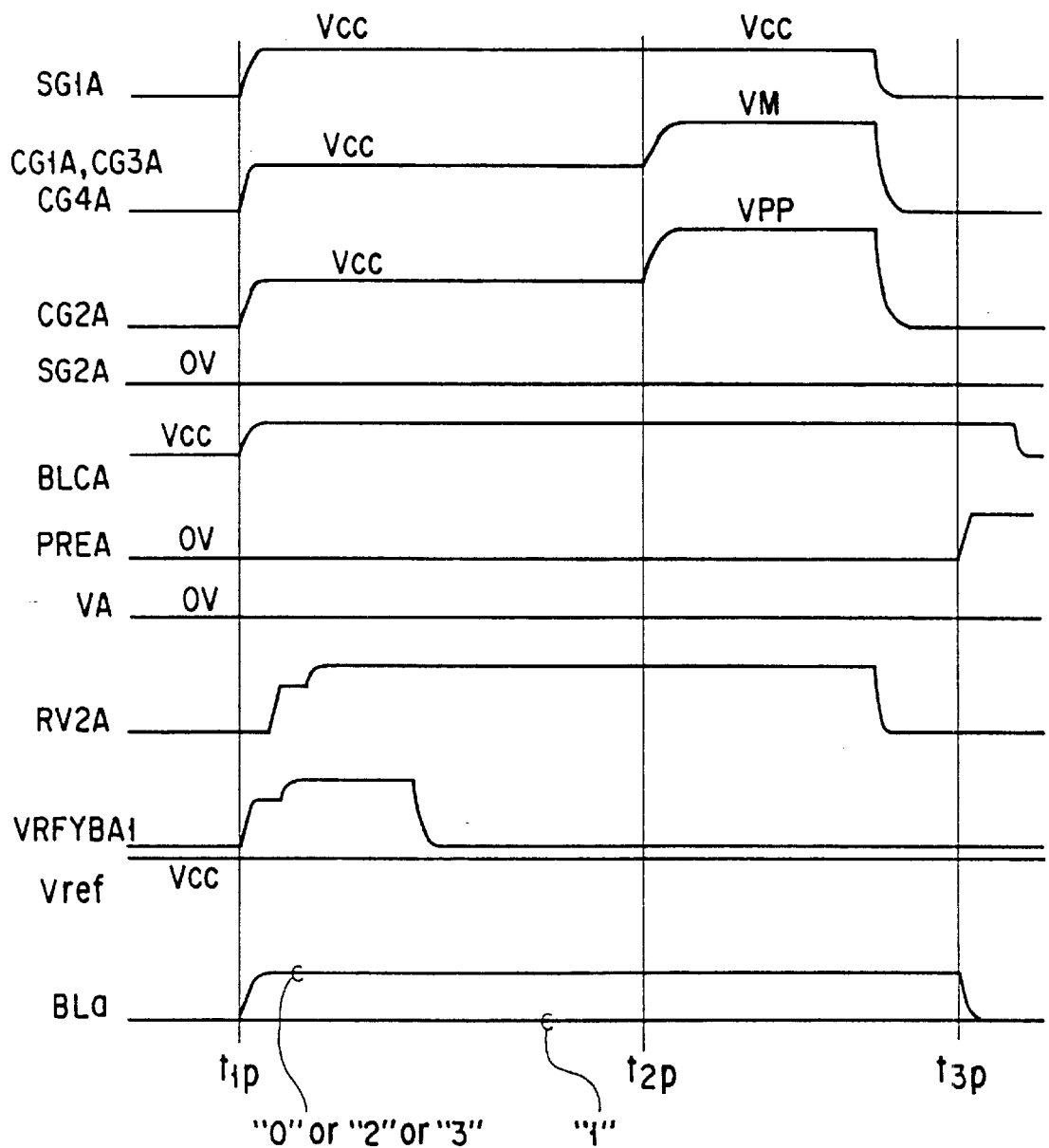
FIG. 57 is an operation waveform showing the writing operation (program first cycle)

FIG. 57 is an operation waveform showing the writing operation (the program second cycle).

At time $t_{1p}$, the voltage VRFYBA1 is made to be "H" so that the bit line Bla for writing "0" or "2" or "3" is electrically charged to the write non-selected voltage Vcc. When the degree of voltage drop corresponding to the threshold voltage of the n-channel MOS transistor Qn39 raises a problem, the level of the signal BLCA is required to be raised. Then, the signal RV2A is made to be Vcc. As a result, write non-selected voltage Vcc is applied from a data circuit storing data "0" or "2" or "3" to the bit line BLa. A write bit line potential of 0V is applied to the bit line Bla from a data circuit storing data "1".

The selection gates SG1A and CG1A to CG4A in the block selected by the control gate/selection gate driver 202B are made to be Vcc. The selection gate SG2A is 0V. At time $t_{2p}$, the selected control gate CG2A is made to be high voltage of VPP (for example, 20V), and the non-selected control gate CG1A, CG3A and CG4A are made to the intermediate voltage VM (for example, 10V). In the memory cell corresponding to the data circuit storing data "1", the potential difference between the channel potential of 0V and VPP of the control gate causes electrons to be injected into the floating gate so that the threshold voltage is increased. In the memory cell corresponding to the data circuit storing data "0" or "2" or "3", the small difference in the potential between the channel potential and VPP of the control gate substantially prevent injection of electrons into the floating gate. Therefore, the threshold voltage of the memory cell is not changed. During the writing operation, signals SAN1, SAN2, VRFYBB, PREB and BLCB are made to be "H", signals SAP1, SAP2, RV1A, RV1B, ECH1 and ECH2 are made to be "L" and the voltage VB is made to be V.

(4) Verify Read Second Cycle

After program second cycle has been completed, the threshold voltage of the memory cell in which "1" is written is detected (write verify second cycle). If it has reached a predetermined threshold voltages, data in the data circuit is changed to "0". If it has not reached the required threshold voltage, data in the data circuit is maintained and writing is again performed. The writing and write verify operations are repeated until all of the memory cells, on which "1" is written, reach required threshold voltages.

Figure 58:
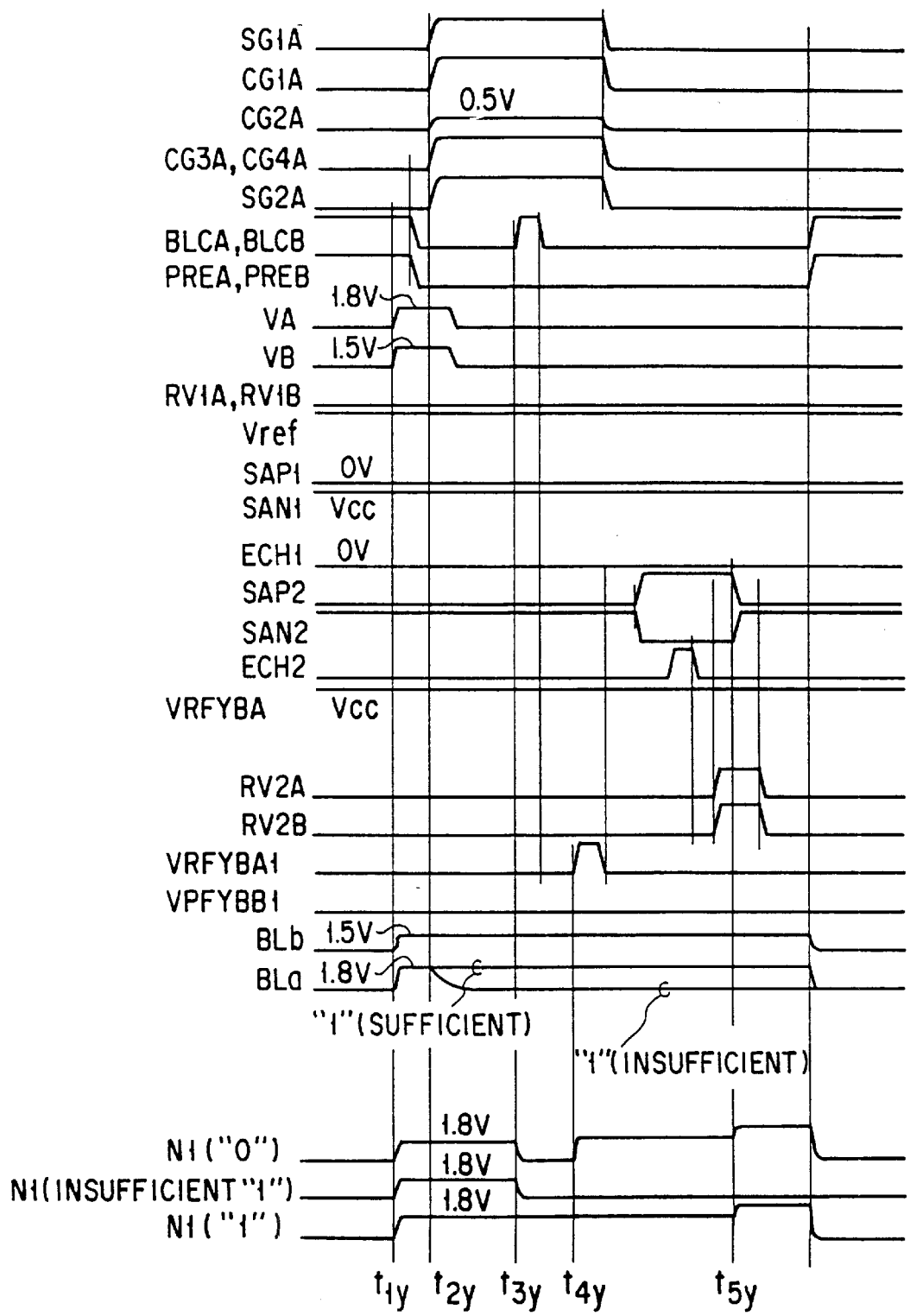
FIG. 58 is an operation waveform showing the verify reading operation (verify read second cycle)

FIG. 58 is an operation waveform showing the verify read operation (verify read second cycle).

At time $t_{1y}$, voltage VA and VB respectively are made to be 1.8V and 1.5V so that bit lines BLa and BLb respectively are made to be 1.8V and 1.5V. When signals BLCA and BLCB are made to be "L", the bit line BLa and the MOS capacitor Qd1 are separated from each other and the bit line BLb and the MOS capacitor Qd2 are separated from each other. Moreover, the bit line BLa and BLb are brought to a floating state. When the signals PREA and PREB are made to be "L", the nodes N1 and N2 which are the gate electrodes of the MOS capacitors Qd1 and Qd2 are brought to a floating state.

At time $t_{2y}$, the selected control gate CG2A in a block selected by the control gate/selection gate driver 202B is made to be 0.5V, and the non-selected control gates CG1A, CG3A and CG4A and the selection gates SG1A and SG2A are made to be Vcc. If the threshold voltage of the selected memory cell is 0.5V or lower, the bit line voltage is made to be lower than 1.5V. If the threshold voltage of the selected memory cell is 0.5V or higher, the bit line voltage is maintained at 1.8V.

Then, at time $t_{3y}$, the signals BLCA and BLCB are made to be "H" so that the potential of the bit line is transferred to the nodes N1 and N2. Then, the signals BLCA and BLCB are made to be "L" so that the bit line Bla and the MOS capacitor Qd1 are separated from each other and the bit line BLb and the MOS capacitor Qd2 are separated from each other.

When the VRFYBA1 has been made to be "H" at time $t_{4y}$, the n-channel MOS transistor Qn2 in the data circuit storing write data "0" or "2" or "3" is turned on so that the node N1 is made to be Vcc.

When the signals SAN2 and SAP2 respectively are made to be "L" and "H" so that the flip-flop FF2 is deactivated. When the signal ECH2 has been made to be "H", it is equalized. Then, the signals RV2A and RV2B are made to be "H".

When the signals SAN2 and SAP2 respectively are again made to be "H" and "L", the voltage of the node N1 is sensed and latched at time $t_5y$. Thus, it is determined whether or not data in the memory cell corresponding to only the data circuit storing write data "1" has been sufficiently brought to the state for writing "1". If data in the memory cell is "1", the voltage of the node N1 is sensed and latched by the flip-flop FF2 so that the write data is changed to "0". If data in the memory cell is not "1", the flip-flop FF1 senses and latches the voltage of the node N2 so that the write data "1" is maintained. Write data in the data circuit storing write data "0" or "2" or "3" is not changed.

Figure 59:
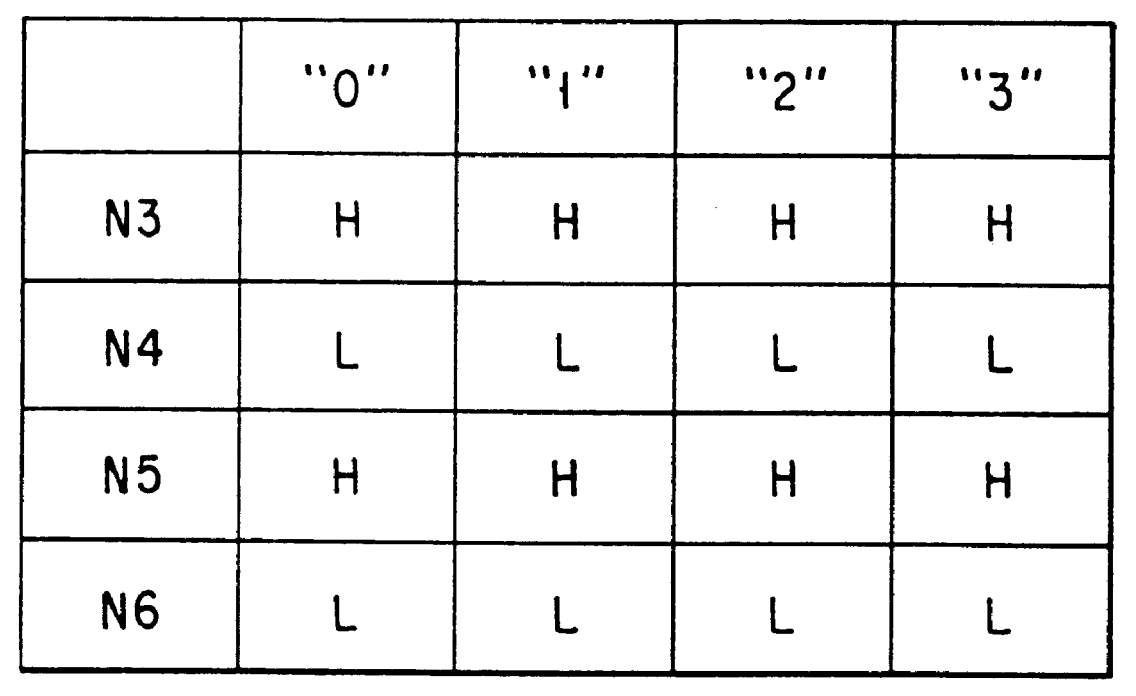

FIG. 59 is a table showing data latched by the flip-flops FF1 and FF2 after data "3" has been sufficiently written.

If all of the selected memory cells for writing data "1" have reached desired threshold voltages, data in the data circuit is as shown in FIG. 59. That is, if data has been sufficiently written in all of the memory cell for writing data "1", the node N5 of all of the data circuits 206C-0, 206C-1, ..., 206C-m–1 and 206C-m are made to be "H". Moreover, the nodes N6 of the same are made to be "L". By detecting the foregoing facts, it can be determined whether or not all of the selected memory cells have reached the required threshold voltages.

The program second cycle write completion can be detected by using the write completion simultaneously detecting transistor Qn6 formed, for example, as shown in FIG. 56. The signal VRED is precharged to, for example, Vcc after the verify read second cycle has been completed. If one or more memory cell in which data "1" has not been sufficiently written exists, the n-channel MOS transistor Qn6 is turned on and VRED is grounded because the node N6 of the data circuit is "H". If data has been sufficiently written in all of the memory cells, the nodes N6 of the data circuits 206C-0, 206C-1, ..., 206C-m–1 and 206C-m are made to be "L". As a result, the n-channel MOS transistors Qn6 in all of the data circuits are turned off and the signal VRED maintains the precharged potential.

The EEPROM according to the seventh embodiment is structured as described above. The verify reading, writing and usual reading are not limited to the foregoing operation examples. Other examples may be employed.

FIG. 60 is an operation waveform showing another verify read operation (verify read first cycle).

The verify read first cycle may be structured, for example, as shown in the operation waveform shown in FIG. 60.

In the verify read first cycle shown in FIG. 60, the operation to time $t_{7v}$ is the same as the verify read first cycle shown in FIG. 54. The operation is different from the same from time $t_{7v}$.

At time $t_{7v}$, the signals BLCA and BLCB are made to be "H", and the potential of the bit line is transferred to the nodes N1 and N2. If the threshold voltage of the memory cell is 2.5V or higher, the bit line Bla is 1.5V or higher. If the threshold voltage of the memory cell is 2.5V or lower, the bit line BLb is 1.5V or lower. Then, the signals BLCA and BLCB are made to be "L" so that the bit line Bla and the MOS capacitor Qd1 are separated from each other and the bit line BLb and the MOS capacitor Qd2 are separated from each other. When the signal VRFYBA1 has been made to be "H" at time $t_{8z}$, the n-channel MOS transistor Qn2 of the data circuit storing write data "0" or "2" is turned on. Therefore, the node N1 is made to be 1.5V or higher. When the signals SAN2 and SAP2 have respectively been made to be "L" and "H", the flip-flop FF2 is deactivated so that the signal ECH2 is made to be "H" and equalized. Then, the signals RV2A and RV2B are made to be "H". When the signals SAN2 and SAP2 have respectively been made to be "H" and "L" at time $t_{9z}$, the voltage of the node N1 is sensed and latched.

Then, write data is changed, as shown in FIG. 60. At time $t_{10z}$, the signals BLCA and BLCB are made to be "H" so that the potential of the bit line is transferred to the nodes N1 and N2. Then, the signals BLCA and BLCB are again made to be "L" so that the bit line Bla and the MOS capacitor Qd1 are separated from each other and the bit line BLb and the MOS capacitor Qd2 are separated from each other.

When the signal VRFYBA has been made to be "L" at time $t_{11z}$, the p-channel MOS transistor Qp13 of the data circuit storing write data "0" or "1" and the data circuit on which data "2" has been sufficiently written is turned on and the node N1 is made to be Vcc. The signals SAN1 and SAP1 respectively are made to be "L" and "H" so that the flip-flop FF1 is deactivated, and the signal ECH1 is made to be "H" and equalized. Then, the signal RV1A and RV1B are made to be "H". When the signals SAN1 and SAP1 respectively are made to be "H" and "L" at time $t_{12z}$, the voltage of the node N1 is sensed and latched.

As described above, it can be determined whether or not data in the memory cell corresponding to only the data circuit storing write data "3" has been sufficiently brought to the state for writing "3". If data in the memory cell is "3", the flip-flops FF1 and FF2 sense and latch the voltage of the node N1 so that write data is changed to "0". If data in the memory cell is not "3", flip-flops FF1 and FF2 sense and latch the voltage of the node N1 so that write data is maintained at "3". Write data in the data circuit storing write data "0" or "1" or "2" is not changed. If all of the selected memory cells for writing "2" or "3" have reached desired threshold voltages, data in the data circuit is made as shown in FIG. 55. That is, when data has been sufficiently written in all of the selected memory cells for writing "2" or "3", nodes N3 of all of the data circuits 206C-0, 206C-1, ..., 206C-m–1 and 206C-m are made to be "H" and nodes N4 of the same are made to be "L". By detecting this, it can be determined whether or not all of the selected memory cells for writing "2" or "3" have reached required threshold voltages.

The circuit structure of the data circuit 206 is not limited to the data circuits 206B and 206C shown in FIGS. 47 and 56. Another circuit structure may be employed.

FIGS. 61 and 62 are circuit diagrams showing another structure of the data circuit.

The operation timing of the signals VRFYBA1 and VRFYBB1 for the data circuit 206D shown in FIG. 61 may be determined such that Vcc is made to be 0v and 0V is made to be Vcc when a similar operation timing for the data circuits shown in FIGS. 47 and 56 is employed (operation waveforms shown in FIGS. 48, 53, 54, 57, 48 and 60). Note that the operation timings of the signals VRFYBA and VRFYBB are similar to those in the case where the data circuits shown in FIG. 47 and 56 are employed.

The operation timing of the signals VRFYBA and VRFYBB for the data circuit 206E shown in FIG. 62 may be determined such that Vcc is made to be 0v and 0V is made to be Vcc when a similar operation timing for the data circuits shown in FIGS. 47 and 56 is employed (operation waveforms shown in FIGS. 48, 53, 54, 57, 48 and 60). Note that the operation timings of the signals VRFYBA1 and VRFYBB1 are similar to those in the case where the data circuits shown in FIG. 47 and 56 are employed.

Although the seventh embodiment has the structure such that data "2" and "3" are written simultaneously and then data "1" is written, the writing order is not limited to this and arbitrary writing order may be employed. For example, an order may be employed in which "1" and "2" are written and then "3" is written. Another order may be employed in which "1" and "3" are simultaneously written and then "2" is written.

(Eighth Embodiment)

A multilevel storing NAND type EEPROM according to an eighth embodiment of the present invention will now be described.

Although the seventh embodiment has the structure such that states "2" and "3" are substantially written and then state "1" is written, the eighth embodiment has the structure such that states "1", "2" and "3" are substantially simultaneously be written.

Similarly to the EEPROM according to the seventh embodiment, the EEPROM according to the eighth embodiment has a structure similar to that according to the sixth embodiment shown in FIGS. 36 and 37.

FIG. 63 is a circuit diagram showing a data circuit 206F of the EEPROM according to the eighth embodiment of the present invention. A data circuit 206F shown in FIG. 63 is structured to store four-level data.

As shown in FIG. 63, memory cells M1 to M4 are connected in series to form a NAND cell. The two ends of the NAND cell respectively are connected to the bit line BL and the source line VS through the selection transistors S1 and S2. A memory cell group M sharing the control gate CG forms a unit called a "page" to which data is simultaneously written or from which data is simultaneously read. A memory cell group connected to the four control gates CG1 to CG4 forms a block. The page and the block are selected by the control gate/selection gate driver 202B. Data circuits 206F-0, 206F-1, . . . , 206F-m−1 and 206F-m are connected to the bit lines BL0 to BLm to temporarily store data to be written in the corresponding memory cell.

The relationship between the writing states with respect to the memory cell and the threshold voltages is similar to that according to the seventh embodiment and is'structured, for example, as shown in FIG. 46.

As shown in FIG. 63, write/read data is latched by a flip-flop FF1 formed of n-channel MOS transistors Qn21, Qn22 and Qn23 and p-channel MOS transistors Qp9, Qp10 and Qp11 and a flip-flop FF2 formed of n-channel MOS transistors Qn29, Qn30 and Qn31 and p-channel MOS transistors Qp16, Qp17 and Qp18. The foregoing flip-flops FF1 and FF2 serve as sense amplifiers.

The flip-flops FF1 and FF2 latches whether "0" is written or whether "1" or "2" or "3" is written as write data information and sense and latch whether the memory cell has information of "0" or information of "1" or "2" or "3" as data information.

The data input/output lines I/OA and I/OB and the flip-flop FF1 are connected to each other through the n-channel MOS transistors Qn28 and Qn27. The data input/output lines I/OC and I/OD and the flip-flop FF2 are connected to each other through the n-channel MOS transistors Qn35 and Qn36. The data input/output lines I/OA, I/OB, I/OC and I/OD are as well as connected to the data input/output buffer 205 shown in FIG. 36.

The gates of the n-channel MOS transistors Qn27, Qn28, Qn35 and Qn36 are connected to the output of a column address decoder formed of a NAND logic circuit G2 and an inverter I4. The n-channel MOS transistors Qn26 and Qn34 equalize flip-flops FF1 and FF2 when signals ECH1 and ECH2 are "H". The n-channel MOS transistors Qn24 and Qn32 control the connection between the flip-flops FF1 and FF2 and a MOS capacitor Qd1. The n-channel MOS transistors Qn25 and Qn33 control the connection between the flip-flops FF1 and FF2 and a MOS capacitor Qd2.

A circuit formed of the p-channel MOS transistors Qp12C and Qp13C changes the gate voltage of the MOS transistor Qd1 in accordance with data in the flip-flop FF1 when activating signal VRFYBAC has been supplied. A circuit formed of the p-channel MOS transistor Qp14C and Qp15C changes the gate voltage of the MOS capacitor Qd2 in accordance with data in the flip-flop FF1 and in response to activating signal VRFYBC. A circuit formed of p-channel MOS transistors Qp12C, Qp19C and Qp20C changes the gate voltage of the MOS capacitor Qd1 in accordance with data in the flip-flops FF1 and FF2 and in response to activating signal VRFYBA2C. A circuit formed of the p-channel MOS transistor Qp14C, Qp21C and Qp22C changes the gate voltage of the MOS capacitor Qd2 in accordance with data in the flip-flops FF1 and FF2 and in response to activating signal VRFYBB2C. A circuit formed of n-channel MOS transistors Qn1C and Qn2C changes the gate voltage of the MOS capacitor Qd1 in accordance with data in the flip-flop FF2 and in response to activating signal VRFYBA1C. A circuit formed of the n-channel MOS transistors Qn3C and Qn4C changes the gate voltage of the MOS capacitor Qd2 in accordance with data in the flip-flop FF2 and in response to activating signal VRFYBB1C.

Each of the MOS capacitors Qd1 and Qd2 comprises a depletion n-channel MOS transistor and has a capacity which is sufficiently smaller than the capacity of the bit line. The n-channel MOS transistor Qn37 electrically charges the MOS capacitor Qd1 to voltage VA in response to signal PREA. The n-channel MOS transistor Qn38 electrically charges the MOS capacitor Qd2 to voltage VB in response to signal PREB. The n-channel MOS transistors Qn39 and Qn40 control the connection between the data circuit 206F and the bit lines BLa and BLb. A circuit formed of the n-channel MOS transistors Qn37 and Qn38 also serves a bit line voltage controller.

The operation of the EEPROM having the abovementioned structure will now be described with reference to an operation waveform.

Reading Operation

FIG. 64 is an operation waveform showing a reading operation.

As shown in FIG. 64, voltages VA and VB respectively are made to be 1.8V and 1.5V so that the bit lines BLa and BLb respectively are made to be 1.8V and 1.5V. Signals BLCA and BLCB are made to be "L" at time $t_{1RC}$ so that the bit line Bla and the MOS capacitor Qd1 are separated from each other and the bit line BLb and the MOS capacitor Qd2 are separated from each other so that the bit lines BLa and BLb are brought to a floating state. When the signals PREA and PREB are made to be "L", the nodes N1 and N2 which are the gate electrodes of the MOS capacitors Qd1 and Qd2 are brought to a floating state.

At time $t_{2RC}$, the selected control gate CG2A in a block selected by the control gate/selection gate driver 202B is made to be 0V, and the non-selected control gates CG1A, CG3A and CG4A and the selection gates SG1A and SG2A are made to be Vcc. If the threshold voltage of the selected memory cell is 0V or lower, the bit line voltage is made to be lower than 1.5V. If the threshold voltage of the selected memory cell is 0V or higher, the bit line voltage is maintained at 1.8V.

Then, at time $t_{3RC}$, the signals BLCA and BLCB are made to be "H" so that data in the bit line is transferred to the MOS capacitors Qd1 and Qd2. Then, the signals BLCA and BLCB are again made to be "L" so that the bit line Bla and the MOS capacitor Qd1 are separated from each other and the bit line BLb and the MOS capacitor Qd2 are separated from each other. When the signals SAN1 and SAP1 respectively are made to be "L" and "H" so that the flip-flop FF1 is deactivated. When the signal ECH1 is made to be "H" so as to be equalized. Then, the signal RV1A and RV1B are made to be "H".

At time $t_{4RC}$, the signals SAN1 and SAP1 respectively are again made to be "H" and "L" so that the voltages of the node N1 is sensed and latched. As a result, data in the memory cell is sensed whether it is "0" or whether it is "1" or "2" or "3" by the flip-flop FF1 and information of this is latched. Then, the selected control gate is made to be 1V. If the threshold voltage of the selected memory cell is 1V or lower, the bit line voltage is made to be lower than 1.5V. If the threshold voltage of the selected memory cell is 1V or higher, the bit line voltage is maintained at 1.8V.

At time $t_{5RC}$, the signals PREA and PREB are made to be "H" so that the nodes N1 and N2 which are gate electrodes of the MOS capacitors Qd1 and Qd2 respectively are made to be 1.8V and 1.5V. When the signals PREA and PREB are made to be "L", the nodes N1 and N2 which are gate electrodes of the MOS capacitors Qd1 and Qd2 are brought to a floating state.

Then, at time $t_{6RC}$, signals BLCA and BLCB are made to be "H". The signals BLCA and BLCB are again made to be "L" so that the bit line Bla and the MOS capacitor Qd1 are separated from each other and the bit line BLb and the MOS capacitor Qd2 are separated from each other. When the signals SAN2 and SAP2 respectively are brought to "L" and "H", the flip-flop FF2 is deactivated and signal ECH2 is made to be "H" so as to be equalized. Then, the signal RV2A and RV2B are made to be "H". At time $t_{7RC}$, the signals SAN2 and SAP2 respectively are made to be "H" and "L" so that the voltage of the node N1 is sensed and latched. Thus, whether or not data in the memory cell is "0" or "1" or whether or not data in the memory cell is "2" or "3" is sensed by the flip-flop FF2 and information of this is latched.

FIG. 65 is a table showing read data sensed and latched by the flip-flops FF1 and FF2 at time $t_{7Rc}$. The potentials of the nodes N3C and N5C of the flip-flops FF1 and FF2 are as shown in FIG. 65.

Whether data written in the memory cell is "2" or "3" is sensed. The selected control gate is made to be 2V. If the threshold voltage of the selected memory cell is 2V or lower, the bit line voltage is made to be lower than 1.5V. If the threshold voltage of the selected memory cell is 2V or higher, the bit line voltage of 1.8V is maintained.

At time $t_{8RC}$, the signals PREA and PREB are made to be "H" so that the nodes N1 and N2 which are gate electrodes of the MOS capacitors Qd1 and Qd2 respectively are made to be 1.8V and 1.5V. When the signals PREA and PREB are made to be "L", the nodes N1 and N2 which are gate electrodes of the MOS capacitors Qd1 and Qd2 are brought to a floating state.

At time $t_{10RC}$, the signals BLCA and BLCB are made to be "H". Then, the signals BLCA and BLCB are again made to be "L" so that the bit line Bla and the MOS capacitor Qd1 are separated from each other and the bit line BLb and the MOS capacitor Qd2 are separated from each other.

Prior to sensing data in the MOS capacitor, VRFYBA2C is made to be 0V at time $t_{11RC}$. As can be understood from FIG. 65, the node N5C is made to be "H" and the node N3C is made to be "H" (that is, the node N4C is made to be "L") only when data is "1". Therefore, only when data is "1", the p-channel MOS transistors Qp12C, Qp19C and QP20C are turned on and the node N1 is made to be Vcc. Then, the signals SAN1 and SAP1 respectively are made to be "L" and "H" so that the flip-flop FF1 is deactivated and the signal ECH1 is made to be "H" so as to be equalized. Then, the signals RV1A and RV1B are made to be "H".

At time $t_{12RC}$, signals SAN1 and SAP1 are again and respectively made to be "H" and "L" so that the voltage of the node N1 is sensed and latched. Thus, whether data in the memory cell is "2" or "3" is sensed by the flip-flop FF1 and information of this is latched.

FIG. 66 is a table showing data which is sensed and latched by the flip-flops FF1 and FF2.

As a result of the foregoing reading operation, four-level data is latched by the flip-flops FF1 and FF2, as shown in FIG. 66. The threshold voltages are distributed in FIG. 66 as follows:

data "0": threshold voltage is 0V or lower data "1": threshold voltage is 0.5V or higher and 0.8V or lower data "2": threshold voltage is 1.5V or higher and 1.8V or lower data "3": threshold voltage is 2.5V or higher and 2.8V or lower During the reading operation, signals VRFYBAC, VRFYBBC, VRFYBA1C and VRFYBB1C are "L" levels. The voltage VS is 0V.

When the column activating signal CENB to be supplied to the column address decoder is made to be "H", data stored in the data circuit selected in response to the address signal is output to the data input/output lines I/OA, I/OB, I/OC and I/OD so as to be output to the outside of the EEPROM through the data input/output buffer 4.

The relationship among data stored in the memory cell, the threshold voltage and levels to be output to the data input/output lines I/OA, I/OB, I/OC and I/OD after data has been read is as shown in FIG. 66.

Data to be output to the outside of the chip may be data obtained by converting signals output to the data input/output lines I/OA, I/OB, I/OC and I/OD by the data input/output buffer 5.

Writing Operation

Initially, write data is loaded into the flip-flops FF1 and FF2. Then, data "1", "2" and "3" are substantially simultaneously written. Verify read is performed to detect whether or not data "1", "2" and "3" have been sufficiently written. If memory cell to which data has not been sufficiently written exists, writing is again performed. When the write completion detecting circuit has detected that data has been sufficiently written in all of the memory cells, the writing operation is completed.

A program will now be described, followed by describing verify read.

Program

Prior to performing the writing operation, supplied data for two bits is converted by the data input/output buffer 205 so as to be supplied to the data circuit 206F.

FIG. 67 is a table showing write data to be supplied to the data circuit 206F and latched by the flip-flops FF1 and FF2. The relationship between the four-level data and the a data input/output lines I/OA, I/OB, I/OC and I/OD is as shown in FIG. 67.

Converted four-level data is transferred to a data circuit at a column address instructed with the address signal when the column activating signal CENB is "H".

Figure 68:
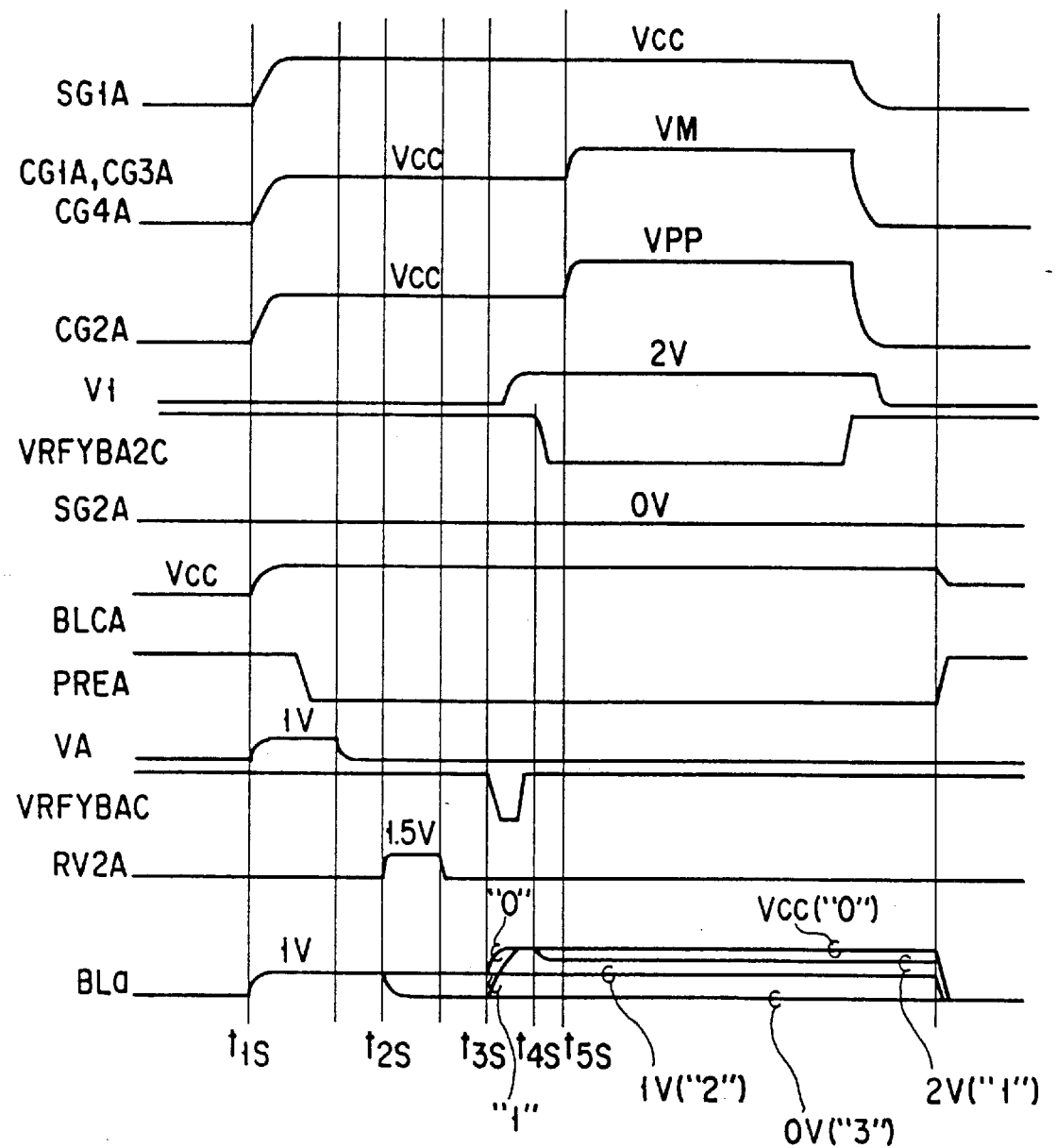
FIG. 68 is an operation waveform showing the writing operation.

FIG. 68 is an operation waveform showing the writing operation.

At time $t_{1s}$, voltage VA is made to be the bit line writing control voltage 1V so that the bit line BLa is made to be 1V. When voltage drop of the n-channel MOS transistor Qn39 corresponding to the threshold voltage raises a problem, the level of the signal BLCA is required to be raised. Then, the signal PRE is made to be "L" so that the bit line is brought to a floating state.

At time $t_{2s}$, the signal RV2A is made to be 1.5V. As a result, bit line control voltage of 0V is applied to the bit line of the columns having data "1" or "3". When the threshold voltage of the n-channel MOS transistor Qn32 is made to be 1V, the n-channel MOS transistor Qn32 is turned off when "0" or "2" is written. When "1" or "3" is written, the n-channel MOS transistor Qn32 is turned on.

At time $t_{3s}$, VRFYBAC is made to be 0V, and bit line write control voltage Vcc is, to the bit line, output from the data circuit storing data "0" or data "1".

Then, VRFYBA2C is made to be 0V at time $t_{4s}$, and biasing to VRFYBA1 from the data circuit storing data "1" is performed and potential of 2V for writing "1" on the bit line is output to the bit line.

As a result, the bit line for writing "0" is made to be Vcc, the bit line for writing "1" is made to be 2V, the bit line for writing "2" is made to be 1V and the bit line for writing "3" is made to be 0V.

At time $t_1$s, selection gate SG1A and control gates CG1A to CG4A of the block selected by the election gate/selection gate driver 202B are made to be Vcc. The selection gate SG2A is made to be 0V.

Then, the selected control gate CG2A is made to be high voltage of VPP (for example, 20V), while the non-selected control gates CG1A, CG3A and CG4A are made to VM (for example, 10V). In the memory cell corresponding to a data circuit storing data "3", the difference in the potential between the channel potential of 0V and VPP of the control gate causes electrons to be injected into the floating gate so that the threshold voltage is increased. In the memory cell corresponding to the data circuit storing data "2", the difference in the potential between the channel potential of 1V and VPP of the control gate causes electrons to be injected into the floating gate so that the threshold voltage is increased. In the memory cell storing data "1", the difference in the potential between the channel potential of 2V and VPP of the control gate causes electrons to be injected into the floating gate so that the threshold voltage is increased. The reason why the channel potential is made to be 1V when "2" is written and the same is made to be 2V when "1" is written is that the quantity of electrons is reduced in the sequential order as the case in which data "3" is written, the case in which data "2" is written and the case in which data "1" is written. In the memory cell corresponding to the data circuit storing data "0", the difference in the potential between the channel potential and VPP of the control gate is small. Therefore, substantially no electrons is injected into the floating gate. Therefore, the threshold voltage of the memory cell is not changed. During the writing operation, signals SAN1, SAN2, PREB and BLCB are "H" level, signals SAP1, SAP2, VRFYBA1C, RV1A, RV1B, RV2B, ECH1 and ECH2 are "L" level and the voltage VB is 0V.

(2) Verify Read

After the writing operation has been completed, whether or not writing has been performed sufficiently is detected (write verify). If a required threshold voltage has been realized, data in the data circuit is changed to "0". If a required threshold voltage has not been realized, data in the data circuit is maintained and writing is again performed. The writing operation and the write verify are repeated until the memory cell for writing "1", that for writing "2" and that for writing "3" reach required threshold voltages.

Figure 69:
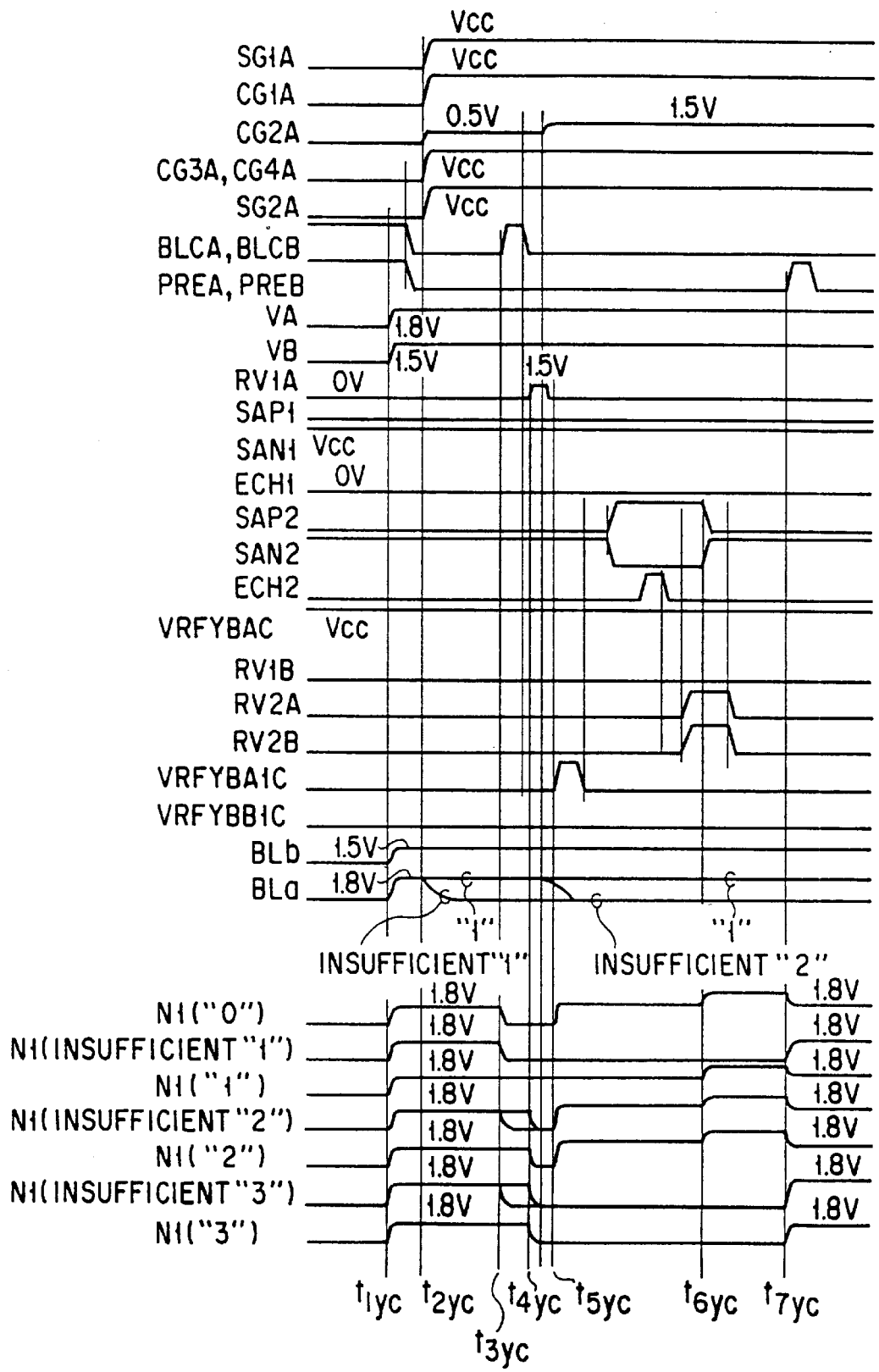
FIG. 69 is an operation waveform showing the verify read operation.

FIGS. 69 and 70 are operation waveforms showing the verify read operation. FIG. 70 shows timings following the timings shown in FIG. 69.

Referring to FIGS. 69 and 70, the write verify operation will now be described.

Initially, it is determined whether or not the memory cell for writing "1" has reached a predetermined threshold voltage.

As shown in FIG. 69, at time $t_{1yc}$, voltage VA and VB respectively are made to be 1.8V and 1.5V so that bit lines BLa and BLb respectively are made to be 1.8V and 1.5V. When signals BLCA and BLCB are made to be "L" and the bit line BLa and the MOS capacitor Qd1 are separated from each other and the bit line BLb and the MOS capacitor Qd2 are separated from each other. Moreover, the bit line BLa and BLb are brought to a floating state. When the signals PREA and PREB are made to be "L", the nodes N1 and N2 which are the gate electrodes of the MOS capacitors Qd1 and Qd2 are brought to a floating state.

At time $t_{2yc}$, the selected control gate CG2A in a block selected by the control gate/selection gate driver 202B is made to be 0.5V, and the non-selected control gates CG1A, CG3A and CG4A and the selection gates SG1A and SG2A are made to be Vcc. If the threshold voltage of the selected memory cell is 0.5V or lower, the bit line voltage is made to be lower than 1.5V. If the threshold voltage of the selected memory cell is 0.5V or higher, the bit line voltage is maintained at 1.8V.

Then, at time $t_{3yc}$, the signals BLCA and BLCB are made to be "H" so that the potential of the bit line is transferred to the nodes N1 and N2. Then, the signals BLCA and BLCB are made to be "L" so that the bit line B1a and the MOS capacitor Qd1 are separated from each other and the bit line BLb and the MOS capacitor Qd2 are separated from each other. At time $t_{4yc}$, RV1a is made to be 1.5V. When data "2" is written or when data "3" is written, node N1 is electrically discharged to 0V.

At time $t_{5yc}$, the signal VRFYBA1C is made to be "H" so that the n-channel MOS transistor Qn2 of the data circuit storing write data "0" or "2" is turned on and node N1 is made to be Vcc. As a result, the node N1 is made to be Vcc when data "0" is written or when data "2" is written When data "3" is written, the node N1 is made to be 0V.

The signals SAN2 and SAP2 respectively are made to be "L" and "H" so that the flip-flop FF2 is deactivated and the signal ECH2 is made to be "H" so as to be equalized. Then, the signals RV2A and RV2B are made to be "H". When the signals SAN2 and SAP2 are again and respectively made to be "H" and "L", the voltage of the node N1 is sensed and latched at time $t_{6yc}$. Thus, it is determined whether or not data in the memory cell corresponding to only the data circuit storing write data "1" has been sufficiently brought to the state for writing data "1". If data in the memory cell is "1", the voltage of the node N1 is sensed and latched by the flip-flop FF2 so that write data is changed to "0". If data in the memory cell is not "1", the flip-flop FF1 senses and latches the voltage of the node N2 to maintain the write data to be "1". Data to be written in the data circuit storing "0" or "2" or "3" is not changed.

Then, the selected control gate is made to be 1.5V. If the threshold voltage of the selected memory cell is 1.5V or lower, the bit line voltage is made to be lower than 1.5V. If the threshold voltage of the selected memory cell is 1.5V or higher, the bit line voltage is maintained at 1.8V. At time $t_{7yc}$, signals PREA and PREB are made to be Vcc so that the nodes N1 and N2 are made to be 1.8V and 1.5V. Then, the nodes N1 and N2 are brought to the floating gate state.

At time $t_{8yc}$, the signals BLCA and BLCB are made to be "H" so that the potential of the bit line is transferred to the nodes N1 and N2. Then, the signals BLCA and BLCB are made to be "L" so that the bit line Bla and the bit line BLb and the MOS capacitor Qd2 are separated from each other.

At time $t_{9yc}$, the signal RV2A is made to be voltage not higher than Vcc, for example, 1.5V. If the threshold voltage of the n-channel MOS transistor Qn32 is 1V, the n-channel MOS transistor Qn32 of the data circuit storing write data "3" is turned on and the node N1 is made to be 0V. In a case where the threshold voltage of the n-channel MOS transistor Qn32 is 1V, the n-channel MOS transistor Qn32 of the data circuit storing write data "3" is turned on and the node N1 is made to be 0V. If data "2" has been sufficiently written in the memory cell of the data circuit storing write data of "2", the n-channel MOS transistor Qn32 is turned off so that the node N1 is maintained at 1.5V or higher. If data "2" has not been sufficiently written, the node N1 is 1.5V or lower.

When the VRFYBAC is made to be "L" at time $t_{10yc}$, the p-channel MOS transistor Qp13 of the data circuit storing write data "0" or "1" is turned on so that the node N1 is made to be Vcc.

The signals SAN1 and SAP1 respectively are made to be "L" and "H" so that the flip-flop FF1 is deactivated and the signal ECH1 is made to be "H" so as to be equalized. Then, the signals RV1A and RV1B are made to be "H". When the signals SAN1 and SAP1 respectively are again made to be "H" and "L", the voltage of the node Ni is sensed and latched at time $t_{11yc}$. Whether or not data in the memory cell corresponding to only the data circuit storing write data "2" has been sufficiently brought to the state for writing "2" is detected. If data in the memory cell is "2", the voltage of the node N1 is sensed and latched by the flip-flop FF1 so that write data is changed to "0". If data in the memory cell is not "2", the voltage of the node N1 is sensed and latched by the flip-flop FF1 so that write data "2" is maintained. Write data in the data circuit storing write data "0" or "1" or "3" is not changed.

Then, the selected control gate is made to be 2.5V. If the threshold voltage of the selected memory cell is 2.5V or lower, the bit line voltage is made to be lower that 1.5V. If the threshold voltage of the selected memory cell is 2.5V or higher, the bit line voltage is maintained at 1.8V. At time $t_{12yc}$, signals BLCA and BLCB are made to be "H" so that the potential of the bit line is transferred to the nodes N1 and N2. When the signals BLCA and BLCB are again made to be "L", the bit line Bla and the MOS capacitor Qd1 are separated from each other and the bit line BLb and the MOS capacitor Qd2 are separated from each other.

At time $t_{13yc}$, the VRFYBAC is made to be "L" so that the p-channel MOS transistor Qp13c of the data circuit storing write data "0" or "1" or the data circuit on which "2" has been sufficiently written is turned on so that the node N1 is made to be Vcc. When the signals SAN1 and SAP1 respectively are made to be "L" and "H" so that the flip-flop FF1 is deactivated and the signal ECH1 is made to be "H" and equalized. Then, the signals RV1A and RV1B are made to be "H". At time $t_{14yc}$, the signals SAN1 and SAP1 respectively are made to be "H" and "L" so that the voltage of the node N1 is sensed and latched.

Then, write data is changed, as shown in FIG. 70. At time $t_{15yc}$, signals BLCA and BLCB are made to be "H" so that the portion of the bit line is transferred to the nodes N1 and N2. The signals BLCA and BLCB are again made to be "L" so that the bit line Bla and the MOS capacitor Qd1 are separated from each other and the bit line BLb and the MOS capacitor Qd2 are separated from each other. At time $t_{16yc}$, the VRFYBA1C is made to be "H" so that the n-channel MOS transistor Qn2C of the data circuit storing write data "0" or "2" and the data circuit on which "1" has been sufficiently written is turned on so that the node N1 is made to be Vcc. The signals SAN2 and SAP2 respectively are made to be "L" and "H" so that the flip-flop FF2 is deactivated and the signal ECH2 is made to be "H" and equalized. Then, the signal RV2A and RV2B are made to be "H". At time $t_{17yc}$, the signals SAN2 and SAP2 respectively are made to be "H" and "L" so that the voltage of the node N1 is sensed and latched.

In the above-mentioned embodiment, the VRFYBA1C is made to be Vcc at time $t_{16yc}$ to electrically charge the node N1 of the MOS capacitor Qd1 to be higher than the potential (1.5V) of the node N2 when "0" is written and when "2" is written. A structure may be employed in which RV2B is made to be, for example, 1.5V at time $t_{16yc}$. In this case, "0" or "2" is written, the n-channel MOS transistor Qn33 is turned on because the node N6C is 0V. Therefore, the node N2 is made to be 0V. If "1" or "3" is written, the n-channel MOS transistor Qn33 is turned off because the node N6C is Vcc and the node N2 is 1.5V so that the node N2 maintains 1.5V. At time $t_{16yc}$, VRFYBA1C is made to be Vcc to perform the foregoing operation. Since the level to which the node N1 must be electrically charged when "0" is written or "2" is written is required to be higher than the potential (0V) of the node N2, the node N1 is required to be electrically charged to a low level of, for example, about 0.5V.

As described above, data in the memory cell corresponding to only the data circuit storing write data of "3" has been sufficiently brought to the state for writing "3" is detected. If data in the memory cell is "3", the flip-flops FF1 and FF2 sense and latch the voltage of the node N1 so that write data is changed to "0". If data in the memory cell is not "3", the flip-flops FF1 and FF2 sense and latch the voltage of the node N1 so that the write data of "3" is maintained. Write data in the data circuit storing write data "0" or "1" or "2" is not changed.

During the write verify, the signal VRFYBBC is made to be "H", the signal VRFYBB1C is made to be "L" and the voltage VS is made to be 0V.

If all of the selected memory cells have reached required threshold voltages, data in the data circuit is made to be "0". That is, when writing has been completed, the nodes N4C and N6C are made to be "L". By detecting this, it can be determined whether or not all of the selected memory cell have reached required threshold voltages.

After writing and verify read have been completed, write completion simultaneous detection is performed to determine whether or not data has been written in all of the columns.

FIG. 63 is a circuit diagram showing a data circuit 206F having the write completion simultaneous detection transistor.

Completion of writing can be detected by using a write completion simultaneous detection transistors Qn5C and Qn6C formed as shown in FIG. 63. After verify read has been performed, VRTC is precharged to, for example, Vcc. If one or more memory cell in which data has been written insufficiently exists, at least either the node N4C or the node N6C of the data circuit is "H".

Therefore, at least either the n-channel MOS transistor Qn5C or the n-channel MOS transistor Qn6C is turned on so that the level of VRTC is lowered from the precharge level. When data has been sufficiently written on all of the memory cells, the nodes N4C and N6C of the data circuits 206F-0, 206F-1, . . . , 206F-m−1 are made to be "L". As a result, the N-channel MOS transistors Qn5C and Qn6C in all of the data circuits are turned off so that VRTC holds the precharged potential.

The EEPROM according to the eighth embodiment has the above-mentioned structure. The verify read, writing and usual reading operations are not limited to the foregoing descriptions. Other operations may be employed.

FIG. 71 is an operation waveform showing another verify read operation.

The verify read first cycle may be structured, for example, as shown in the operation waveform shown in FIG. 71.

In the verify read first cycle shown in FIG. 71, the operation to time $t_{12yc}$ is the same as the verify read first cycle shown in FIG. 70. The operation is different from the same from time $t_{12yc}$.

At time $t_{12yc}$, the signals BLCA and BLCB are made to be "H", and the potential of the bit line is transferred to the nodes N1 and N2. If the threshold voltage of the memory cell is 2.5V or higher, the bit line Bla is 1.5V or higher. If the threshold voltage of the memory cell is 2.5V or lower, the bit line BLb is 1.5V or lower. Then, the signals BLCA and BLCB are made to be "L" so that the bit line Bla and the MOS capacitor Qd1 are separated from each other and the bit line BLb and the MOS capacitor Qd2 are separated from each other.

When the signal VRFYBA1C has been made to be "H" at time $t_{13zc}$, the n-channel MOS transistor Qn2 of the data circuit storing write data "0" or "2" and the data circuit on which "1" has been sufficiently written is turned on. Therefore, the node N1 is made to be 1.5V or higher. When the signals SAN2 and SAP2 have respectively been made to be "L" and "H", the flip-flop FF2 is deactivated so that the signal ECH2 is made to be "H" and equalized. Then, the signals RV2A and RV2B are made to be "H". At time $t_{14zc}$, the signals SAN2 and SAP2 respectively are made to be "H" and "L" so that the voltage of the node N1 is sensed and latched.

Then, write data is changed, as shown in FIG. 71. At time $t_{15zc}$, the signals BLCA and BLCB are made to be "H" so that the potential of the bit line is transferred to the nodes N1 and N2. Then, the signals BLCA and BLCB are again made to be "L" so that the bit line Bla and the MOS capacitor Qd1 are separated from each other and the bit line BLb and the MOS capacitor Qd2 are separated from each other.

When the signal VRFYBAC has been made to be "L" at time $t_{16zc}$, the p-channel MOS transistor Qp13 of the data circuit storing write data "0" or "1" and the data circuit on which data "2" has been sufficiently written is turned on and the node N1 is made to be Vcc. The signals SAN1 and SAP1 respectively are made to be "L" and "H" so that the flip-flop FF1 is deactivated, and the signal ECH1 is made to be "H" and equalized. Then, the signal RV1A and RV1B are made to be "H". When the signals SAN1 and SAP1 respectively are made to be "H" and "L" at time $t_{17zc}$, the voltage of the node N1 is sensed and latched.

Also the circuit of the data circuit according to the eighth embodiment is not limited to that shown in FIG. 63. Therefore, another circuit structure may be employed.

FIGS. 72, 73, 74 and 75 are circuit diagrams showing other structures.

Figure 72:
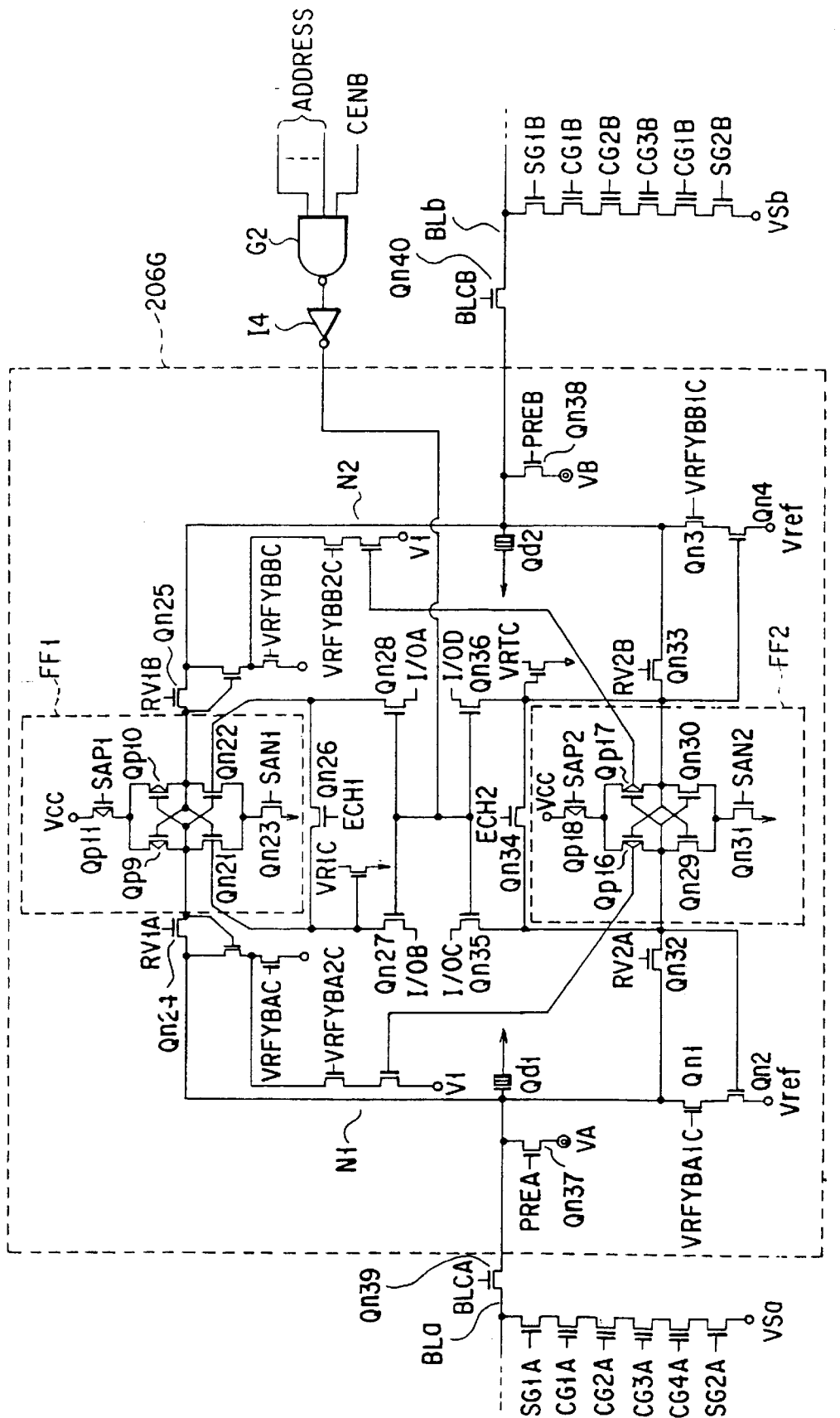
FIG. 72 is another circuit diagram showing the data circuit.

The operation timing of the signals VRFYBA1C and VRFYBB1C for the data circuit 206G shown in FIG. 72 may be determined such that Vcc is made to be 0V and 0V is made to be Vcc when a similar operation timing for the data circuits shown in FIG. 63 is employed (operation waveforms shown in FIGS. 65, 68, 69, 70 and 71).

Note that the operation timings of the signals VRFYBAC, VRFYBBC, VRFYBA2C and VRFYBB2C are similar to those in the case where the data circuit 206F shown in FIG. 63 is employed.

The operation timing of the signals VRFYBAC, VRFYBBC, VRFYBA2C and VRFYBB2C for the data circuit 206H shown in FIG. 73 may be determined such that Vcc is made to be 0V and 0V is made to be Vcc when a similar operation timing for the data circuit 206F shown in FIG. 63 is employed (operation waveforms shown in FIGS. 65, 68, 69, 70 and 71). Note that the operation timings of the signals VRFYBA1C and VRFYBB1C are similar to those in the case where the data circuit 206F shown in FIG. 63 is employed.

The operation timing of the signals VRFYBAC and VRFYBBC for the data circuit 206I shown in FIG. 74 may be determined such that Vcc is made to be 0V and 0V is made to be Vcc when a similar operation timing for the data circuit 206F shown in FIG. 63 is employed (operation waveforms shown in FIGS. 65, 68, 69, 70 and 71). Note that the operation timings of the signals VRFYBA1C, VRFYBB1C, VRFYBA2C and VRFYBB2C are similar to those in the case where the data circuit 206F shown in FIG. 63 is employed.

Figure 75:
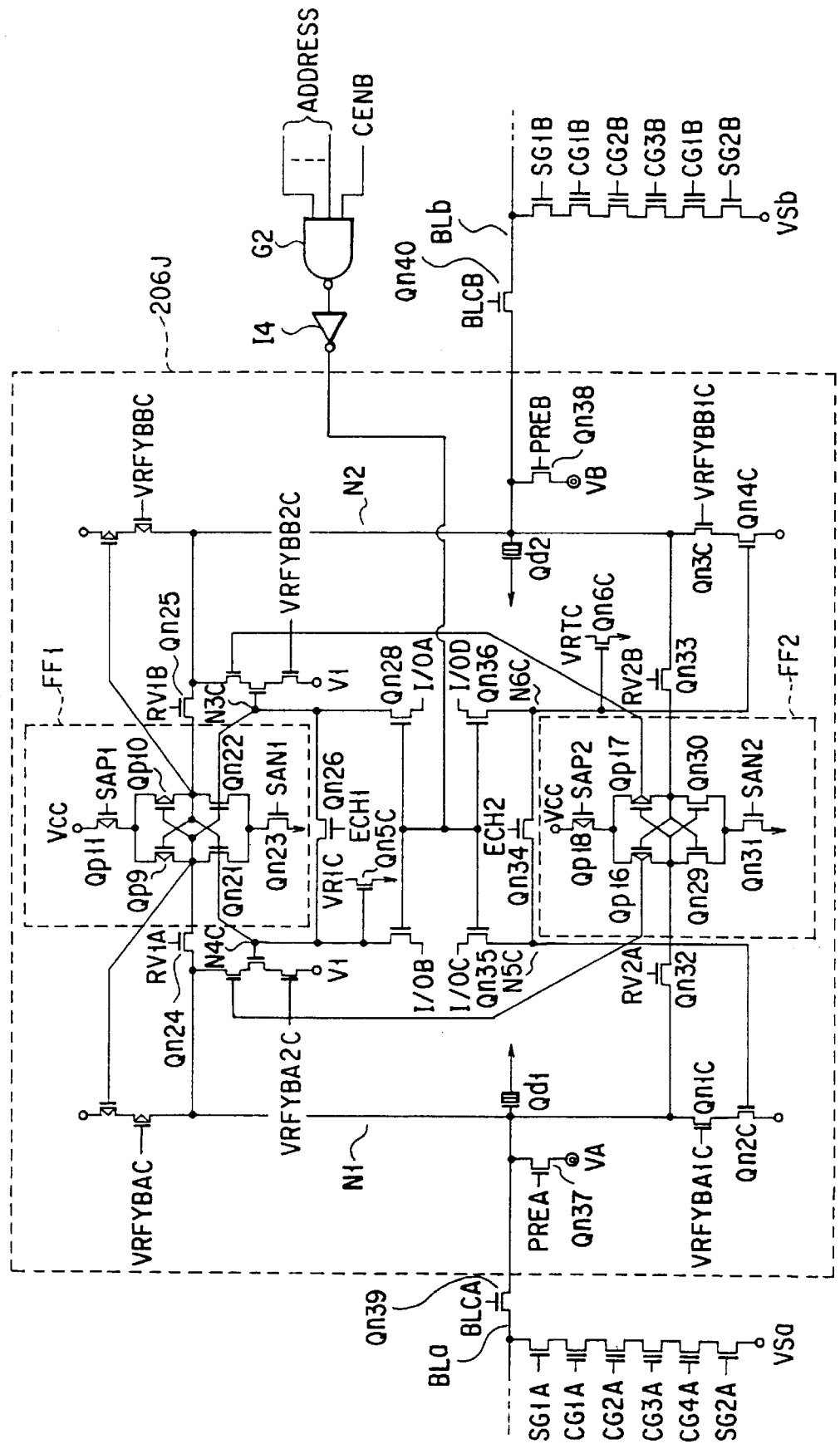
FIG. 75 is another circuit diagram showing the data circuit.

The operation timing of the signals VRFYBA2C and VRFYBB2C for the data circuit 206J shown in FIG. 75 may be determined such that Vcc is made to be 0V and 0V is made to be Vcc when a similar operation timing for the data circuit 206F shown in FIG. 63 is employed (operation waveforms shown in FIGS. 65, 68, 69, 70 and 71). Note that the operation timings of the signals VRFYBA2C, VRFYBB2C, VRFYBAC1C and VRFYBB1C are made to be Vcc, they may be made to be Vcc+Vth (Vth is the threshold voltage of the n-channel MOS transistor) or Vcc+2Vth. In this case, the n-channel MOS transistor is able to transfer the potential without lowering of the threshold voltage.

The eighth embodiment has the structure such that the bit line is precharged when the reading operation is performed or when the verify read is performed, and then the non-selected control gates CG1A, CG3A and CG4A are made to be Vcc to turn in the memory cells having the CG1A, CG3A and CG4A as the gate electrodes.

A structure may be employed in which the non-selected control gates CG1A, CG3A and CG4A are made to be Vcc and then brought to the floating state followed by precharging the bit line. Another structure may be employed in which the bit line is precharged and then the non-selected control gate is made to be Vcc followed by bringing the non-selected control gate to the floating state. In this case, the non-selected control gate is in the floating state in a period in which the electric current flows from the bit line to the source line. In the period in-which the read current flows, the channel of the memory cell having the non-selected control gate as the gate electrode is increased from 0V. As a result, capacity coupling between the channel and the non-selected control gate causes the potential of the non-selected control gate to be higher than Vcc. When the potential of the non-selected control gate is higher than Vcc, the resistance of the memory cell having the non-selected control gate as the gate electrode is reduced. As a result, the read electric current is raised and thus reading speed can be raised.

(Ninth Embodiment)

A multilevel storing NAND type EEPROM according to a ninth embodiment of the present invention will now be described.

Similarly to the EEPROM according to the eighth embodiment, the EEPROM according to the ninth embodiment has a similar structure to the structure according to the sixth embodiment shown in FIGS. 36 and 37.

Figure 76:
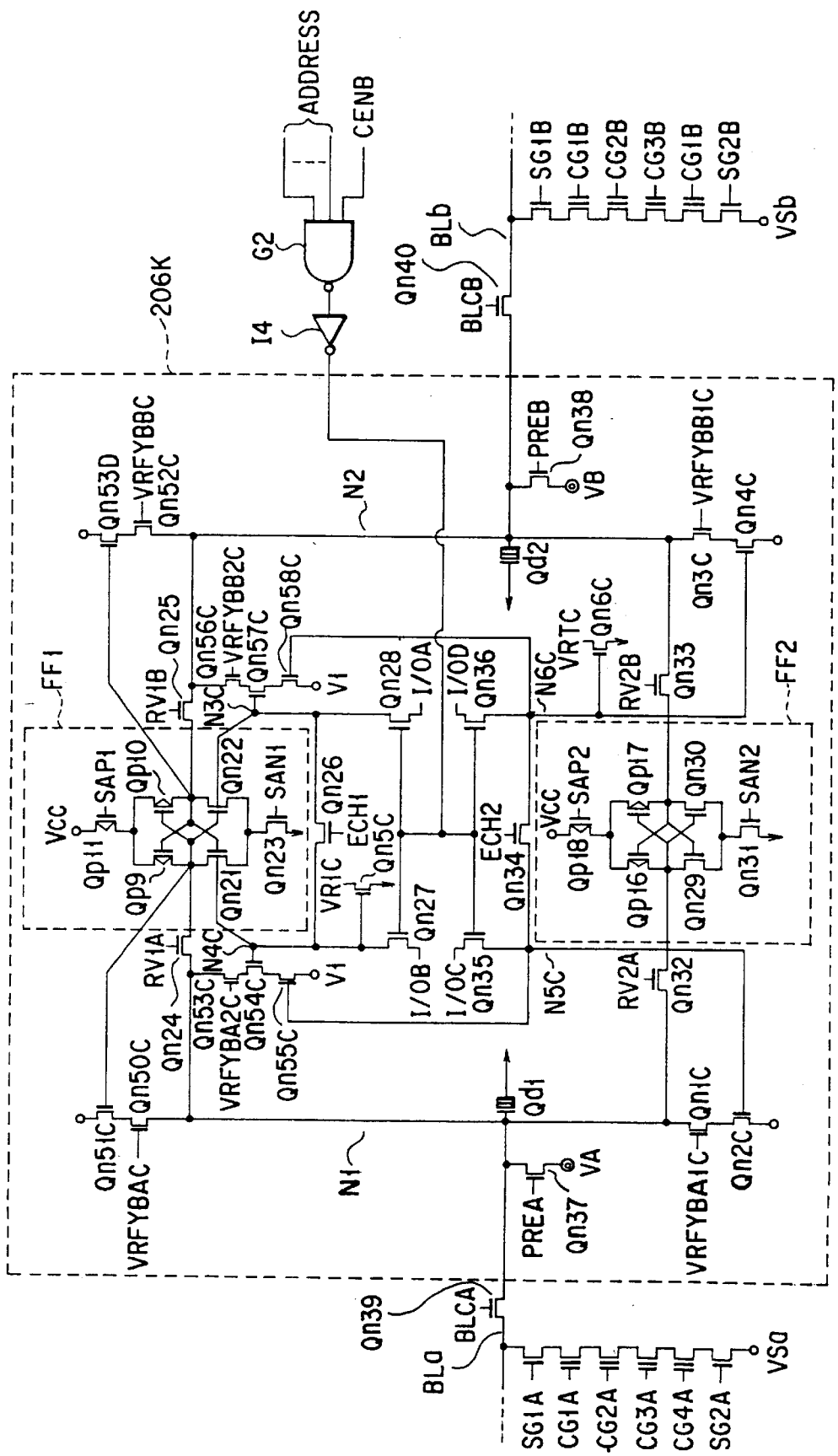
FIG. 76 is a circuit diagram showing the bit line controller of an EEPROM according to a ninth embodiment of the present invention.

FIG. 76 is a circuit diagram showing a data circuit 206K of the EEPROM according to the ninth embodiment of the present invention. The data circuit 206K shown in FIG. 76 is structured to store four-level data.

The data circuit 206K shown in FIG. 76 includes two latches (a first latch FF1 and a second latch FF2). When writing is performed, two-bit write data is stored in the two latches. When reading is performed, read four-level data is stored in the two latches, and then output to the outside of the chip through I/OA to I/OD.

As shown in FIG. 76, write/read data is latched by a flip-flop FF1 formed of n-channel MOS transistors Qn21, Qn22 and Qn23 and p-channel MOS transistors Qp9, Qp10 and Qp11 and a flip-flop FF2 formed of n-channel MOS transistors Qn29, Qn30 and Qn31 and p-channel MOS transistors Qp16, Qp17 and Qp18. The foregoing flip-flops FF1 and FF2 serve as sense amplifiers.

The flip-flops FF1 and FF2 latch whether "0" or "1" or "2" or "3" is written as write data information and sense and latch whether the memory cell has information of "0" or "1" or "2" or "3" as data information.

The data input/output lines I/OA and I/OB and the flip-flop FF1 are connected to each other through the n-channel MOS transistors Qn28 and Qn27. The data input/output lines I/OC and I/OD and the flip-flop FF2 are connected to each other through the n-channel MOS transistors Qn35 and Qn36. The data input/output lines I/OA, I/OB, I/OC and I/OD are as well as connected to the data input/output buffer 205 shown in FIG. 36. The gates of the n-channel MOS transistors Qn27 and Qn28, are connected to the output of a column address decoder formed of a NAND logic circuit G2 and an inverter I4.

The n-channel MOS transistors Qn26 and Qn34 equalize flip-flops FF1 and FF2 when signals ECH1 and ECH2 are "H". The n-channel MOS transistors Qn24 and Qn32 control the connection between the flip-flops FF1 and FF2 and a MOS capacitor Qd1. The n-channel MOS transistors Qn25 and Qn33 control the connection between the flip-flops FF1 and FF2 and a MOS capacitor Qd2.

A circuit formed of the p-channel MOS transistors Qn50C and Qn51C changes the gate voltage of the MOS transistor Qd1 in accordance with data in the flip-flop FF1 and in response to activating signal VRFYBAC. A circuit formed of the p-channel MOS transistor Qn52C and Qn53D changes the gate voltage of the MOS capacitor Qd2 in accordance with data in the flip-flop FF1 and in response to activating signal VRFYBBC. A circuit formed of the n-channel MOS transistors Qn53C, Qn54C and Qn55C changes the gate voltage of the MOS capacitor Qd1 in accordance with data in the flip-flops FF1 and FF2 and in response to activating signal RRFYBA2C. A circuit formed of the n-channel MOS transistors Qn56C, Qn57C and Qn58C changes the gate voltage of the MOS capacitor Qd2 in accordance with data in the flip-flops FF1 and FF2 and in response to activating signal VRFYBB2C. A circuit composed on the n-channel MOS transistors Qn1C and Qn2C changes the gate voltage of the MOS capacitor Qd1 in accordance with data in the flip-flop FF2 and in response to activating signal VRFYBA1C. A circuit formed of the n-channel MOS transistors Qn3C and Qn4C changes the gate voltage of the MOS capacitor Qd2 in accordance with data in the flip-flop FF2 and in response to activating signal VRFYBB1C.

Each of the MOS capacitors Qd1 and Qd2 comprises depletion n-channel MOS transistors and have capacities which are sufficiently smaller than the capacity of the bit line. The n-channel MOS transistor Qn37 electrically charges the MOS capacitor Qd1 to voltage VA in response to signal PREA. The n-channel MOS transistor Qn38 electrically charges the MOS capacitor Qd2 to voltage VB in response to signal PREB. The n-channel MOS transistors Qn39 and Qn40 control the connection between the data circuit 3 and the bit lines Bla and Blb in response to signals BLCA and BLCB. A circuit formed of the n-channel MOS transistors Qn37 and Qn38 also serves as a bit line voltage controller.

The operation of the EEPROM having the above-mentioned structure will now be described with reference to the operation waveform. In the following description, a state where control gate CG2A has been selected will now be described.

Reading Operation

FIG. 77 is an operation waveform showing a reading operation.

As shown in FIG. 77, at time $t_{w1}$, voltages VA and VB respectively are made to be 1.8V and 1.5V so that the bit lines BLa and BLb respectively are made to be 1.8V and 1.5V. The signals PREA and PREB are made to be "L" so that the bit lines BLa and BLb are brought to the floating state.

At time $t_{w2}$, the selected control gate CG2A in the block selected by the control gate/selection gate driver 202B is made to be 1V, non-selected control gates CG1A, CG3A and CG4A and selection gates SG1A and SG2A are made to be Vcc. If the threshold voltage of the selected memory cell is 1V or lower, the bit line voltage is lower than 1.5V. If the threshold voltage of the selected memory cell is 1V or higher, the bit line voltage of 1.8V is maintained. Then, the signals SAN1 and SAP1 respectively are made to be "L" and "H" so that the flip-flop FF1 is deactivated and the signal ECH1 is made to be "H" and equalized.

At time $t_{3w}$, the signal RV1A and RV1B are made to be "H". At time $t_{w4}$, the signals SAN1 and SAP1 are again made to be "H" and "L" so that the voltage of the node N1 is sensed and latched. As a result, it is determined whether data in the memory cell is "0 or 1" or "2 or 3" is sensed by the flip-flop FF1 and information of this is latched.

Then, it is determined whether the threshold voltage of the memory cell is 0V or higher; or 0V or lower. At time $t_{w5}$, the bit line Bla and the dummy bit line BLb respectively are precharged to 1.8V and 1.5V followed by brining the bit line Bla and the dummy bit line BLb to the floating state.

At time $t_{w6}$, the selected control gate is made to be 0V. If the threshold voltage of the selected memory cell is 0V or lower, the bit line voltage is lower than 1.5V. If the threshold voltage of the selected memory cell is 0V or higher, the bit line voltage of 1.8V is maintained. The signals SAN2 and SAP2 respectively are made to be "L" and "H" so that the flip-flop FF2 is deactivated and signal ECH2 is made to be "H" and equalized. At time $t_{w7}$, the signals RV2A and RV2B are made to be "H".

At time $t_{w8}$, the signals SAN2 and SAP2 respectively are made to be "H" and "L" so that the voltage of the node N1 is sensed and latched. Thus, it is determined whether data in the memory cell is "0" or "1 or 2 or 3" is sensed by the flip-flop FF2 and information of this is latched.

FIG. 78 is a table showing read data sensed and latched by the flip-flops FF1 and FF2 at time $t_{w8}$. The potentials of the nodes N3C and N5C of the flip-flops FF1 and FF2 are as shown in FIG. 78.

Finally, whether data written in the memory cell is "0 or 1 or 2" or "3" is sensed. At time $t_{w9}$, the bit line Bla and the dummy bit line BLb are precharged to 1.8V and 1.5V, respectively. Then, the bit line Bla and the dummy bit line BLb are brought to the floating state. Then, the selected control gate is made to be 2V at time $t_{w10}$. If the threshold voltage of the selected memory cell is 2V or lower, the bit line voltage is lower than 1.5V. If the threshold voltage of the selected memory cell is 2V or higher, the bit line voltage of 1.8V is maintained. At time $t_{w11}$, VRFYBA2C is made to be Vcc.

As can be understood from FIG. 78, the node N5C is made to be "H" and the node N3C is made to be "L" (that is, the node N4C is made to be "H") only when data is "1". Therefore, only when data is "1", the n-channel MOS transistors Qn54C, Qn55C and Qn53C are turned on and the node N1 is made to be Vcc. Then, the signals SAN2 and SAP2 respectively are made to be "L" and "H" so that the flip-flop FF2 is deactivated and the signal ECH2 is made to be "H" and equalized. At time $t_{w12}$, the signals RV2A and RV2B are made to be "H". At time $t_{w13}$, the signals SAN2 and SAP2 are again made to be "H" and "L" so that the voltage of the node N1 is sensed and latched. Thus, whether data in the memory cell is "0 or 1 or 2" or "3" is sensed by the flip-flop FF2 and information of this is latched.

FIG. 79 is a table showing read data which is sensed and latched by the flip-flops FF1 and FF2.

Two-bit data stored by the flip-flops FF1 and FF2 is output to the outside of the chip when CENB is activated at time $t_{w14}$.

The writing operation and write verify read operation are similar to those according to the eighth embodiment.

In the ninth embodiment, the bit lines and the dummy bit lines are precharged prior to applying a predetermined reading voltages (for example, 0V, 1V and 2V) to the word lines.

On the other hand, the eighth embodiment has the structure such that the bit line and the dummy bit line are first precharged when reading and verify reading are performed. Then, no precharge is performed and the word line reading voltage is changed (for example, it is changed from 0V to 1V and 2V). Also the eighth embodiment having the foregoing structure may be structured such that the bit line and the dummy bit line are precharged similarly to the ninth embodiment whenever reading voltage (for example, 0V, 1V and 2V) is applied to the word line when reading or verify reading is performed.

Figure 80:
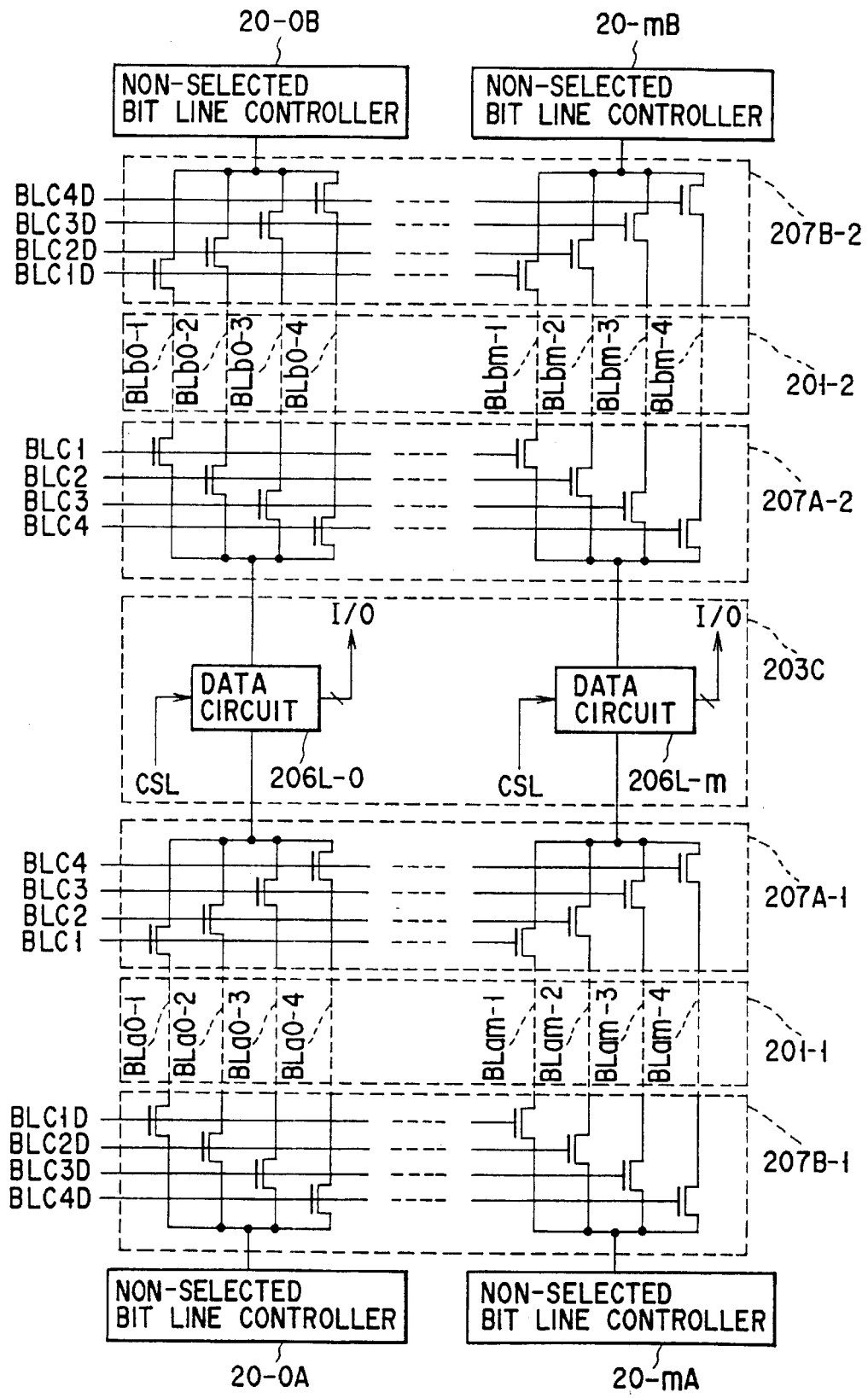
FIG. 80 is a diagram showing the structure of the EEPROM having a modified column structure.

Although the sixth to ninth embodiments have the above-mentioned structures, the sixth to ninth embodiments may be modified as follows:

FIG. 80 is a diagram showing an EEPROM having a modified column structure.

In the sixth to ninth embodiments, only data circuit 206 corresponds to each of right and left bit lines BL. A structure may be employed in which one data circuit 206L corresponds to each of a plurality of right and left bit lines BL.

As shown in FIG. 80, the modified EEPROM has a structure such that one of data circuits 206L-0 to 206L-m is provided for four bit lines BLai-1 to BLai-4 or BLbi-1 to BLbi-4 (i is any one of 0 to 3).

A portion including the memory cell array 201-1 will now be described.

When the bit line BLai-1 is selected from the four bit lines BLai-1 to BLai-4, signal BLC1 of the drive signals BLC1 to BLC4 for driving the transfer gate circuit 207A-1 in the portion including the bit line controller 203C is made to be "H" level and the other signals BLC2 to 4 are made to be "L" level. Simultaneously, the signal BLC1D of the drive signals BLC1D to BLC4D for driving the transfer gate 207B in the portion including the non-selected bit line controller 20 is made to be "L" level and the other signals BLC2D to BLC4D are made to be "H" level. As a result, only the selected bit line BLi-1 is connected to the data circuits 206L-0 to 206L-m.

Thus, only the selected bit line BLai-1 is connected to the data circuits 206L-0 to 206L-m while the non-selected bit lines BLai-2 to BLai-4 are connected to the non-selected bit line controllers 20-0A to 20-mA. The non-selected bit line controllers 20-0A to 20-mA control the potentials of the non-selected bit lines BLai-2 to BLai-4.

As described above, according to the sixth to ninth embodiments, when data is written, at least one bit line controller electrically charges the bit line to a required bit line write control voltage. As a result, a bit line voltage controller can be realized which has a simple structure and which applies bit line write control voltage corresponding to n-level write data to the bit line. Thus, an n-level storing EEPROM can be obtained which is able to reduce the size of the column-system circuit and the size of the chip and which is suitable to realize a highly integrated structure.

Assuming that the number of multilevel data is $2^m$ (m is a natural number not smaller than 2)=n for latching write data into the memory cell and sensing and latching read data from the memory cell, the number of the flip-flops can be made to be m. Therefore, the size of the column-system circuit can be reduced. The determination circuit provided for determining whether or not re-writing is performed during verification is controlled in accordance with write data which is updated in the data latch/sense amplifier in accordance with a result of verify read.

The number "n" of multilevel data may be a natural number satisfying $2^{m-1} < n \leq 2^m$.

(Tenth Embodiment)

Figure 81:
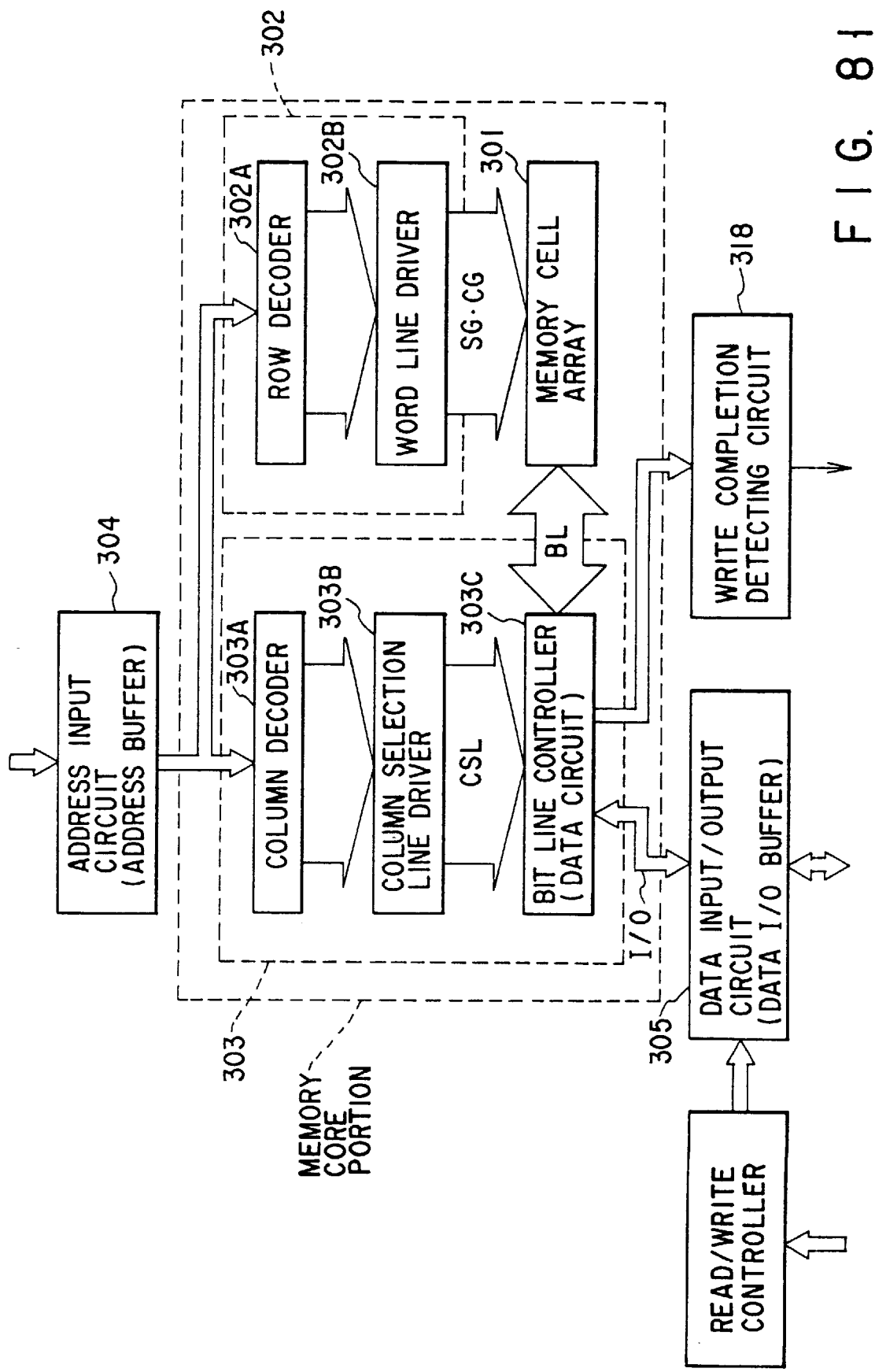
FIG. 81 is a diagram showing the structure of a multilevel data storing EEPROM according to a tenth embodiment of the present invention.

FIG. 81 is a diagram showing the structure of a multilevel storing EEPROM according to a tenth embodiment of the present invention.

As shown in FIG. 81, a row-system circuit 302 and a column-system circuit 303 are provided for a memory cell array 301 having memory cells arranged in the matrix manner.

The row-system circuit 302 includes a row decoder 302A for receiving an address signal output from an address buffer 304 to select a row of the memory cell array 301 in response to the supplied address signal, and a word line driver 302B for driving a word line of the memory cell array 301 in accordance with an output from the row decoder 302A. In this embodiment, a NAND type EEPROM will now be described which comprises word lines which are selection gates (SG) and control gates (CG). Therefore, the word line driver 302B is sometimes called a control gate/selection gate driver. The control gate/selection gate driver 302B selects a selection gate (SG) and a control gate (CG) in response to the address signal to apply writing voltage, reading voltage and the like to the selected selection gate and control gate.

The column-system circuit 303 includes a column decoder 303A for receiving the address signal output from the address buffer 304 to select a column of the memory cell array and a column selection line driver 303B for driving the column selection line for selecting a column of the memory cell array 301 in accordance with an output from the column decoder 303A.

Moreover, the column-system circuit 303 includes a bit line controller 303C for temporarily storing data to be written in the memory cell and reading data in the memory cell. The bit line controller 303C is connected to a data input/output circuit (data input/output buffer) 305. The-bit line controller 303C receives write data from the data input/output buffer 305 when data is written to output the received write data to the memory cell. On the other hand, the bit line controller 303C receives data read from the memory cell to output received data to the data input/output buffer 305.

The data input/output buffer 305 controls input/output of data such that it introduces write data supplied from outside of the EEPROM and outputs data read from the memory core portion to the outside of the EEPROM. Moreover, the data input/output buffer 305 has a function serving as an interface between the outside of the EEPROM and the memory core portion. For example, the data input/output buffer 305 has a function for encoding four-level data read from the memory core portion into two-bit data to output the same to the outside and a function for decoding two-bit data supplied from the outside of the EEPROM into four-level data to introduce the same to the memory core portion.

Figure 82:
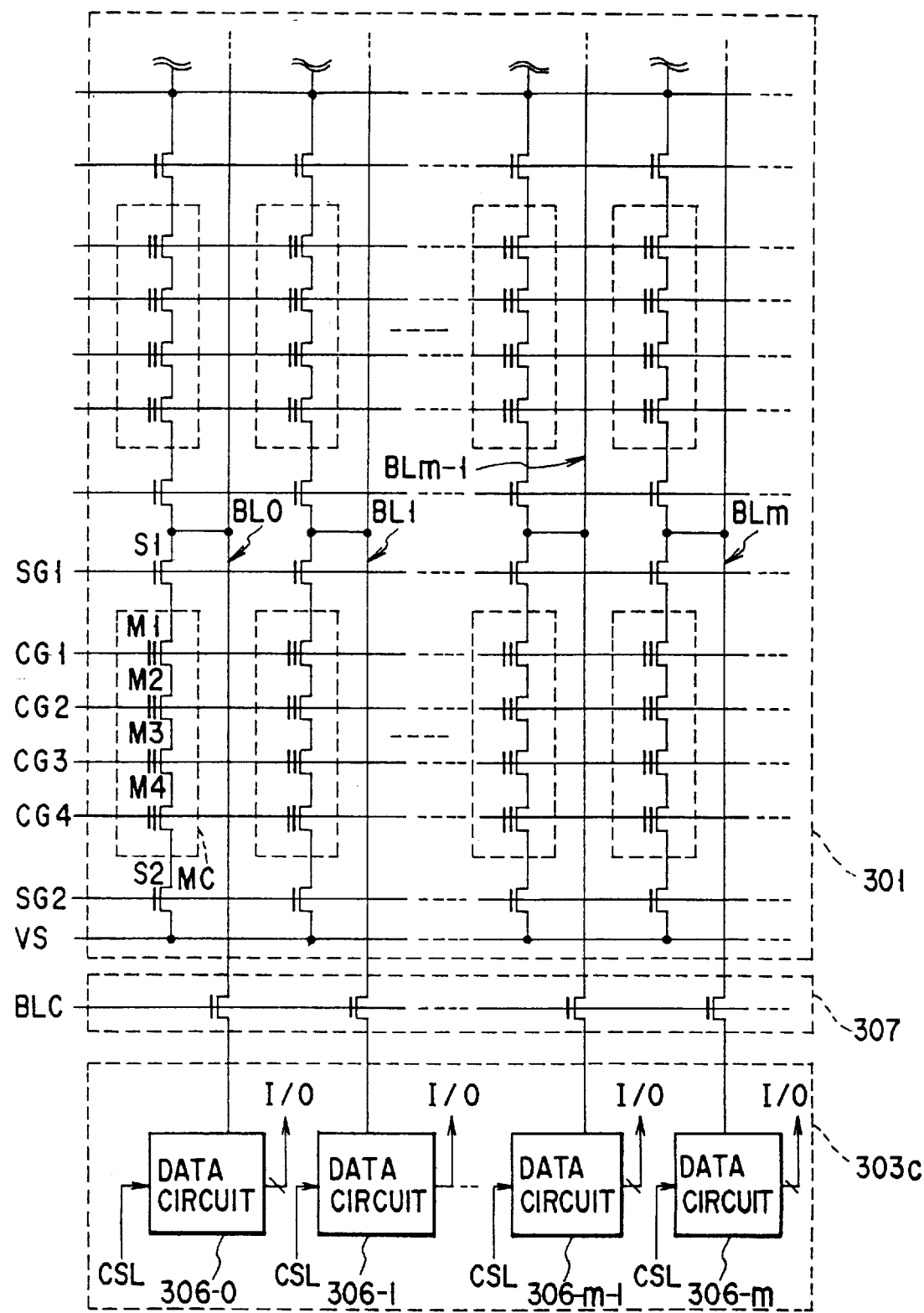
FIG. 82 is a diagram showing the structures of the memory cell array and the column-system circuit shown in FIG. 81.

FIG. 82 is a diagram showing the structure of the memory cell array 301 and the column-system circuit 303 shown in FIG. 81.

As shown in FIG. 82, the memory cell array 301 has memory cells MC arranged in the matrix manner. The EEPROM according to this embodiment has a structure such that one cell MC includes a plurality of memory cell transistors M1 to M4 connected in series so that a NAND cell MC is formed. An end of the cell MC is connected to bit line BL through a selection transistor S1, while another end of the same is connected to a source line VS through a selection transistor S2. A group of the memory cell transistors M sharing the control gate CG forms a unit called a "page". Data is written and read simultaneously in page units. A group of memory cell transistors M connected to four control gates CG1 to CG4 forms a unit called a "block". The page and block respectively are selected by control gate/selection gate driver.

Data circuits 306-0 to 306-$m$ respectively are connected between the bit lines BL0 to BLm and data input/output line I/O. The data circuits 306-0 to 306-$m$ have a function for temporarily storing data to be written in the memory cell and a function for sensing and temporarily storing data read from the memory cell.

Figures 83, 85, 86:
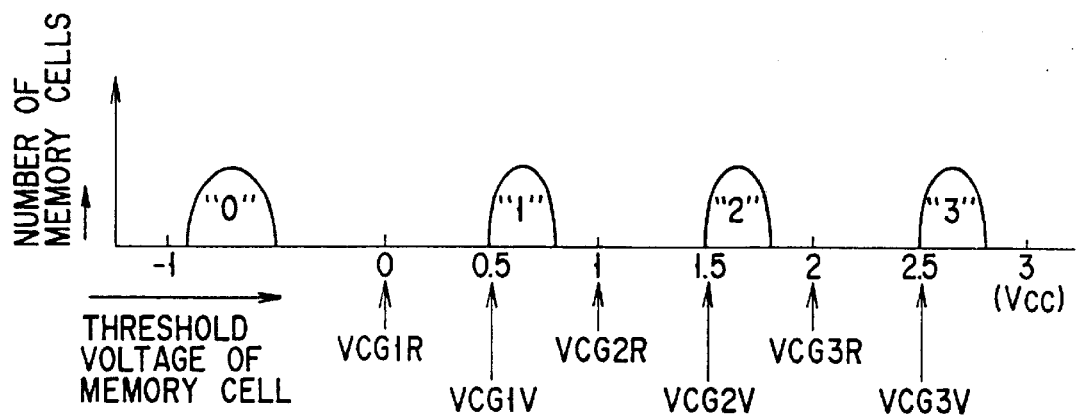
FIG. 83 is a graph showing the relationship between the threshold voltages and four writing states of the memory cell transistor when the EEPROM is a four-level data storing memory.
FIG. 85 is a table showing the relationship between write data and potential level of the data input/output line.
FIG. 86 is a table showing the relationship between read data and potential level of the data input/output line.

FIG. 83 is a graph showing the threshold voltage of the memory cell transistor M and four writing states (four-level data "0", "1", "2" and "3") when the EEPROM is a four-level storing EEPROM.

When the EEPROM is structured to store four-level data, four writing states are provided for one memory cell transistor M. The four writing states are distinguished from one another in accordance with the threshold voltage of the memory cell transistor M.

As shown in FIG. 83, the state of data "0" in the EEPROM having the power supply voltage Vcc which is set to 3V is made to be the same as the state after data has been erased. Thus, for example, a negative threshold voltage is assigned.

In a state of data "1", a threshold voltage from, for example, 0.5V to 0.8V is assigned. In a state of data "2", a threshold voltage from, for example, 1.5V to 1.8V is assigned. In a state of data "3", a threshold voltage from, for example, 2.5V to 2.8V is assigned.

When data is read from the memory cell transistor M, three read voltages VCG1R to VCG3R are applied to the control gate CG, sequentially.

Initially, reading voltage VCG1R is applied to the control gate CG. In accordance with whether the memory cell transistor M turns on or off, whether stored data is "0" or "1 or 2 or 3" is detected. Then, reading voltage VCG2R is applied so that whether stored data is "1" or "2 or 3" is detected. When reading voltage VCG3R is applied, whether data is "2" or "3" is detected. The reading voltages VCG1R, VCG2R and VCG3R are, for example, 0V, 1V and 2V, respectively.

Voltages VCG1V, VCG2V and VCG3V shown in FIG. 83 are voltages called verify read voltages which are used to detect (when a verifying operation is performed) whether or not data has been sufficiently written. The verify read voltage is applied to the control gate CG after data has been written. Whether or not the threshold voltage of the memory cell transistor M has been shifted to a range corresponding to written data can be detected in accordance with whether or not the memory cell transistor M is turned on when the verify read voltage has been applied to the control gate CG. By using this, whether or not sufficient writing has been performed is detected. The verify read voltages VCGLV, VCG2V and VCG3V are, for example, 0.5V, 1.5V and 2.5V, respectively.

Figure 84:
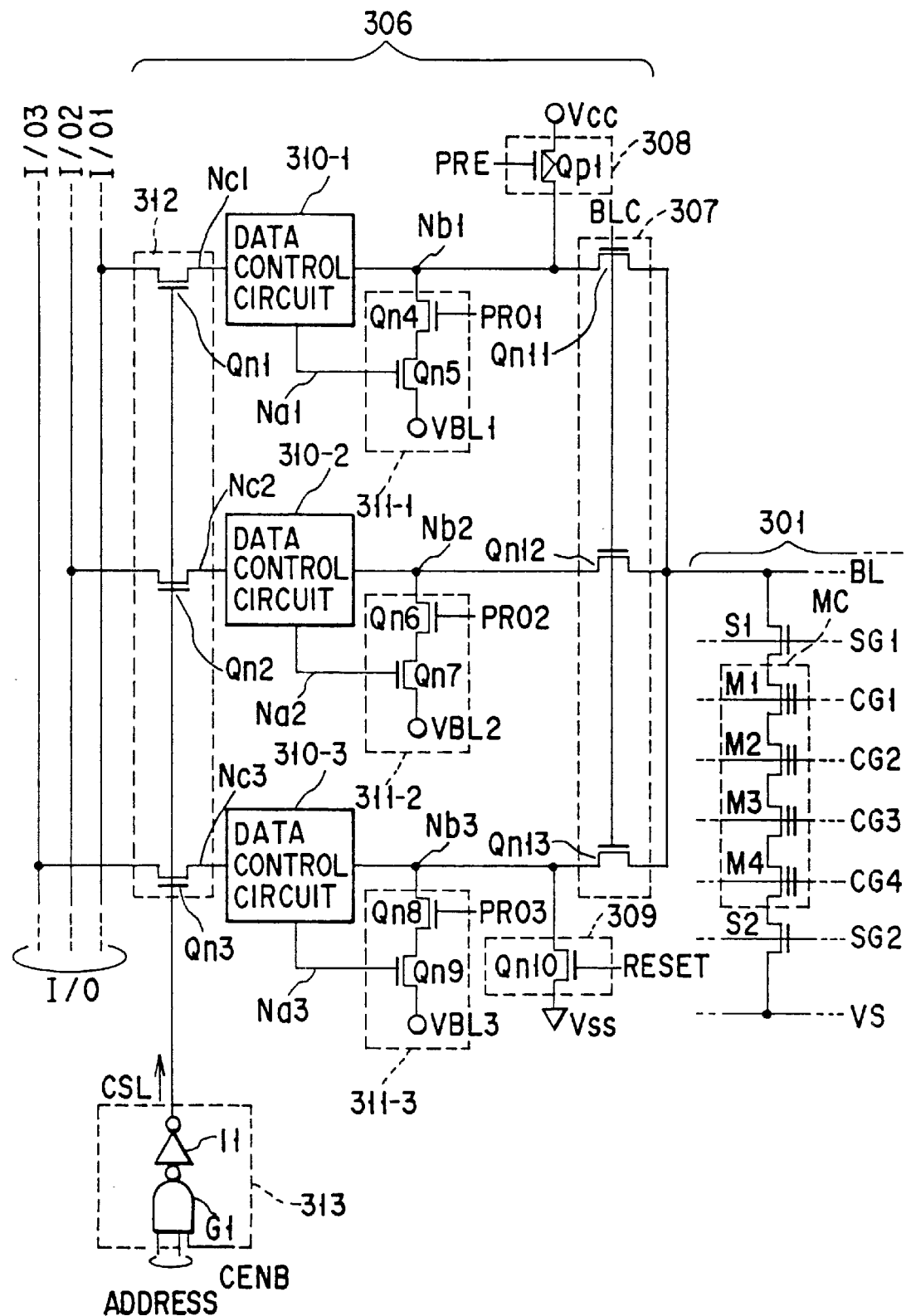
FIG. 84 is a diagram showing the structure of the bit line controller shown in FIG. 82.

FIG. 84 is a diagram showing the structure of the data circuit 306 shown in FIG. 82.

As shown in FIG. 84, the data circuit 306 is connected to the bit line BL through a transfer gate circuit 307. The data circuit 306 includes a bit line precharge circuit 308 for precharging the bit line BL, a bit line reset circuit 309 for resetting the bit line. BL, a data controller 310 having a function for storing write data and read data, a bit line write voltage controller 311 for setting the voltage of the bit line BL to the bit line write control voltage and a column gate circuit 312 for connecting the data controller 310 and the data input/output line I/O.

The three data controllers 310-1 to 310-3 respectively store whether or not data "1" is written, whether or not data "2" is written and whether or not data "3" is written.

The column gate circuit 312 is formed of n-channel MOS transistors Qn1, Qn2 and Qn3. The n-channel MOS transistors Qn1, Qn2 and Qn3 control the connection between the three data controllers 310-1 to 310-3 and the three data input/output lines I/O1, I/O2 and I/O3.

The column decoder 313 is formed of an inverter circuit I1 and a NAND circuit G1. The column decoder 313 outputs a column selection signal CSL and selects one or more data circuits 306-0 to 306-$m$ in response to an address signal when the column activating signal CENB is "H" level.

In the data circuit 306 selected by the column decoder 313, the data controllers 310-1 to 310-3 and the data input/output lines I/O1 to I/O3 are connected to one another. As a result, write data can be supplied from the data input/output lines I/O1 to I/O3 to the data controllers 310-1 to 310-3.

FIG. 85 is a table showing write data and potential levels of the data input/output lines I/O1 to I/O3.

Similarly, read data can be output from the data controllers 310-1 to 310-3 to the data input/output lines I/O1 to I/O3.

FIG. 86 is a table showing read data and the potential levels of the data input/output lines I/O1 to I/O3.

The bit line write voltage controllers 311-1 to 311-3 are provided for each of the data controllers 310-1 to 310-3. The bit line write voltage controllers 311-1 to 311-3 respectively are connected to node Nai of each of the data controllers to 310-3. The node Nai (I=1, 2, 3) is a reverse signal of node Nci for the data controllers 310-1 to 310-3.

Each of the bit line write voltage controllers 311-1 to 311-3 is formed of n-channel MOS transistors Qn4 and Qn5, Qn6 and Qn7 and QnB and Qn9. The bit line write voltage controllers 311-1 to 311-3 output BL write control voltages VBL1, VBL2 and VBL3 to the bit line BL in accordance with data stored in the data controllers 310-1 to 310-3.

The bit line precharge circuit 308 is formed of a p-channel MOS transistor Qp1. The p-channel MOS transistor Qp1 electrically charges the bit line BL to the power supply voltage Vcc in response to bit line precharge signal PRE.

The EEPROM according to the present invention has the structure such that the bit line precharge circuit 308 serves as one of the bit line write voltage controllers. The bit line precharge circuit 308 applies the power supply voltage Vcc to the bit line BL, the power supply voltage Vcc being used as one of bit line write control voltages VBL (voltage when "0" is written as described later). Therefore, the bit line write control voltage generator is not required to generate all of the four bit line write control voltages but it is required to generate only three voltages. Therefore, the size of the circuit can be reduced.

A bit line reset circuit 309 is formed of a n-channel MOS transistor Qn10. A n-channel MOS transistor Qn10 electrically discharges the bit line BL to the ground voltage 0V in response to bit line reset signal RESET.

The transfer gate circuit 307 is formed of n-channel MOS transistors Qn11 Qn12 and Qn13. The n-channel MOS transistors Qn11, Qn12 and Qn13 respectively control the electrical connection between the data circuit 306 and the bit line BL in response to transfer gate drive signal BLC.

Figure 87:
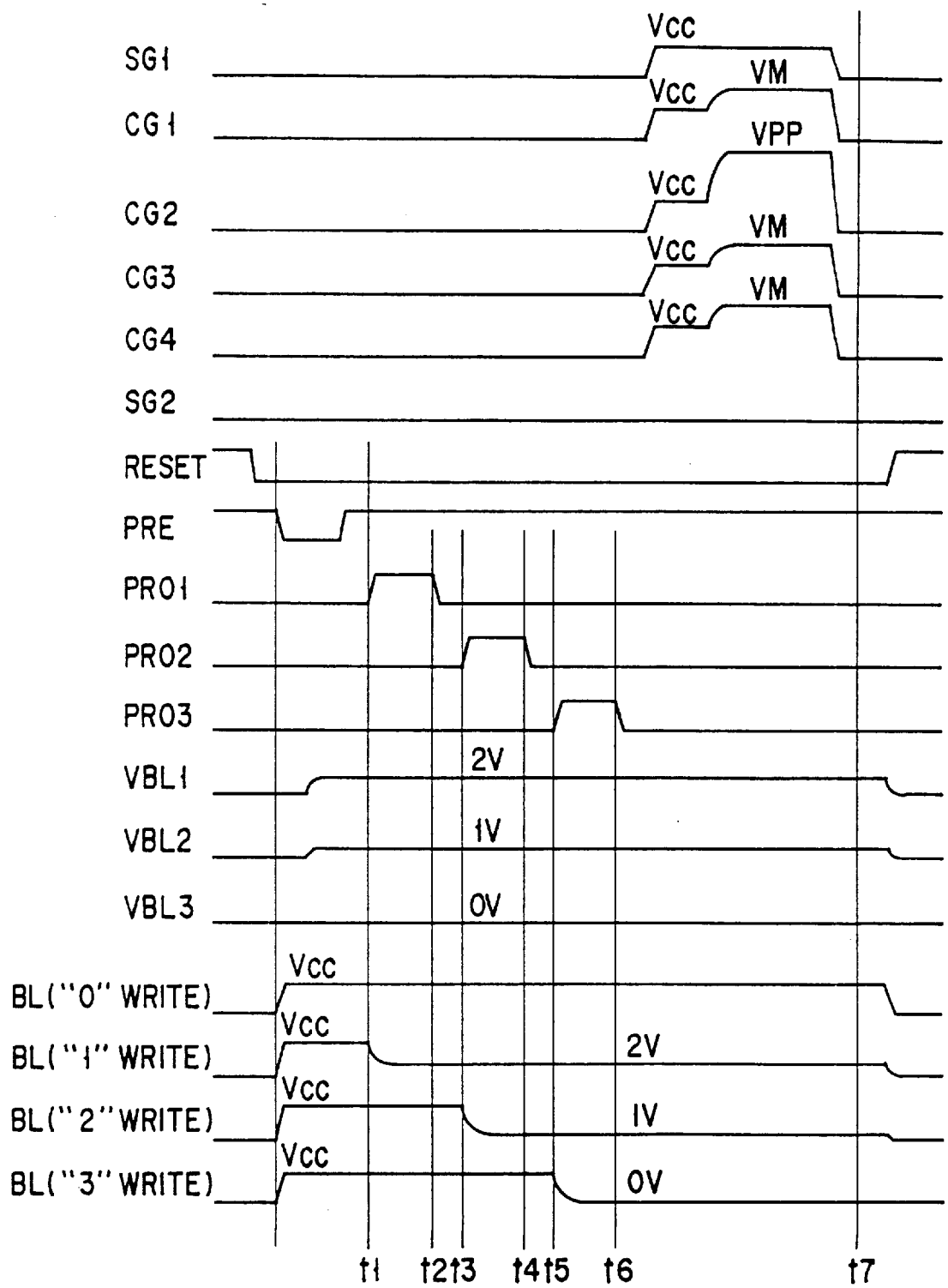
FIG. 87 is a operation waveform showing the writing operation of the EEPROM having the data circuit shown in FIG. 84.

FIG. 87 is an operation waveform showing a writing operation of the EEPROM having the data circuit 306 shown in FIG. 84.

Referring to FIG. 87, the writing operation which is performed by the EEPROM according to the tenth embodiment will now be described such that a state where control gate CG2 is selected.

Initially, the bit line reset signal RESET is made to be "L" level so that the n-channel MOS transistor Qn10 is turned off and the bit line BL is brought to the floating state. Then, the bit line precharge signal PRE is made to be "L" level so that the p-channel MOS transistor Qp1 is turned on and the bit line BL is electrically charged to voltage Vcc which is one of bit line write control voltages VBL. If voltage drop corresponding to the threshold voltage of the n-channel MOS transistor Qn11 raises a problem, the transfer gate drive signal BLC is required to be raised. Then, the bit line precharge signal PRE is made to be "H" level so that the bit line BL is again brought to the floating state. The voltage of the bit line BL in the floating state is maintained at the voltage Vcc (for example, 3V). If the bit line write control voltage VBL2 is made to be, for example, 2V, the bit line write control voltage VBL2 is made to be, for example, 1V and the bit line write control voltage VBL3 is made to be, for example, 0V.

Then, the write control signals PRO1, PRO2 and PRO3 are sequentially made to be "H" level. When data "1" is written, the n-channel transistor Qn5 is turned on and the n-channel transistors Qn7 and Qn9 are turned off. Therefore, the voltage of the bit line BL is made to be 2V-(VBL1). Similarly, when data "2" is written, the n channel transistor Qn7 is turned on and the n-channel transistors Qn5 and Qn9 are turned off. Thus, the voltage of the bit line BL is made to be 1V (VBL2). When data "3" is written, the n-channel transistor Qn9 is turned on and the n-channel transistors Qn5 and Qn7 are turned off. Therefore, the voltage of the bit line BL is made to be 0V (VBL3). When data "0" is written, the n-channel transistors Qn5, Qn7 and Qn9 are turned off. Therefore, the voltage of the bit line BL is not changed and maintained at 3V (Vcc).

Then, the selection gate SG1 in the selected block is made to be the power supply voltage Vcc., the non-selected control gates CG1, CG3 and CG4 are made to be the control gate write control voltage VM=(for example, 10V), the selected control gate CG2 is made to be the control gate write voltage VPP (for example, 18V) and the selection gate SG2 is made to be 0V to perform writing.

As described above, the EEPROM according to the tenth embodiment has the structure such that the bit line write control voltage VBL for writing data "0" is applied as follows. Therefore, a circuit for generating the foregoing voltage is not required. That is, the bit line precharge circuit 308 is operated to previously electrically charge the bit line BL to the voltage Vcc. Then, the charged bit line BL is brought to the floating state prior to making the voltage of the bit line BL to correspond to write data so as to maintain the potential of the bit line BL in the charged level. The potential of the charged BL is as it is used as the BL write control voltage when data "0" is written. Therefore, the circuit for making the voltage of the bit line BL to correspond to writing of data "0" can be omitted.

If the bit line BL is not brought to the floating state when data "0" is written, a circuit for making the voltage of the bit line BL to be a level corresponding to writing of data "0" is required in a case where nodes Na1, Na2 and Na3 are "L". Therefore, the number of transistors and that of wiring are increased and thus the area of the circuit is increased. In this case, the technical requirement for raising the degree of integration cannot be satisfied.

However, the tenth embodiment is able to reduce the area of the foregoing circuit so that the technical requirement for raising the degree of integration is satisfied.

The EEPROM according to the tenth embodiment may be modified as follows.

The reason why the bit line write control voltage VBL is changed to correspond to write data is that the quantity of charge to be stored in the floating gate of the memory cell transistor M2 is made to be different for write data. However, in consideration of the principle of the injection of the charge into the floating gate, the bit line write control voltages VBL when data "1", "2" and "3" are written may be the same (for example, 0V) except a case where data "0" is written. In this case, the voltage to be applied to the control gate CG is changed in accordance with write data or time (time generally called a "write pulse width") in which the voltage is applied to the control gate CG is changed in accordance with write data to obtain the same effect.

The bit line write control voltage for writing data "1" may be made to be voltage VBL2 and the bit line write control voltage for writing data "2" or "3" may be made to be voltage VBL3. Alternately, the bit line write control voltage for writing data "1" or "2" may be made to be voltage VBL2 and the bit line write control voltage for writing data "3" may be made to be voltage VBL3.

The operation shown in the operation waveform shown in FIG. 87 is performed such that the write control signal PROL is made to be "H" level in a period from time t1 to time t2. When data "1" is written, the voltage of the bit line BL is made to be the voltage VBL1. In a period from time t3 to t4, the write control signal PRO2 is made to be "H" level. When data "2" is written, the voltage of the bit line BL is made to be the foregoing voltage VBL2. In a period from time t5 to t6, the write control signal PRO3 is made to be "H" level. When data "3" is written, the voltage of the bit line BL is made to be the foregoing voltage VBL3.

Another structure may be employed in which a common power source is employed for voltages VBL1, VBL2 and VBL3; and the common power source applies the voltage VBL1 in the period from time t1 to t3, the voltage VBL2 in the period from time t3 to t5 and the voltage VBL3 in the period from time t5 to t7. As an alternative to this, a common write signal is employed for the write signals PRO1, PRO2 and PRO3 to simultaneously make all of the signals to be "H" in only the period from time t1 to t2.

The voltage for the bit line BL, which is previously electrically charged so as to be brought to the floating state may be another voltage level in place of Vcc. For example, the voltage of the bit line BL, which is previously electrically charged, may be 2V, 1V or 0V corresponding to data "1", data "2" or data "3". In this case, it is preferable that a structure be employed in which the existing circuits, such as the verify circuit and the bit line reset circuit, connected to the bit line BL are used to electrically charge the bit line BL to the voltage level corresponding to data. In this case, enlargement of the circuit can be prevented.

An example of the structure of the circuit for use in the data controller 310 will now be described.

FIG. 88A is a diagram showing the data controller 310 of the semiconductor memory device according to the tenth embodiment of the present invention.

As shown in FIG. 88A, a data control circuit 310-$i$ ($i=1$, 2 or 3) includes an input/output terminal 315 connected to a node Na$i$, a flip-flop circuit 314$i$ having a inverse input/output terminal 315B connected to a node Nc$i$ and a verify circuit 316$i$.

The signal levels in the flip-flop circuit 314$i$ and the inverse input/output terminal 315B have opposite phase to that of the signal level of the input/output terminal 315. The inverse input/output terminal 315B of the flip-flop circuit 314$i$ is electrically connected to the data input/output line I/O and the bit line BL. Therefore, the flip-flop circuit 314$i$ is able to store information of data to be written in the memory cell and information of data to be read from the memory cell.

The verify circuit 316$i$ is formed of p-channel MOS transistor Qp2 and Qp3. The potential of the node Na$i$ is applied to the gate of the p-channel MOS transistor Qp2, while verify signal VRFYB$i$ is supplied to the gate of the p-channel MOS transistor Qp3. The verify circuit 316$i$ applies the power supply voltage Vcc when the verify signal VRFYB$i$ has been made to be "L" in a case where the node Na$i$ ($i=1$, 2 or 3) is "L".

The n-channel MOS transistor Qn14, in series, connected between the node Nc$i$ and the node Na$i$ is a transfer gate circuit for controlling the electrical connection between the node Nc$i$ and the node Nb$i$ in response to transfer gate drive signal RV$i$ ($i=1$, 2 or 3). When the transfer gate drive signal has been made to be "H" level, the node Nc$i$ and the node Nb$i$ are electrically connected.

FIG. 88B is a circuit diagram of the flip-flop circuit 314$i$ shown in FIG. 88A. The flip-flop circuit 314$i$ is formed of p-channel MOS transistors Qp4, Qp5, Qp6 and Qp7 and the n-channel MOS transistors Qn15, Qn16, Qn17 and Qn18.

When data is written, write data information is latched. When data is read, the potential of the bit line is sensed and read data information is latched.

Figure 89:
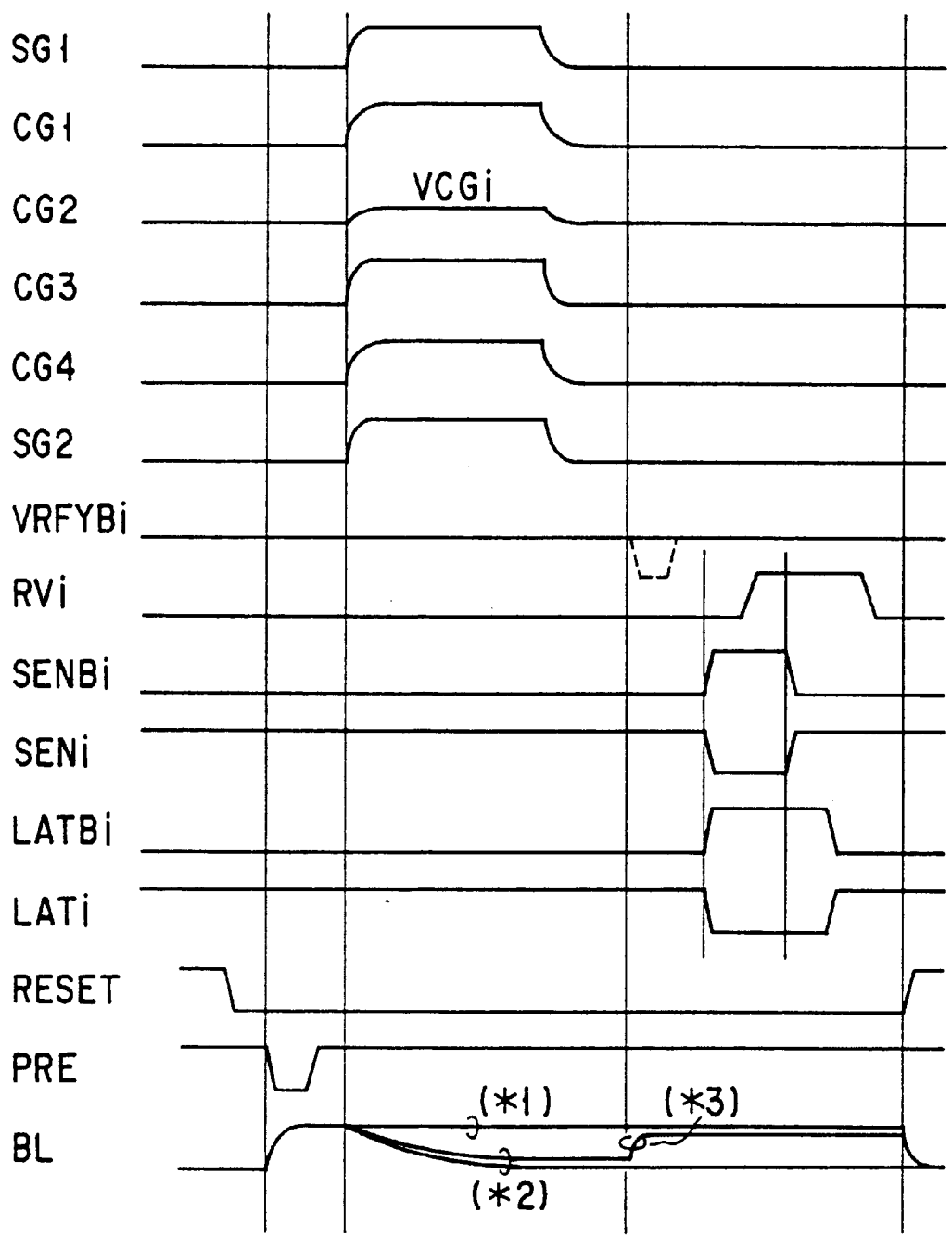
FIG. 89 is an operation waveform showing the reading operation of the EEPROM having the data controller shown in FIGS. 88A and 88B and the verify reading operation which is performed after the writing operation.

FIG. 89 is an operation waveform of the EEPROM having the data control circuit 310$i$ shown in FIG. 88A showing the reading operation and the verify read operation to be performed after the writing operation.

Referring to FIG. 89, the reading and verify operations which are performed by the EEPROM according to the tenth embodiment will now be described such that the state in which the control gate CG2 has been selected is taken for example.

Initially, the bit line reset signal RESET is made to be "L" so that the bit line BL is brought to the floating state. Then, the bit line precharge signal PRE is made to be "L" level so that the bit line BL is electrically charged to the power supply voltage Vcc. Then, the bit line precharge signal PRE is made to be "H" so that the bit line BL is again brought to the floating state.

When the usual reading operation is performed, read voltage VCGiR ($i=1$, 2 or 3) is applied to the selected control gate CG2. An example of the read voltage VCGiR is shown in FIG. 83. The non-selected control gates CG1, CG3 and CG4 and the selection gates SG1 and SG2 are applied with the voltage Vcc.

When the verify read operation is performed, verify read voltage VCGiV ($i=1$, 2 or 3) is applied to the selected control gate CG2. An example of the verify read voltage VCGiV is shown in FIG. 83 similarly to the read voltage VCGiR. When the verify read operation is performed, also the voltage Vcc is applied to the non-selected control gates CG1, CG3 and CG4 and the selection gates SG1 and SG2.

When the foregoing usual reading operation or verify read operation is performed, the potential of the bit line BL is made to be "L" level if the threshold voltage of the memory cell transistor M2 is not higher than the read voltage VCGiR or not higher than the verify read voltage VCGiV. If the threshold voltage of the memory cell transistor M2 is not lower than the read voltage VCGiR or not lower than the verify read voltage VCGiV, the potential of the bit line is made to be "H" level.

When the verify read operation is then performed, the verify signal VRFYB$i$ is made to be "L" level as indicated by a broken line. Only when the node Na$i$ is "L" level, the potential of the bit line BL is made to be "H" level regardless of the state of the memory cell transistor M2. Then, the sense amplifier activating signal SEN$i$ is made to be "L" level, SENB$i$ is made to be "H" level, the latch activating signal LAT$i$ is made to be "L" level and LATB$i$ is made to be "H" level. Thus, the flip-flop circuit 314$i$ is deactivated. After the flip-flop circuit 314$i$ has been deactivated, the transfer gate drive signal RV$i$ is made to be "H" level so that the nodes Nb$i$ and the node Nc$i$ are electrically connected to each other. After the node Nb$i$ and the node Nc$i$ have been electrically connected to each other, the sense amplifier activating signal SEN$i$ is made to be "H" level and SENB$i$ is made to be "L" level so that the flip-flop circuit 314$i$ is activated. Since the flip-flop circuit 314$i$ has been activated and connected to the bit line BL, the voltage of the bit line BL is sensed. Then, the latch activating signal LAT$i$ is made to be "H" level and LATB$i$ is made to be "L" level so that the voltage (information) of the sensed bit line BL is latched by the flip-flop circuit 314$i$.

The voltage of the bit line BL indicated as (*1) is the voltage when the threshold voltage of the memory cell transistor is VCG$i$ or higher, that indicated as (*2) is the voltage when the threshold voltage of the memory cell transistor is VCGi or lower and that indicated as (*3) is the voltage when the node Nai is "L" level when verify read operation is performed.

The foregoing operation is repeated in the data controllers 310-1 to 310-3 so that reading of data and verify read of written data are performed.

The data controller 310-1 detects whether data stored in the memory cell transistor M is "1" or "2" or "3" when the usual reading operation is performed. When the verify read operation is performed, the data controller 310-1 detects whether or not data written in the memory cell transistor M has reached the state "1". Similarly, the data controller 310-2 detects whether data stored in the memory cell transistor M is "2" or "3" when the usual reading operation is performed. When the verify read operation is performed, the data controller 310-2 detects whether or not data written in the memory cell transistor M has reached the state "2". The data controller 310-3 detects whether or not data stored in the memory cell transistor M is "3" when the usual reading operation is performed. When the verify read operation is performed, the data controller 310-3 detects whether or not data written in the memory cell transistor M has reached the state "3".

Another example of the structure of the data controller 310 will now be described.

Figure 90A:
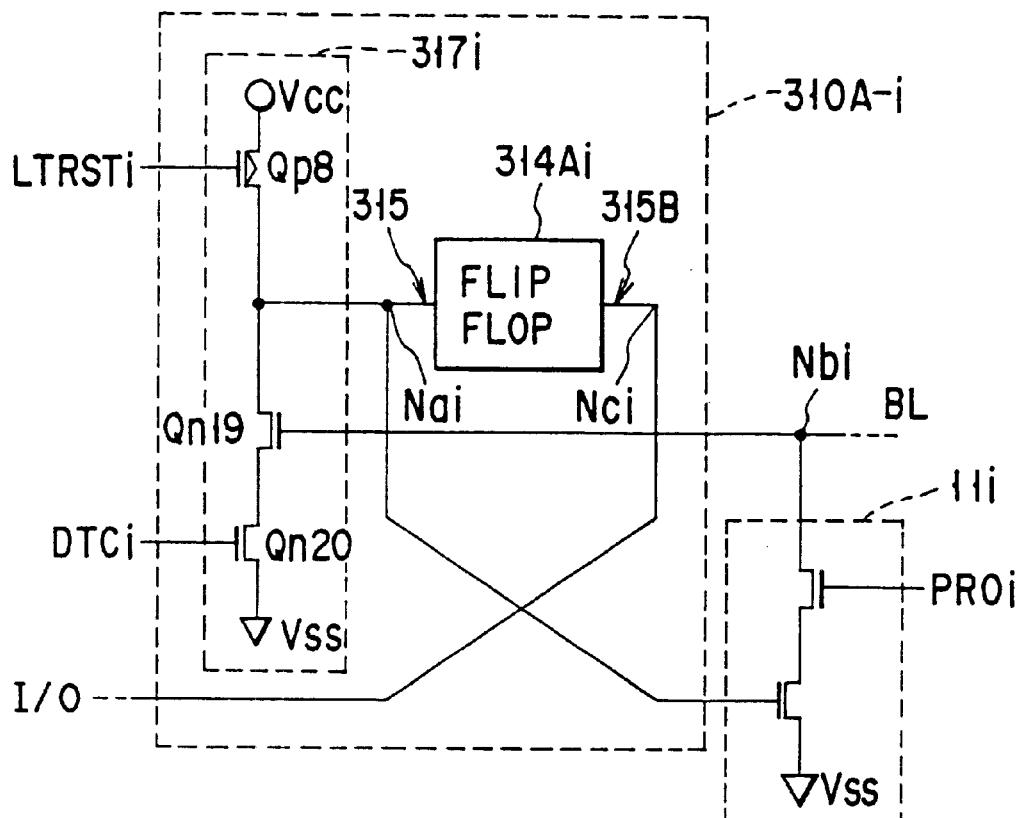
FIG. 90A is a diagram showing another structure of the data controller of the semiconductor memory device according to the first embodiment of the present invention.

FIG. 90A is a diagram showing another structure of the data controller 310 of the semiconductor memory device according to the tenth embodiment of the present invention.

As shown in FIG. 90A, the data controller 310A-i (i) =1, 2 or 3) has an input/output terminal 315 connected to the node Nai, a flip-flop circuit 314Ai having an inverse input/output terminal 315B connected to the node Nci and a data transfer controller 317i (i=1, 2 or 3) for controlling transfer of data in the bit line BL to the flip-flop circuit 314Ai.

The signal level of the inverse input/output terminal 315B of the flip-flop circuit 314Ai has an opposite phase of the signal level of the input/output terminal 315. The input/output terminal 315 of the flip-flop circuit 314Ai is connected to the data transfer controller 317i, while the inverse input/output terminal 315B is connected to the data input/output line I/O. Therefore, the flip-flop circuit 314Ai is able to store information of data to be written in the memory cell and information of data read from the memory cell, similarly to the flip-flop circuit 314i shown in FIGS. 88A and 88B.

The data transfer controller 317i is formed of p-channel MOS transistor Qp8 and n-channel MOS transistors Qn19 and Qn20, in series connected between the power supply voltage Vcc and the ground potential Vss. The p-channel MOS transistor Qp8 resets the node Nai to "H" when signal LTRSTi has been made to be "L" level. The n-channel MOS transistors Qn19 and Qn20 make the node Nai to "L" level when the potential of the node Nbi is "H" level and signal DTCi is "H" level.

Figure 90B:
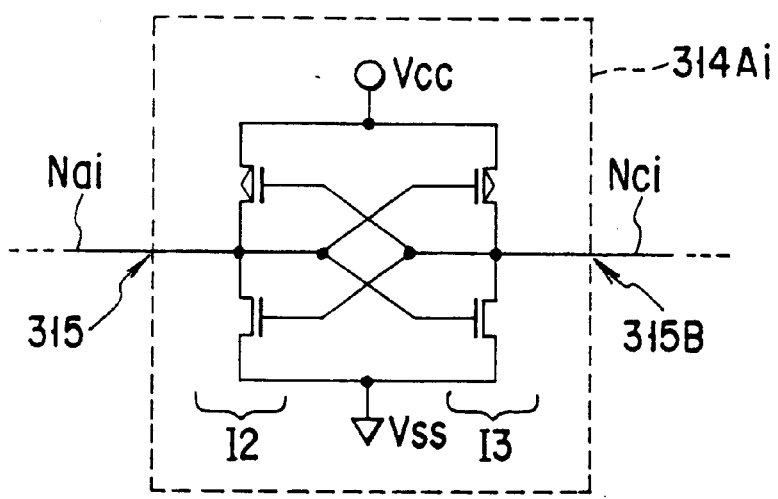
FIG. 90B is a circuit diagram showing the flip-flop circuit shown in FIG. 90A.

FIG. 90B is a diagram of a circuit for use in the flip-flop circuit 314Ai shown in FIG. 90A. The flip-flop circuit 314Ai is formed of a cross couple type latch in which the output of a CMOS inverter I2 is connected to the input of a CMOS inverter I3 and the output of the CMOS inverter I3 is connected to the input of the CMOS inverter I2.

Figure 91:
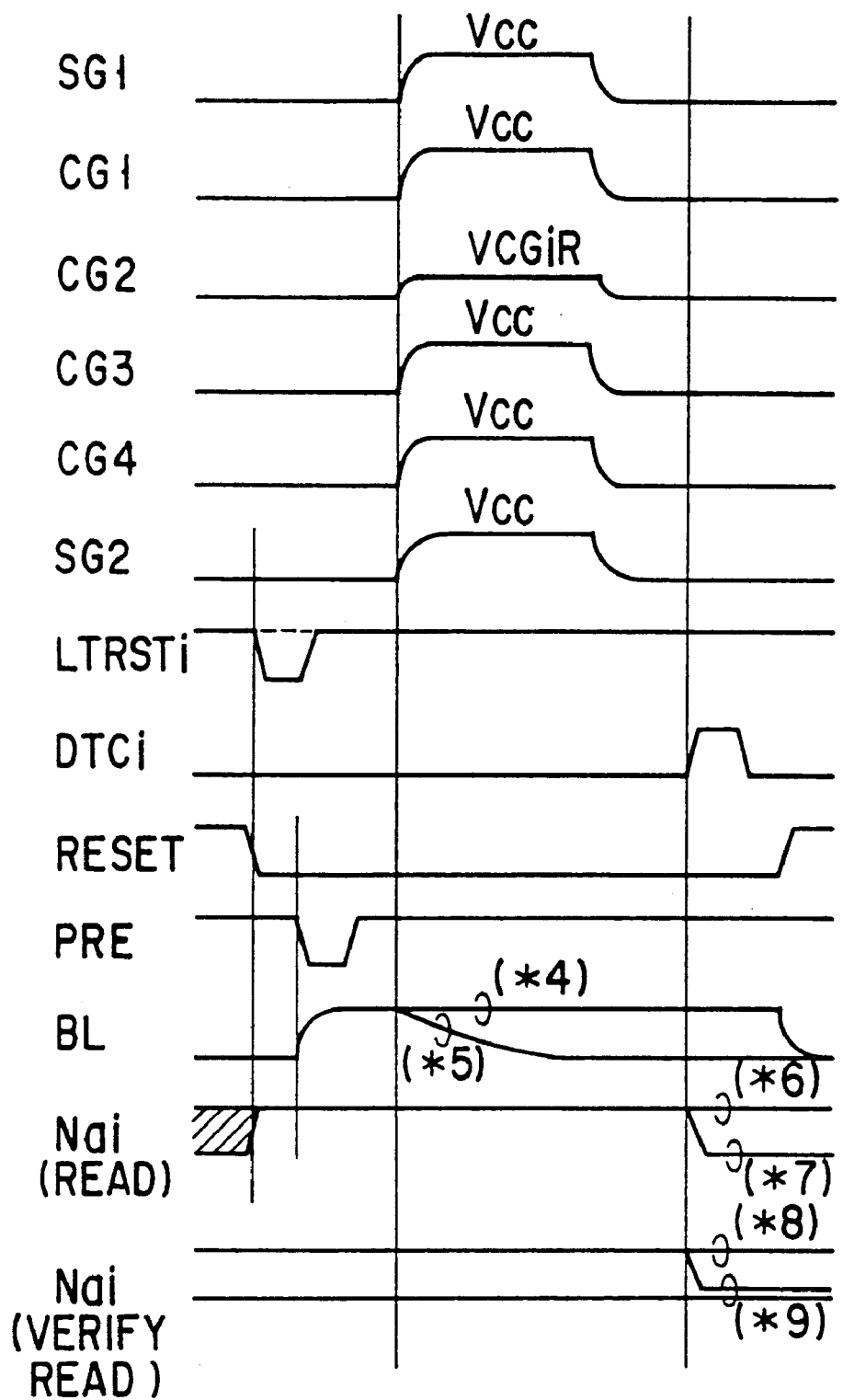
FIG. 91 is an operation waveform showing the reading operation of the EEPROM having the data controller shown in FIGS. 90A and 90B and the verify operation which is performed after the writing operation.

FIG. 91 is an operation waveform for the EEPROM having the data controller 314i shown in FIG. 90A showing the reading operation and the verify operation which is performed after the writing operation has been performed.

Referring to FIG. 91, the reading operation and the verify read operation which are performed by the EEPROM will now be described such that a state in which the control gate CG2 has been selected is taken for example.

Initially, the bit line reset signal RESET is made to be "L" level so that the bit line BL is brought to the floating state. When a usual reading operation is performed, the signal LTRSTi is made to be "L" level, while the node Nai is reset to "H" level. Then, the bit line precharge signal PRE is made to be "L" level and the bit line BL is electrically charged to the power supply voltage Vcc. Then, the bit line precharge signal PRE is made to be "H" level so that the bit line BL is again brought to the floating state.

When a usual reading operation is then performed, the read voltage VCGiR (i=1, 2 or 3) is applied to the selected control gate CG2. An example of the read voltage VCGiR is shown in FIG. 83. The non-selected control gates CG1, CG3 and CG4 and the selection gates SG1 and SG2 are applied with the voltage Vcc.

When the verify read is performed, the verify read voltage VCGiV (i=1, 2 or 3) is applied to the selected control gate CG2. An example of the verify read voltage VCGiV is, similarly to the read voltage VCGiR, shown in FIG. 83. When the verify read is performed, the voltage Vcc is applied to the non-selected control gates CG1, CG3 and CG4 and the selection gates SG1 and SG2.

When the usual reading or verify read is performed, the potential of the bit line BL is made to be "L" level if the threshold voltage of the memory cell transistor M2 is not higher than the read voltage VCGiR or not higher than the verify read voltage VCGiV. If the threshold voltage of the memory cell transistor M2 is not lower than the read voltage VCGiR or not lower than the verify read voltage VCGiV, the potential of the bit line BL is made to be "L" level.

When the verify read operation is then performed, the n-channel MOS transistor Qn19 is turned on in only a case where the signal DTCi is made to be "H" and the potential of the bit line BL is "H" level. Therefore, the potential of the node Nai is made to be "L" level. If the potential of the bit line BL is "L" level, the n-channel MOS transistor Qn19 is turned off. Therefore, the potential of the node Nai is not changed.

The voltage of the bit line BL indicated as (*4) is the voltage when the threshold voltage of the memory cell transistor is not lower than VCGi, and the voltage indicated as (*5) is the voltage when the threshold voltage of the memory cell transistor is not higher than VCGi. The voltage of the node Nai when the usual reading is performed and indicated as (*6) is the voltage when the threshold voltage of the memory cell transistor is not higher than VCGi and the voltage indicated as (*7) is the voltage when the threshold voltage of the memory cell transistor is not lower than VCGi. The voltage of the node Nai when the verify read is performed and indicated as (*8) is the voltage when the threshold voltage of the memory cell transistor is not higher than VCGi and the voltage indicated as (*9) is the voltage when the threshold voltage of the memory cell transistor is not lower than VCGi.

The foregoing operation is repeated in the data controllers 310A-1 to 310A-3 so that reading of data and verify read of written data are performed. The data controller 310A-1 detects whether data stored in the memory cell transistor M is "1" or "2" or "3" when the usual reading operation is performed. When the verify read operation is performed, the data controller 310A-1 detects whether or not data written in the memory cell transistor M has reached the state "1". Similarly, the data controller 310A-2 detects whether data stored in the memory cell transistor M is "2" or "3" when the usual reading operation is performed. When the verify read operation is performed, the data controller 310A-2 detects whether or not data written in the memory cell transistor M has reached the state "2". The data controller 310A-3 detects whether or not data stored in the memory cell transistor M is "3" when the usual reading operation is performed. When the verify read operation is performed, the data controller 310A-3 detects whether or not data written in the memory cell transistor M has reached the state "3".

If the data controller 310 shown in FIG. 84 is formed of the circuit shown in FIG. 88A or the circuit shown in FIG. 90A, repetition of the writing operation and the verify read operation causes four-level data to be written in the memory cell transistor M. When data has been written in all of the memory cells forming the page, data written in all of the data circuits 306-0 to 306-m is made to be "0". The reason for this is that write data is changed as shown in FIG. 92 if success of writing has been confirmed as a result of the verify read.

FIG. 92 is a table showing a state of change of data in the data circuit 306. If results of the detection of write data in all of the data circuits 306-0 to 306-m are "0" level, the data writing operation is completed. The writing operation is performed after a fact that data has sufficiently reached a required state has been confirmed.

FIG. 93 is a circuit diagram showing a data write completion detecting circuit 318 for detecting write data in the data circuit 306 to detect whether or not data write operation has been completed.

As shown in FIG. 13, the data write completion detecting circuit 318 is provided for each data circuit 306. Detection circuits 318-1 to 318-m. respectively detect write data for the data circuits 306-0 to 306-m. When all of the data items are "0" level, a data write completion signal is output.

Each of the detection circuits 318-1 to 318-m is formed of n-channel MOS transistors Qn100 to Qn105. The n-channel MOS transistors Qn100 and Qn101 detect whether or not the node Na1 of the data controller 310-1 is "L" level. The n-channel MOS transistors Qn102 and Qn103 detect whether or not the node Na2 of the data controller 310-2 is "L" level. The n-channel MOS transistors Qn104 and Qn105 detect whether or not the node Na3 of the data controller 310-3 is "L" level. When all of the signals PCHK1, PCHK2 and PCHK3 are "H" and all of the signal lines PEND1, PEND2 and PEND3 are not electrically connected to the ground potential Vss, a data write completion signal is output and the data write is completed. Although the signals PCHK1, PCHK2 and PCHK3 are different signals in this embodiment, a common signal may be employed. Although the signal lines PEND1, PEND2 and PEND3 are different signal lines in this embodiment, a common signal line may be employed.

(Eleventh Embodiment)

A multilevel storing EEPROM according to an eleventh embodiment of the present invention will now be described. In this description, the same elements as those of the EEPROM according to the tenth embodiment are given the same reference numerals and different portions will mainly be described.

Figure 94:
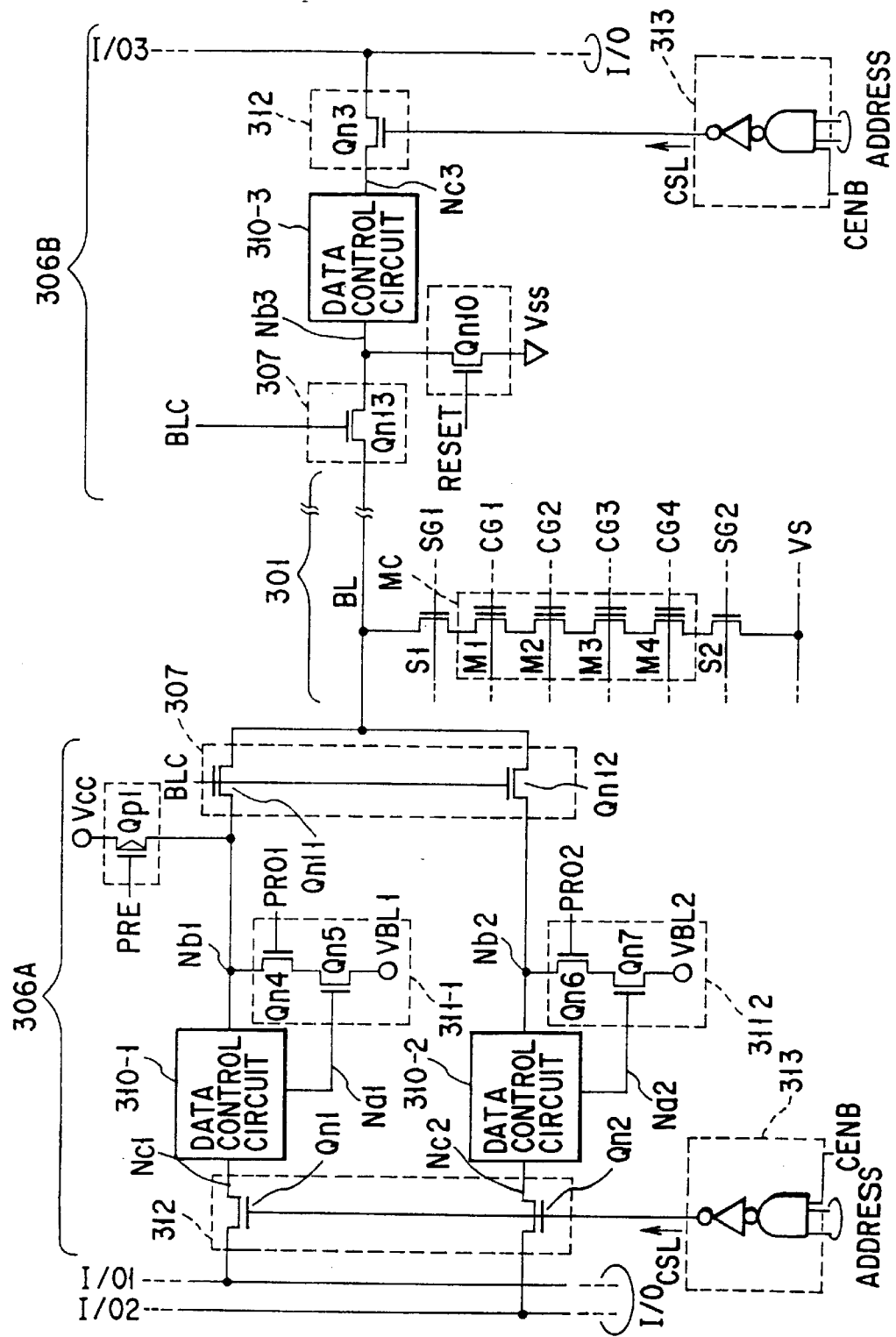
FIG. 94 is a diagram showing the structure of a data circuit of the multilevel data storing EEPROM according to an eleventh embodiment of the present invention.

FIG. 94 is a diagram showing the structure of a data circuit of the multilevel storing EEPROM according to the eleventh embodiment of the present invention.

The EEPROM according to the eleventh embodiment and that according to the tenth embodiment are different from each other in a structure in which the data controllers 310-1 to 310-3 included in the data circuit 306 are arranged to be dispersed at the two ends of the bit line BL.

Another difference lies in that the controller (311-3) of the three bit line write voltage controllers 311 for outputting a bit line write control voltage VBL3 which is 0V is omitted. Moreover, the output (0V) of "L" level from the flip-flop circuit included in the data controller 310-3 is used as the voltage VBL3.

Further difference lies in that the "H" level output (Vcc= 3V) from the flip-flop circuit included in the data controller 310-3 is used as the bit line write control voltage VBL for writing data "0".

Note that the data controllers 310-1 to 310-3 shown in FIG. 94 are the same as the data controllers 310-1 to 310-3 shown in FIG. 88A.

FIG. 95 is an operation waveform showing the write operation which is performed by the EEPROM having the data circuit shown in FIG. 94.

Referring to FIG. 95, the write operation, which is performed by the EEPROM according to the eleventh embodiment, will now be described such that a state in which the control gate CG2 has been selected is taken for example.

Initially, the bit line reset signal RESET is made to be "L" level so that the bit line BL is brought to the floating state. Then, the transfer gate drive signal RV3 is made to be "H" level and the verify signal VRFYB3 is made to be "L" level. When data "0" or data "1" or data "2" is written, an "H" level output is supplied to the bit line BL from the flip-flop circuit 314-3. Thus, the bit line BL is electrically charged to the voltage Vcc which is one of bit line write control voltages VBL. When data "3" is written, an "L" level output is supplied to the bit line BL from the flip-flop circuit 314-3. The bit line BL is made to be 0V which is another voltage of the bit line write control voltages VBL. Then, the transfer gate drive signal RV3 is made to be "L" level and the verify signal VRFYB3 is made to be "L" level so that the bit line BL is again brought to the floating state.

Then, the write control signals PRO1 and PRO2 respectively are made to be "H" level. When data "1" is written, the n-channel transistor Qn5 is turned on and Qn7 is turned off so that the voltage of the bit line BL is made to be 2V (VBL1). When data "2" is written, the n-channel transistor Qn5 is turned off and Qn7 is turned on so that the voltage of the bit line BL is made to be 1V (VBL2). When data "3" is written, both of the n-channel transistors Qn5 and Qn7 are turned off so that the voltage of the bit line BL is not changed and maintained at 0V. When data "0" is written, both of the n-channel transistors Qn5 and Qn7 are turned off so that the voltage of the bit line BL is not changed and maintained at the voltage Vcc.

Then, the selected gate SG1 in the selected block is made to be the power supply voltage Vcc, the non-selected control gates CG1, CG3 and CG4 are made to be the control gate write control voltage VM (for example, 10V), the selected control gate CG2 is made to be the control gate write voltage VPP9 (for example, 18V) and the selected gate SG2 is made to be 0V when writing is performed.

The reading operation and the verify read operation, which is performed after the writing operation are performed as shown in FIG. 89 or FIG. 91.

As described above, the EEPROM according to the eleventh embodiment has the structure such that the bit line write control voltage VBL for writing data "0" is used to previously electrically charge the bit line BL to the voltage vcc by using the "H" level output from the flip-flop circuit 314-3. Similarly, the bit line write control voltage VBL for writing data "3" is used to previously electrically charge the bit line BL by using the "L" level output from the flip-flop circuit 314-3. Prior to making the voltage of the bit line BL to the voltage corresponding to write data, charged or discharged bit line BL is brought to the floating state so as to maintain the potential of the bit line BL at the charged or discharged state. The potential of the bit line BL in the charged state is as it is used as the bit line write control voltage when data "0" is written. Similarly, the potential of the bit line BL in the discharged state is as it is used as the bit line write control voltage when data "3" is written.

Therefore, also the eleventh embodiment is able to omit the circuit for making the voltage of the bit line BL to be the voltage corresponding to writing of data "0". Moreover, the eleventh embodiment is able to omit the circuit for making the voltage of the bit line BL to be the voltage corresponding to writing of data "3".

Therefore, the eleventh embodiment is able to solve the problem in that the area of the circuit is increased excessively similarly to the tenth embodiment. Thus, the technical requirement for raising the degree of integration can be satisfied.

Note that the EEPROM according to the eleventh embodiment may be modified similarly to the EEPROM according to the tenth embodiment.

Although the bit line write control voltages VBL1 and VBL2 are determined to be 2V and 1V, the voltages may be 0V.

(Twelfth Embodiment)

A multilevel storing EEPROM according to a twelfth embodiment of the present invention will now be described.

FIG. 96 is a diagram showing the structure of the multilevel storing EEPROM according to the twelfth embodiment of the present invention.

The EEPROM structured as shown in FIG. 96 and according to the twelfth embodiment is different from the EEPROM having the structure shown in FIG. 81, the EEPROM according to this embodiment having a structure called an open bit structure. The open bit structure basically comprises row-system circuits 302a and 302b provided for memory cell arrays 310a and 310b and a column-system circuit 303 which is commonly provided for the memory cell arrays 310a and 310b.

The row-system circuits 302a and 302b include a row decoder 302A for receiving an address signal output from the address buffer 304 and selects a row in the memory cell array in response to the supplied address signal and a word line driver 302B for driving a word line of the memory cell array in accordance with an output from the row decoder 302A. In the case of a NAND type EEPROM of a type according to this embodiment, the word line is a selection gate and a control gate. Therefore, the word line driver 302B is also called a control gate/selection gate driver.

The column-system circuit 303 which is commonly used by the memory cell arrays 301a and 301b has a column decoder 303A for receiving the address signal output from the address buffer 304 to select a column in the memory cell array in response to the supplied address signal, and a column selection line driver 303B for driving a column selection line for selecting a column of the memory cell array in accordance with an output from the column decoder 303A. Moreover, the column-system circuit 303 has a bit line controller 303C including a data circuit for temporarily storing data to be written in the memory cell and reading data in the memory cell. The bit line controller 303C is connected to a data input/output circuit (data input/output buffer) 305. The bit line control circuit 303C receives read data from the memory cell when data is read to output the supplied read data to the data input/output buffer 305.

The data input/output buffer 305 controls input and output of data such that it introduces write data supplied from outside of the EEPROM to a memory core portion and outputs data read from the memory core portion to the outside of the EEPROM. The data input/output buffer 305 has a function to serve as an interface circuit between the outside of the EEPROM and the memory core portion. An example of the interface circuit function is such that two ternary data read from the memory core portion is encoded into 3-bit data to output the same to the outside and a function for decoding supplied 3-bit data into two ternary data to introduce the same to the memory core portion. In the description below, another interface circuit function will be described.

FIG. 97 is a diagram showing the structures of the memory cell arrays 301a and 301b and the column-system circuit 303 shown in FIG. 96.

As shown in FIG. 97, each of the memory cell arrays 301a and 301b has memory cells MC arranged in the matrix manner. The EEPROM according to this embodiment has a structure such that one cell MC includes a plurality of memory cell transistors connected in series so that a NAND cell MC is formed. An end of the cell MC is connected to bit line BLl through a selection transistor S1, while another end of the same is connected to a source line VS through a selection transistor S2. A group of the memory cell transistors sharing the control gate CG forms a unit called a "page". Data is written and read simultaneously in unit of page. A group of memory cell transistors M connected to four control gates CG1 to CG4 forms a unit called a "block". The page and block respectively are selected by control gate/ selection gate driver. Data circuits 306A-0 to 306A-m respectively are connected between the bit lines BLa0 to BLam and data input/output line I/O. The data circuits 306A-0 to 306A-m have a function for temporarily storing data to be written in the memory cell and a function for sensing and temporarily storing data read from the memory cell.

Figure 98:
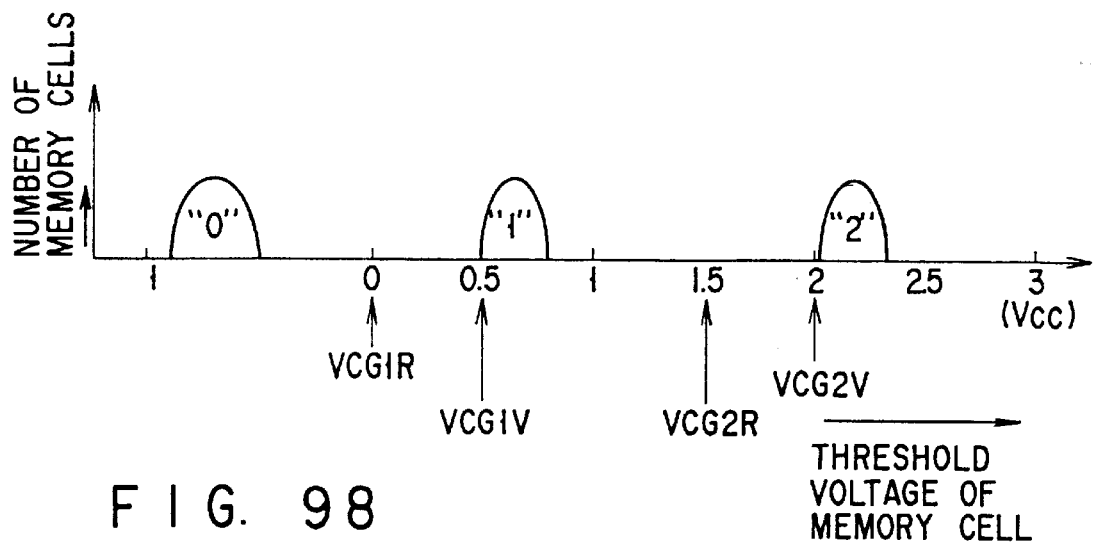
FIG. 98 is a table showing the threshold voltages and three writing states of the memory cell transistor when the EEPROM is able to memory ternary data.

FIG. 98 is a table showing the relationship between the threshold voltages of the memory cell transistor and three writing states (ternary data "0", "1" and "2") when the EEPROM has a structure for storing ternary data.

When the EEPROM is structured to store ternary data, three writing states are provided for one memory cell transistor. The three writing states are distinguished from one another in accordance with the threshold voltage of the memory cell transistor M.

As shown in FIG. 98, the state of data "0" in the EEPROM having the power supply voltage Vcc which is set to 3V is made to be the same as the state after data has been erased. Thus, for example, a negative threshold voltage is assigned. In a state of data "1", a threshold voltage from, for example, 0.5V to 0.8V is assigned. In a state of data "2", a threshold voltage from, for example, 2.0V to 2.3V is assigned.

When data is read from the memory cell transistor, three read voltages VCG1R to VCG2R are sequentially applied to the control gate CG.

Initially, reading voltage VCG1R is applied to the control gate CG. In accordance with whether the memory cell transistor turns on or off, whether stored data is "0" or "1 or 2" is detected. Then, reading voltage VCG2R is applied so that whether stored data is "1" or "2" is detected. The reading voltages VCG1R and VCG2R are, for example, 0V and 1.5V, respectively.

Voltages VCG1V and VCG2V shown in FIG. 98 are voltages called verify read voltages which are used to detect (when a verifying operation is performed) whether or not data has been sufficiently written. The verify read voltage is applied to the control gate CG after data has been written. Whether or not the threshold voltage of the memory cell transistor has been shifted to a range corresponding to written data can be detected in accordance with whether or not the memory cell transistor is turned on when the verify read voltage has been applied to the control gate CG. By using this, whether or not sufficient writing has been performed is determined. The verify read voltages VCG1V and VCG2V are, for example, 0.5V and 2.5V, respectively.

Figure 99:
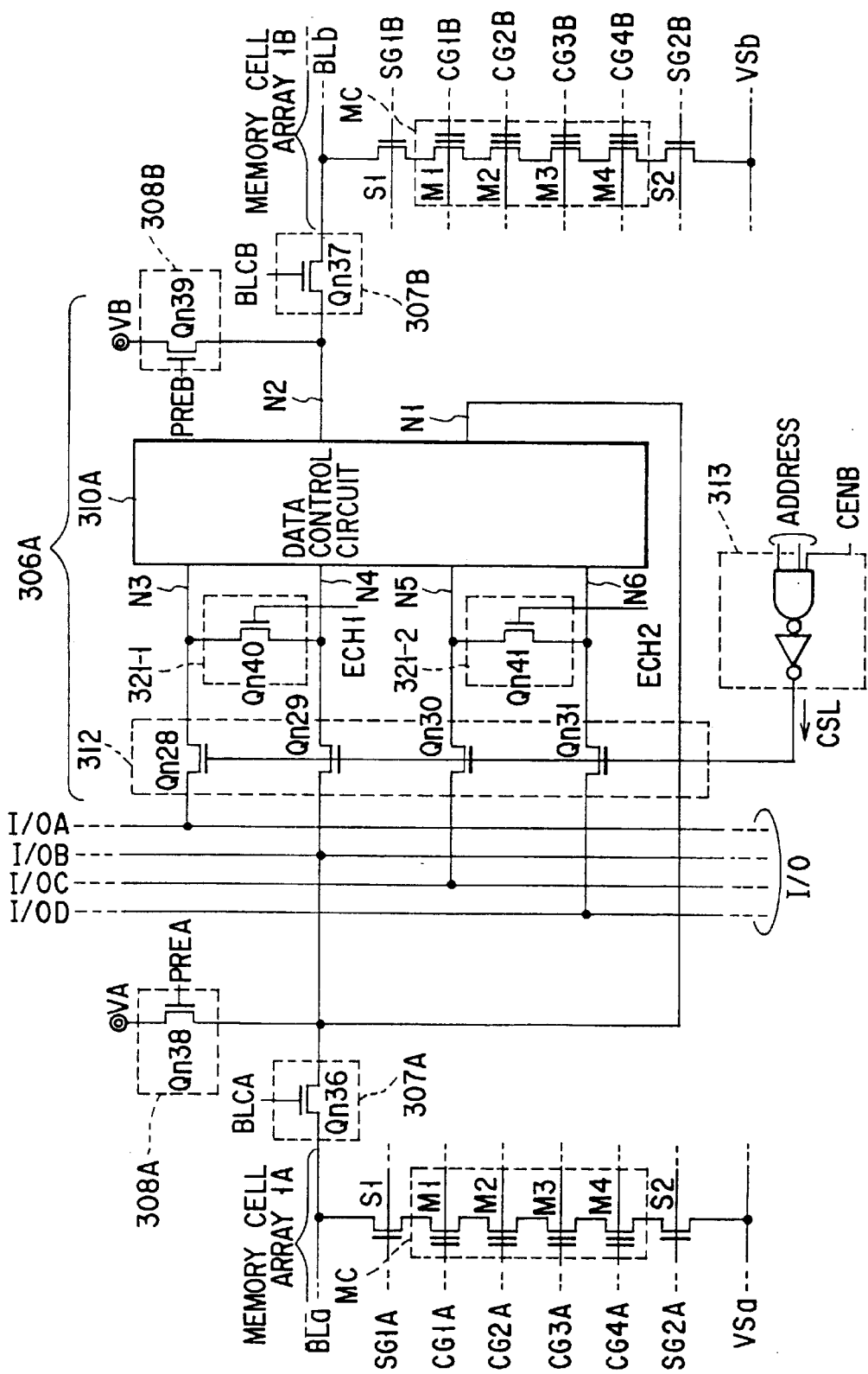
FIG. 99 is a diagram showing the structure of the data circuit shown in FIG. 97.

FIG. 99 is a diagram showing the structure of the data circuit 306A shown in FIG. 97.

As shown in FIG. 99, the data circuit 306A is connected to the bit line BLa through a transfer gate circuit 307A and is connected to the bit line Blb through the transfer gate 307B. The transfer gate circuit 307A is formed of n-channel MOS transistor Qn36 so as to control the connection between the data circuit 306A and the bit line BLa in response to transfer gate drive signal BLCA. The transfer gate circuit 307B is formed of an n-channel MOS transistor Qn37 to control the connection between the data circuit 306A and the bit line BLb in response to the transfer gate drive signal BLCA. The data circuit 306A includes a bit line precharge circuit 308A for precharging the bit line BLa, a bit line precharge circuit 308B for precharging the bit line BLb, a data controller 310A having a function for storing write data and read data, a column gate circuit 312 for connecting the data controller 310A and the data input/output line I/O, an equalizer 321-1 for equalizing a node N3 of the data controller 310A connected to the data input/output line I/OA and a node N4 of the data controller 310A connected to the data input/output line I/OB and an equalizer 321-2 for equalizing a node N5 of the data controller 310A connected to the data input/output line I/OC and a node N6 of the data controller 310A connected to the data input/output line I/OD.

The bit line precharge circuit 308A is formed of the n-channel MOS transistor Qn38. Similarly, the bit line precharge circuit 308B is formed of the n-channel MOS transistor Qn39. The n-channel MOS transistor Qn38 electrically charges the bit line BLa to the voltage VA in response to the bit line precharge signal PREA. Similarly, the n-channel MOS transistor Qn39 electrically charges the bit line BLb in response to the bit line precharge signal PREB.

The column gate circuit 312 is formed of the n-channel MOS transistors Qn28, Qn29, Qn30 and Qn31. The n-channel MOS transistors Qn28, Qn29, Qn30 and Qn31 control the connection between the data circuit 306A and the data input/output lines I/OA to I/OD. An end of the data input/output line I/OA is, through the n-channel MOS transistor Qn28, connected to the node N3. An end. of the data input/output line I/OB is, through the n-channel MOS transistor Qn29, connected to the node N4. An end of the data input/output line I/OC is, through the n-channel MOS transistor Qn30, connected to the node N5. An end of the data input/output line I/OD is, through the n-channel MOS transistor Qn31, connected to the node N6. Another end of each of the data input/output lines I/OA to I/OD is connected to the data input/output buffer 305 shown in FIG. 96.

In the data circuit 306A selected by the column decoder 313, the data controller 310A and the data input/output lines I/OA to I/OD are connected to one another. As a result, write data can be supplied from the data input/output lines I/OA to I/OD to the data controller 310A.

FIG. 103 is a table showing write data for writing data and potential levels of the data input/output lines I/OA to I/OD.

Similarly, read data can be output from the data controller 310A to the data input/output lines I/OA to I/OD.

FIG. 104 is a table showing read data when data is read and the potential levels of the data input/output lines I/OA to I/OD.

The equalizer 321-1 is formed of the n-channel MOS transistor Qn40 to equalize the node N3 and the node N4 in response to the equalizing signal ECH1. Similarly, the equalizer 321-2 is formed of the n-channel MOS transistor Qn43 to equalize the node N5 and the node N6 in response to the equalizing signal equalizing signal ECH2.

The EEPROM according to the twelfth embodiment has a structure such that each of the bit line precharge circuits 308A and 308B serves one of bit line write voltage controllers. The voltage VA which is applied from the bit line precharge circuit 308A to the bit line BLa is used as one of bit line write control voltages VBL. Similarly, the voltage VB which is applied from the bit line precharge circuit 308B to the bit line BLb is used as one of bit line write control voltages VBL.

An example of the data controller 310A will now be described.

Figure 100:
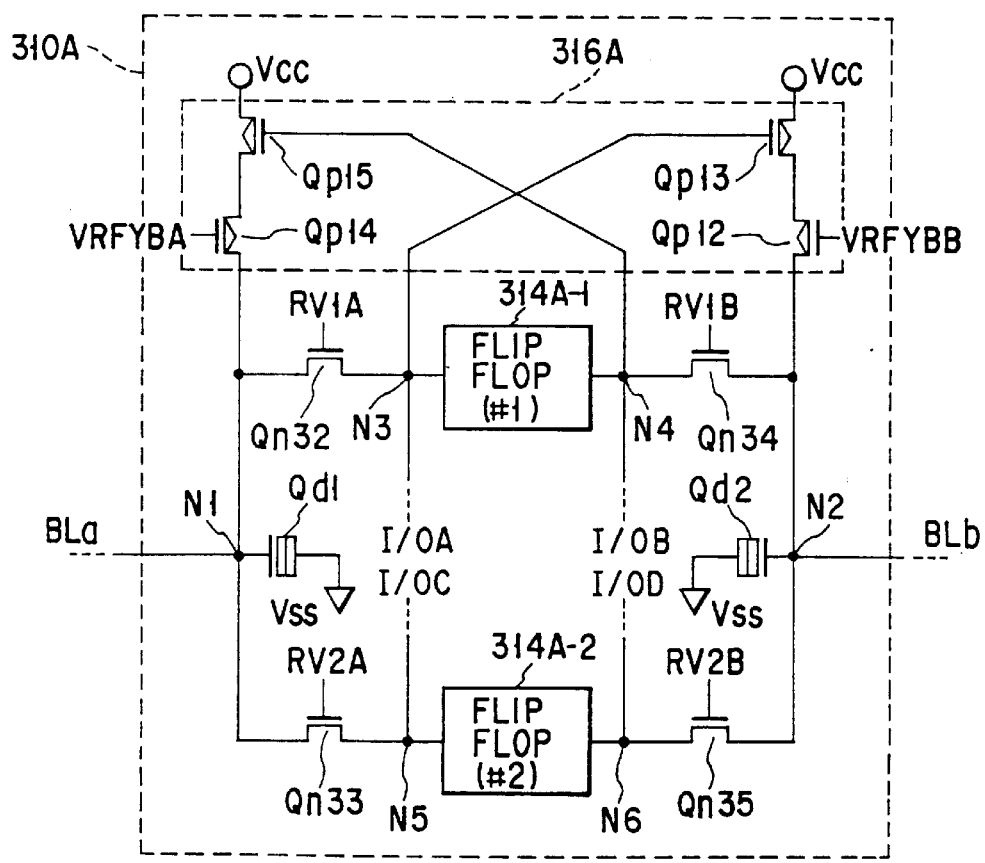
FIG. 100 is a diagram showing a data controller of the semiconductor memory device according to the twelfth embodiment of the present invention.
Figure 101:
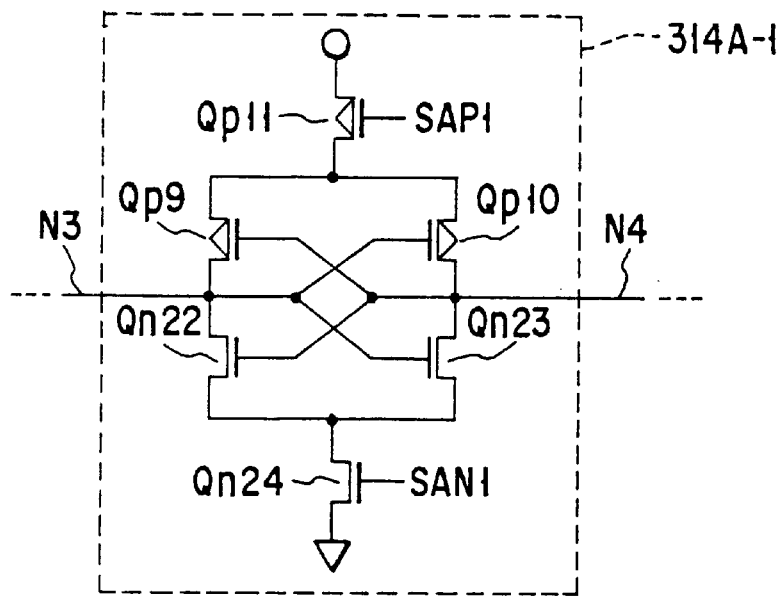
FIG. 101 is a circuit diagram showing a first flip-flop circuit shown in FIG. 100.
Figure 102:
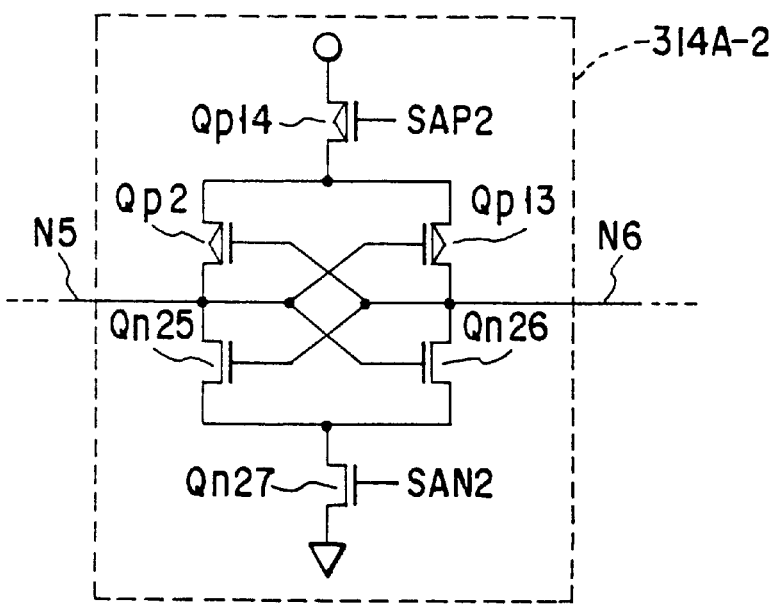
FIG. 102 is a circuit diagram showing a second flip-flop circuit shown in FIG. 100.

FIG. 100 is a diagram showing the structure of the data controller 310A of the semiconductor memory device according to the twelfth embodiment of the present invention. FIG. 101 is a circuit diagram showing a first flip-flop circuit. FIG. 102 is a circuit diagram showing a second flip-flop circuit.

As shown in FIG. 100, the data controller 310A includes a first flip-flop circuit 314A-1 having an input/output terminal connected to the node N3 and an inverted input/output terminal connected to the node N4, a second flip-flop circuit 314A-2 having an input/output terminal connected to the node N5 and an inverted input/output terminal connected to the node N6 and a verify circuit 316A.

As shown in FIG. 101, the first flip-flop circuit 314A-1 is formed of n-channel MOS transistors Qn22, Qn23 and Qn24 and p-channel MOS transistors Qp9, Qp10 and Qp11. As shown in FIG. 102, the second flip-flop circuit 314A-2 is formed of the n-channel MOS transistors Qn25, Qn26 and Qn27 and p-channel MOS transistors Qp12, Qp13 and Qp14. The first flip-flop circuit 314A-1 and the second flip-flop circuit 314A-2 latch information of data to be written when data is written, sense the potential of the bit line BLa or bit line BLb and latch read data information when data is read.

The first flip-flop circuit 314A-1 latches write data information whether or not data "0" is written in the memory cell transistor and whether "1" or "2" is written. As read data information, it senses and latches whether or not the memory cell transistor stores data "0" and whether or not the same stores data "1" or "2".

The second flip-flop circuit 314A-2 latches, as write data information, whether or not data "2" is written in the memory cell transistor and whether or not "1 or 0" is written. As read data information, it senses and latches whether or not the memory cell transistor stores data "2" and whether or not it stores. "1 or 0".

The n-channel MOS transistors Qn32, Qn33, Qn34 and Qn35 respectively form transfer gate circuits. The n-channel MOS transistor Qn32 connects the node N3 of the first flip-flop circuit 314A-1 to the MOS capacitor Qd1 connected to the node N1 when the transfer gate drive signal RV1A has been made to be "H" level. The n-channel MOS transistor Qn33 connects the node N5 to the second flip-flop circuit 314A-2 to the MOS capacitor Qd1 when the transfer gate drive signal RV2A has been made to be "H" level. The n-channel MOS transistor Qn34 connects the node N4 of the first flip-flop circuit 314A-1 to the MOS capacitor Qd2 connected to the node N2 when the transfer gate drive signal RV1B has been made to be "H" level. The n-channel MOS transistor Qn35 connects the node N6 of the second flip-flop circuit 314A-2 to the MOS capacitor Qd2 when the transfer gate drive signal RV2B has been made to be "H" level. The MOS capacitors Qd1 and Qd2 are formed of depletion type n-channel MOS transistors each having a capacity which is sufficiently smaller than the capacity of the bit line.

The verify circuit 316A is formed of the p-channel MOS transistors Qp12, Qp13, Qp14 and Qp15.

The p-channel MOS transistor Qp14 forming the verify circuit 316A is electrically conducted when the activating signal VRFYBA has been made to be "L" level. The p-channel MOS transistor Qp15 is electrically conducted when the node N4 of the first flip-flop circuit 314A-1 has been made to be "L" level. When both of the p-channel MOS transistors Qp14 and Qp15 have been electrically conducted, the gate of the MOS capacitor Qd1, that is, the node N1, is applied with the voltage Vcc. The p-channel MOS transistor Qp12 forming the verify circuit 316A is electrically conducted when the activating signal VRFYBB has been made to be "L" level. The p-channel MOS transistor Qp13 is electrically conducted when the node N3 of the first flip-flop circuit 314A-1 has been made to be "L" level. When both of the p-channel MOS transistors Qp12 and Qp13 are electrically conducted, the gate of the MOS capacitor Qd2, that is, the node N2, is applied with the voltage Vcc.

When the n-channel MOS transistor Qn38 shown in FIG. 99 has been electrically conducted, the gate of the MOS capacitor Qd1 is applied with the voltage VA so that the MOS capacitor Qd1 is electrically charged. When the n-channel MOS transistor Qn39 shown in FIG. 99 has been electrically conducted, the gate of the MOS capacitor Qd2 is applied with the voltage VB so that the MOS capacitor Qd2 is electrically charged.

As described above, the bit line precharge circuits 308A and 308B formed of the n-channel MOS transistors Qn38 and Qn39 also serve as bit line write voltage controllers.

Also the verify circuit 316A for changing the gate voltages of the MOS capacitors Qd1 and Qd2 is a circuit also serving as a bit line write voltage controller.

Also the transfer gate circuit formed of the second flip-flop circuit 314A-2 and the n-channel MOS transistor Qn33 and the transfer gate circuit formed of the n-channel MOS transistor Qn35 change the gate potentials of the MOS capacitors Qd1 and Qd2. Therefore, the foregoing circuits also serve as bit line write voltage controllers.

The operation of the EEPROM according to the twelfth embodiment of the present invention will now be described. An operation will now be described in which an access to the memory cell array 301a of the two memory cell arrays 301a and 301b has been made and thus the control gate CG2A has been selected. Since the operation which is performed when an access to the memory cell array 301b has been made is similar to the operation which is performed when an access to the memory cell array 301a has been made, it is omitted from description.

Figure 105:
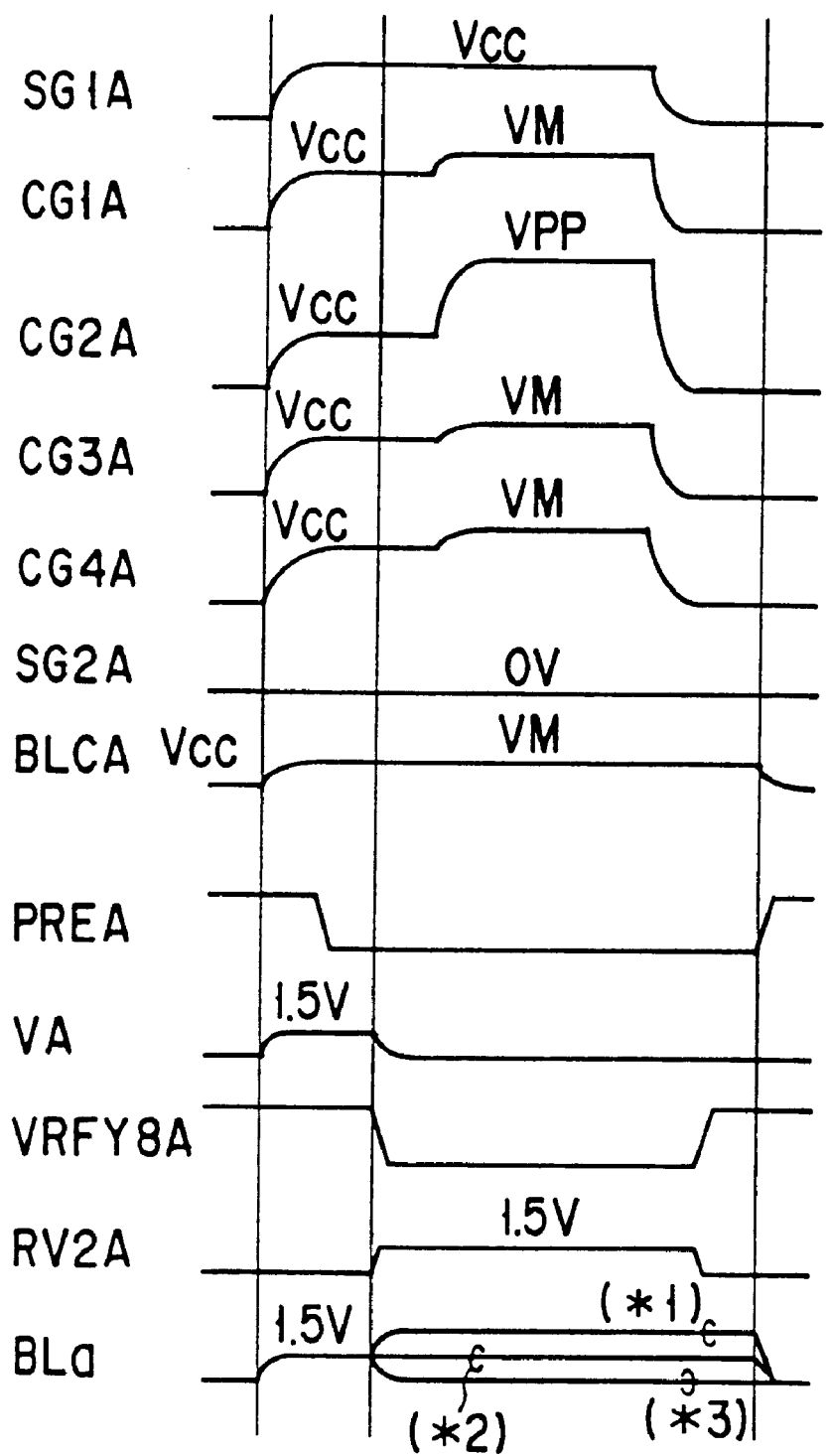
FIG. 105 is an operation waveform showing the writing operation of the EEPROM according to the twelfth embodiment of the present invention.

FIG. 105 is an operation waveform showing a writing operation which is performed by the EEPROM according to the twelfth embodiment of the present invention.

Initially, for example, 3-bit external write data is supplied to the data input/output buffer 305 from outside of the EEPROM. The 3-bit external write data is eight-level data. The memory cell transistor of the EEPROM according to this embodiment has a structure for storing ternary data. Therefore, external write data is converted into two ternary effective data items in the EEPROM by the data input/output buffer 305. Each of the ternary data items is expressed, for example, as shown in FIG. 103 and supplied to the data circuit 306A. Two ternary effective data items are prepared so as to be supplied to the data circuit 306A in the adjacent even and odd-order columns. Thus, the 3-bit eight-level data items are, by the data input/output buffer 305, converted into ternary data×2, that is, nine-levels as the-level of data such that eight of the nine-levels are effective. One of the two ternary data items which are internally effective is transferred to one of the data circuits 306A corresponding to the column address instructed with the address signal when the column activating signal CENB is "H" level. Any one of the ternary data items is, as write data, stored in the data circuit 306A.

Then, the bit line precharge signal PREA is made to be "H" level and the voltage VA is made to be 1.5V. As a result, the bit line BLa is electrically charged to 1.5V which is one of bit line write control voltages. Then, the bit line precharge signal PREA is made to be "L" so that the bit line BLa is brought to the floating state. Then, the verify signal VRFYBA is made to be "L" level and the transfer gate drive signal RVA2A is made to be 1.5V. When the threshold voltage of the n-channel MOS transistor Qn33 having a gate for receiving the drive signal RVA2A is made to be 1V, the n-channel MOS transistor Qn33 is turned off when data "0" or data "1" is written and turned on when data "2" is written. As a result, when the data controller 310A stores data "0", voltage Vcc is, as the bit line write control voltage, applied from the data controller 310A to the bit line BLa. When the data controller 310A stores data "2", voltage Vss (0V) is, as the bit line write control voltage, applied from the data controller 310A to the bit line BLa. If a problem arises in that the potential of the bit line BLa is dropped by a degree corresponding to the threshold voltage of the n-channel MOS transistor Qn36 in the transfer gate circuit 307A (see FIG. 99), the drive signal BLCA is required to be raised to the raised potential VM, as shown in FIG. 105. The bit line voltage BLa indicated as (*1) is voltage when data "0" is written, the voltage indicated as (*2) is voltage when data "1" is written and the voltage indicated as (*3) is voltage when data "2" is written.

Then, the control gate/selection gate driver 303B 20 makes the potentials of the selection gate SG1A and the control gates CG1A to CG4A in the selected block to be voltage Vcc. The selection gate SG2A is 0V. Then, the selected control gate CG2A is made to be high voltage VPP (for example, 20V), and the non-selected control gates CG1A, CG3A and CG4A are made to be intermediate voltage VM (for example, 10V). In the memory cell transistor corresponding to the data controller 310A storing data "2", the difference in the potential between the channel potential of 0V and VPP of the control gate causes electrons to be injected into the floating gate so that the threshold voltage is increased. In the memory cell transistor corresponding to the data controller 310A storing data "1", the difference in the potential between the channel potential of 1.5V and VPP of the control gate causes electrons to be injected into the floating gate so that the threshold voltage is increased. The reason why the channel potential is made to be 1.5V is that the quantity of electrons to be injected into the floating gate is required to be reduced as compared with the case in which data "2" is written. In the memory cell transistor corresponding to the data controller 310A storing data "0", the difference in the potential between the channel potential and VPP for the control gate is small. Therefore, substantially no electrons is injected into the floating gate. Therefore, the threshold voltage of the memory cell transistor is not changed.

During the writing operation, the sense amplifier activating signals SAN1 and SAN2, the verify signal VRFYBB, the bit line precharge signal PREB and the transfer gate drive signal BLCB are "H" level. The sense amplifier activating signals SAP1 and SAP2, the transfer gate drive signals RV1A, RV1B and RV2B and the equalizing signals ECH1 and ECH2 are "L" level. The voltage VB is 0V.

After the writing operation has been completed, the verify read operation is performed to verify the threshold voltage of the memory cell transistor. If a fact that the threshold voltage of the memory cell transistor has reached a required-level has been verified as a result of the verify read operation, read data stored by the data controller 310A is changed to data "0". If it has not reached the required-level, the data controller 310A again performs the writing operation while maintaining stored write data. The write operation and the verify read operation are repeated until all of the threshold voltages of the selected memory cell transistors reach the required-levels.

Figure 106:
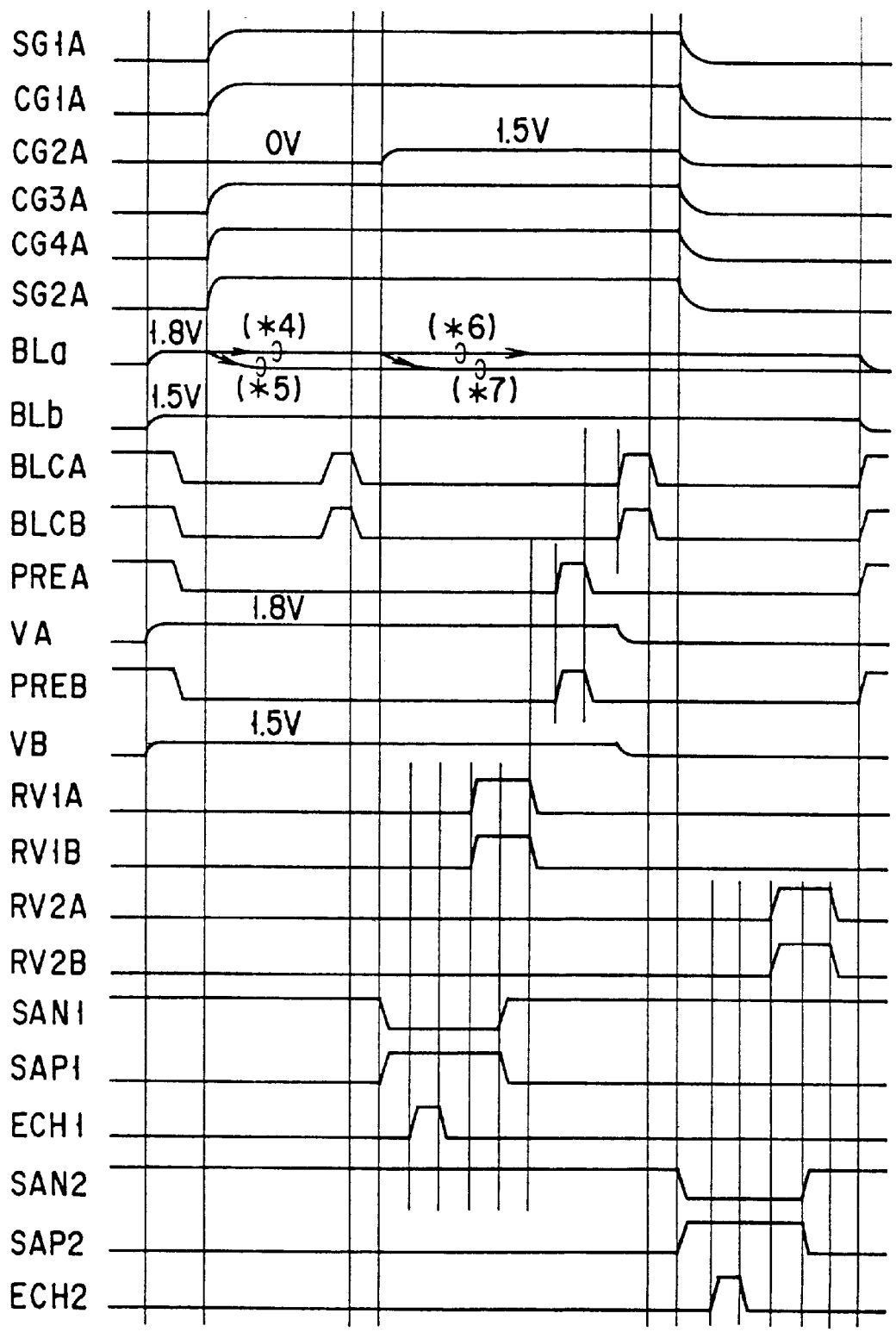
FIG. 106 is an operation waveform showing the reading operation of the EEPROM according to the twelfth embodiment of the present invention.

FIG. 106 is an operation waveform showing the reading operation which is performed by the EEPROM according to the twelfth embodiment of the present invention.

Initially, the voltage VA is made to be 1.8V and the voltage VB is made to be 1.5V. As a result, the bit line BLa is electrically charged to 1.8V and the bit line BLb is electrically charged to 1.5V. Then, the transfer gate drive signals BLCA and BLCB are made to be "L" level so that the bit line BLa and the MOS capacitor Qd1 are separated from each other and the bit line BLb and the MOS capacitor Qd2 are separated from each other. As a result, the bit lines BLa and BLb are brought to the electrically floating state.

Then, the bit line precharge signals PREA and PREB are made to be "L" level so that the node N1 which is the gate electrode of the MOS capacitor Qd1 and the node N2 which is the gate electrode of the MOS capacitor Qd2 are brought to the electrically floating state. Then, the selected control gate CG2A in the block selected by the control gate/selection gate driver 303B is made to be 0V, and the non-selected control gates CG1A, CG3A and CG4A and the selection gates SG1A and SG2A are made to be voltage Vcc. If the threshold voltage of the selected memory cell transistor is 0V or lower, the voltage of the bit line is lower than 1.5V. If the threshold voltage of the selected memory cell transistor is 0V or higher, the voltage of the bit line is maintained at 1.8V. Then, the transfer gate drive signals BLCA and BLCB are made to be "H" level so that the bit lines BLa and BLb are temporarily connected to the nodes N1 and N2. Then, transfer gate drive signals BLCA and BLCB are made to be "L" level so that the bit lines BLa and BLb and the nodes N1 and N2 are again separated from each other.

Then, the sense amplifier activating signal SAN1 is made to be "L" level and the sense amplifier activating signal SAP1 is made to be "H" level so that the first flip-flop circuit 314A-1 is deactivated. Then, the equalizing signal ECH1 is made to be "H" level so as to equalize the node N3 and the node N4. Then, the transfer gate drive signals RV1A and RV1B are made to be "H" level. Then, the sense amplifier activating signal SAN1 is made to be "H" level, and the sense amplifier activating signal SAP1 is made to be "L" level so that the first flip-flop circuit 314A-1 is activated. As a result, the voltage of the node N1 is sensed and latched by the first flip-flop circuit 314A-1. Thus, whether data read from the memory cell transistor is "0" or "1 or 2" is sensed and latched by the first flip-flop circuit 314A-1.

Then, the selected control gate CG2A is made to be 1.5V. The bit line precharge signals PREA and PREB are made to be "H" level so that the node N1 which is the gate electrode of the MOS capacitor Qd1 is electrically charged to 1.8V and the node N2 which is the gate electrode of the MOS capacitor Qd2 is electrically charged to 1.5V. Then, the bit line precharge signals PREA and PREB are made to be "L" level so that the nodes N1 and N2 are brought to the electrically floating state. If the threshold voltage of the selected memory cell transistor is 1.5V or lower, the voltage of the bit line is lower than 1.5V. If the threshold voltage of the selected memory cell transistor is 1.5V or higher, the voltage of the bit line is maintained at 1.8V.

Then, the transfer gate drive signals BLCA and BLCB are made to be "H" level so that the bit lines BLa and BLb are temporarily connected to the nodes N1 and N2. Then, the transfer gate drive signals BLCA and BLCB are made to be "L" level so that the bit line BLa and BLb and the nodes N1 and N2 are again separated from each other. Then, the sense amplifier activating signal SAN2 is made to be "L" level and the sense amplifier activating signal SAP2 is made to be "H" level so that the second flip-flop circuit 314A-2 is deactivated. Then, the equalizing signal ECH2 is made to be "H" level to equalize the node N5 and the node N6. Then, the transfer gate drive signals RV2A and RV2B respectively are made to be "H" level. Then, the sense amplifier activating signal SAN2 is made to be "H" level and the sense amplifier activating signal SAP2 is made to be "L" level so that the second flip-flop circuit 314A-2 is activated. As a result, the voltage of the node N1 is sensed and latched by the second flip-flop circuit 314A-2. Thus, whether data read from the memory cell transistor is "2" or "0 or 1" is sensed and latched by the second flip-flop circuit 314A-2. The data controller 310A formed of the two first flip-flop circuits 314A-1 and 314A-2 is able to distinguish and store data read from the memory cell transistor whether it is "0" or "1" or "2". Thus, the data circuit 306A is able to store read data.

The bit line voltage BLa indicated as (*4) is voltage when data in the memory cell transistor is "1" and "2", voltage indicated as (*5) is voltage when data in the memory cell transistor is "0", voltage indicated as (*6) is voltage when data in the memory cell transistor is "2" and voltage indicated as (*7) is voltage when data in the memory cell transistor is "0" and "1".

During the foregoing read operation, the verify signals VRFYBA and VRFYBB are "H" level. The voltages VSa and VSb of the source line of the memory cell transistor are 0V.

Then, the column activating signal CENB to be supplied to the column address decoder is made to be "H" level so that data read from one of the data circuits 306A selected in response to the address signal is output to the data input/output lines I/OA, I/OB, I/OC and I/OD. At this time, the data circuits 306A in the even and odd number columns arranged adjacently output two ternary data, for example, as shown in FIG. 104, so as to be supplied to the data input/output buffer 305. The data input/output buffer 305 is supplied with ternary data×2. The data input/output buffer 305 converts the two ternary data into 3-bit and eight-level external read data to output the same to the outside of the EEPROM.

Figure 107:
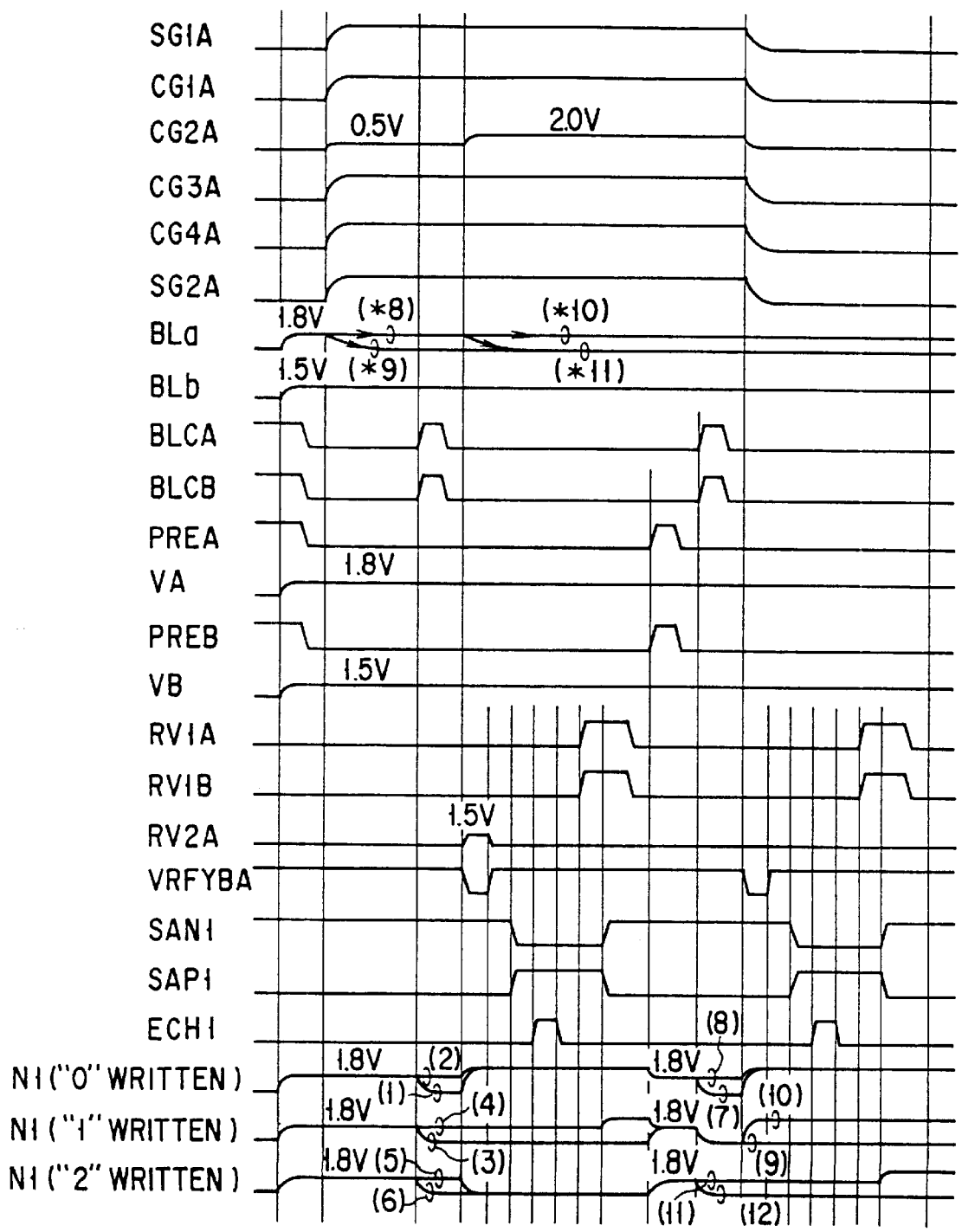
FIG. 107 is an operation waveform showing the verify reading operation of the EEPROM according to the twelfth embodiment of the present invention.
Figure 108:
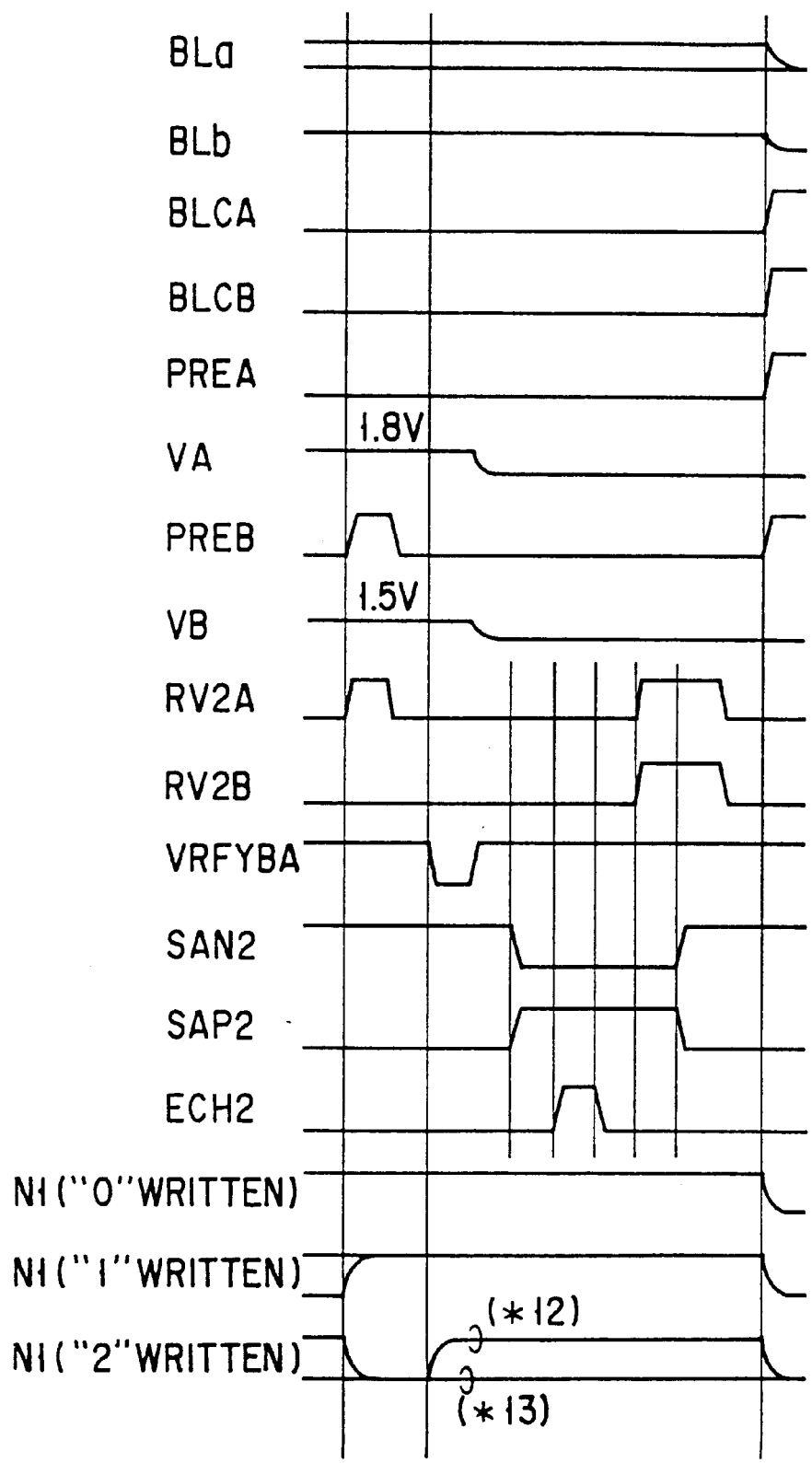
FIG. 108 is an operation waveform showing the verify reading operation of the EEPROM according to the twelfth embodiment of the present invention.

FIGS. 107 and 108 are operation waveforms showing the verify read operation which is performed by the EEPROM according to the twelfth embodiment of the present invention. FIG. 108 shows timings following timings shown in FIG. 107.

Initially, the voltage VA is made to be 1.8V and the voltage VB is made to be 1.5V. As a result, the bit line BLa is electrically charged to 1.8V and the bit line BLb is electrically charged to 1.5V. Then, the transfer gate drive signals BLCA and BLCB are made to be "L" level so that the bit line BLa and the MOS capacitor Qd1 are separated from each other and the bit line BLb and the MOS capacitor Qd2 are separated from each other. Thus, the bit lines BLa and BLb are brought to the electrically floating state. Then, the bit line precharge signals PREA and PREB are made to be "L" level so that the node N1 which is the gate electrode of the MOS capacitor Qd1 and the node N2 which is the gate electrode of the MOS capacitor Qd2 respectively are brought to the electrically floating state.

Then, the selected control gate CG2A in the block selected by the control gate/selection gate driver is made to be 0.5V and the non-selected control gates CG1A, CG3A and CG4A and the selection gates SG1A and,SG2A respectively are made to be Vcc. If the threshold voltage of the selected memory cell transistor is 0.5V or lower, the voltage of the bit line is lower than 1.5V. If the threshold voltage of the selected memory cell transistor is 0.5V or higher, the voltage of the bit line is maintained at 1.8V. Then, the transfer gate drive signals BLCA and BLCB are made to be "H" level so that the bit lines BLa and BLb are temporary connected to the nodes N1 and N2. Then, the transfer gate drive signals BLCA and BLCB are made to be "L" level so that the bit lines BLa and BLb and the nodes N1 and N2 are again separated from each other.

Then, the transfer gate drive signal RVA2A is made to be 1.5V which is lower than the voltage Vcc. When the threshold voltage of the n-channel MOS transistor Qn33 having a gate for receiving the drive signal RVA2A is made to be 1V, the n-channel MOS transistor Qn33 In the data circuit 306A storing write data "2" is turned on and the node N1 is made to be 0V. On the other hand, the n-channel MOS transistor Qn33 of the data circuit 306A storing write data "0" or "1" is turned off so that the node N1 is maintained at voltage of 0.5V or higher. Then, the verify signal VRFYBA is made to be "L" level. Thus, write data "0" corresponds to turning on of the p-channel MOS transistor Qp15 in the data circuit 306A so that the node N1 is made to be voltage Vcc.

Then, the sense amplifier activating signal SAN1 is made to be "L" level and the sense amplifier activating signal SAP1 is made to be "H" level so that the first flip-flop circuit 314A-1 is deactivated. Then, the equalizing signal ECH1 is made to be "H" level so as to equalize the node N3 and the node N4. Then, the transfer gate drive signals RV1A and RVLB are made to be "H" level. Then, the sense amplifier activating signal SAN1 is made to be "H" level and the sense amplifier activating signal SAP1 is made to be "L" level so that the first flip-flop circuit 314A-1 is activated. Thus, the voltage of the-node N1 is sensed and latched by the first flip-flop circuit 314A-1. As a result, whether or not data in the memory cell transistor corresponding to only the data circuit 306A storing write data "1" has been sufficiently brought to the state of data "1" can be detected. If the memory cell transistor has been brought to the state of data "1", the first flip-flop circuit 314A-1 senses and latches the voltage of the node N1. Thus, write data is changed to "0". If the memory cell transistor has been brought to the state of data "1", the first flip-flop circuit 314A-1 senses and latches the voltage of the node N1 to maintain the stored write data "1". In the data circuit 306A storing write data "0" or write data "2", data is not changed.

Referring to FIG. 107, waveform indicated as (1) is a waveform realized in a case of the memory cell transistor storing data "0", that indicated as (2) is a waveform realized in a case of the memory cell transistor storing data "1" or data "2", that indicated as (3) is a waveform realized in a case of the memory cell transistor which is arranged to store data "1" and which has not reached the state of data "1", that indicated as (4) is a waveform realized in a case of the memory cell transistor which is arranged to store data "1" and which has reached the state of data "1", that indicated as (5) is a waveform realized in a case of the memory cell transistor which is arranged to store data "2" and which has reached the state of data "1" and that indicated as (6) is a waveform realized in a case of the memory cell transistor which is arranged to store data "2" and which has not reached the state of data "1". The voltage of the bit line BLa indicated as (*8) is voltage realized when the memory cell transistor has reached the state of data "1", that indicated as (*9) is voltage realized when the memory cell transistor has not reached the state of data "1", that indicated as (*10) is voltage realized when the memory cell transistor has reached the state of data "2", and that indicated as (*11) is voltage realized when the memory cell transistor has not reached the state of data "2".

Then, the selected control gate CG2A is made to be 2V. If the threshold voltage of the data memory cell transistor is 2V or lower, the voltage of the bit line is lower than 1.5V. If the threshold voltage of the selected memory cell transistor is 2V or higher, the voltage of the bit line is maintained at 1.8V. Then, the transfer gate drive signals BLCA and BLCB are made to be "H" so that the bit lines BLa and BLb respectively and temporarily are connected to the nodes N1 and N2. Then, the transfer gate drive signals BLCA and BLCB respectively are made to be "L" level so that the bit lines BLa and BLb and the nodes N1 and N2 are again separated from each other.

Then, the verify signal VRFYBA is made to be "L" level so that the node N1 is made to be the voltage Vcc in only the data circuit 306A storing write data "0" because the p-channel MOS transistor Qp15 has been turned on. Then, the sense amplifier activating signal SAN1 is made to be "L" level and the sense amplifier activating signal SAP1 is made to be "H" level so that the first flip-flop circuit 314A-1 is deactivated.

Then, the equalizing signal ECH1 is made to be "H" level so as to equalize the node N3 and the node N4. Then, the transfer gate drive signals RV1A and RV1B are made to be "H" level. Then, the sense amplifier activating signal SAN1 is made to be "H" level and the sense amplifier activating signal SAP1 is made to be "L" level so that the first flip-flop circuit 314A-1 is activated. Thus, the voltage of the node N1 is sensed and latched by the first flip-flop circuit 314A-1.

Referring to FIG. 107, waveform indicated as (7) is a waveform realized in a case of the memory cell transistor storing data "0" or data "1", that indicated as (8) is a waveform realized in a case of the memory cell transistor storing data "2", that indicated as (9) is a waveform realized in a case of the memory cell transistor which is arranged to store data "1" and which has not reached the state of data "1", that indicated as (10) is a waveform realized in a case of the memory cell transistor which is arranged to store data "1" and which has reached the state of data "1", that indicated as (11) is a waveform realized in a case of the memory cell transistor which is arranged to store data "2" and which has reached the state of data "2", and that indicated as (12) is a waveform realized in a case of the memory cell transistor which is arranged to store data "2" and which has not realized the state of data "2".

Then, write data is changed, as shown in FIG. 108.

Initially, the bit line precharge signal PREB and the transfer gate drive signal RV2A respectively are made to be "H" level. As a result, the potential of the node N2 is made to be 1.5V and the potential of the node N1 is made to be the level determined in accordance with data in the second flip-flop circuit 314A-2. Then, the verify signal VRFYBA is made to be "L" level. As a result, the potential of the node N1 is made to be the level determined in accordance with data in the first flip-flop circuit 314A-1. Then, the sense amplifier activating signal SAN2 is made to be "L" and the sense amplifier activating signal SAP2 is made to be "H" level so that the second flip-flop circuit 314A-2 is deactivated. Then, the equalizing signal ECH2 is made to be "H" level to equalize the node N5 and the node N6.

Then, the transfer gate drive signals RV2A and RV2B respectively are made to be "H" level. Then, the sense amplifier activating signal SAN2 is made to be "H" level and the sense amplifier activating signal SAP2 is made to be "L" level to activate the second flip-flop circuit 314A-2. As a result, the voltage of the node N1 is sensed and latched by the second flip-flop circuit 314A-2.

Therefore, whether or not data in the memory cell transistor corresponding to only the data circuit 306A storing write data "2" has sufficiently be brought to the state of data "2" can be detected. If the memory cell transistor has brought to the state of data "2", the first flip-flop circuit 314A-1 and the second flip-flop circuit 314A-2 respectively sense and latch the voltage of the node N1. As a result, write data is changed to "0". If the memory cell transistor has not brought to the state of data "2", the first flip-flop circuit 314A-1 and the second flip-flop circuit 314A-2 respectively sense and latch the voltage of the node N1 to maintain stored write data "2". In the data circuit 306A storing write data "0" or write data "1", data is not changed.

During the verify read operation, the verify signal VRFYBB is "H" level and the voltage VS of the source line of the memory cell transistor is 0V.

If all of the selected memory cell transistors have reached required threshold voltages, all of write data items in the data circuits 306A-0 to 306A-m are made to be "0". By detecting this, whether or not all of the selected memory cell transistors have reached required threshold voltages can be detected.

FIG. 109 is a table showing a state in which write data in the data circuit 306A is changed.

Although the EEPROM according to the twelfth embodiment has the structure such that the potential of the bit line corresponding to the data circuit 306A storing write data "1" is made to be the bit line write control voltage which is 1.5V, the voltage may be 0V. Similarly to the structure shown in FIG. 92, write operation is performed after a fact has been confirmed that data has sufficiently reached the required state.

(Thirteenth Embodiment)

FIG. 110 is a diagram showing the structures of a memory cell array 301 and a column-system circuit 303 of an EEPROM according to a thirteenth embodiment of the present invention.

The tenth and eleventh embodiments have the structure such that one data circuit 306 corresponds to one bit line BL. A structure may be employed in which one data circuit 306 corresponds to a plurality of bit lines BL.

As shown in FIG. 110, the EEPROM according to the thirteenth embodiment has a structure such that one of the data circuits 306-0 to 306-m is provided for four bit lines BLi-1 to BLi-4 (i is 0 to 3). When the bit line BLi-1 is selected from four bit lines BLi-1 to Bli-4, the signal BLC1 of the drive signals BLC1 to BLC4 for driving the transfer gate circuit 307-1 in the data circuit portion is made to be "H" level. Moreover, the other signals BLC2 to BLC4 respectively are made to be "L" level.

Simultaneously, the signal BLC1D of the drive signals BLC1D to BLC4D for driving the transfer gate circuit 307-2 in the portion including the non-selected bit line controller 320 is made to be "L" level. Moreover, the other signals BLC2D to BLC4D respectively are made to be "H" level. As a result, only the selected bit line BLi-1 is connected to the data circuits 306-0 to 306-m. The non-selected bit lines BLi-2 to BLi-4 respectively are connected to the non-selected bit line controllers 320-0 to 320-m. The non-selected bit line controllers 320-0 to 320-m control the potentials of the non-selected bit lines BLi-2 to BLi-4.

(Fourteenth Embodiment)

Figure 111:
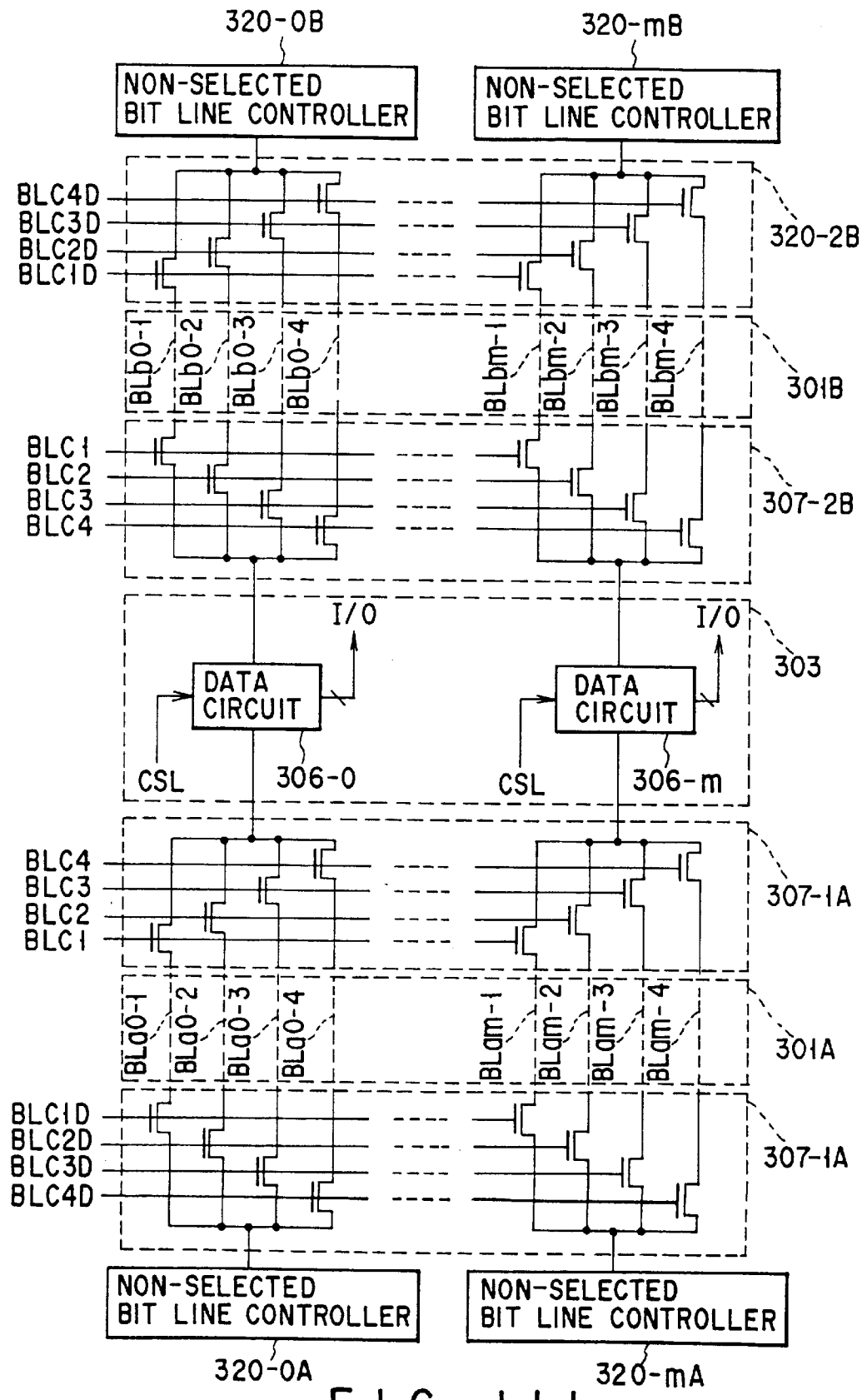
FIG. 111 is a diagram showing the structures of the memory cell array and the column-system circuit of the EEPROM according to the fourteenth embodiment of the present invention.

FIG. 111 is a diagram showing the structures of a memory cell arrays 301A and 301B and a column-system circuit of an EEPROM according to a fourteenth embodiment of the present invention.

Also the twelfth embodiment has the structure such that one data circuit 306 corresponds to one bit line BLa (or BLb), similarly to the tenth and eleventh embodiments. A modification may be employed in which one data circuit 306 corresponds to a plurality of bit lines BLa (or BLb). A modification of the twelfth embodiment will now be described as the fourteenth embodiment.

Also the EEPROM according to the fourteenth embodiment structured as shown in FIG. 111 has a structure such that one bit line selected from four bit lines BLi-1 to BLi-4 (i is 0 to 3) and the data circuits 306-0 to 306-m are connected and three non-selected bit lines and the non-selected bit line controllers 320-0 to 320-m are connected.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

Although the foregoing embodiment has been made about the structure in which the NAND cells are integrated in the memory cell array, the present invention is not limited to this. The following cell may be employed in the present invention.

FIG. 112 is a diagram showing a memory cell array having NOR cells integrated therein. The NOR cells shown in FIG. 112 are connected to the bit line BL through the selection gate transistor.

FIG. 113 is a diagram showing a memory cell array having other NOR cells integrated therein. The NOR cells shown in FIG. 113 are directly connected to the bit line BL.

Figure 114:
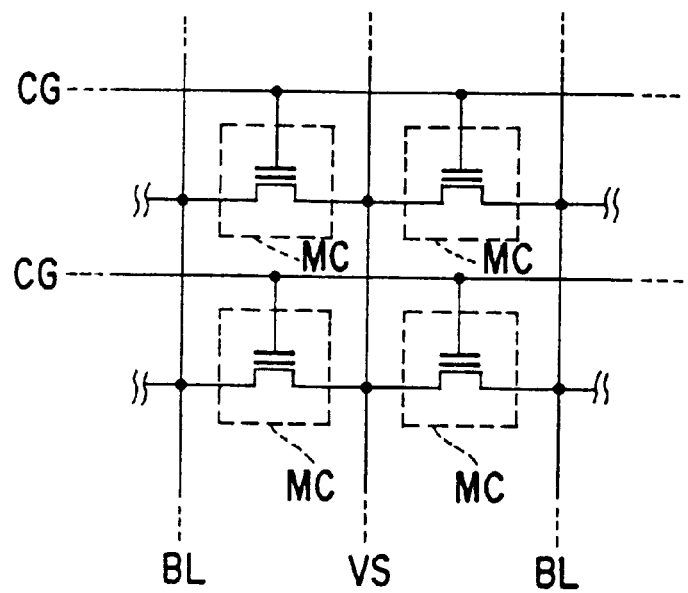

FIG. 114 is a diagram showing a memory cell array having ground array cells integrated therein. As shown in FIG. 114, the ground array cell has a structure such that the bit line BL and the source line VS are arranged in parallel to each other. The ground array cell is one of the NOR type memory.

Figure 115:
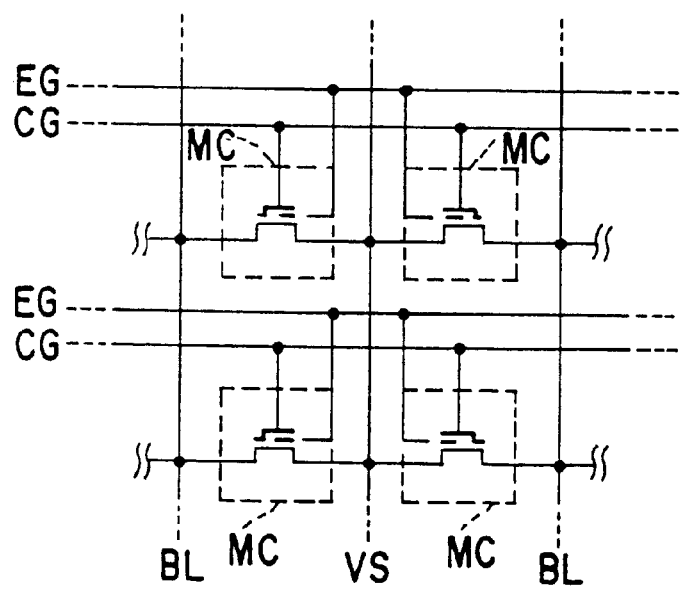

FIG. 115 is a diagram showing a memory cell array having another type ground array cells integrated therein. The ground array cell shown in FIG. 115 has an erasing gate EG for use to erase data. Moreover, the cell has a so-called split channel structure in which a portion of the control gate CG overlaps the channel of the memory cell transistor.

Figure 116:
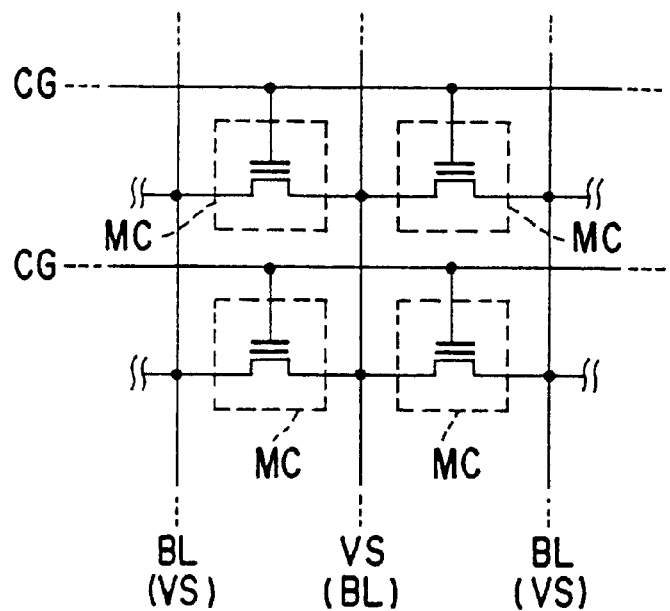

FIG. 116 is a diagram showing a memory cell array having an alternate ground array cells integrated therein. As shown in FIG. 116, the alternate ground array cell has a structure similar to the ground array cell in the viewpoint that the bit line BL and the source line VS are arranged in parallel to each other. However, it is different from the ground array cell in that the bit line BL and the source line VS are alternately switched.

Figure 117:
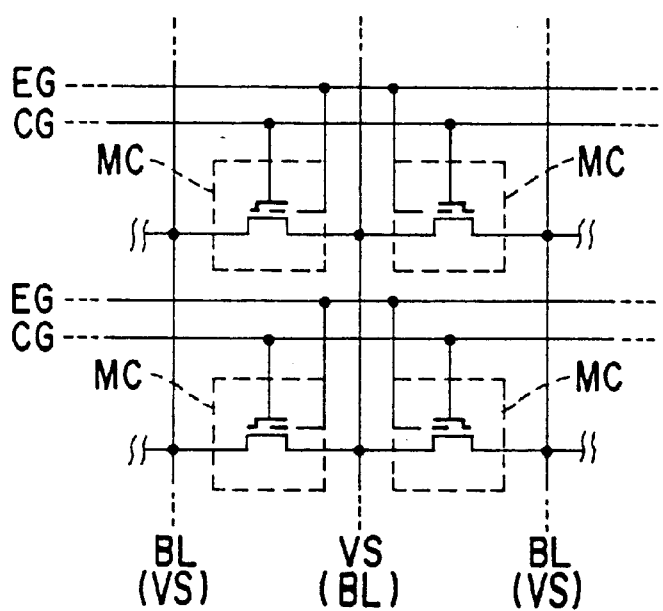

FIG. 117 is a diagram showing a memory cell array having another type alternate ground array cells integrated therein. The alternate ground array cell shown in FIG. 117 has a structure similar to that of the ground array cell shown in FIG. 117.

Figure 118:
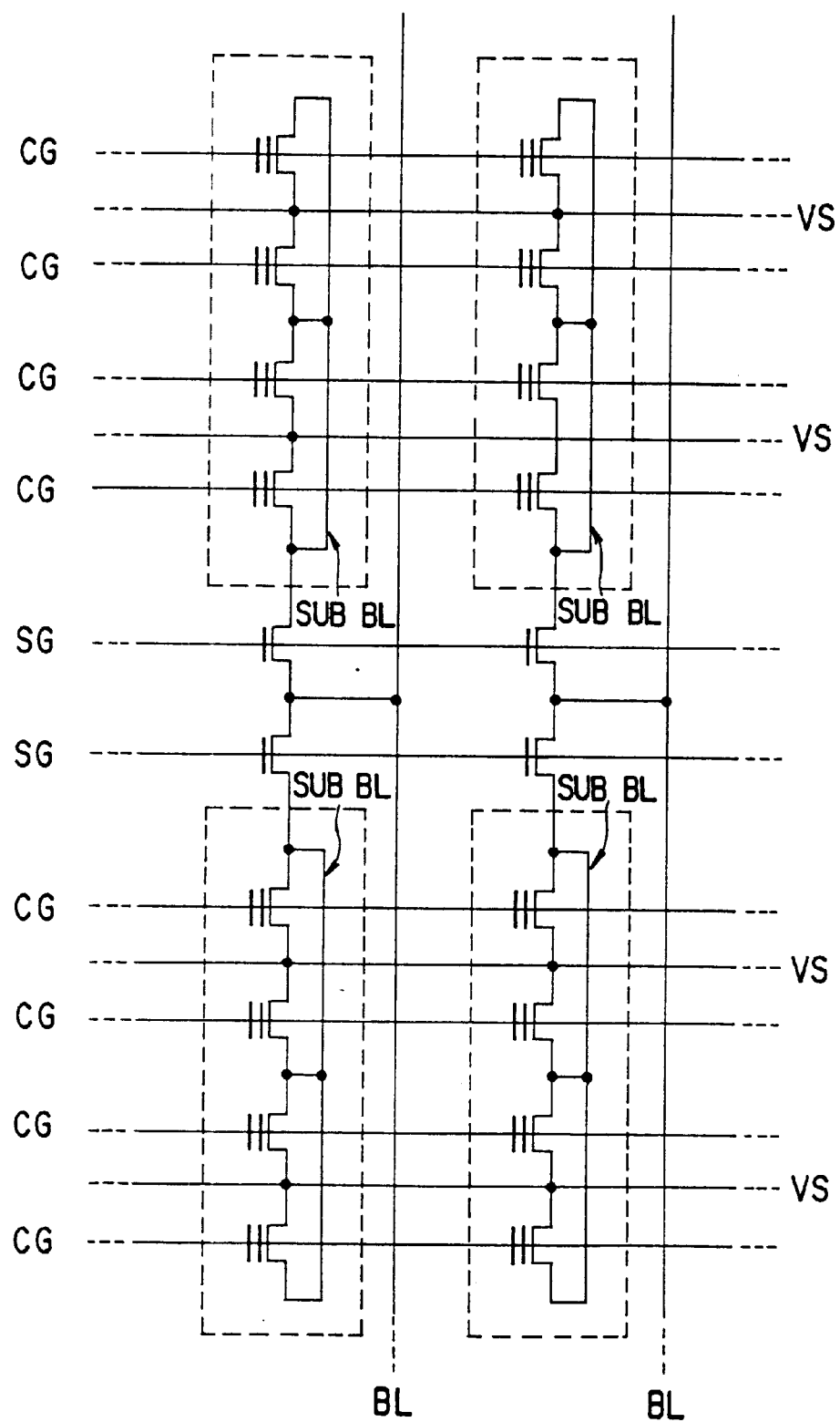

FIG. 118 is a diagram showing a memory cell array having DINOR (Divided NOR) cells integrated therein. As shown in FIG. 118, the DINOR cell has a structure such that, for example, four memory cell transistors are, in parallel, connected between the bit line BL and the source line VS through a bit line side selection transistor.

Figure 119:
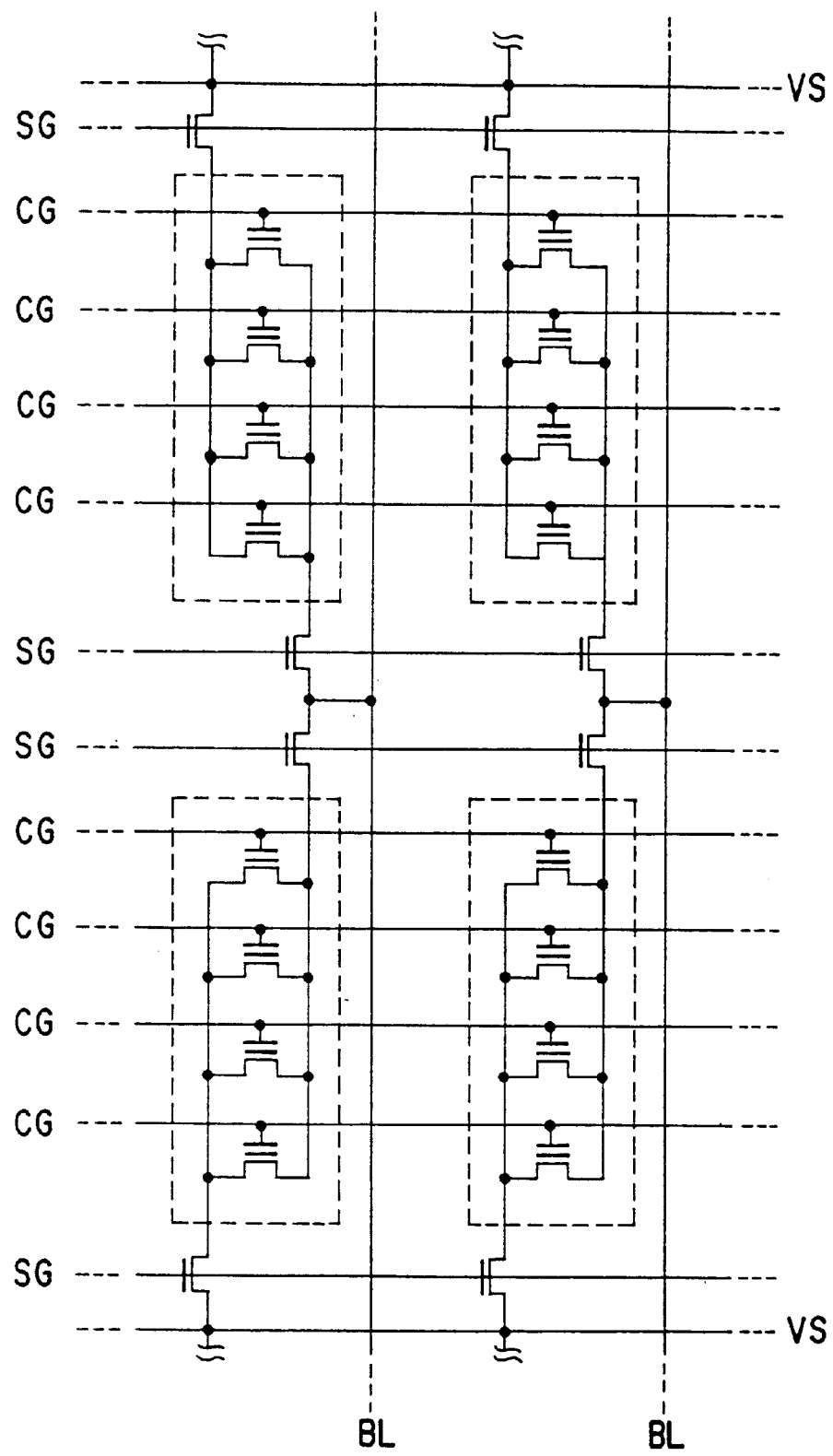

FIG. 119 is a diagram showing a memory cell array having AND cells integrated therein. As shown in FIG. 119, the AND cell has a structure such that, for example, four memory cell transistors are, in parallel, connected between the bit line BL and the source line VS through a bit-line side selection transistor and a source-line side selection transistor.

Although the four-level storing EEPROM has been described in the foregoing embodiments, the present invention may be applied to an EEPROM capable of storing n-level (n≧3).

Although the foregoing embodiments have the structure such that data in the memory ceal is read as the voltage level which has appeared on the bit line BL, data may be read as a level of an electric current which flows the bit line BL.

As described above, according to the present invention, there is provided a nonvolatile semiconductor memory device capable of decreasing the size of the column-system circuit by decreasing the number of the sense amplifiers and data latches and therefore realizing a highly integrated structure.

Moreover, a nonvolatile semiconductor memory device can be provided which is capable of omitting a circuit for converting the number of bits and simultaneously realizing high integration and high-speed input/output operation.

What is claimed is:

1. A multi-level flash memory device comprising:
   a flash memory cell to store multi-level data;
   a word line driver configured to apply a read voltage and a write voltage to a word line of the flash memory cell;
   a bit line controller configured to control a bit line connected to the flash memory cell, the bit line controller comprising a data circuit configured to read a multi-level data stored in the flash memory cell and store the read data, store a multi-level write data and apply a bit line write voltage according to the write data stored, the data circuit comprising a plurality of data control circuits, each being capable of storing a binary data,
   wherein at least one of the data control circuits is placed at one end of the bit line, and the remaining data control circuits are located at another end of the bit line.

2. The multi-level flash memory device according to claim 1, wherein said bit line controller verifies an actual written state of the flash memory cell, and modifies the write data to inhibit progress of the writing, if it has been verified that the flash memory cell has been written successfully.

3. The device according to claim 2, wherein each data control circuit selectively determines the actual written state of the flash memory cell dependent on the binary data stored in itself.

4. The device according to claim 1, wherein each data control circuit acts as a sense amplifier, and the plurality of the data control circuits separately work as the sense amplifier with respect to time frame.

5. The device according to claim 1, further comprising a plurality of I/O lines and column select gates, wherein each data control circuit is connected to respective I/O line via respective column select gate.

* * * * *